July 7, 1964 P. A. HOFFMAN 3,140,481

REVERSIBLE ANALOG TO DIGITAL CONVERTER

Original Filed April 28, 1960 57 Sheets-Sheet 1

INVENTOR.
PHILIP A. HOFFMAN
BY
Diggins & LeBlanc

REVERSIBLE ANALOG TO DIGITAL CONVERTER

Original Filed April 28, 1960 57 Sheets-Sheet 2

INVENTOR.

BY

INVENTOR.

BY

July 7, 1964 P. A. HOFFMAN 3,140,481

REVERSIBLE ANALOG TO DIGITAL CONVERTER

Original Filed April 28, 1960 57 Sheets-Sheet 4

INVENTOR.

BY

INVENTOR.

BY

REVERSIBLE ANALOG TO DIGITAL CONVERTER

Original Filed April 28, 1960

INVENTOR.

BY

INVENTOR.

BY

July 7, 1964 P. A. HOFFMAN 3,140,481

REVERSIBLE ANALOG TO DIGITAL CONVERTER

Original Filed April 28, 1960

57 Sheets-Sheet 8

INVENTOR.

BY

July 7, 1964 P. A. HOFFMAN 3,140,481
REVERSIBLE ANALOG TO DIGITAL CONVERTER
Original Filed April 28, 1960 57 Sheets-Sheet 9
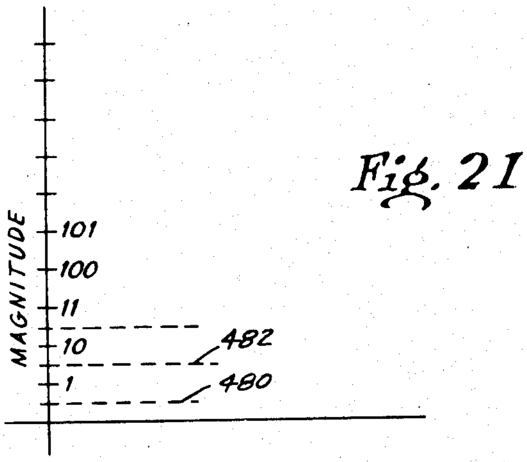
Fig. 21
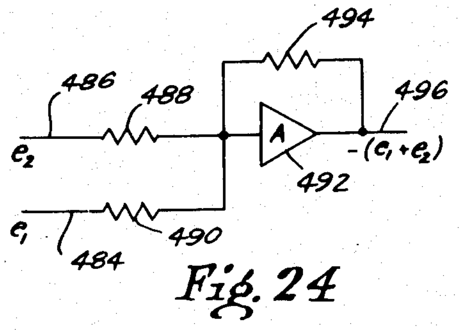
Fig. 24
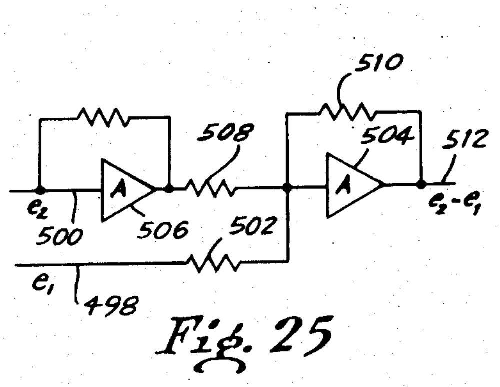
Fig. 25
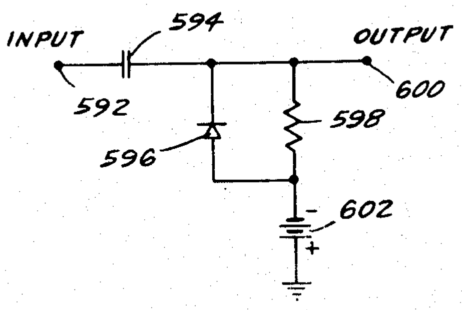
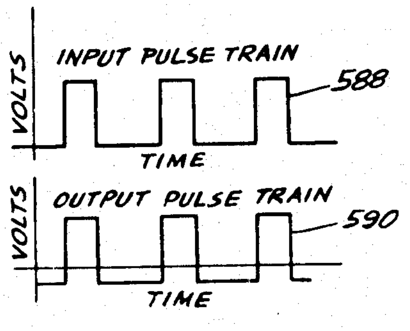
Fig. 26a Fig. 26b
INVENTOR.
BY July 7, 1964 P. A. HOFFMAN 3,140,481

REVERSIBLE ANALOG TO DIGITAL CONVERTER

Original Filed April 28, 1960 57 Sheets-Sheet 10

INVENTOR.

BY

July 7, 1964 P. A. HOFFMAN 3,140,481

REVERSIBLE ANALOG TO DIGITAL CONVERTER

Original Filed April 28, 1960 57 Sheets-Sheet 11

INVENTOR.

BY

REVERSIBLE ANALOG TO DIGITAL CONVERTER

Original Filed April 28, 1960 57 Sheets-Sheet 12

INVENTOR.

BY

INVENTOR.

BY

INVENTOR.

BY

July 7, 1964 P. A. HOFFMAN 3,140,481

REVERSIBLE ANALOG TO DIGITAL CONVERTER

Original Filed April 28, 1960 57 Sheets-Sheet 15

INVENTOR.

BY

INVENTOR.

BY

INVENTOR.

BY

INVENTOR.

BY

July 7, 1964 P. A. HOFFMAN 3,140,481

REVERSIBLE ANALOG TO DIGITAL CONVERTER

Original Filed April 28, 1960 57 Sheets-Sheet 19

INVENTOR.

BY

INVENTOR.

BY

INVENTOR.

BY

July 7, 1964 P. A. HOFFMAN 3,140,481

REVERSIBLE ANALOG TO DIGITAL CONVERTER

Original Filed April 28, 1960 57 Sheets-Sheet 22

INVENTOR.

BY

INVENTOR.

BY

July 7, 1964 P. A. HOFFMAN 3,140,481

REVERSIBLE ANALOG TO DIGITAL CONVERTER

Original Filed April 28, 1960 57 Sheets-Sheet 24

INVENTOR.

BY

REVERSIBLE ANALOG TO DIGITAL CONVERTER

Original Filed April 28, 1960 57 Sheets-Sheet 25

INVENTOR.

BY

INVENTOR.

BY

INVENTOR.

BY

INVENTOR.

BY

REVERSIBLE ANALOG TO DIGITAL CONVERTER

Original Filed April 28, 1960 57 Sheets-Sheet 29

INVENTOR.

BY

INVENTOR.

BY

July 7, 1964 P. A. HOFFMAN 3,140,481

REVERSIBLE ANALOG TO DIGITAL CONVERTER

Original Filed April 28, 1960 57 Sheets-Sheet 31

$C_{809} = C_{817}$

INVENTOR.

BY

July 7, 1964 P. A. HOFFMAN 3,140,481

REVERSIBLE ANALOG TO DIGITAL CONVERTER

Original Filed April 28, 1960

57 Sheets-Sheet 32

INVENTOR.

BY

INVENTOR.

BY

INVENTOR.

BY

July 7, 1964 P. A. HOFFMAN 3,140,481

REVERSIBLE ANALOG TO DIGITAL CONVERTER

Original Filed April 28, 1960 57 Sheets-Sheet 35

INVENTOR.

BY

July 7, 1964 P. A. HOFFMAN 3,140,481

REVERSIBLE ANALOG TO DIGITAL CONVERTER

Original Filed April 28, 1960 57 Sheets-Sheet 36

INVENTOR.

BY

July 7, 1964 P. A. HOFFMAN 3,140,481

REVERSIBLE ANALOG TO DIGITAL CONVERTER

Original Filed April 28, 1960 57 Sheets-Sheet 37

INVENTOR.

BY

INVENTOR.

BY

INVENTOR.

BY

INVENTOR.

BY

REVERSIBLE ANALOG TO DIGITAL CONVERTER

Original Filed April 28, 1960 57 Sheets-Sheet 41

INVENTOR.

BY

INVENTOR.

BY

INVENTOR.

BY

INVENTOR.

BY

INVENTOR.

BY

July 7, 1964 P. A. HOFFMAN 3,140,481

REVERSIBLE ANALOG TO DIGITAL CONVERTER

Original Filed April 28, 1960 57 Sheets-Sheet 46

INVENTOR.

BY

INVENTOR.

BY

July 7, 1964 P. A. HOFFMAN 3,140,481

REVERSIBLE ANALOG TO DIGITAL CONVERTER

Original Filed April 28, 1960 57 Sheets-Sheet 48

INVENTOR.

BY

INVENTOR.

BY

July 7, 1964 P. A. HOFFMAN 3,140,481

REVERSIBLE ANALOG TO DIGITAL CONVERTER

Original Filed April 28, 1960 57 Sheets-Sheet 50

INVENTOR.

BY

INVENTOR.

BY

INVENTOR.

BY

July 7, 1964 P. A. HOFFMAN 3,140,481

REVERSIBLE ANALOG TO DIGITAL CONVERTER

Original Filed April 28, 1960 57 Sheets-Sheet 53

INVENTOR.

BY

INVENTOR.

BY

INVENTOR.

BY

REVERSIBLE ANALOG TO DIGITAL CONVERTER

Original Filed April 28, 1960

INVENTOR.

BY

INVENTOR.

BY

United States Patent Office 3,140,481

Patented July 7, 1964

3,140,481

REVERSIBLE ANALOG TO DIGITAL CONVERTER

Philip A. Hoffman, Towson, Md., assignor to Hoffman and Eaton, Towson, Md., a partnership Original application Apr. 28, 1960, Ser. No. 25,343, now Patent No. 3,098,224, dated July 16, 1963. Divided and this application Dec. 28, 1961, Ser. No. 162,761
211 Claims. (Cl. 340—347)

This invention relates to a reversible analog to digital and digital to analog converter system and more particularly with a completely electronic converter system useful both in the conversion of analog information to digital information and in the conversion of digital information into analog information.

Analog to digital converters and digital to analog converters are well known. They are useful in a wide variety of applications such as in the field of telemetry for transferring the analog output of various types of transducers such as accelerometers, airspeed meters and the like into electrical pulses and for converting electrical pulses into analog quantities which represent the original information measured. Converters are also useful for voice encoding and for voice communication in which application they provide a communication system having superior fidelity and other desirable characteristics over comparable systems. Also coming into use are converters for electrical driven machinery and particularly for machine tools.

The converters which are the subject of the present invention accept electrical quantities in the form of a voltage or current or other signal as input. The output of the analog to digital converter may take many forms. One form is electrical pulses in serial time relationship. Other forms include the condition of electrical or magnetic quantities in flip-flops or in magnetic cores. Still other forms of output are mechanical such as counters or registers, or the setting of relays. The outputs of the digital to analog converters are electromagnetic signals such as voltages or current or the like which vary with time. As used hereinafter the word "converter" refers to both analog to digital converters and digital to analog converters. When a statement applies just to an analog to digital converter or to a digital to analog converter but not to both the appropriate complete name will be used.

One of the circuits which has heretofore been widely used in analog to digital converters generates a comparison voltage which is brought to approximate equality with an analog voltage by means of successive trials and adjustments. The means for generating and controlling the comparison voltage have been complex and required many expensive precision components usually including a large number of amplifiers and resistors. Because of the number of components involved these systems of necessity are expensive, require relatively high supply voltages and involve a large energy consumption.

The present invention avoids the above-mentioned difficulties by providing a greatly simplified electronic converter requiring only a small number of precision components and with control circuits of vastly reduced complexity. Additional advantages of the circuit of the present invention are the low energy consumption and the low supply voltages required. An important feature of the present invention is its wide adaptability to various inputs and outputs in conjunction with its complete reversibility through an extremely simple switch arrangement. The individual analog to digital and digital to analog converter units may be used together or may be used independently with other outside circuits such as analog computers, digital computers, and various memory devices and the like, and may additionally be employed in conjunction with portions of existing inscriber and outscriber equipment used with large digital computers.

It is therefore a primary object of the present invention to provide a novel electronic converter.

Another object of the invention is to provide a novel reversible electronic converter.

Another object of the present invention is to provide analog to digital converters and digital to analog converters which are simpler and less expensive than known apparatus.

Another object of the present invention is to provide a relatively simple reversible analog to digital and digital to analog converter.

Another object of the present invention is to provide a converter wherein the digital number may be binary, decimal or have any other number for a base.

Another object of the present invention is to provide a novel converter system which operates on the most significant digit first.

Another object of the present invention is to provide a novel converter system having an increased simplicity and wide adaptability so as to be useable with any number system and with a wide variety of auxiliary equipment.

Another object of the present invention is to provide an improved converter system incorporating charge transfer.

Still another object of the present invention is to provide an improved converter system incorporating delayed feedback.

A still further object of the present invention is to provide an improved converter incorporating electrical delays lines.

These and other objects and advantages of the invention will be more apparent upon reference to the following specification, claims and appended drawings wherein:

Figure 15:
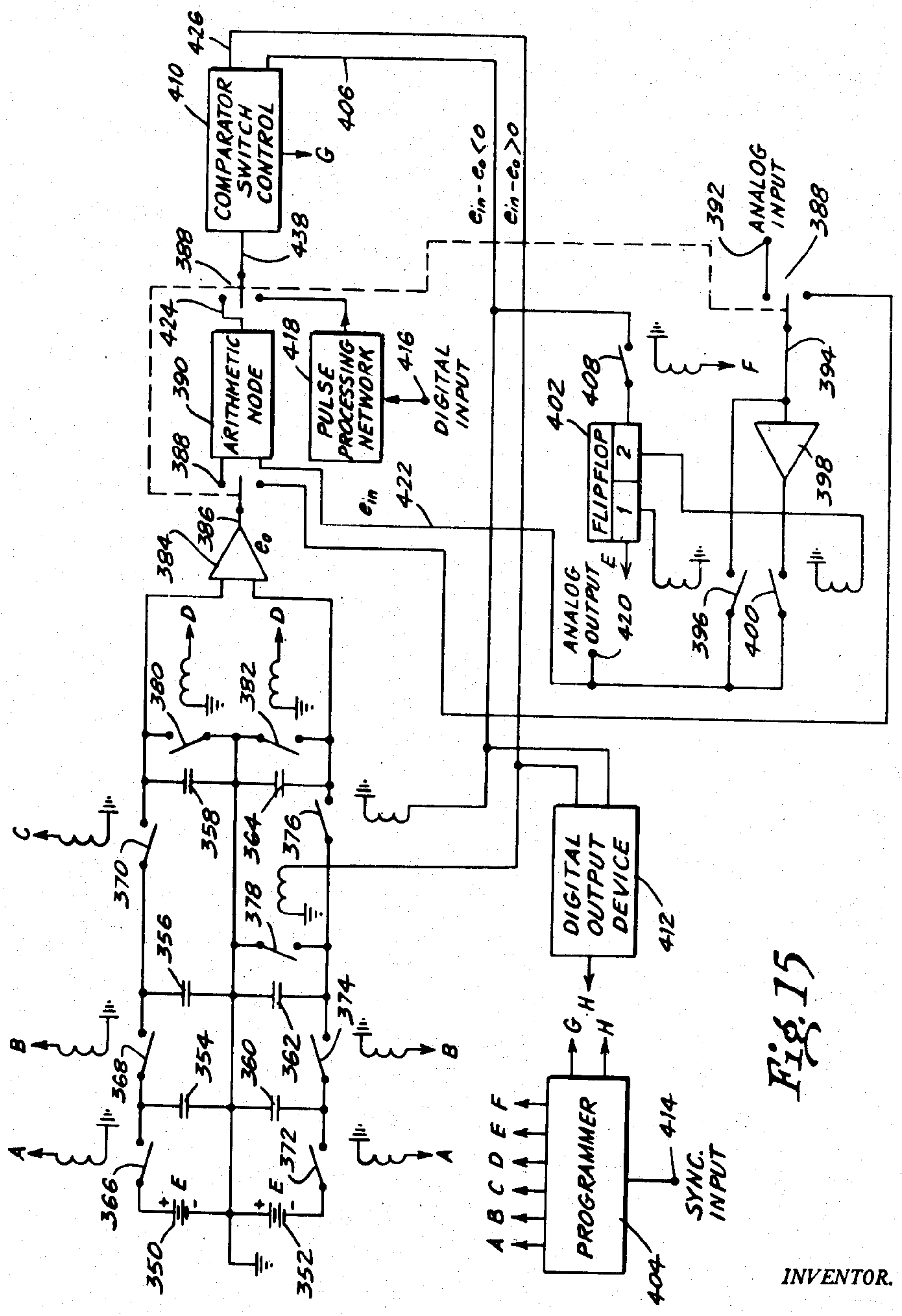
FIGURE 15 is a circuit diagram of a reversible binary *a/d* converter employing 6 capacitors, 2 standard voltage sources, and final charge storage in two relatively large capacitors.
Figures 16, 17:
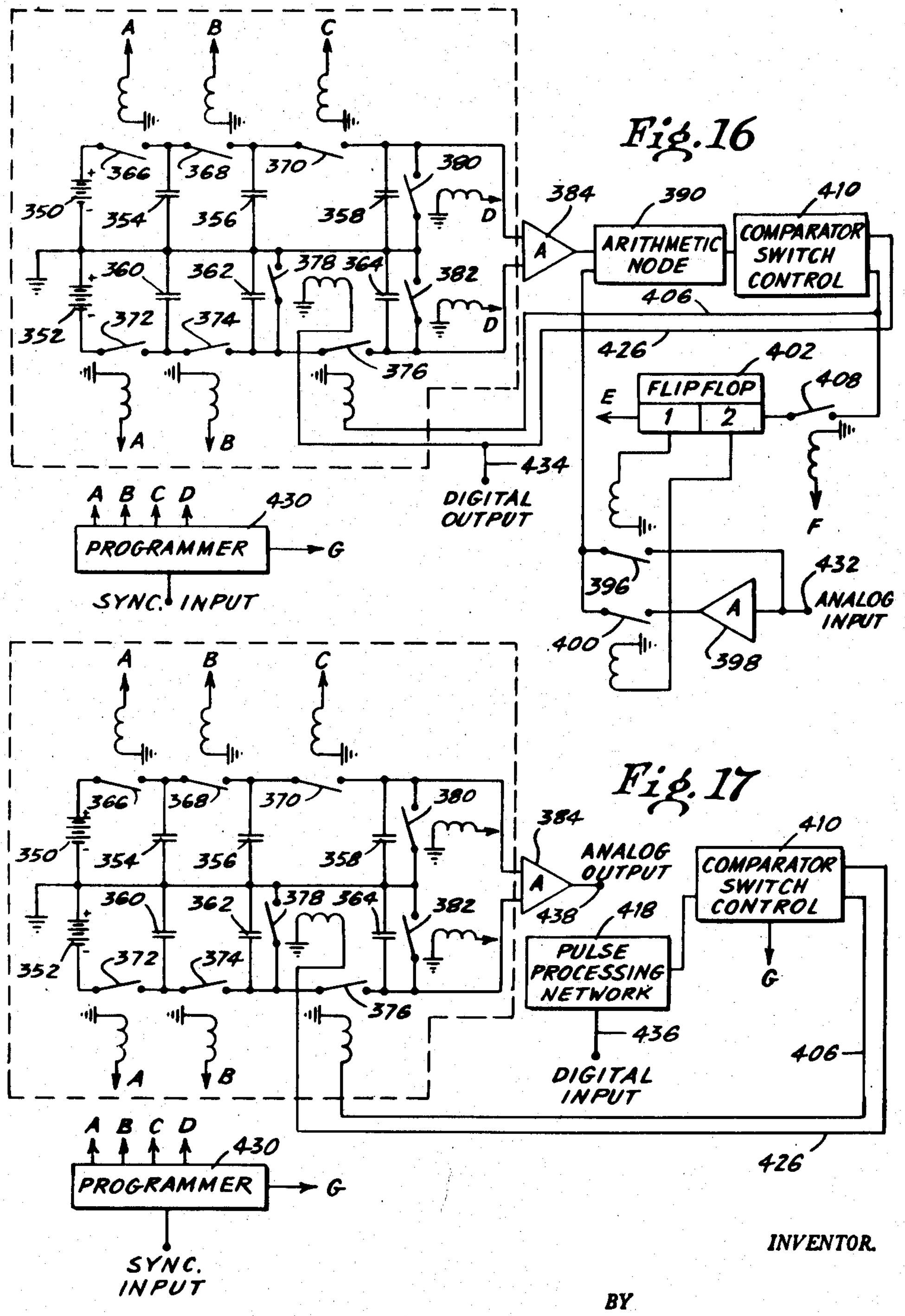
FIGURE 16 is the analog to digital converter used in the device of FIGURE 15.
FIGURE 17 is the digital to analog converter used in the device of FIGURE 15.
Figure 19:
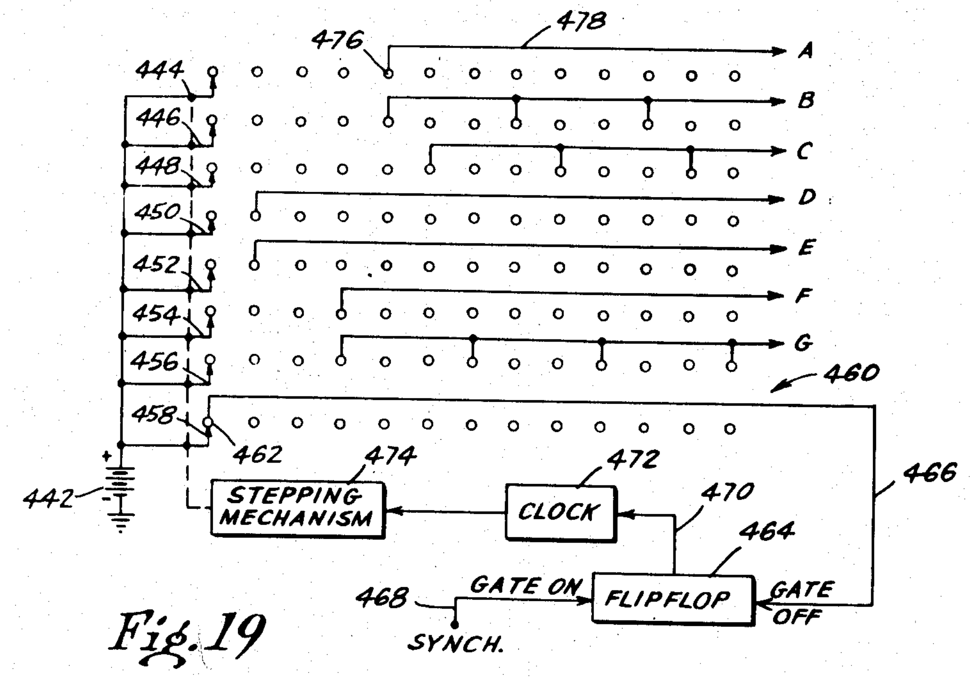
Figure 20:
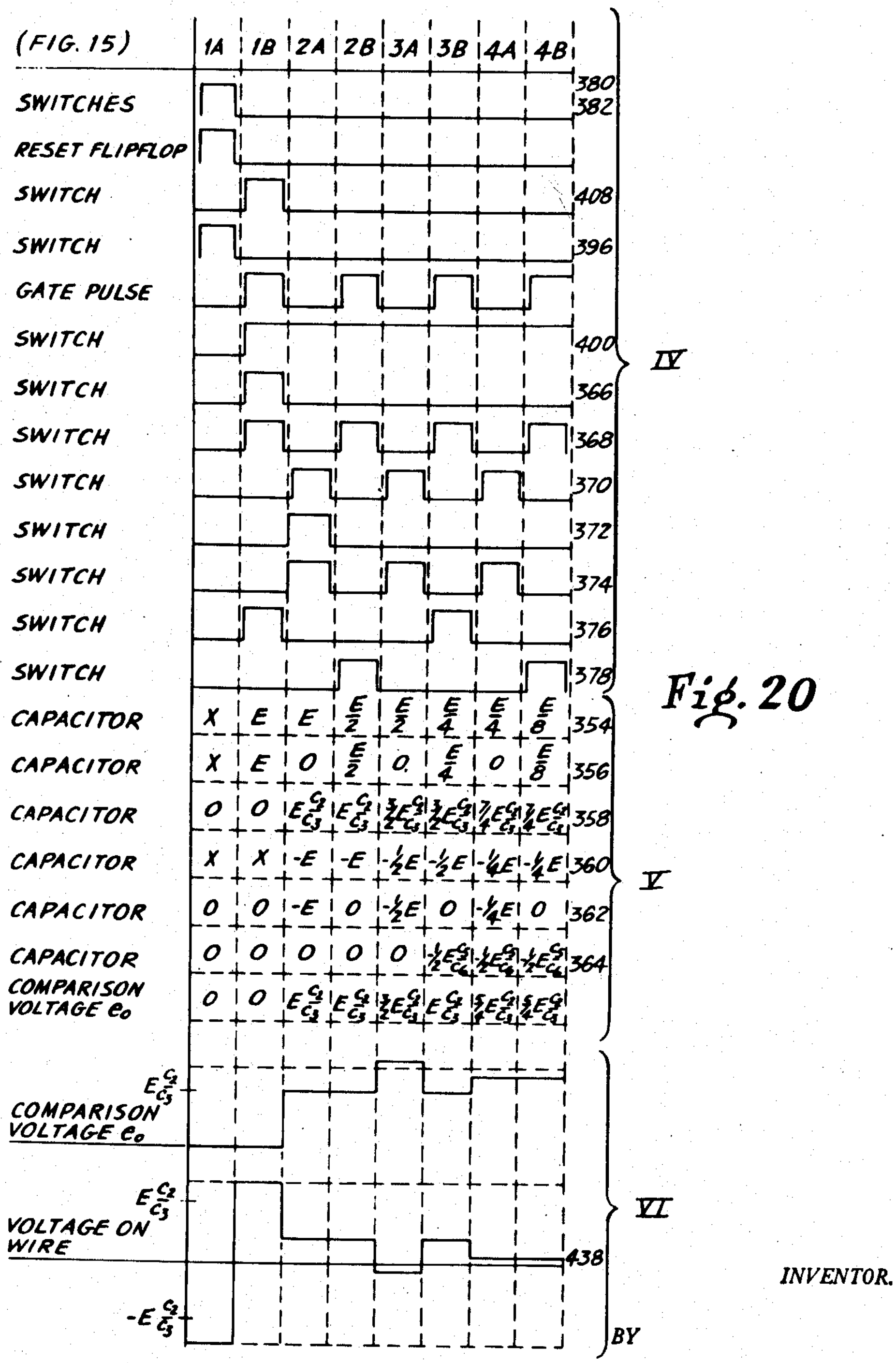

FIGURE 19 showds a programmer suitable for use in the systems of FIGURES 15, 16 and 17 with 3 part bit periods;

FIGURE 20 shows the timing and voltage relationships for the devices shown in FIGURES 15, 16 and 17 for 2 part bit periods.

Figure 3:
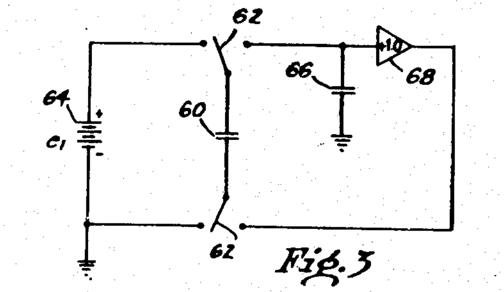
FIGURE 3 shows one method for transferring charge on one capacitor to another capacitor.
Figure 5:
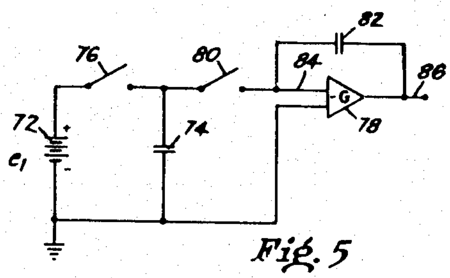
FIGURE 5 shows another method whereby all of the charge on one capacitor may be transferred to another capacitor.
Figure 7:
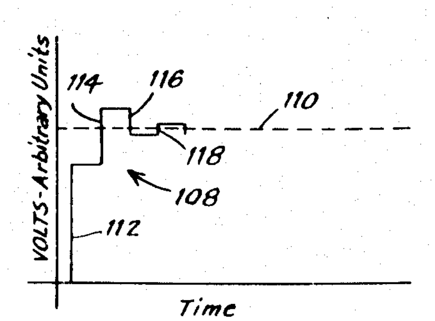
FIGURE 7 shows a second program for the synthesis of comparison or analog output voltages for binary conversions.
Figure 22:
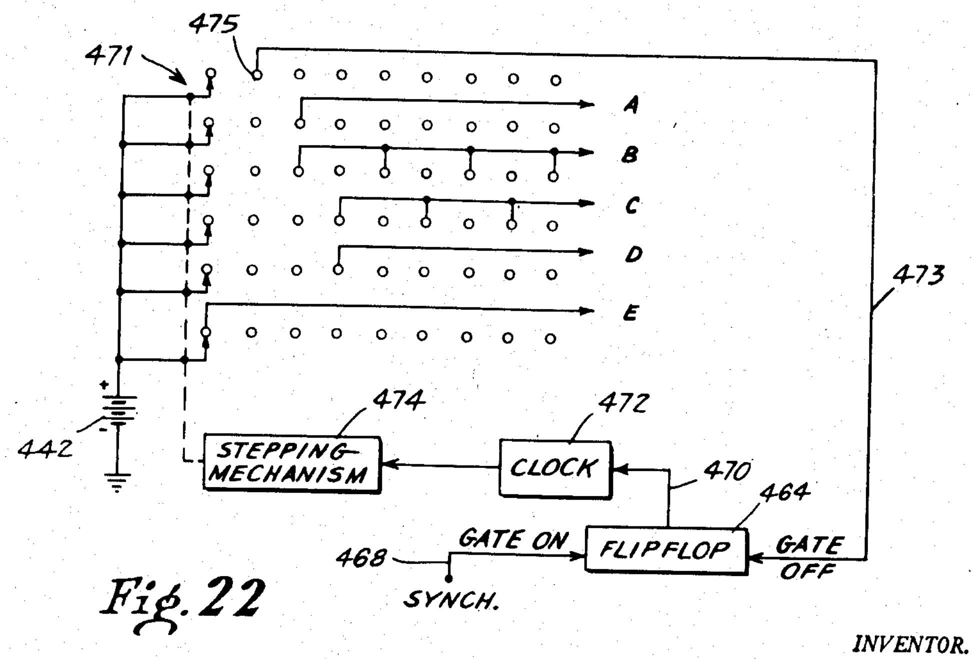
Figure 23:
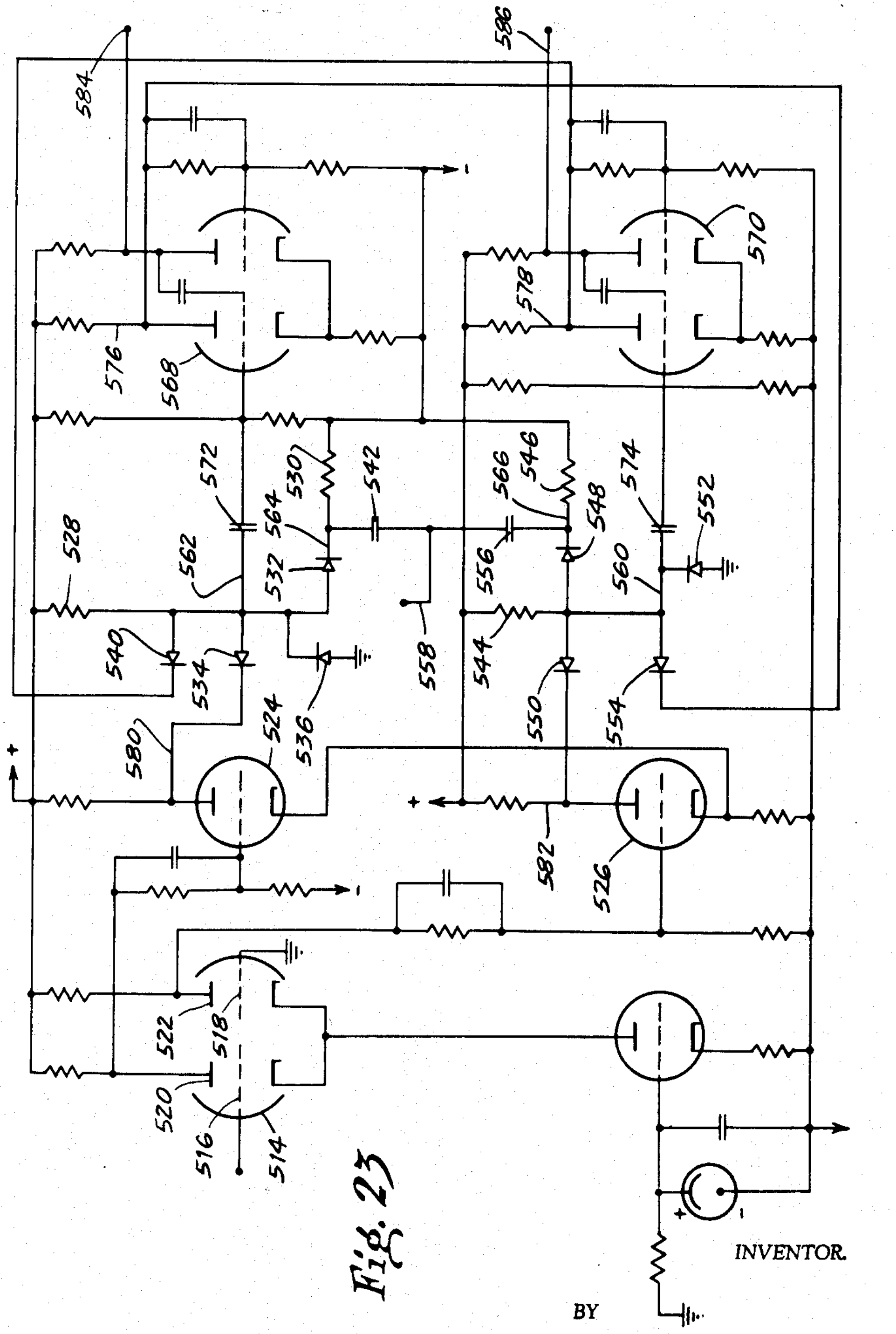
Figure 27:
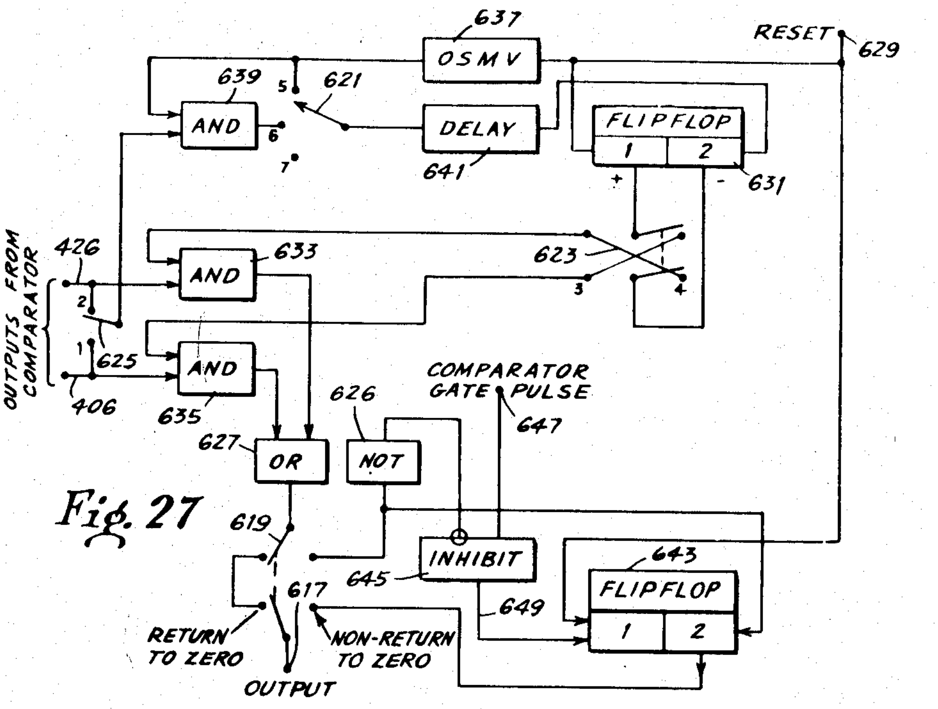
Figure 28:
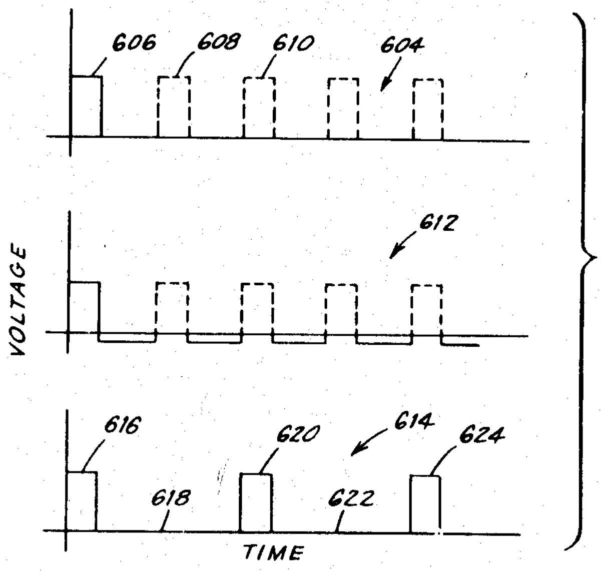
Figure 28A:
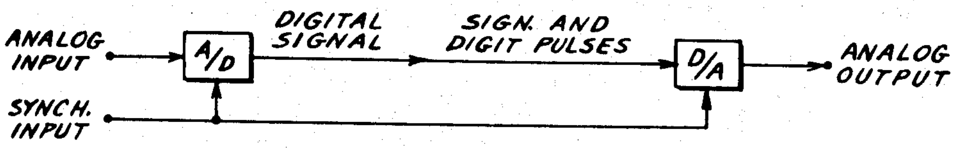
Figure 28B:
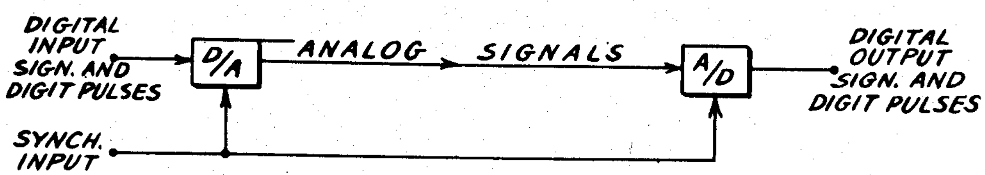
Figure 28C:
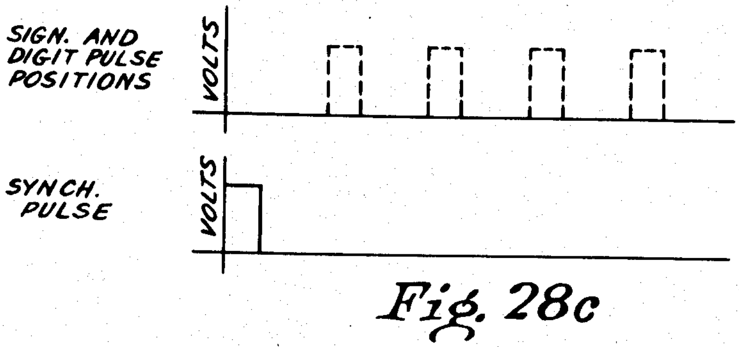
Figure 33:
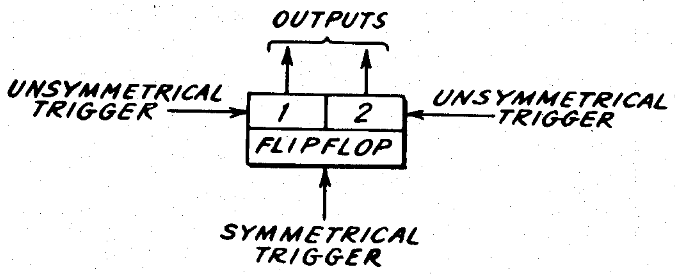
Figures 29, 30:
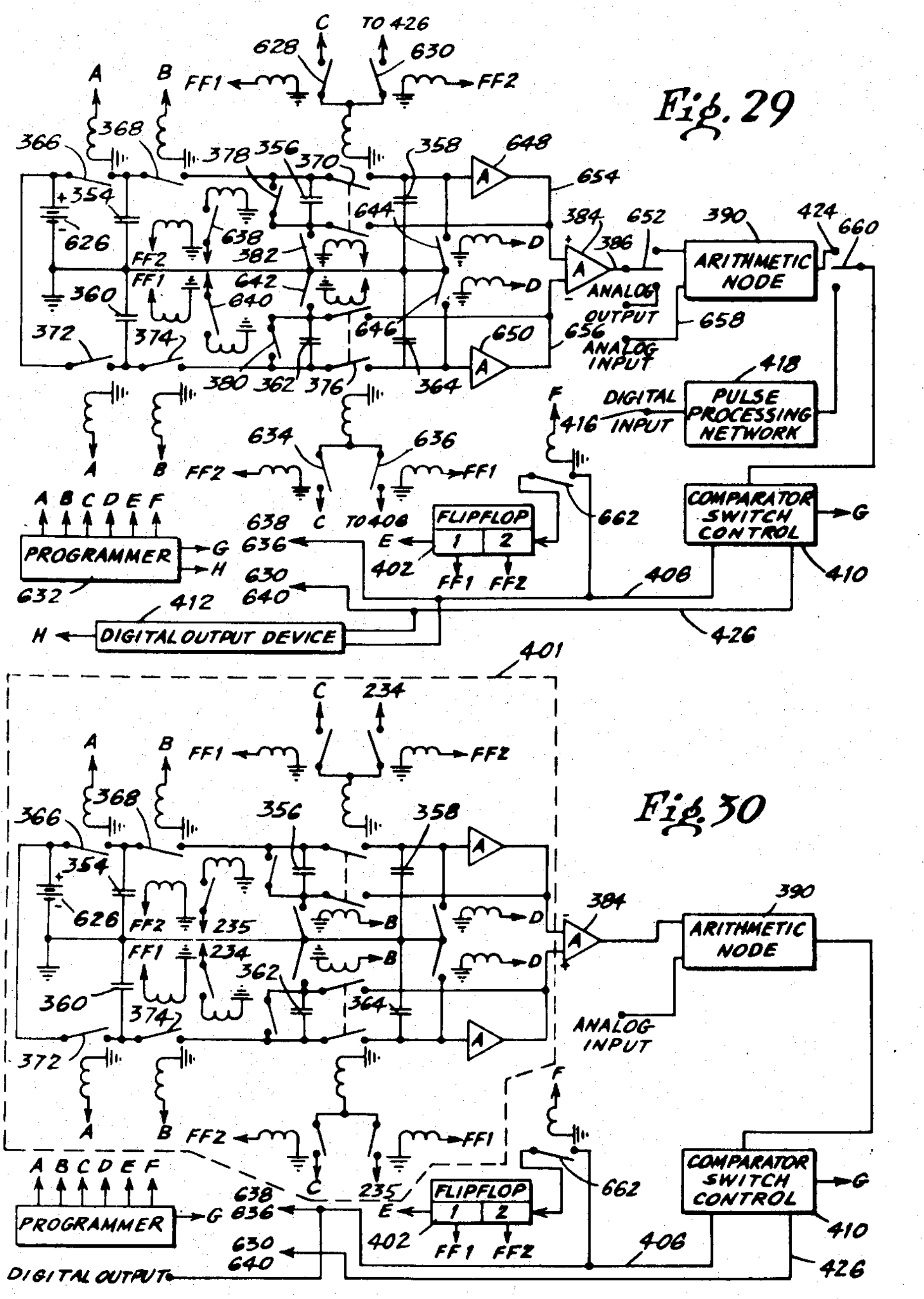
Figure 31:
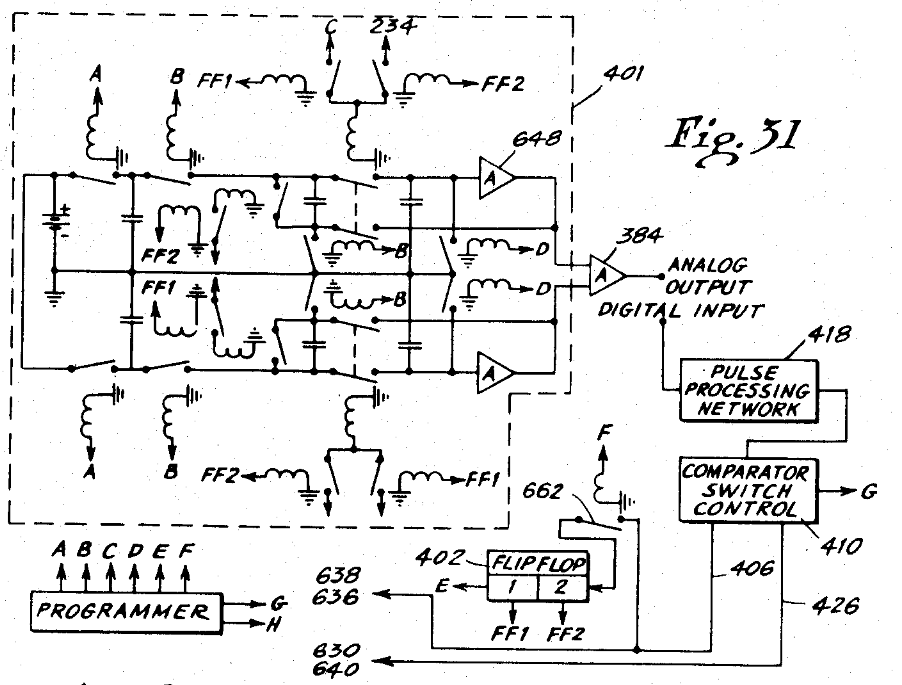
Figure 34:
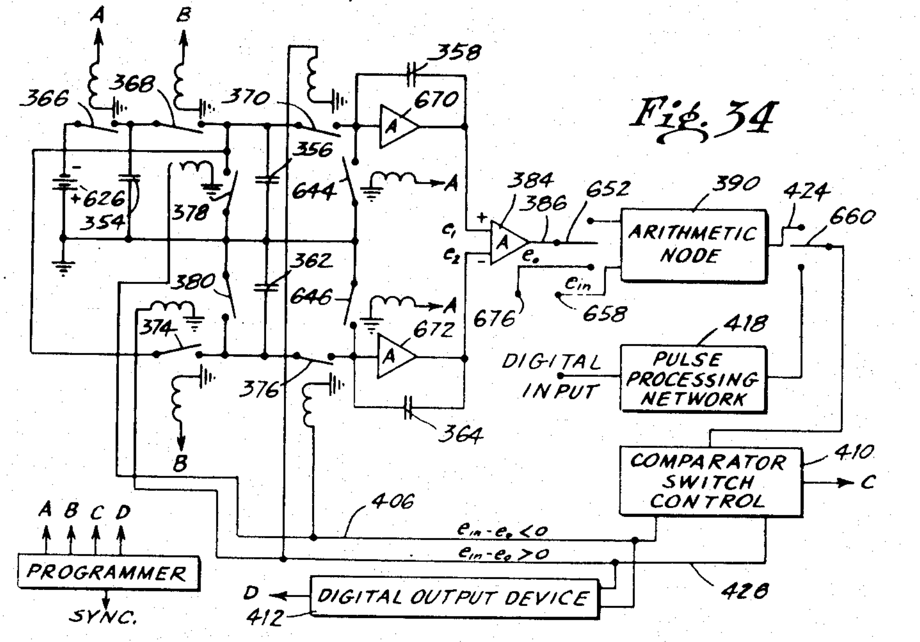
Figure 32:
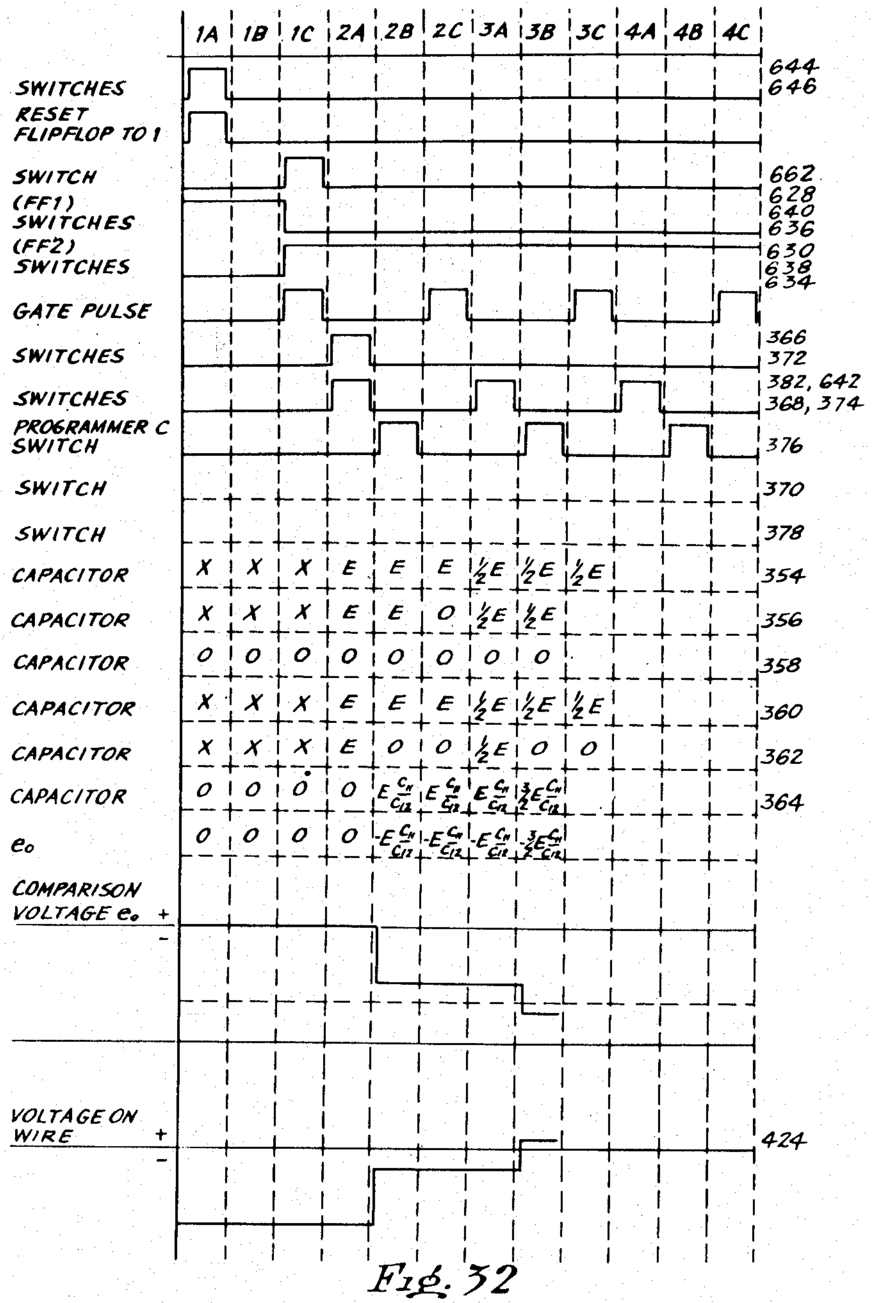
Figure 35:
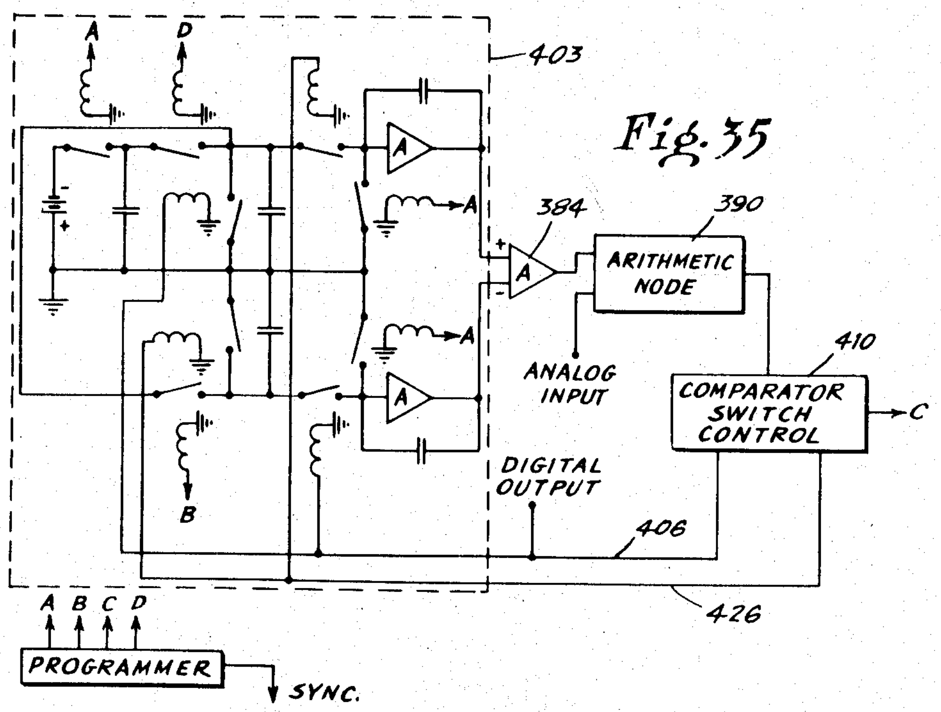
Figure 36:
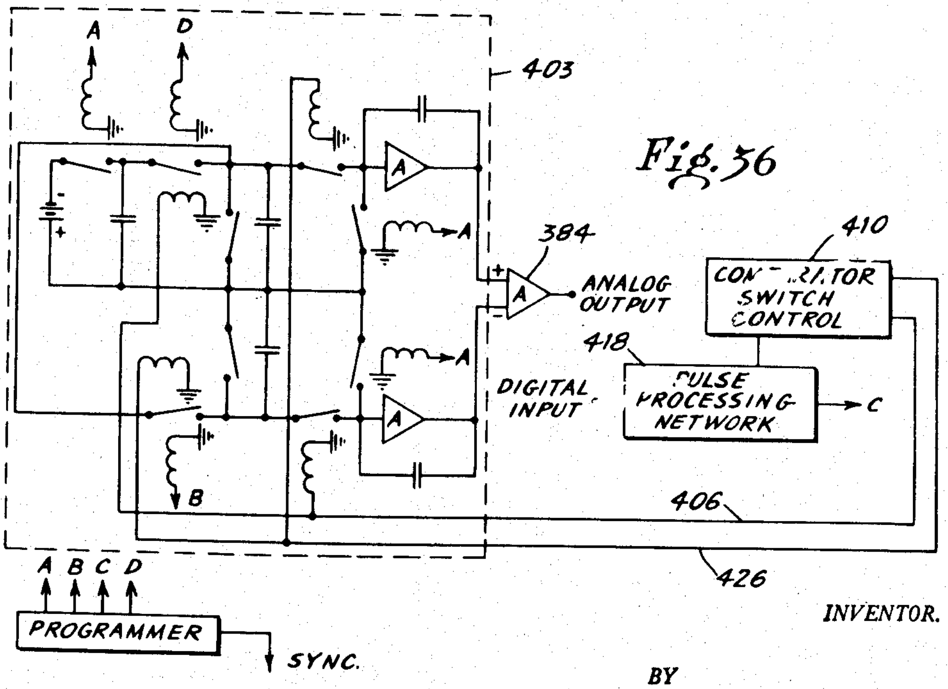
Figure 37:
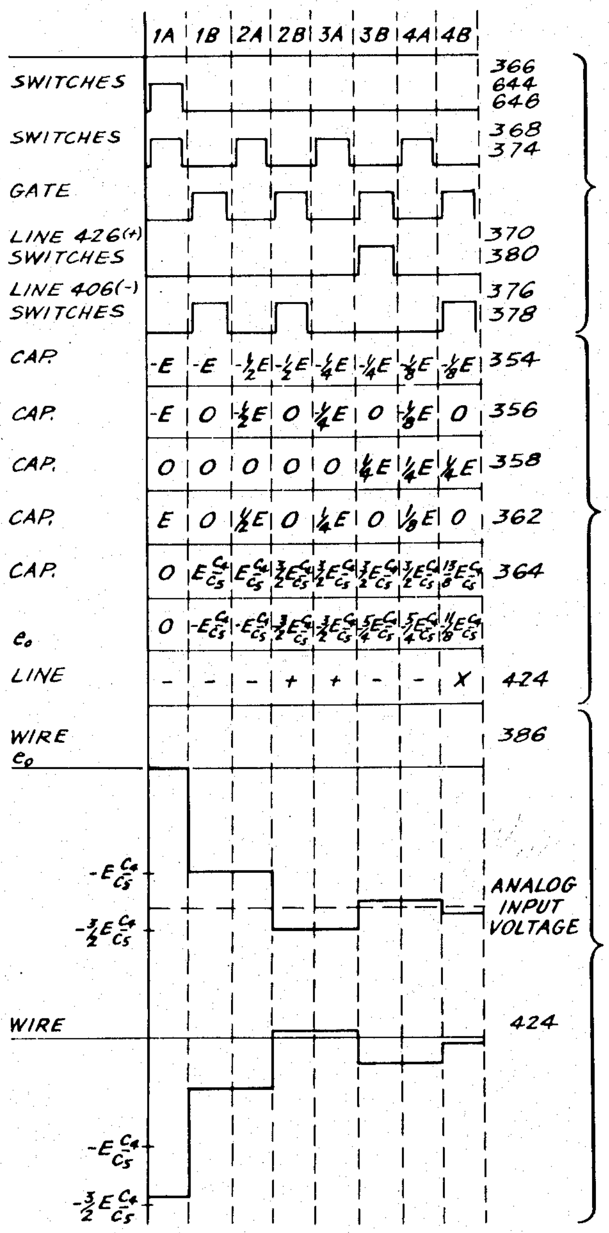
Figure 43:
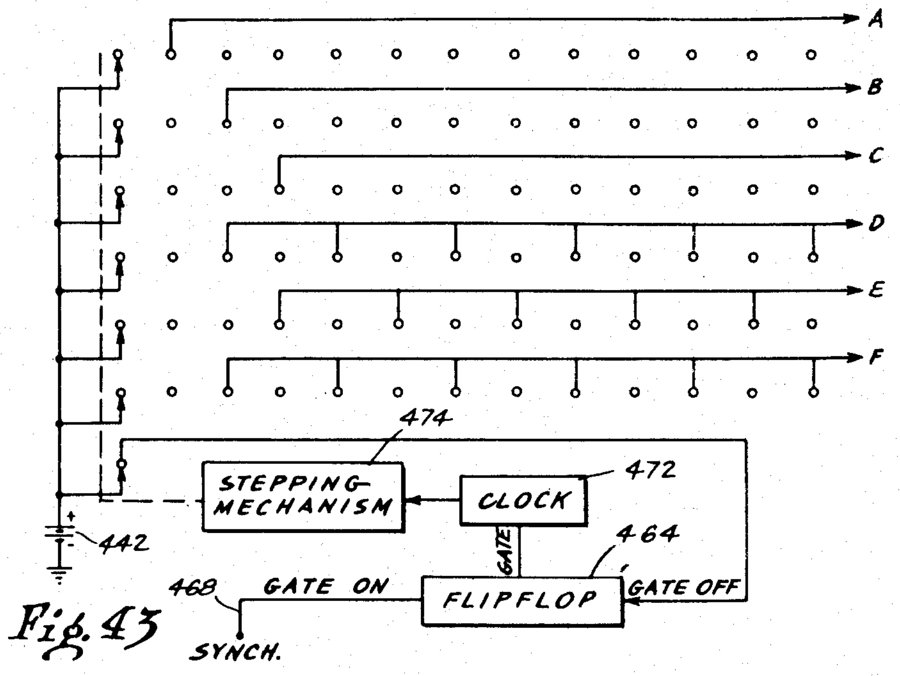
Figure 58:
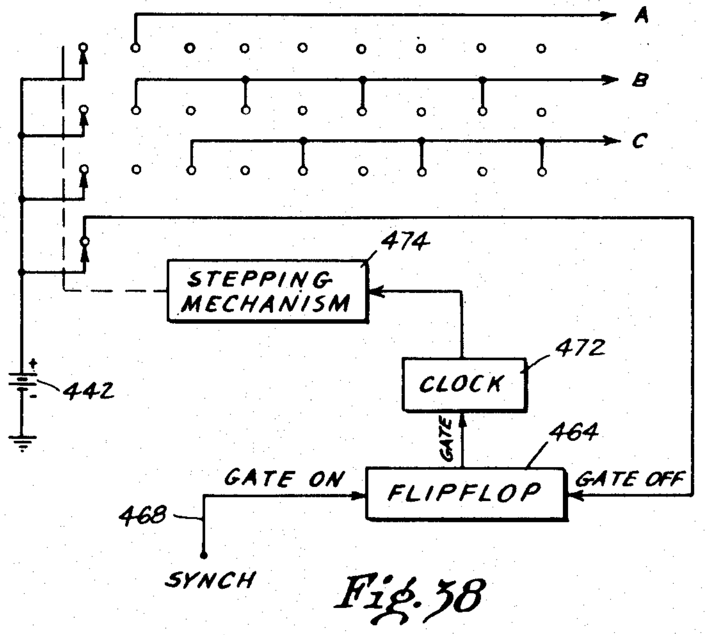
Figure 39:
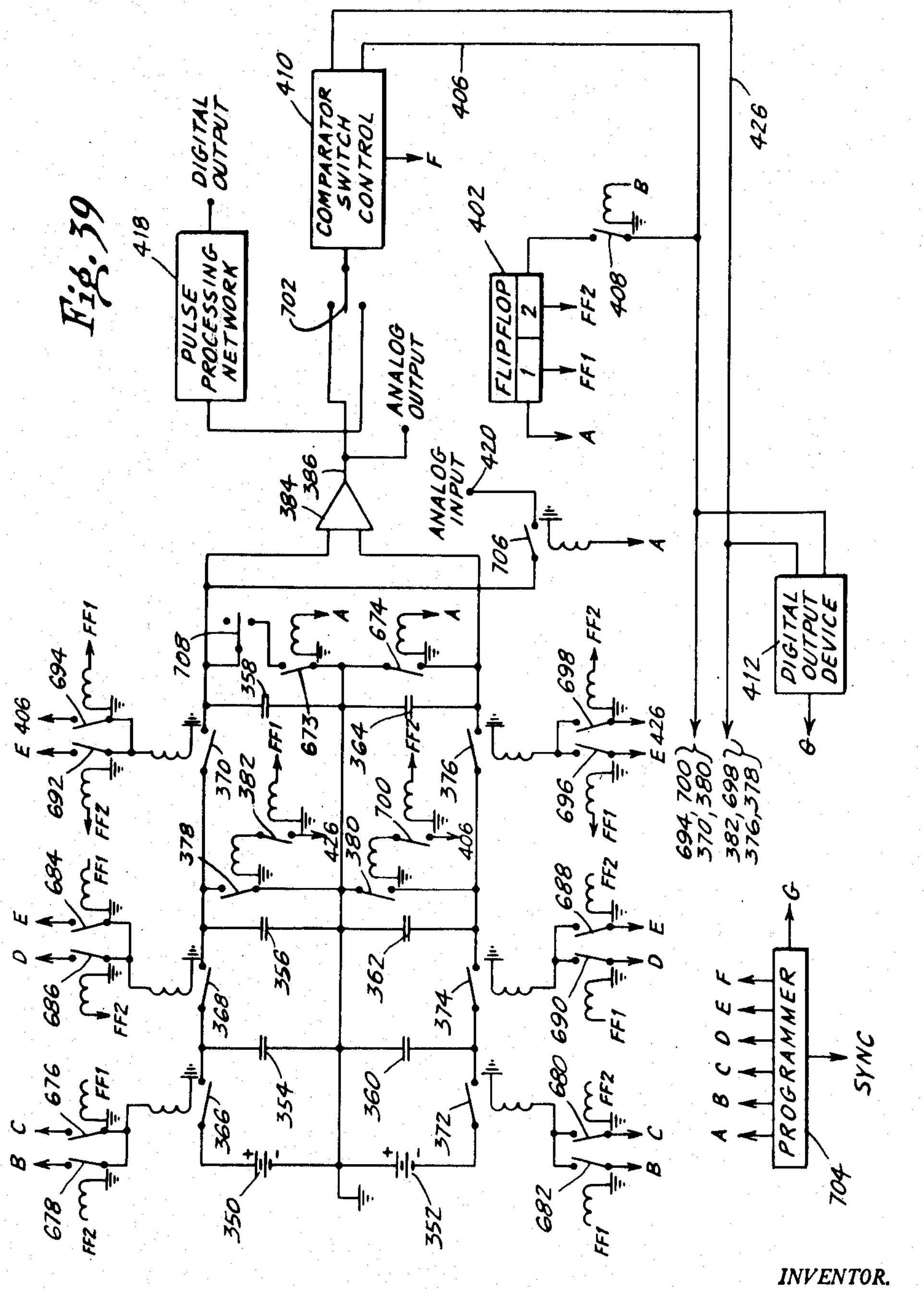
Figure 40:
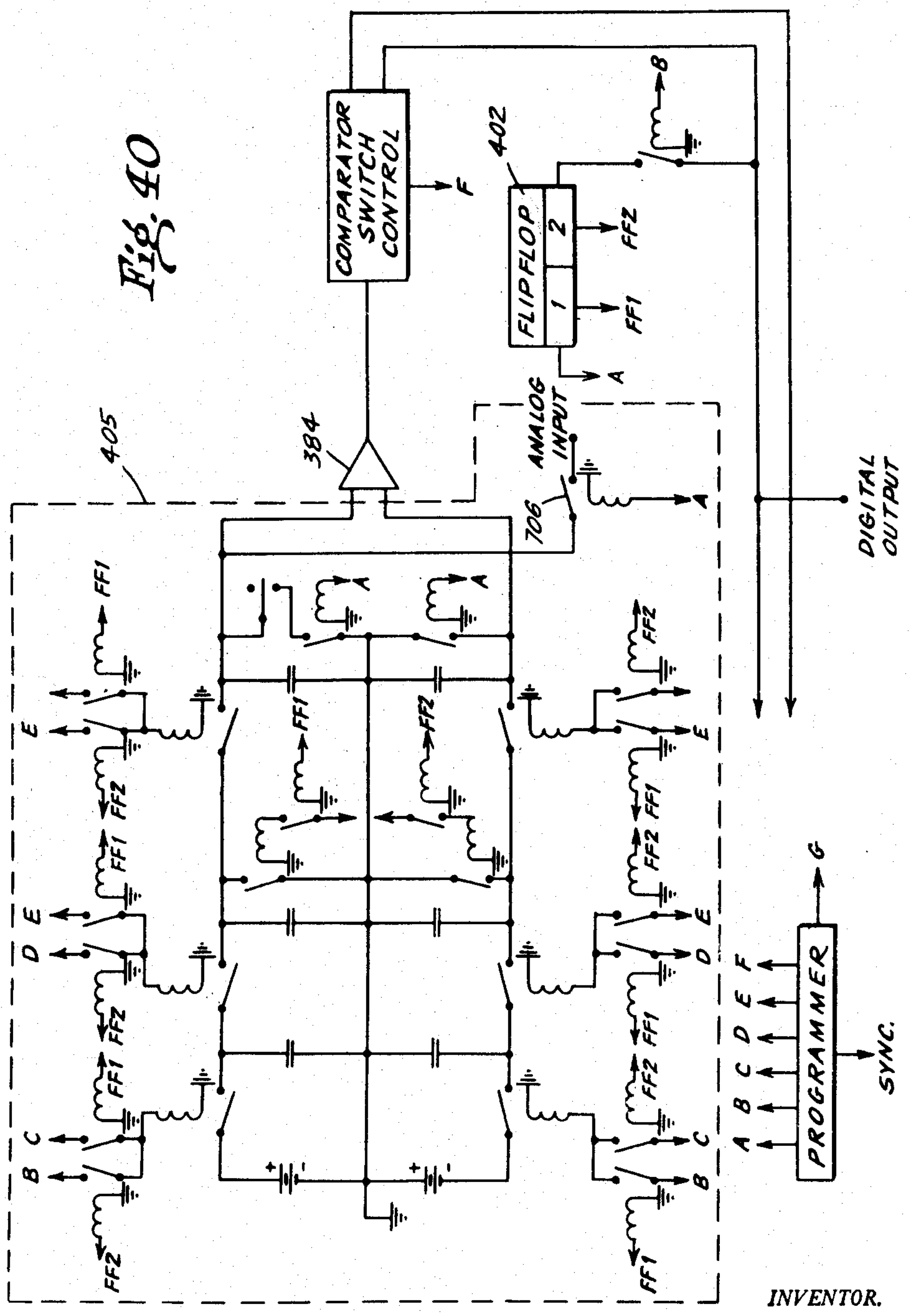
Figure 41:
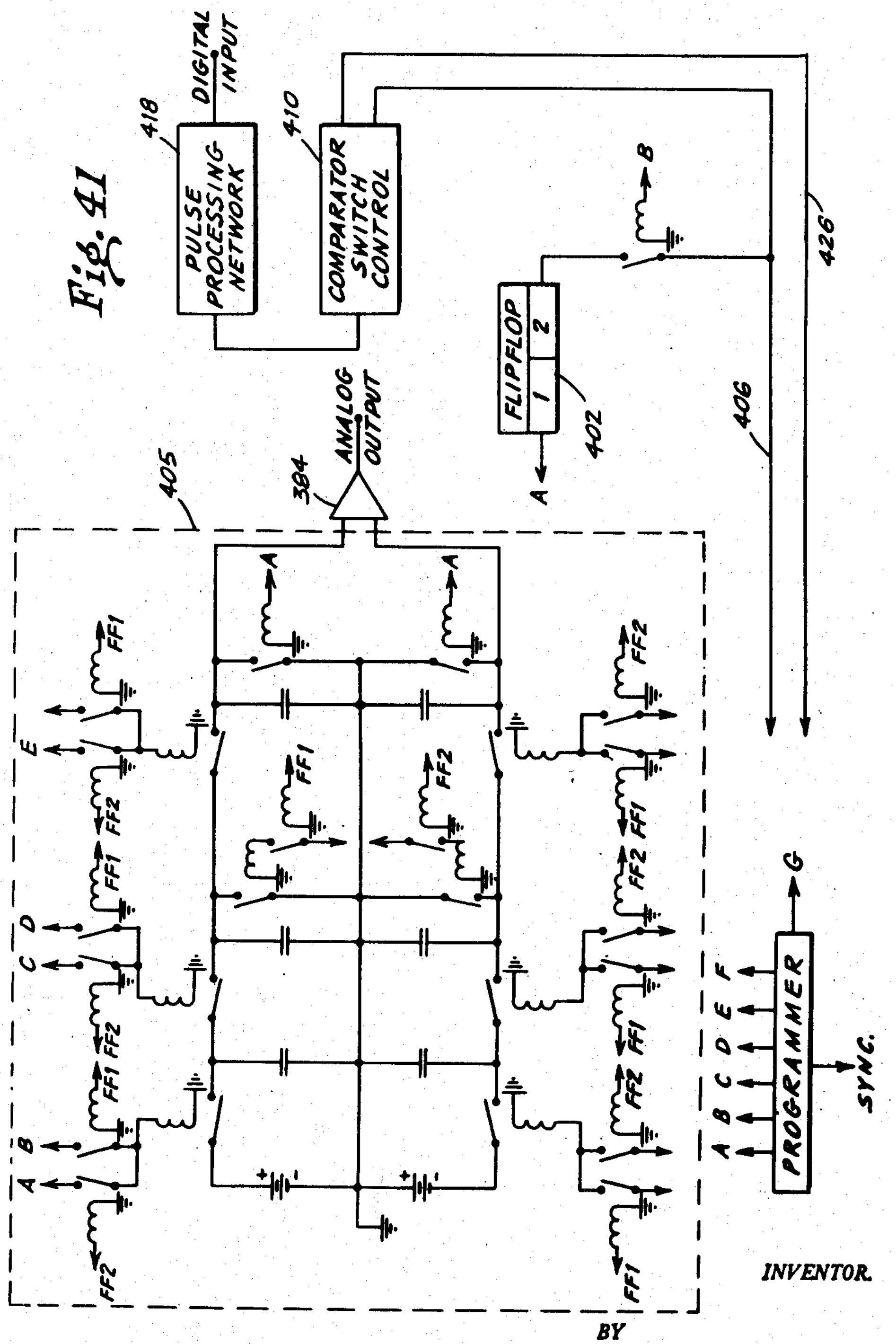
Figure 42:
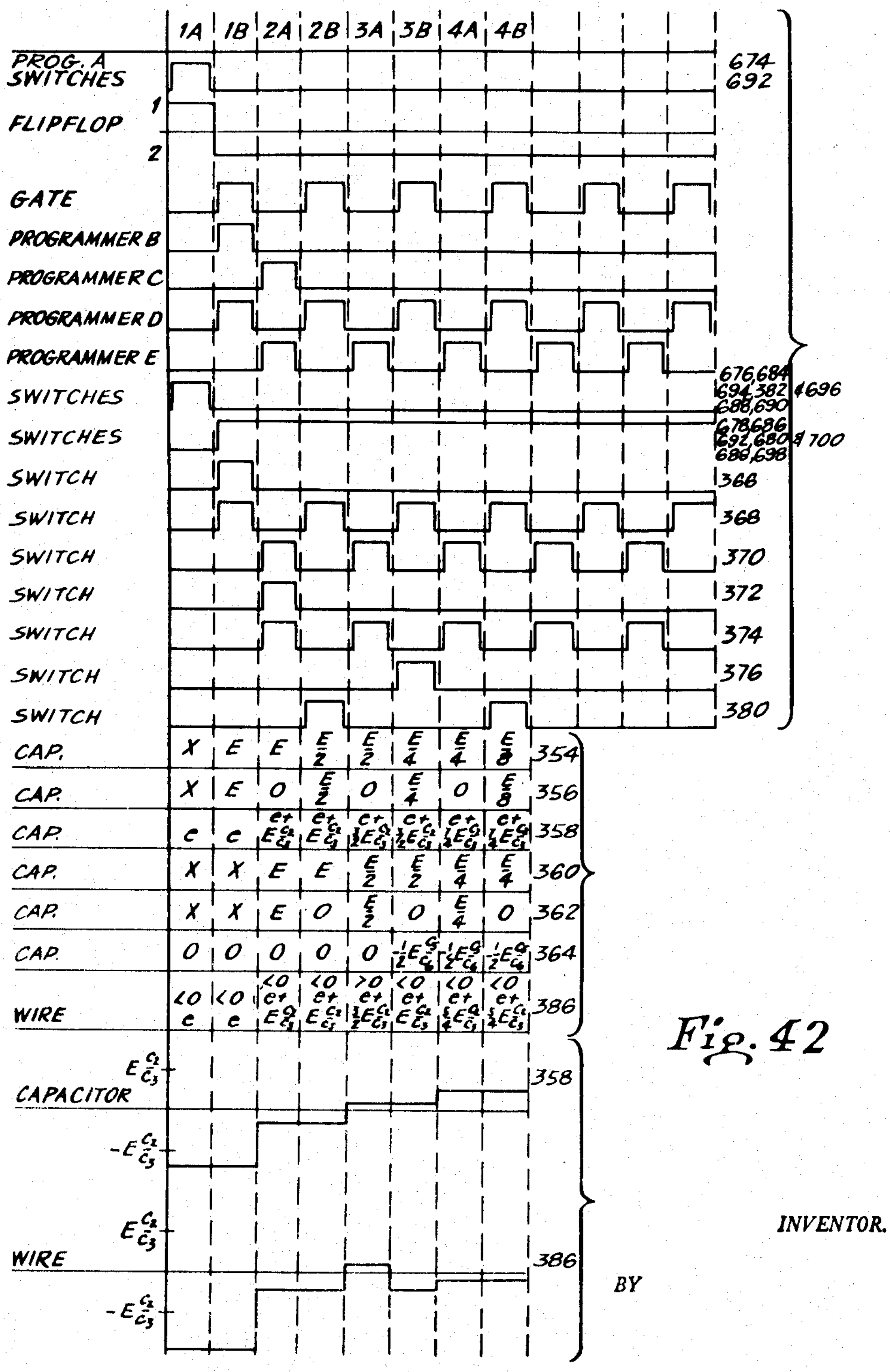
Figure 44:
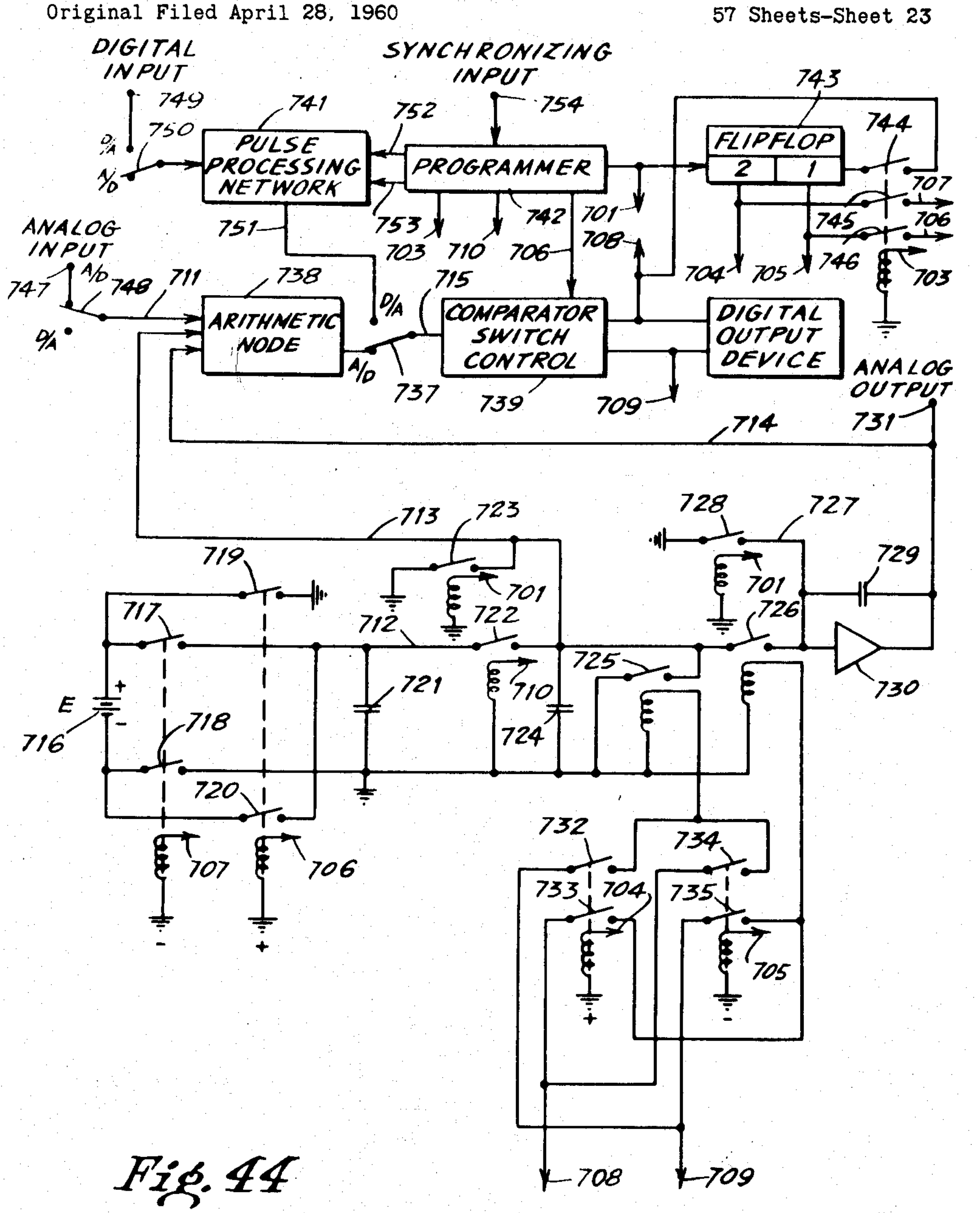
Figure 45:
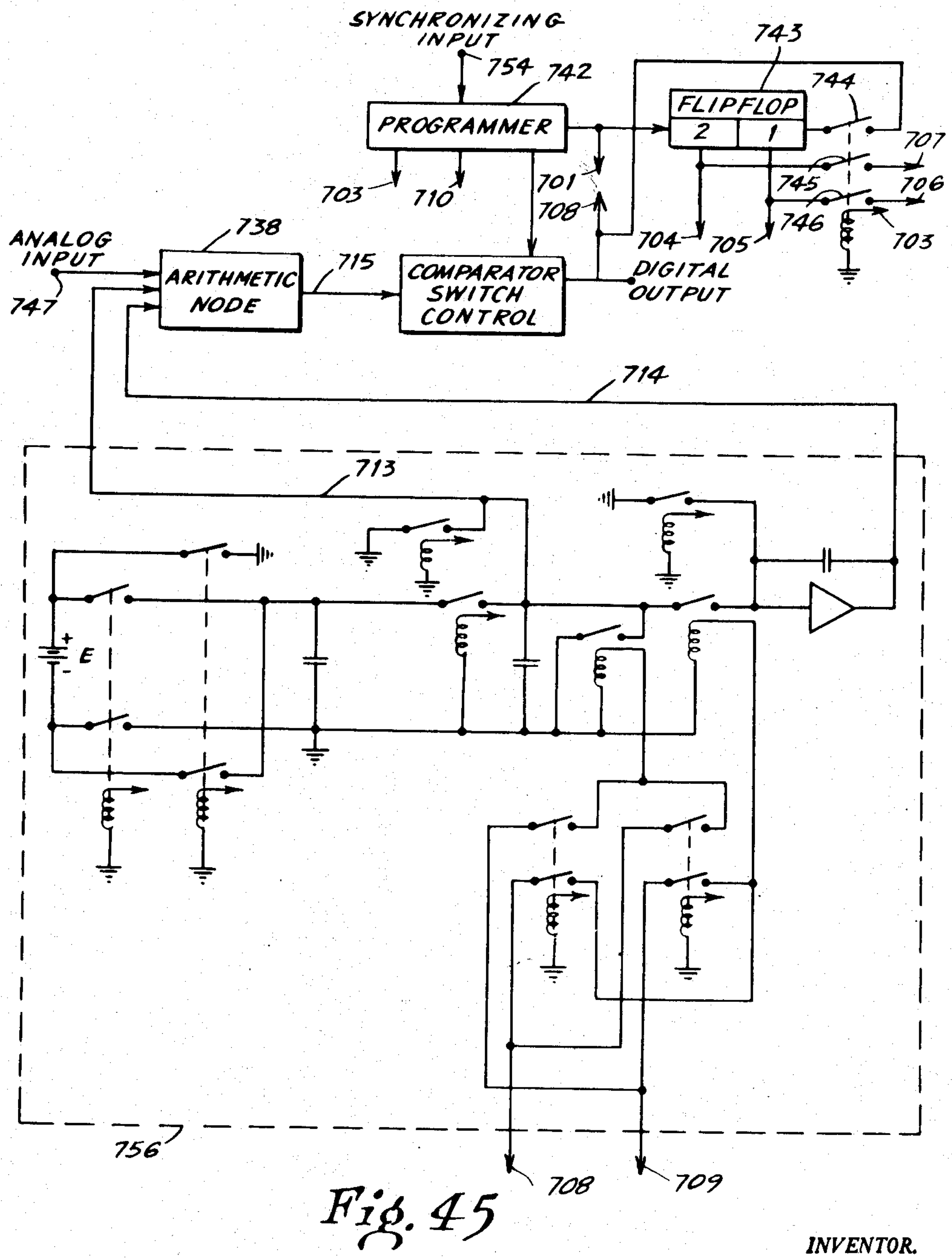
Figure 46:
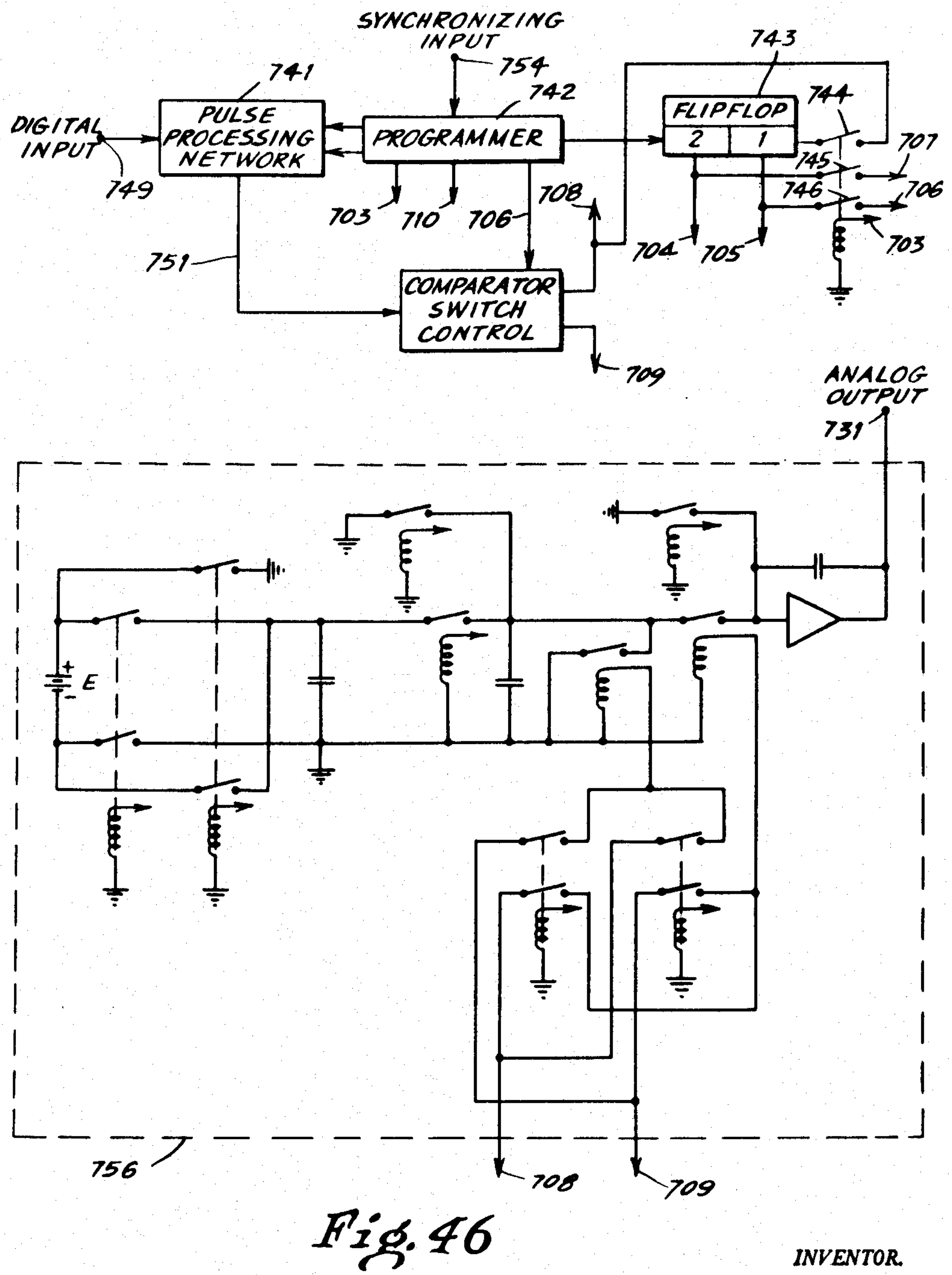
Figure 47:
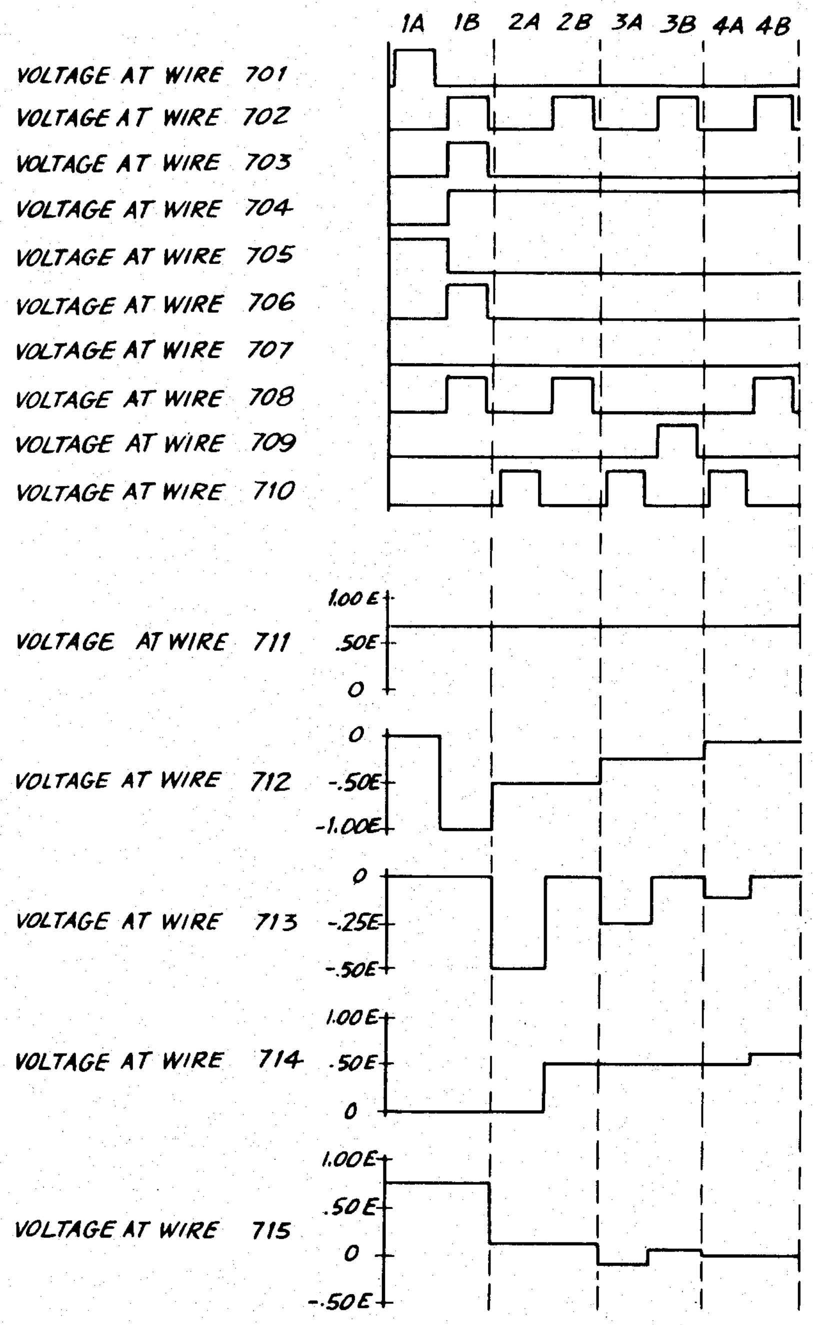
Figure 48:
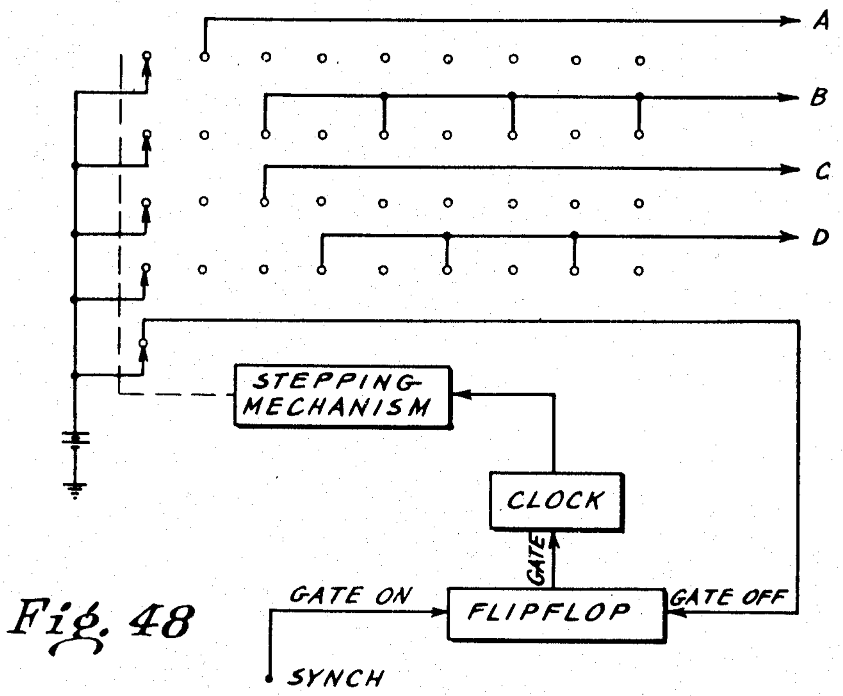
Figure 58:
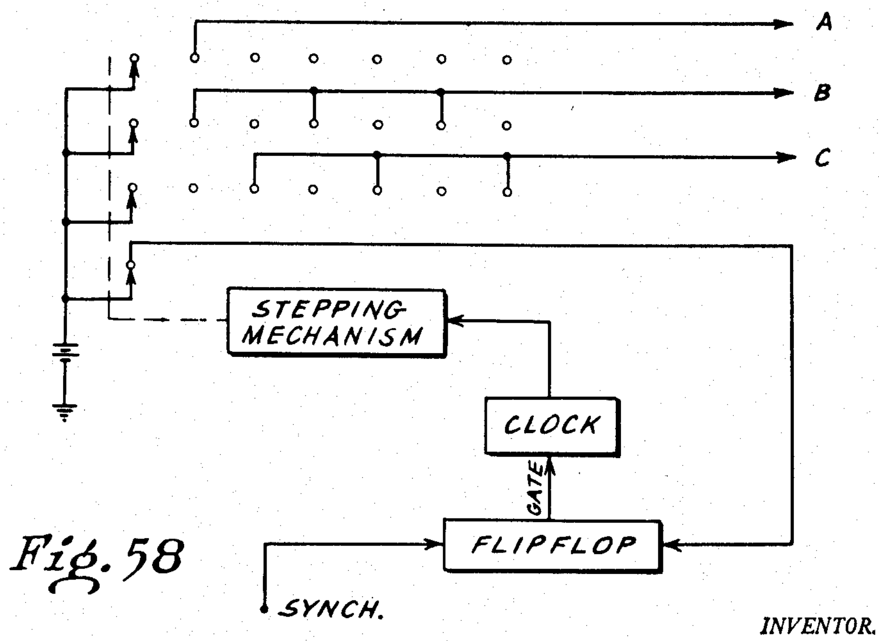
Figure 49:
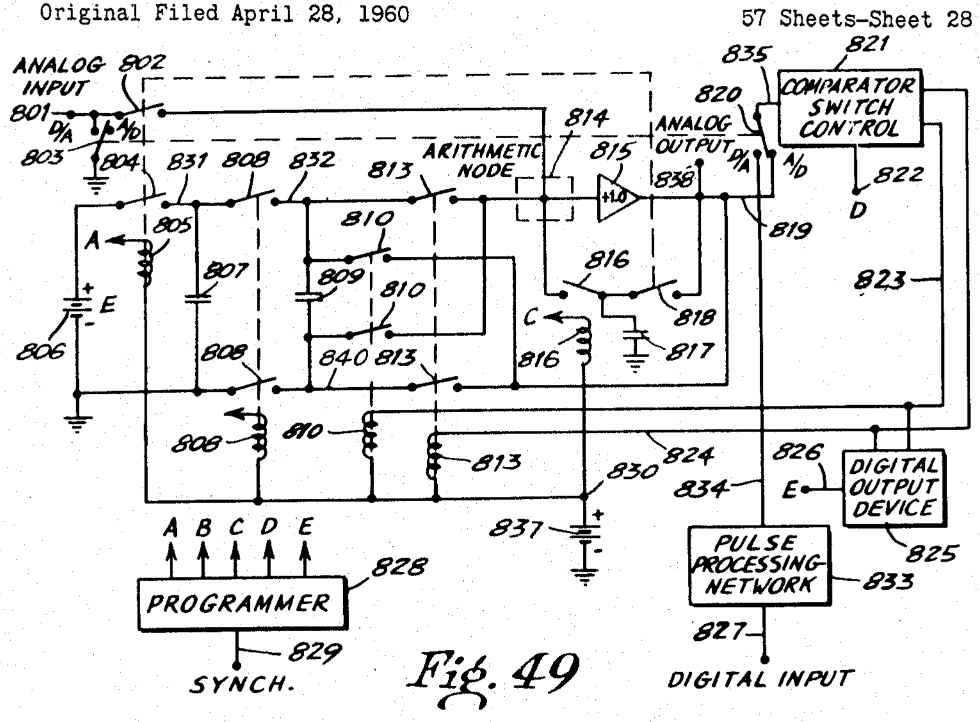
Figure 50:
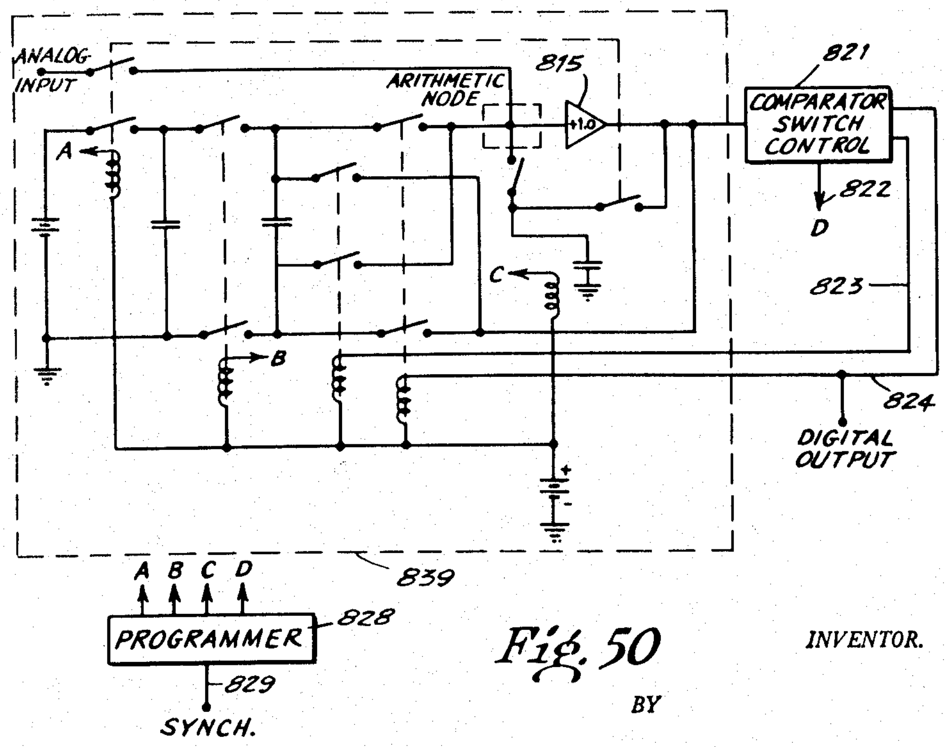
Figure 49A:
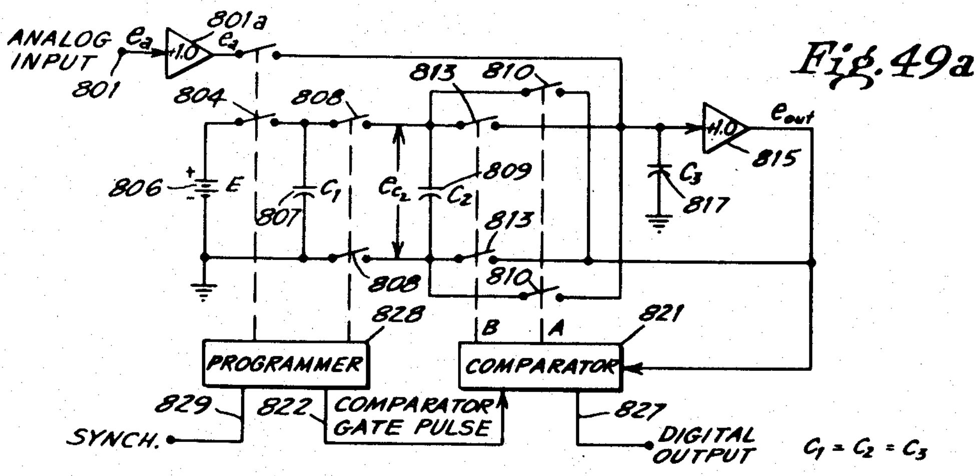
Figure 49B:
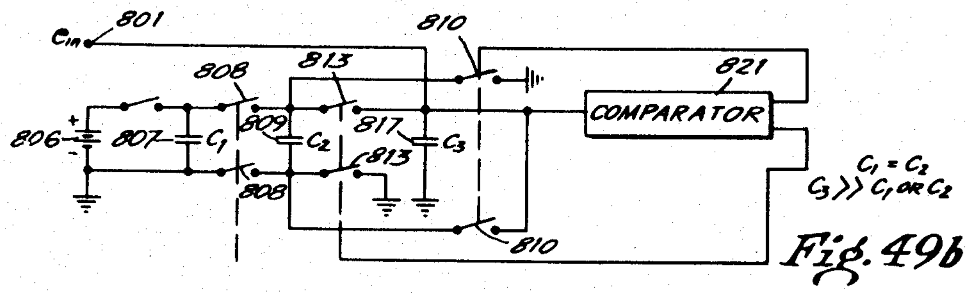
Figure 49C:
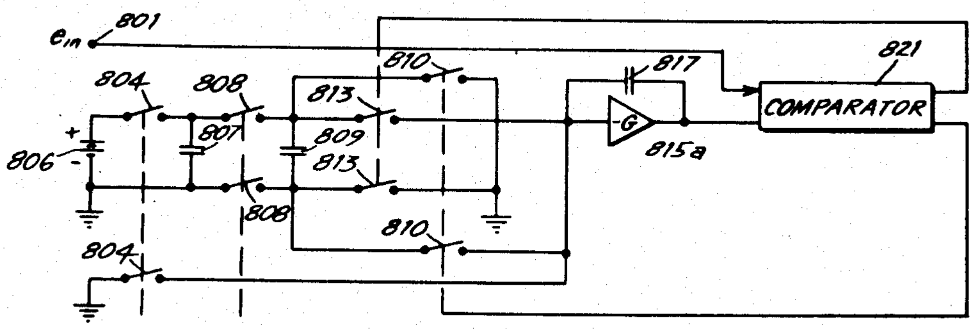
Figure 51:
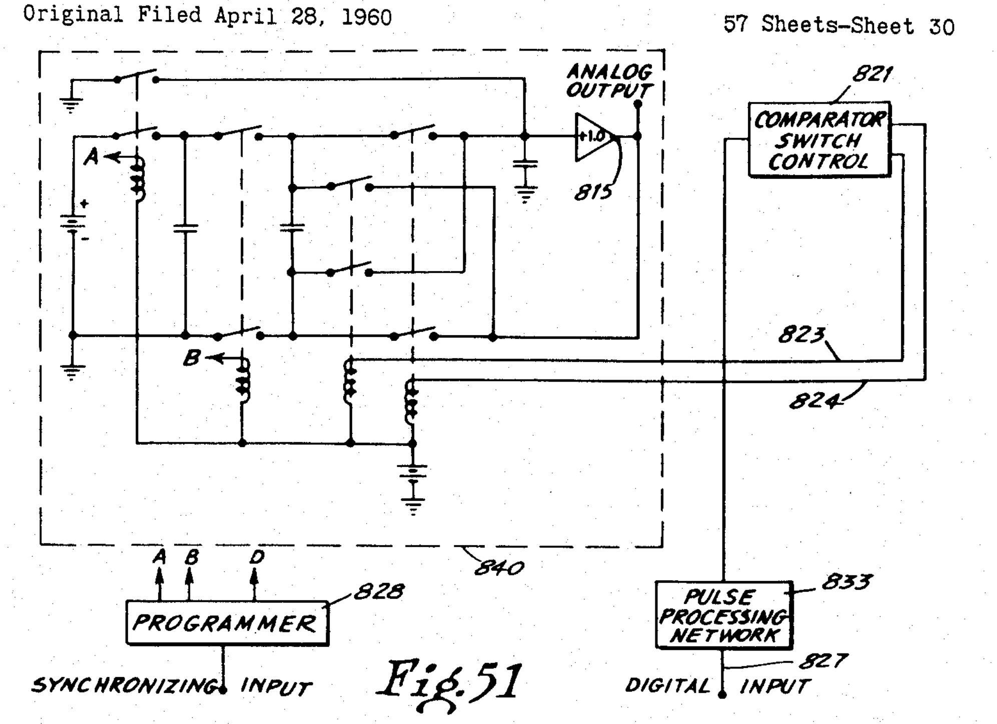
Figure 54:
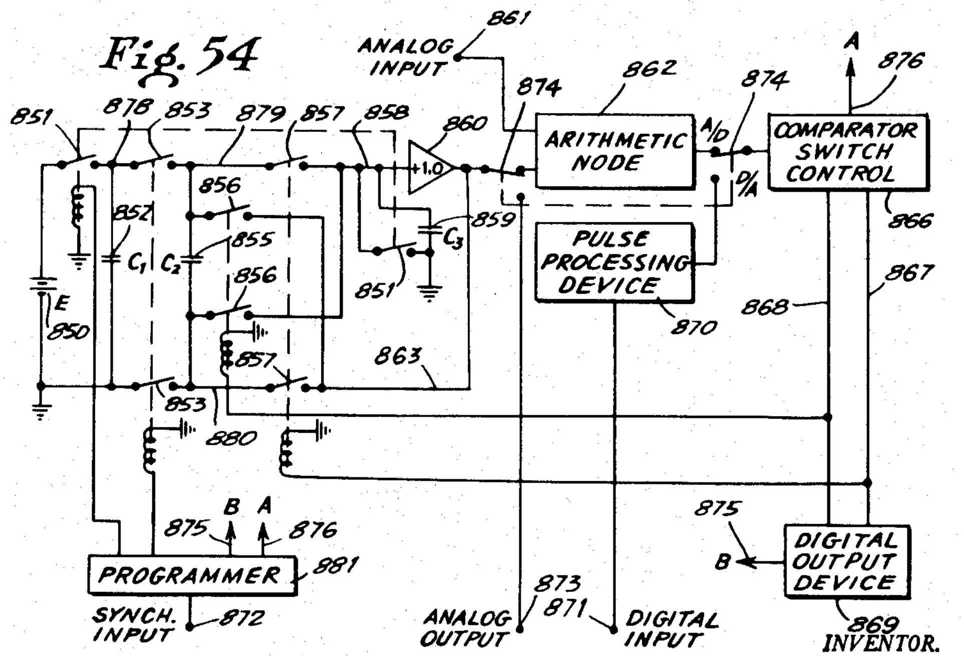
Figure 52:
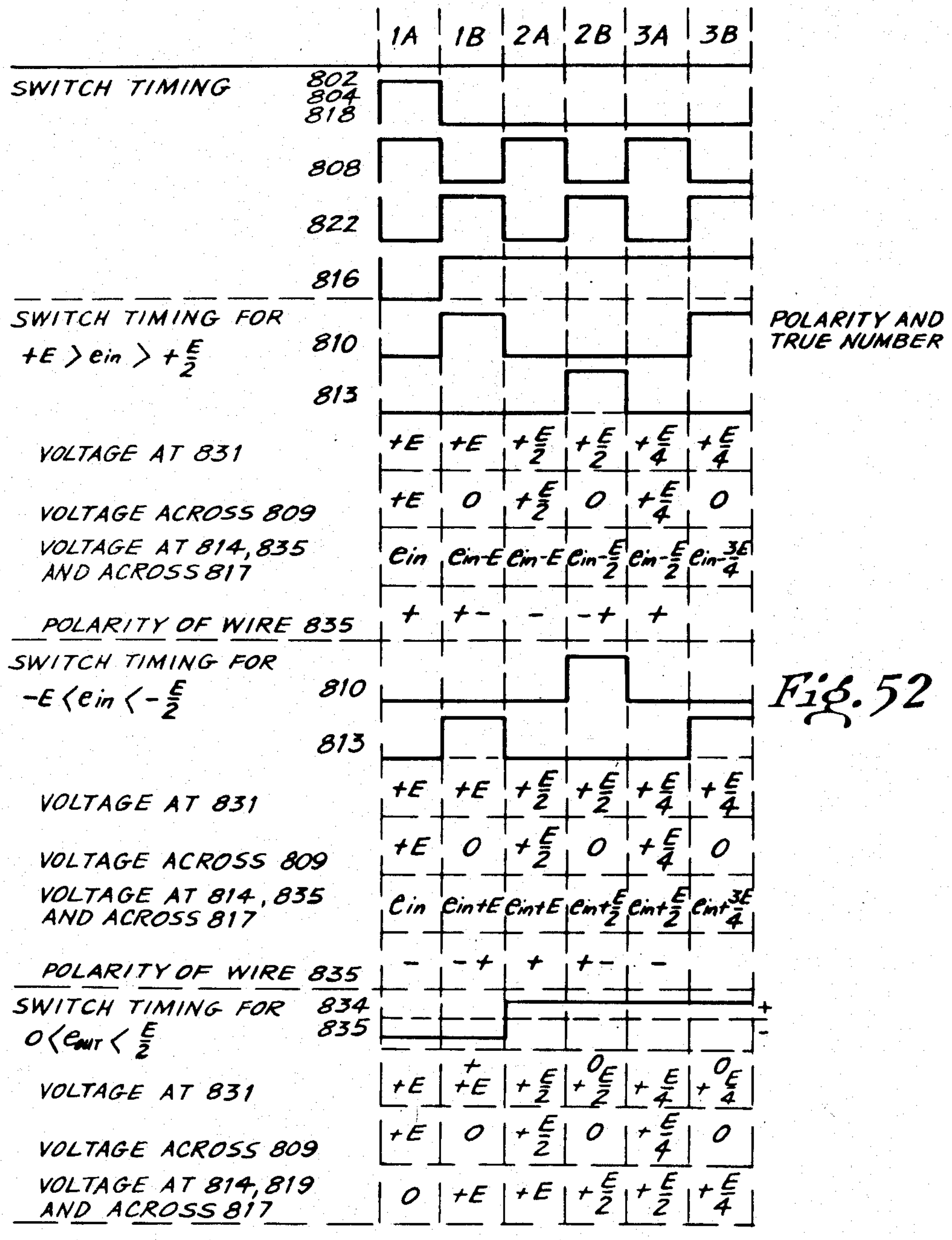
Figure 53:
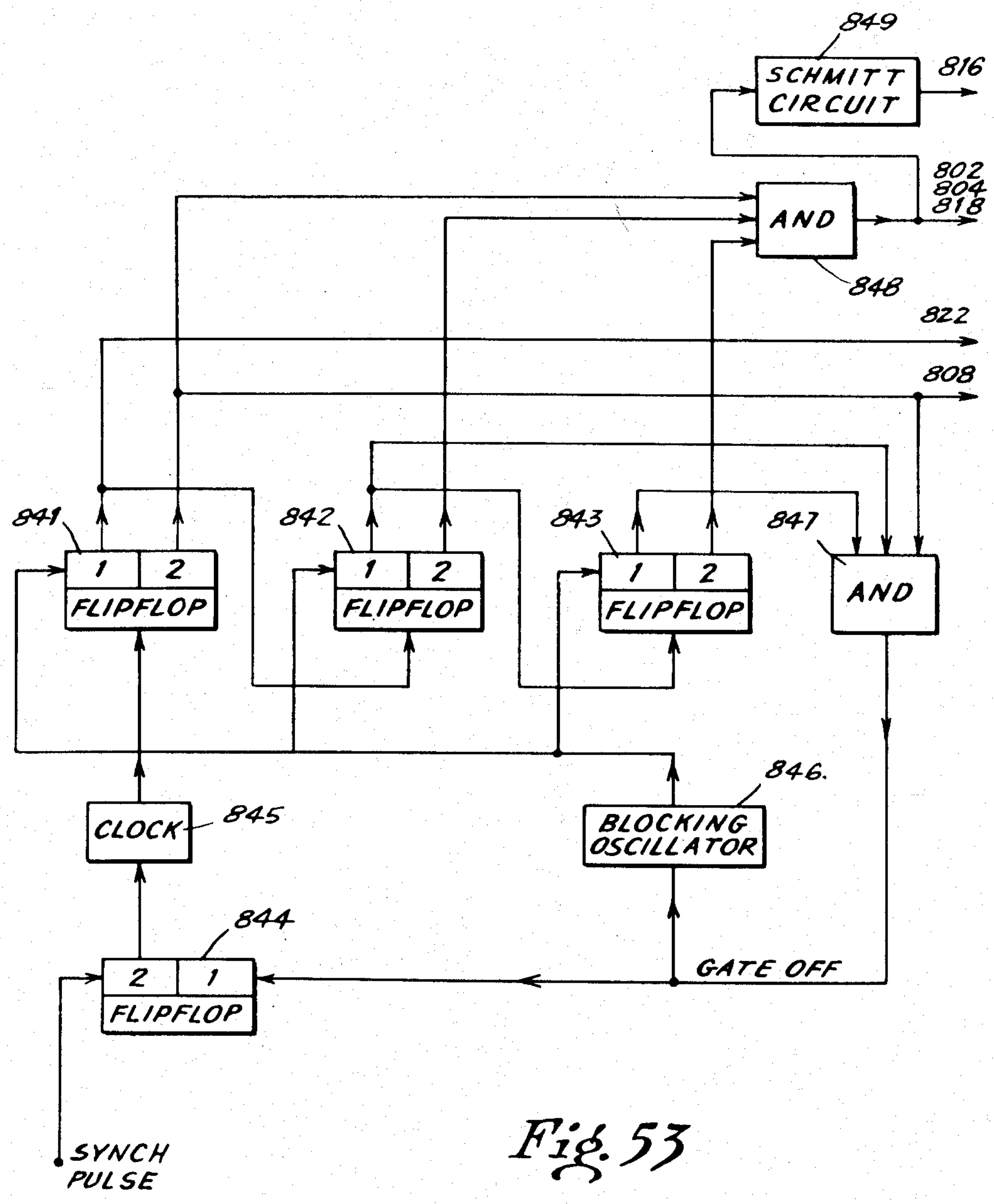
Figure 53A:
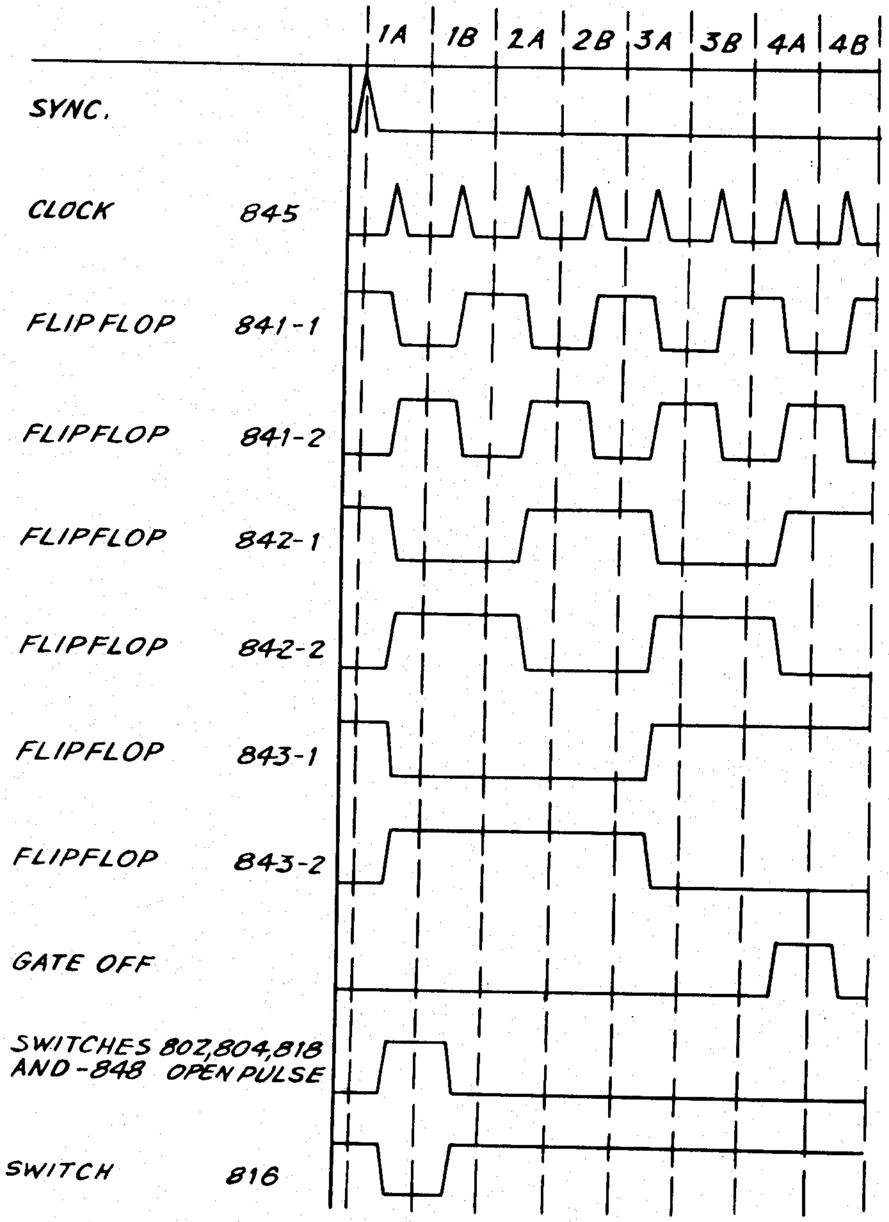
Figure 55:
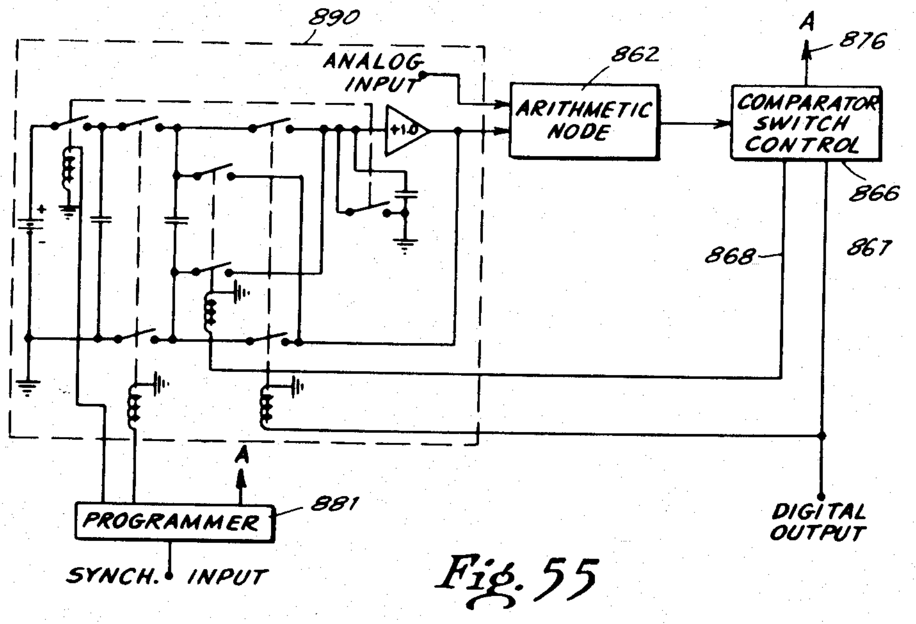
Figure 56:
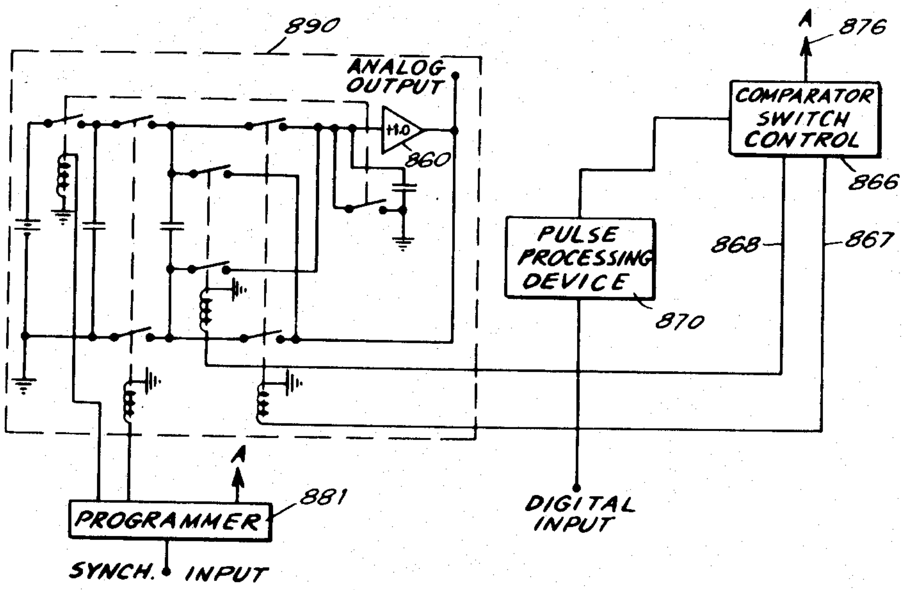
Figure 57:
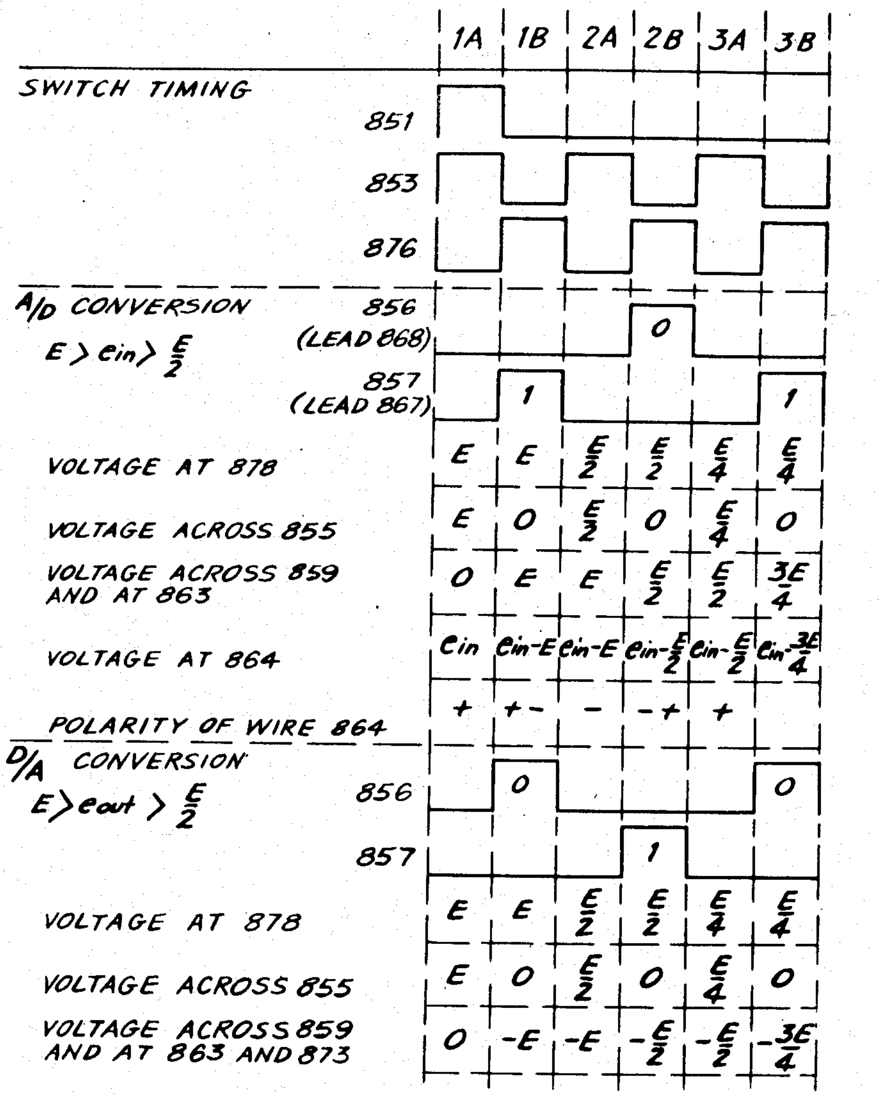
Figure 59:
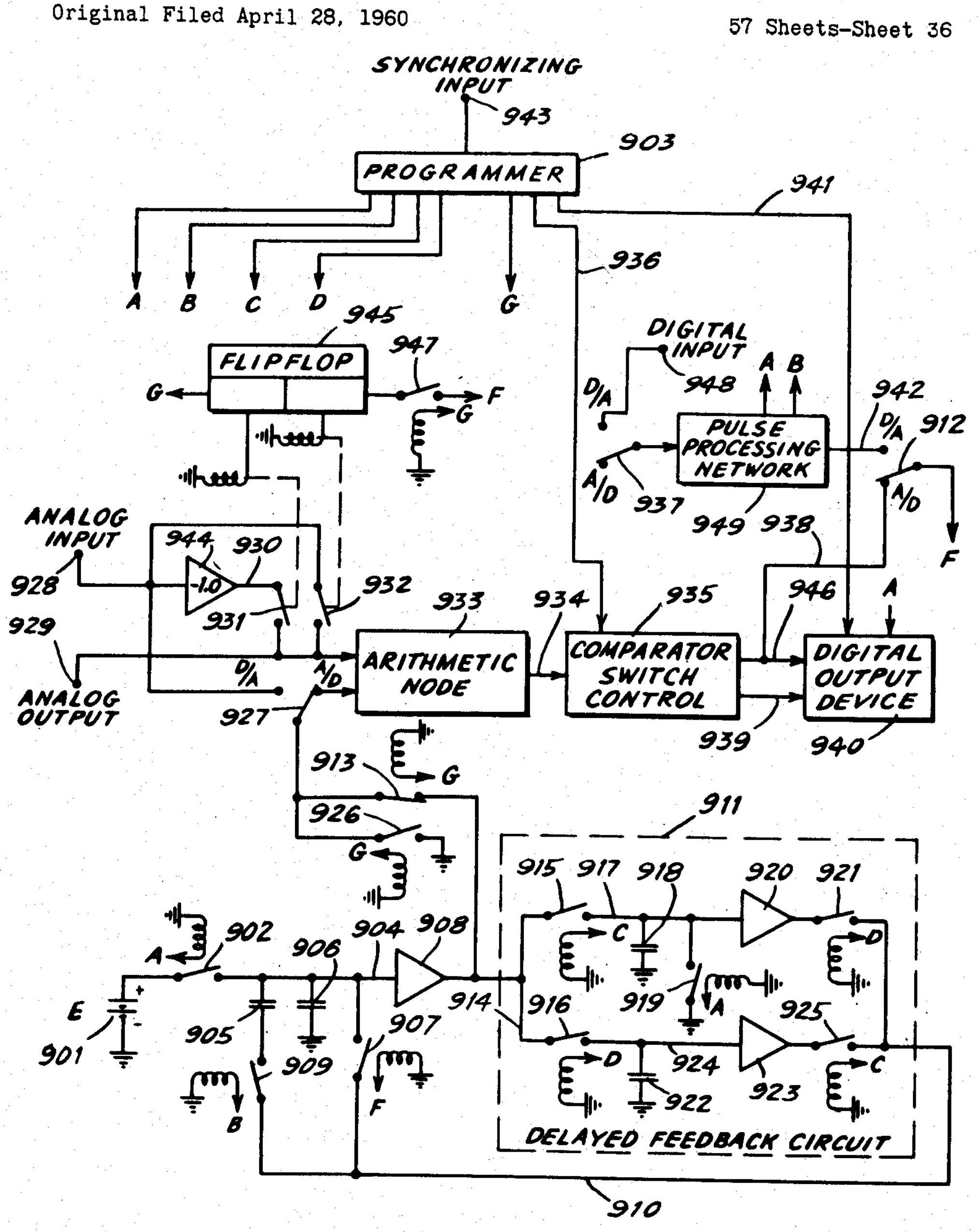
Figure 60:
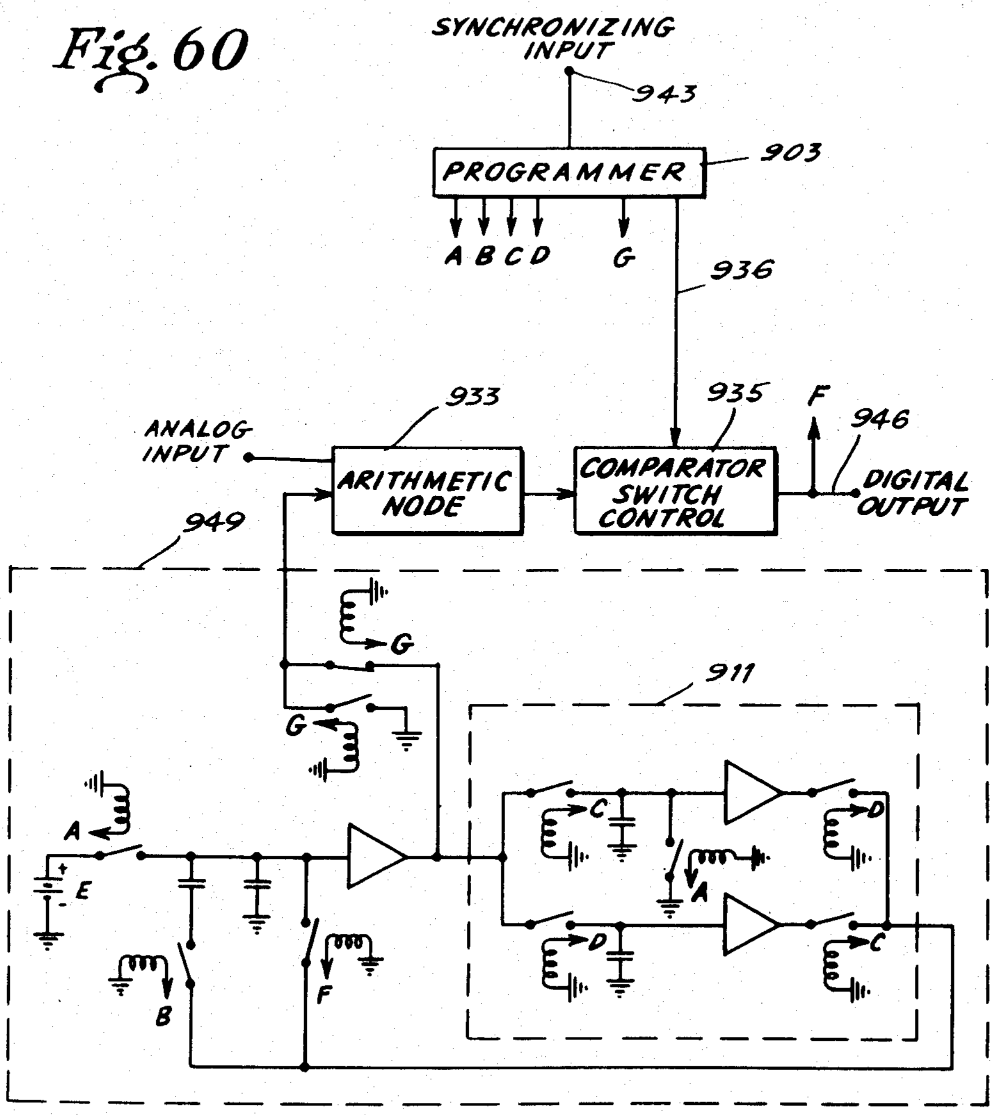
Figure 61:
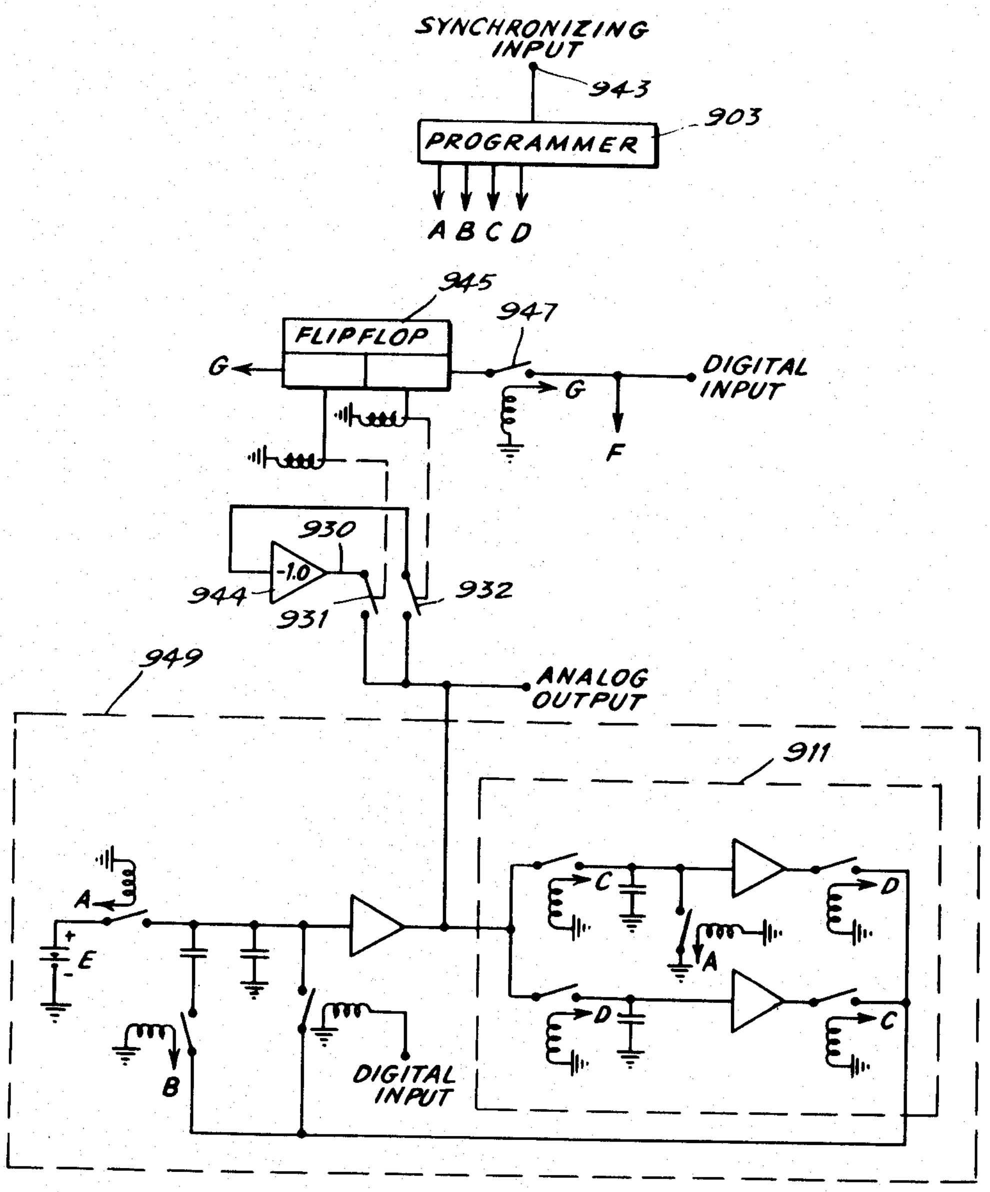
Figure 62:
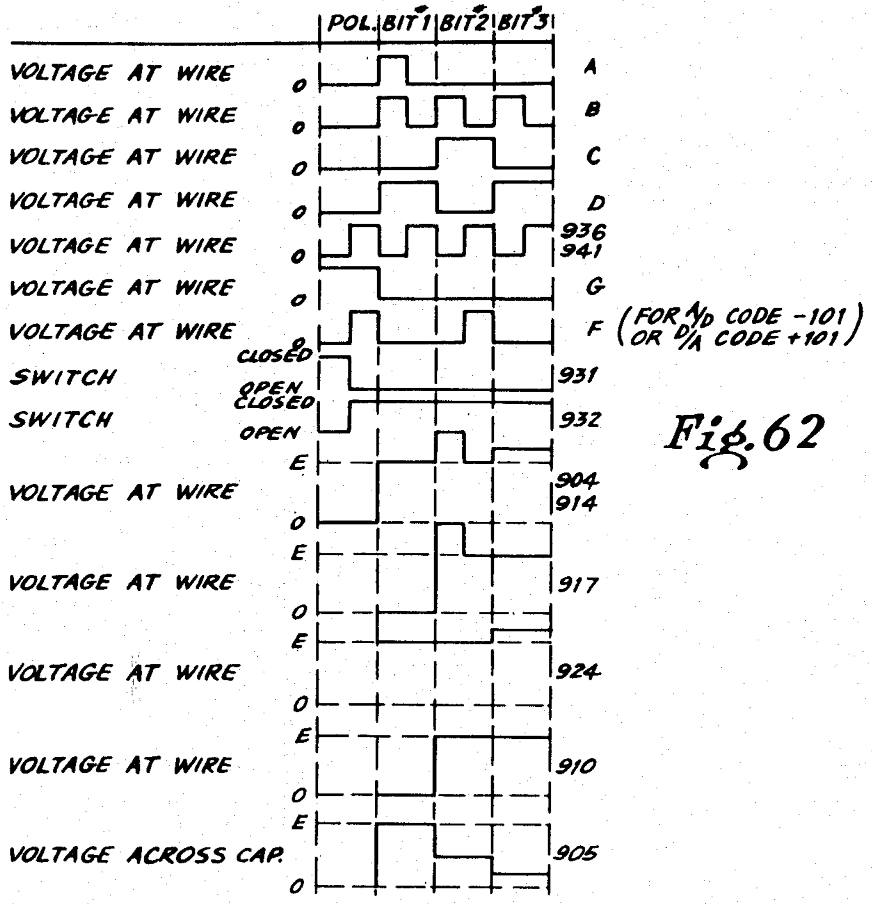
Figure 65:
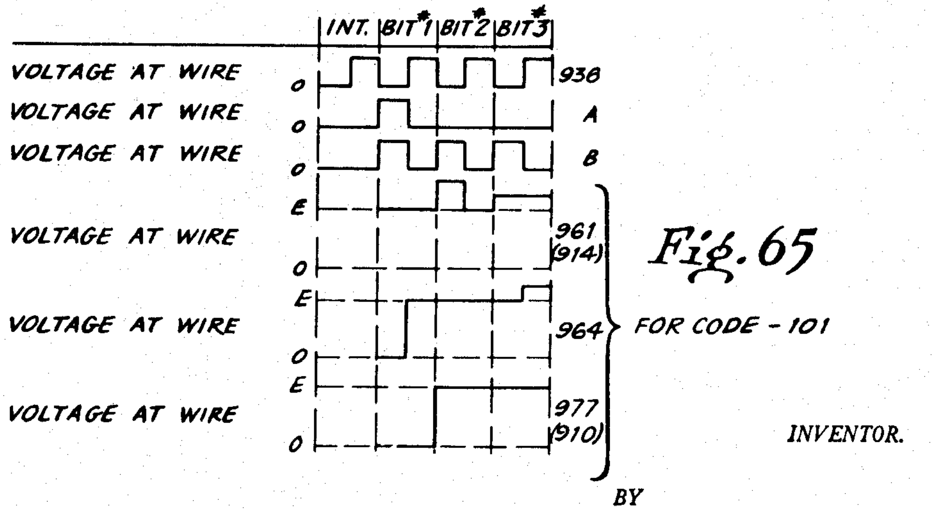
Figure 63:
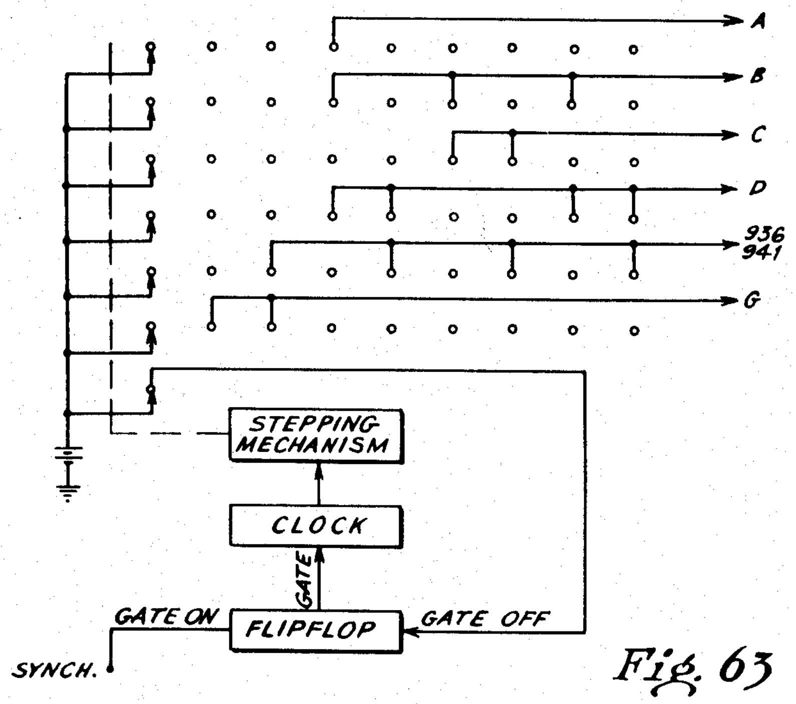
Figure 70:
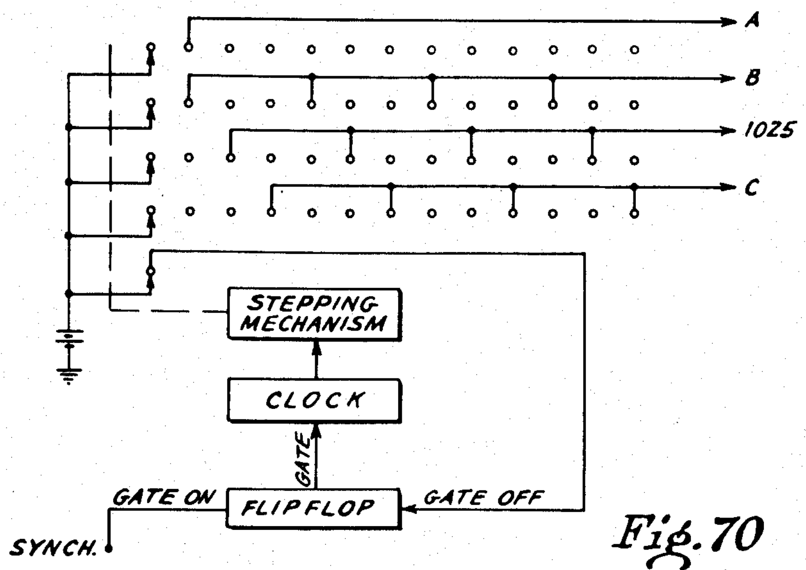
Figure 64:
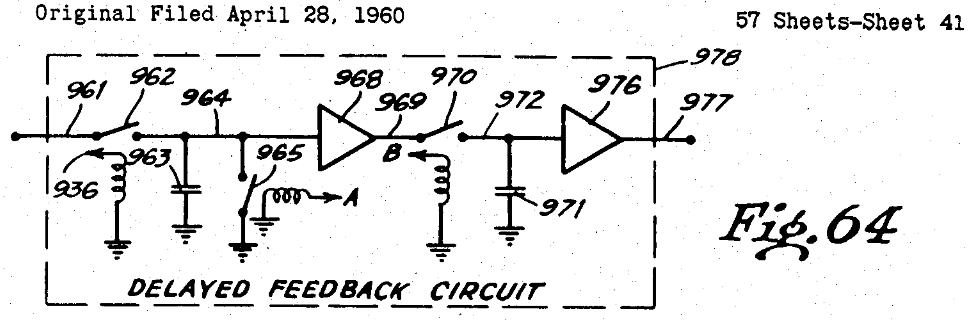
Figure 66:
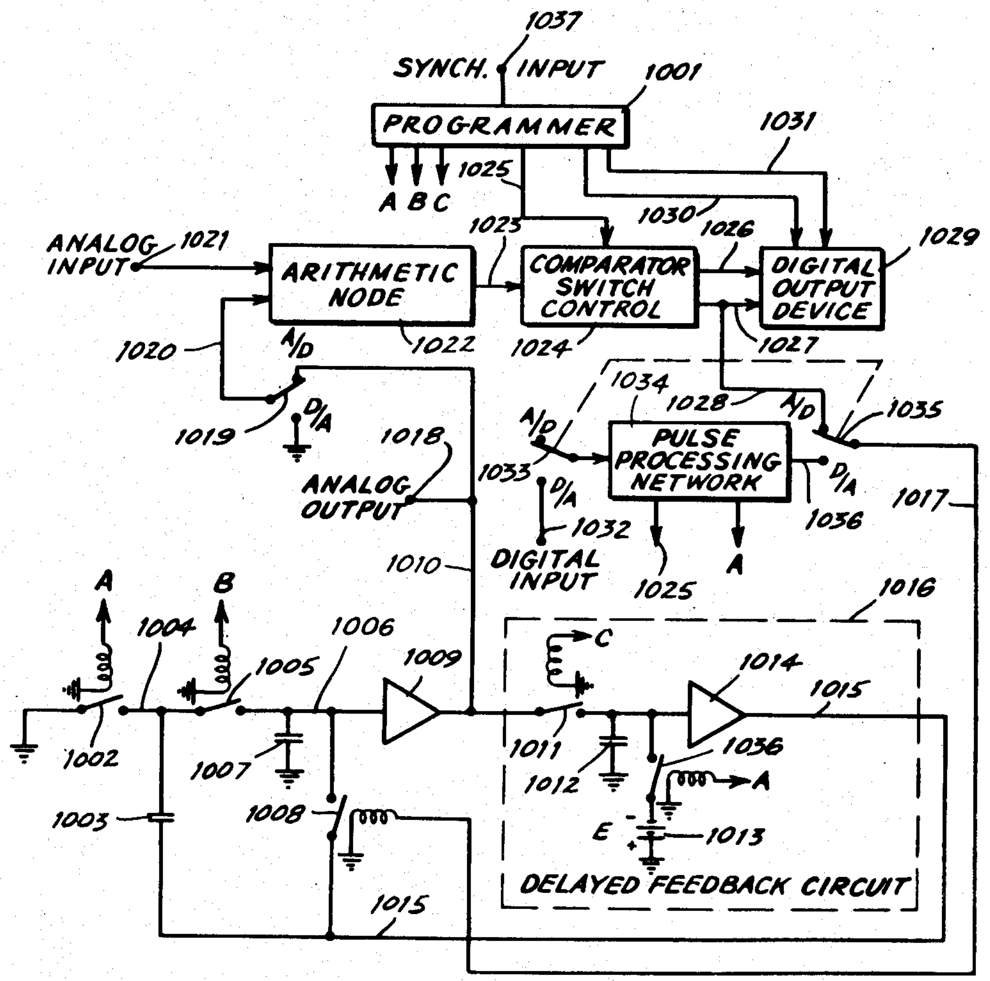
Figure 67:
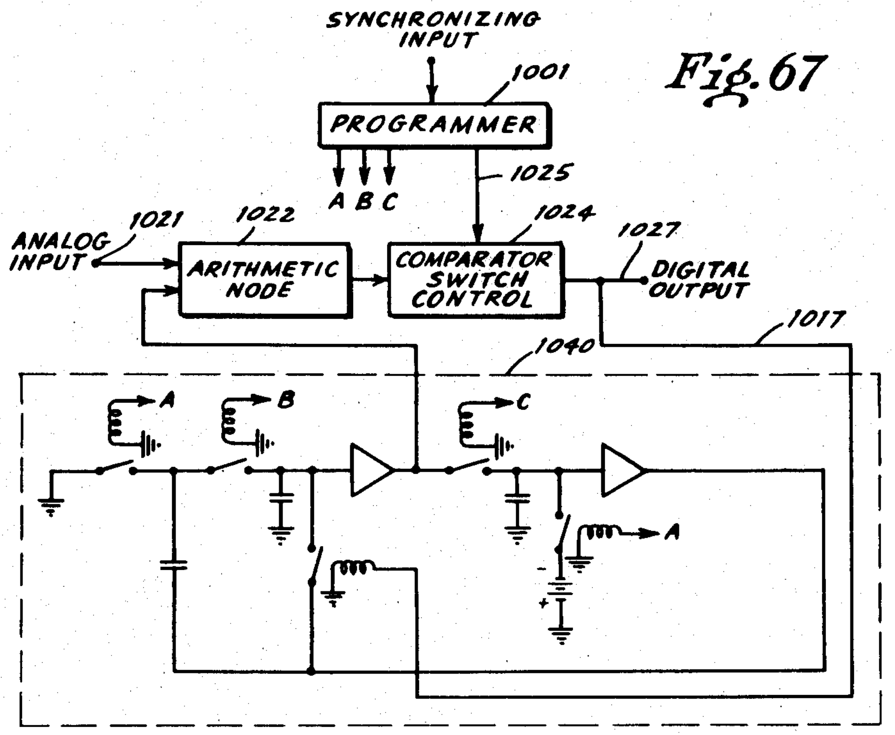
Figure 68:
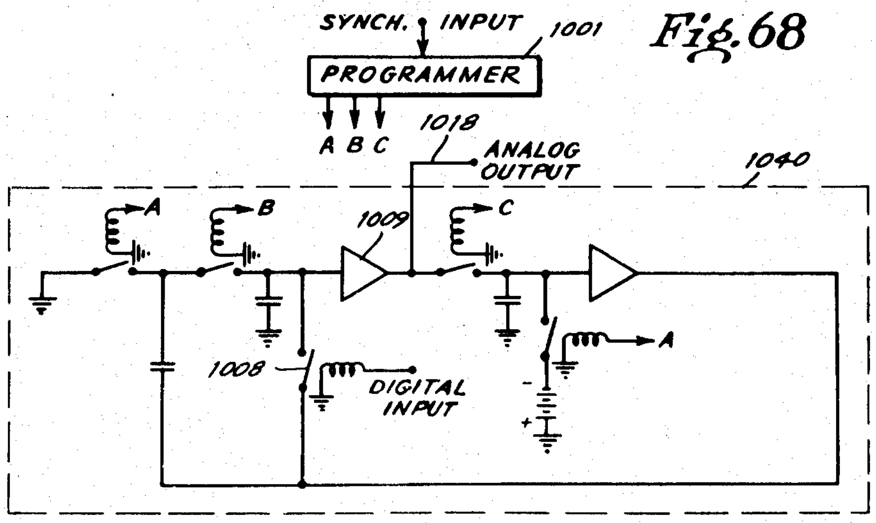
Figure 69:
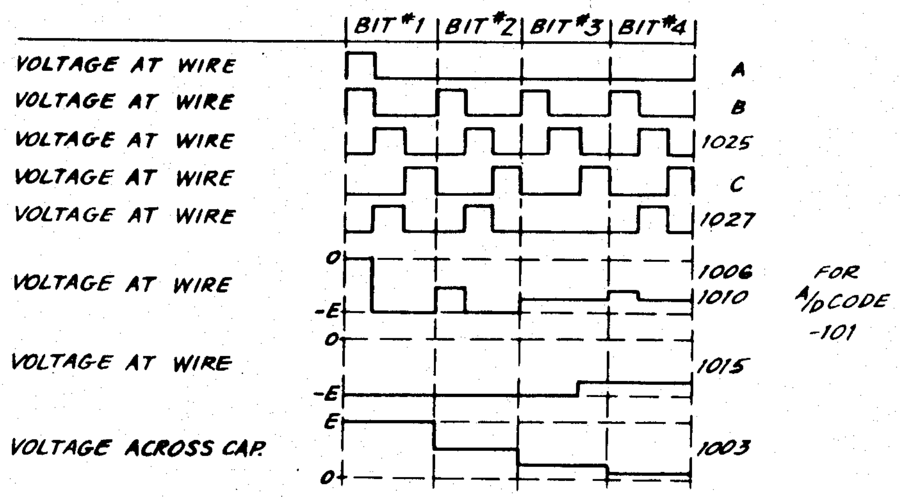
Figure 74:
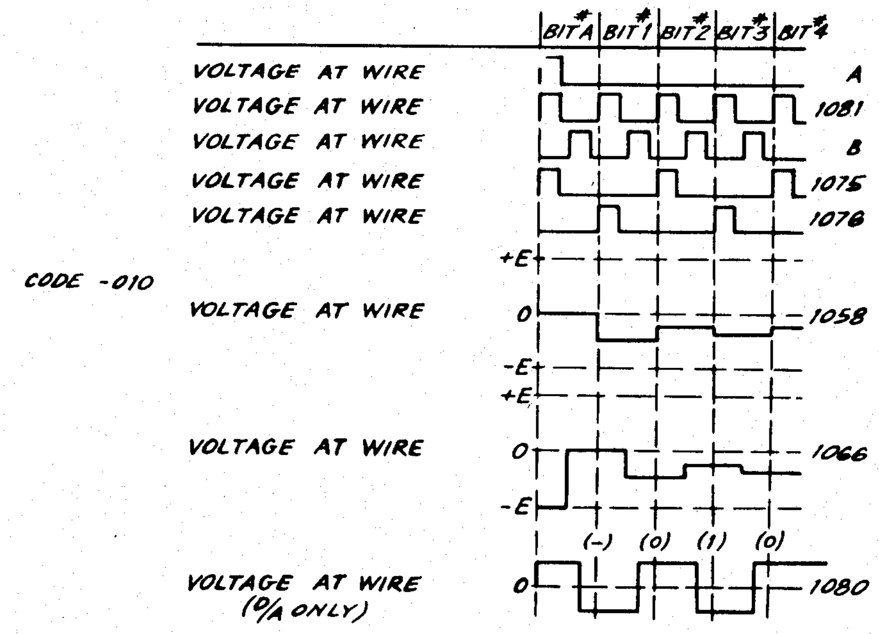
Figure 71:
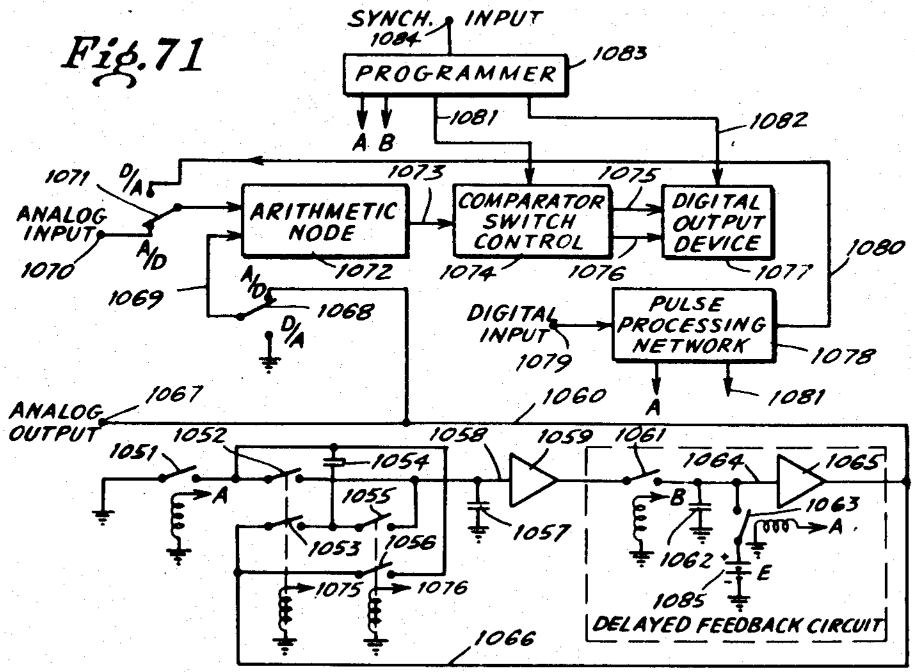
Figure 76:
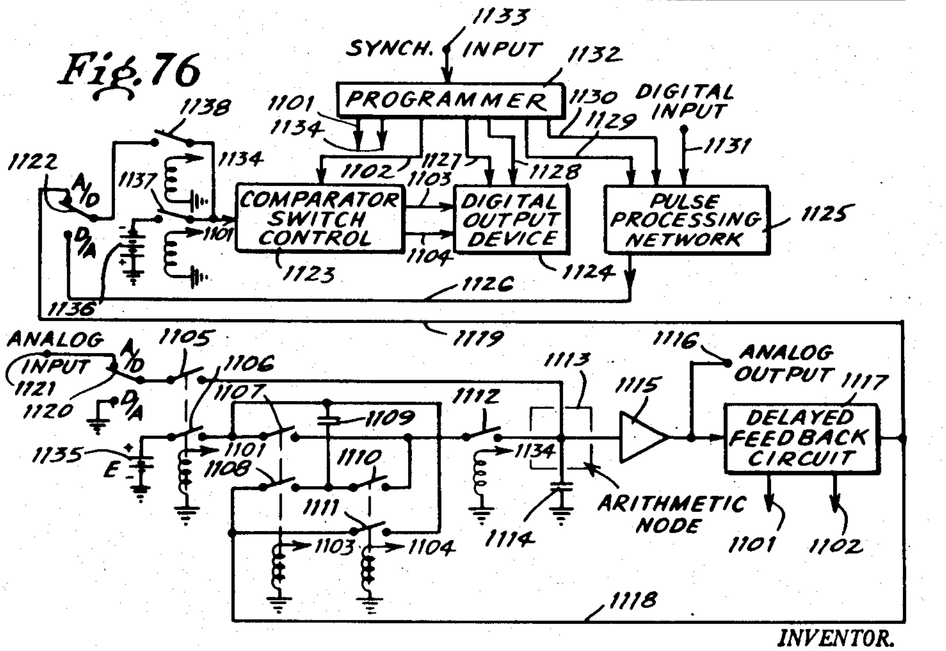
Figure 72:
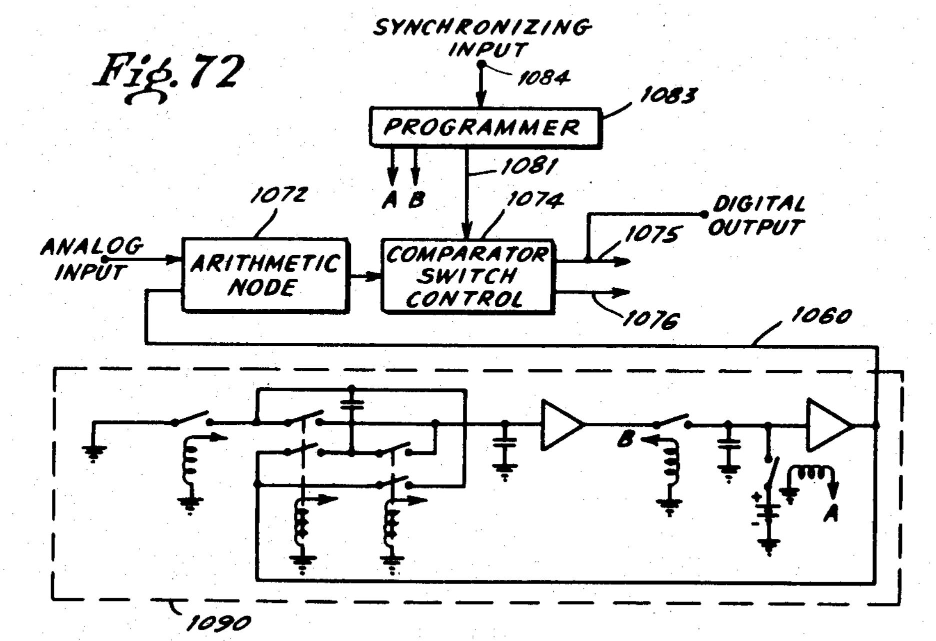
Figure 73:
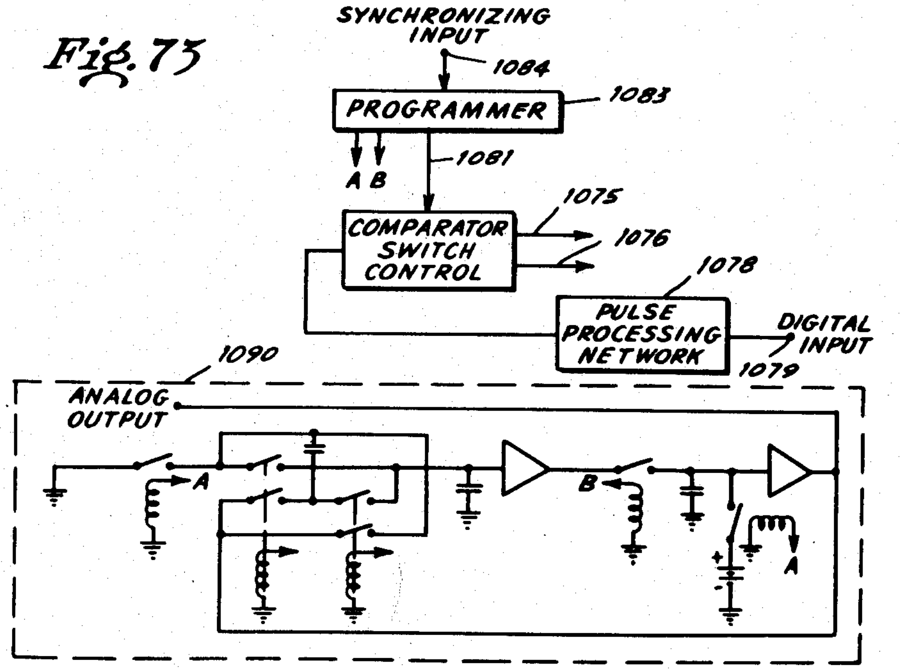
Figure 75:
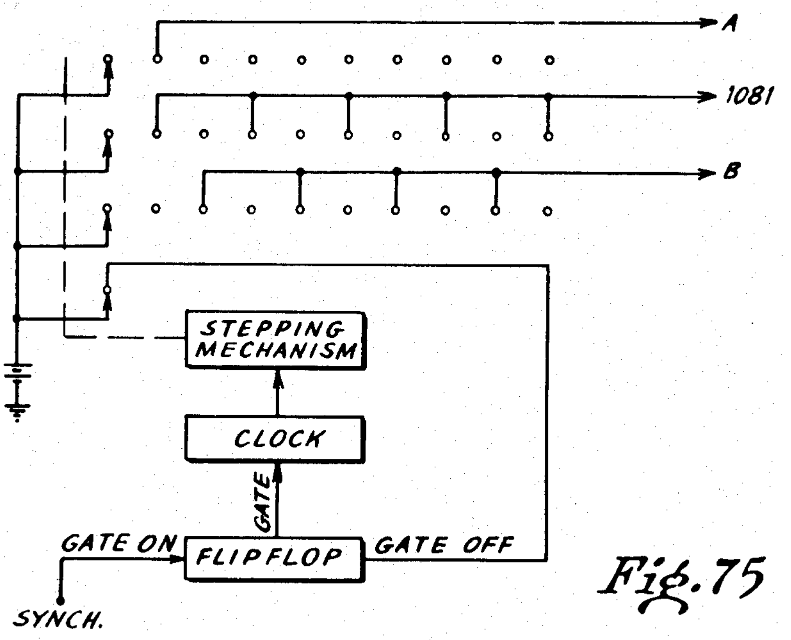
Figure 80:
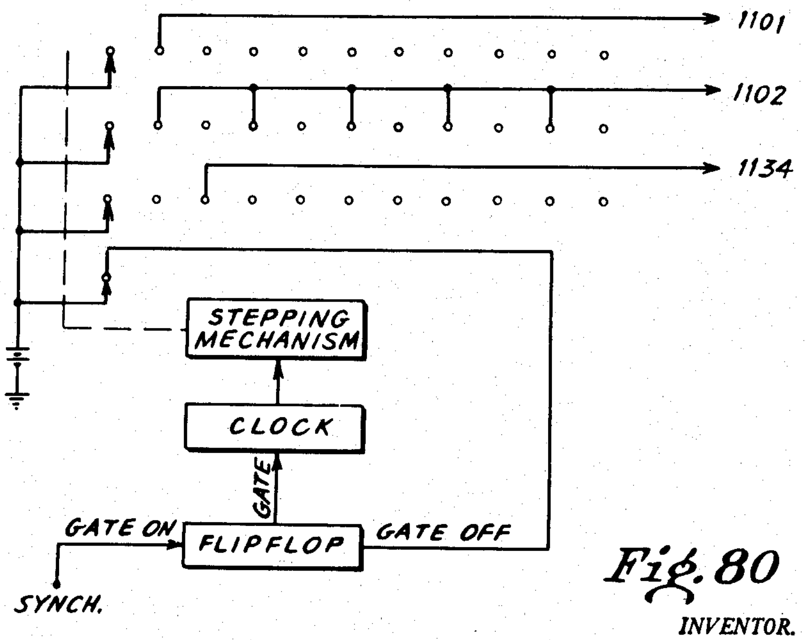
Figure 77:
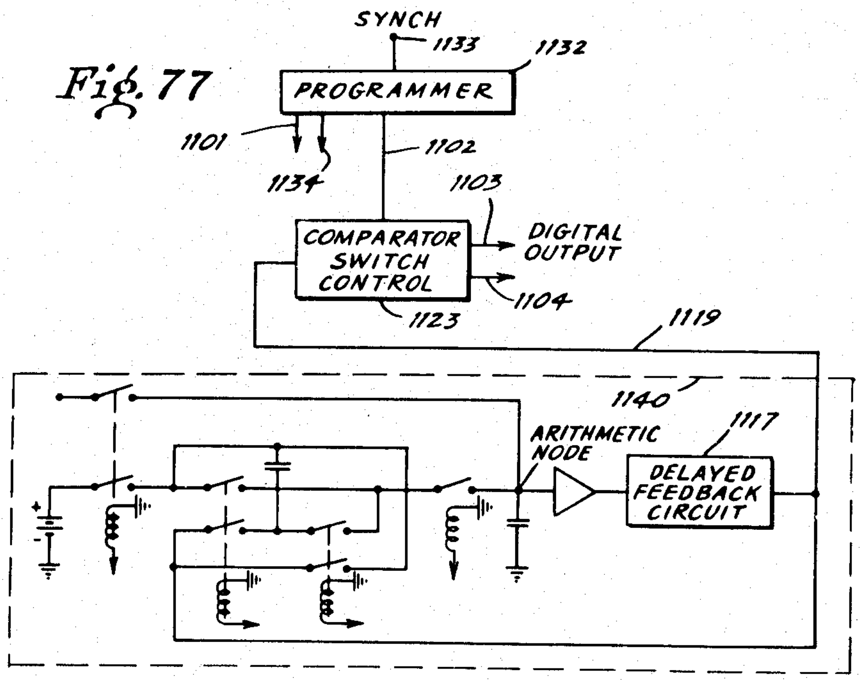
Figure 78:
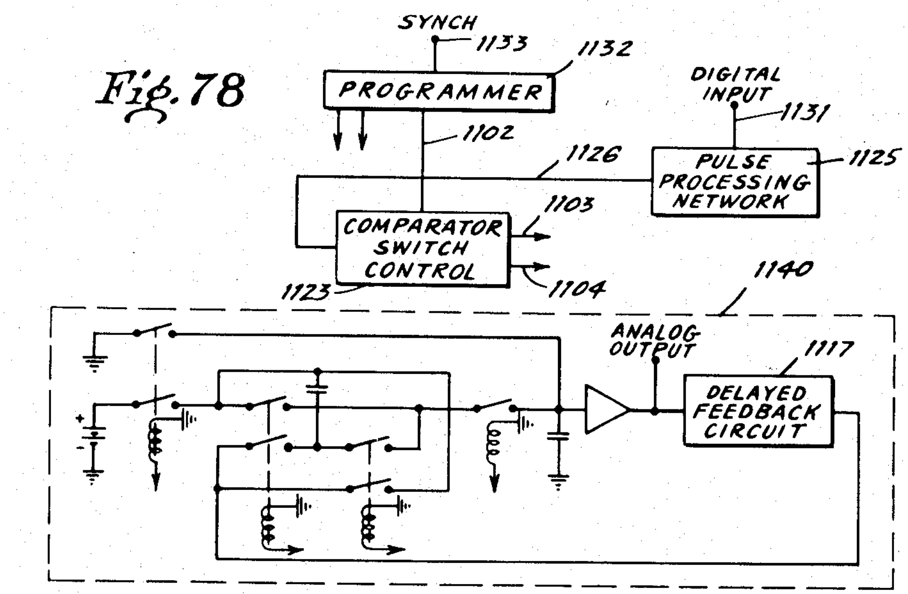
Figure 79:
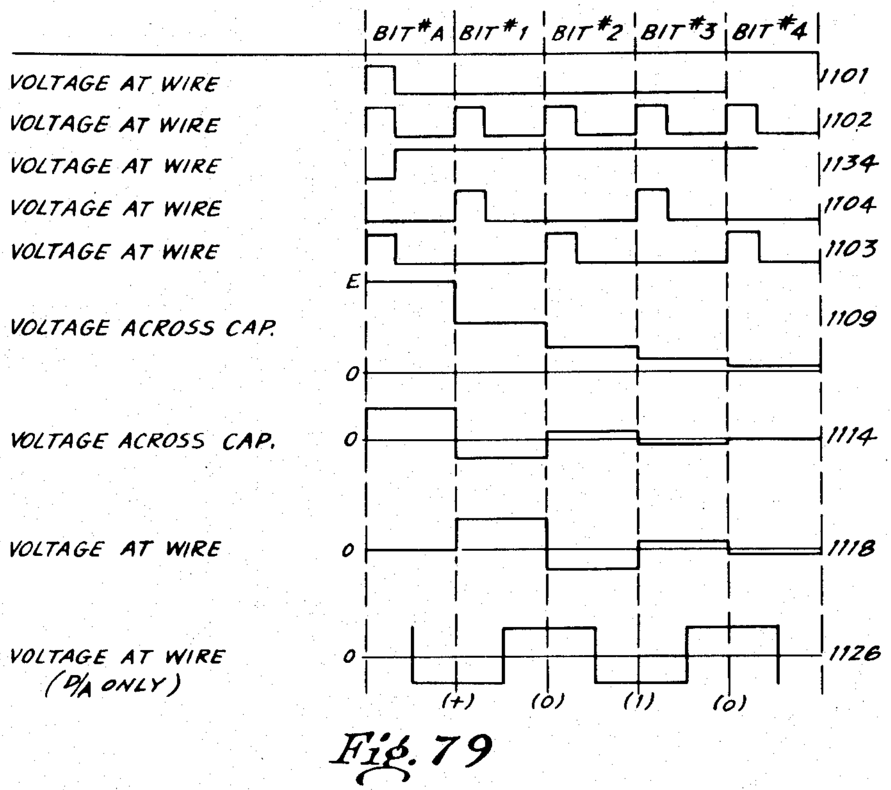
Figure 83:
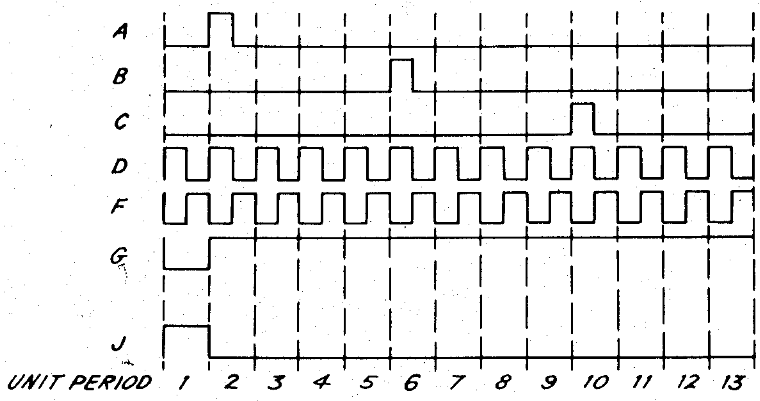
Figure 81:
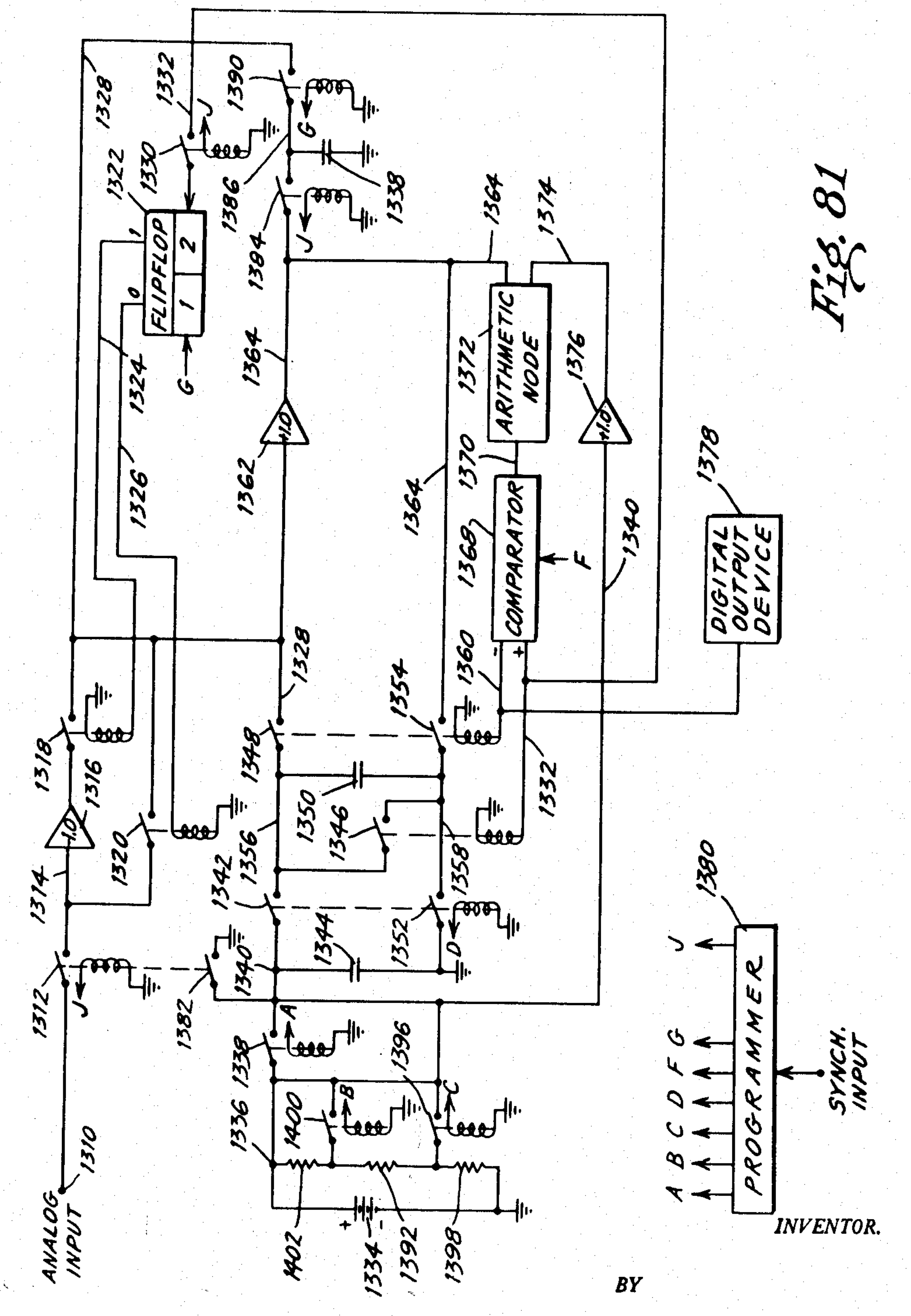
Figure 82:
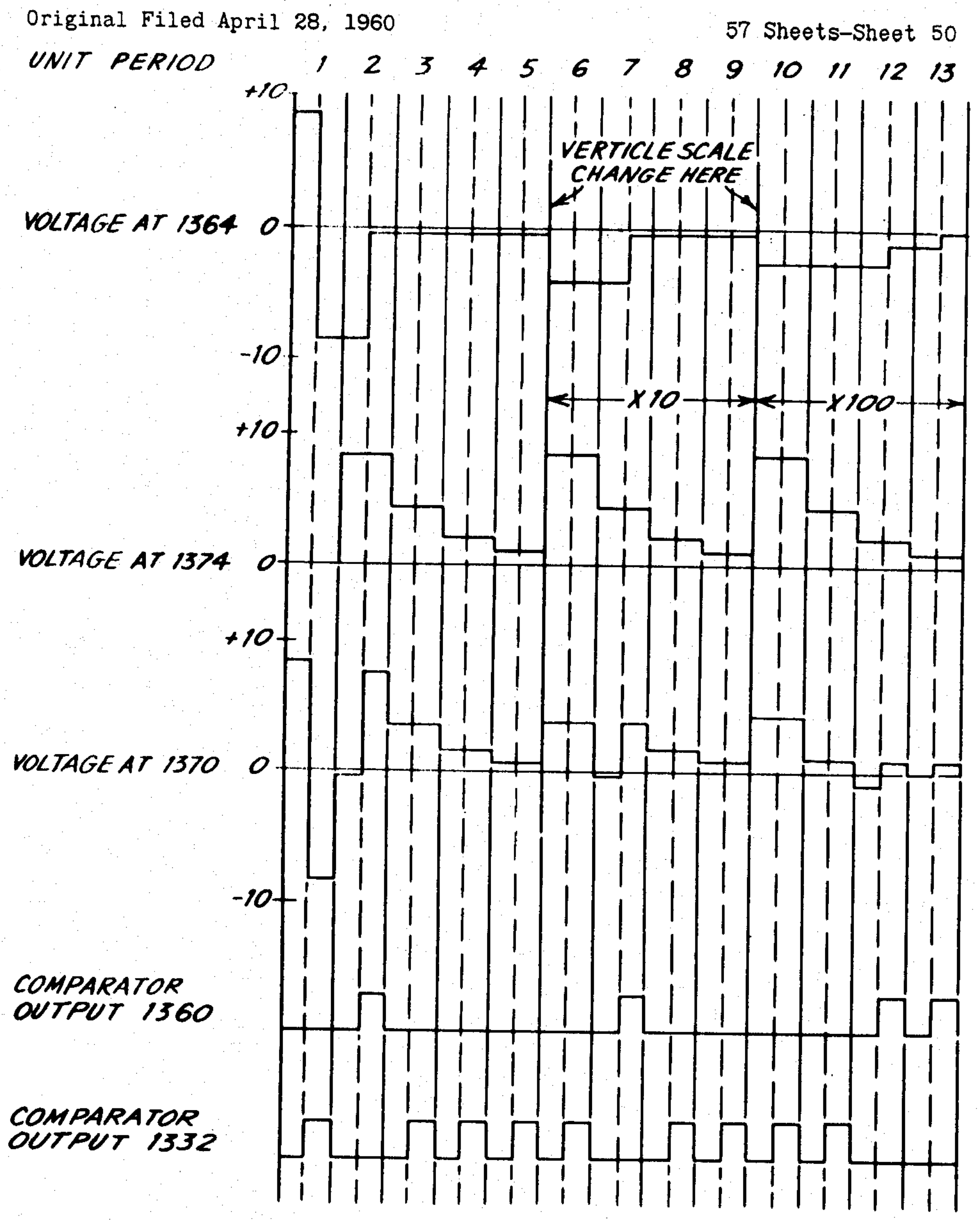
Figure 84:
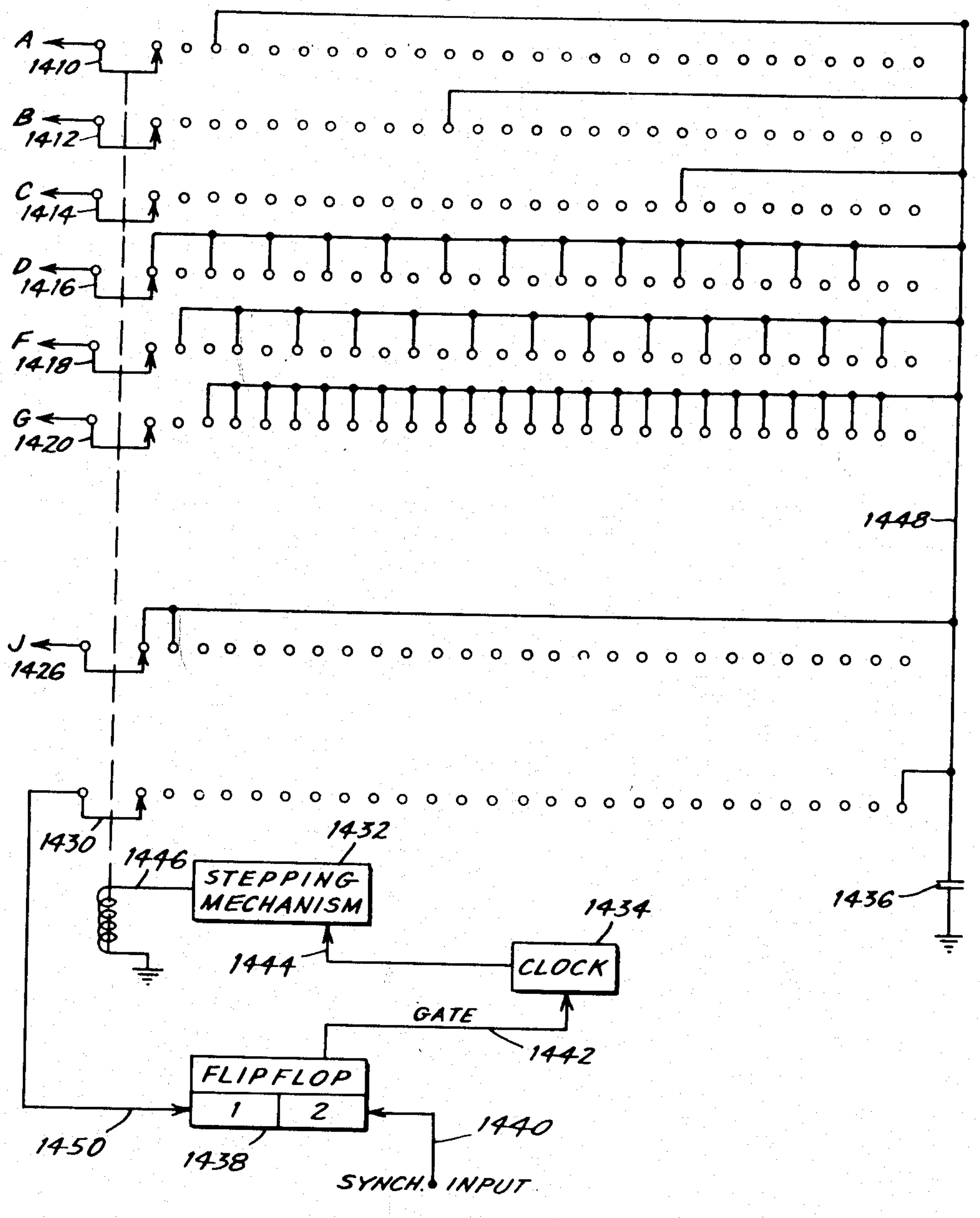
Figure 85:
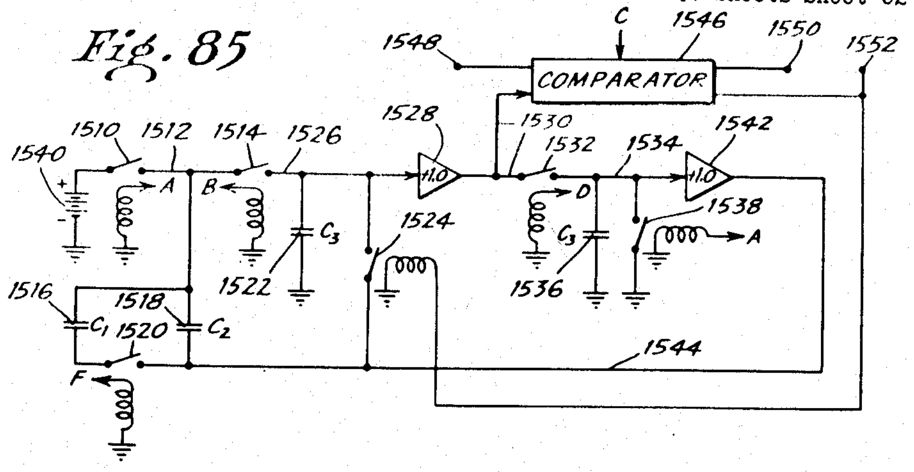
Figure 86:
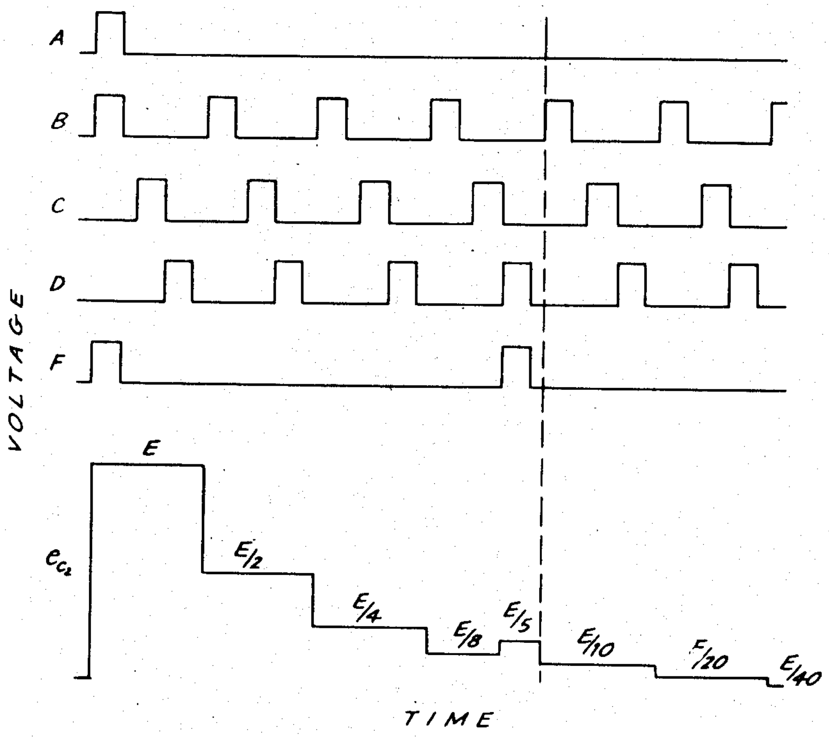
Figure 87:
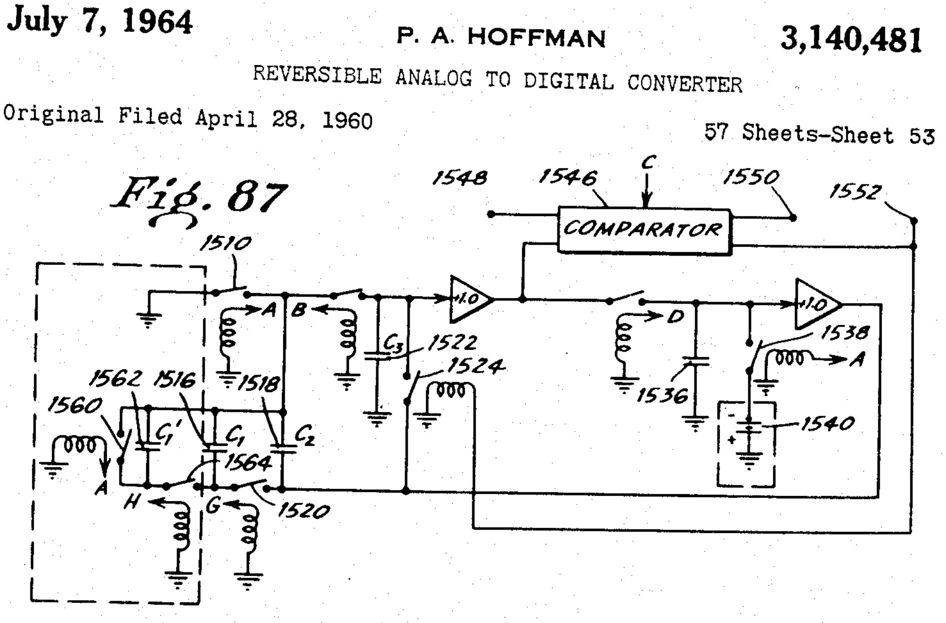
Figure 88:
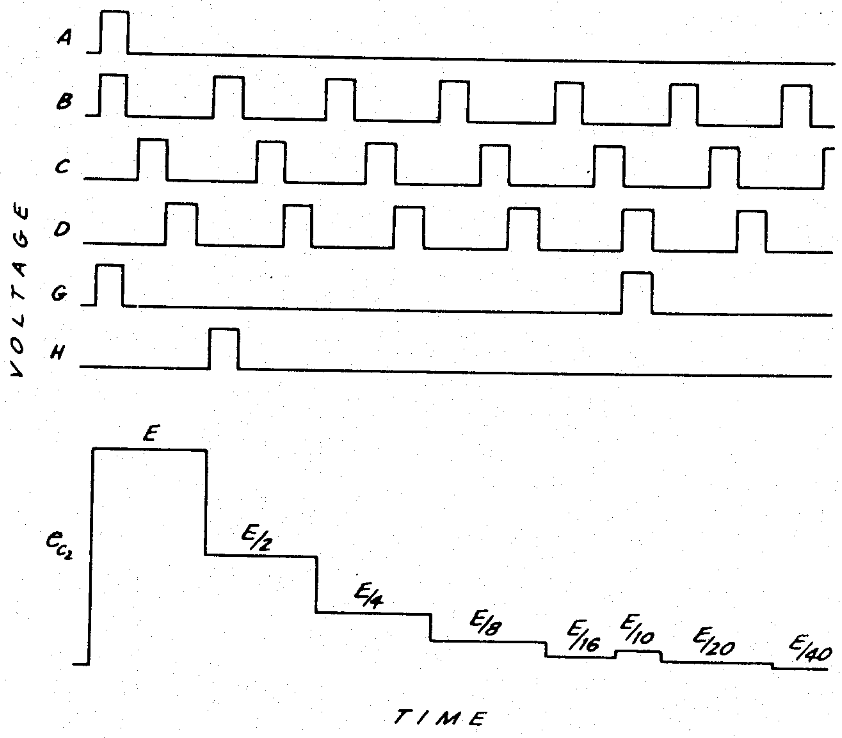
Figure 89:
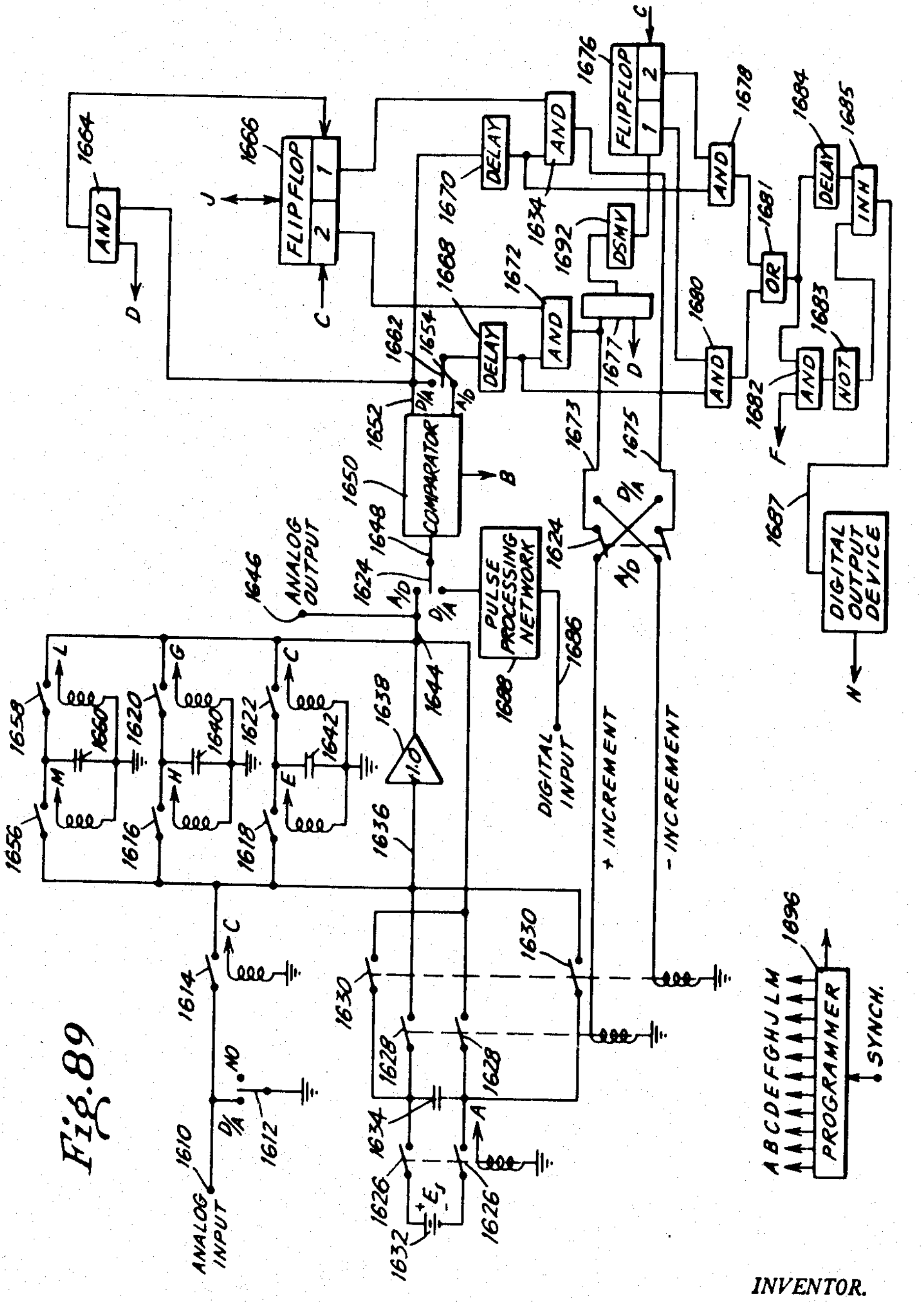
Figure 90:
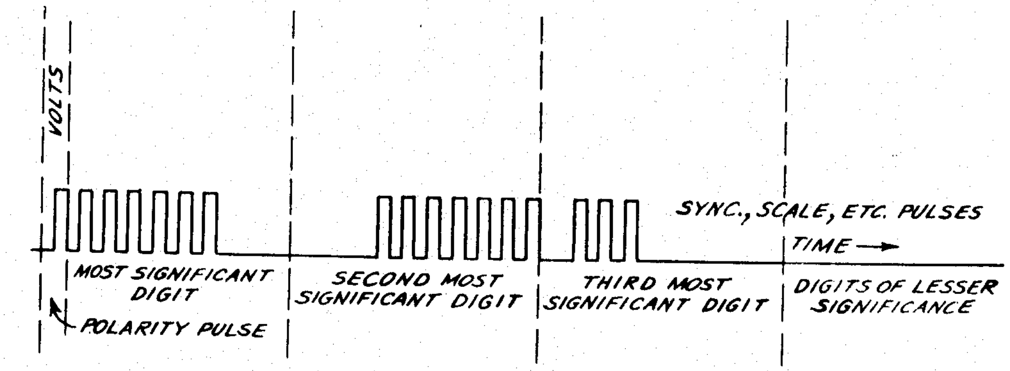
Figure 91:
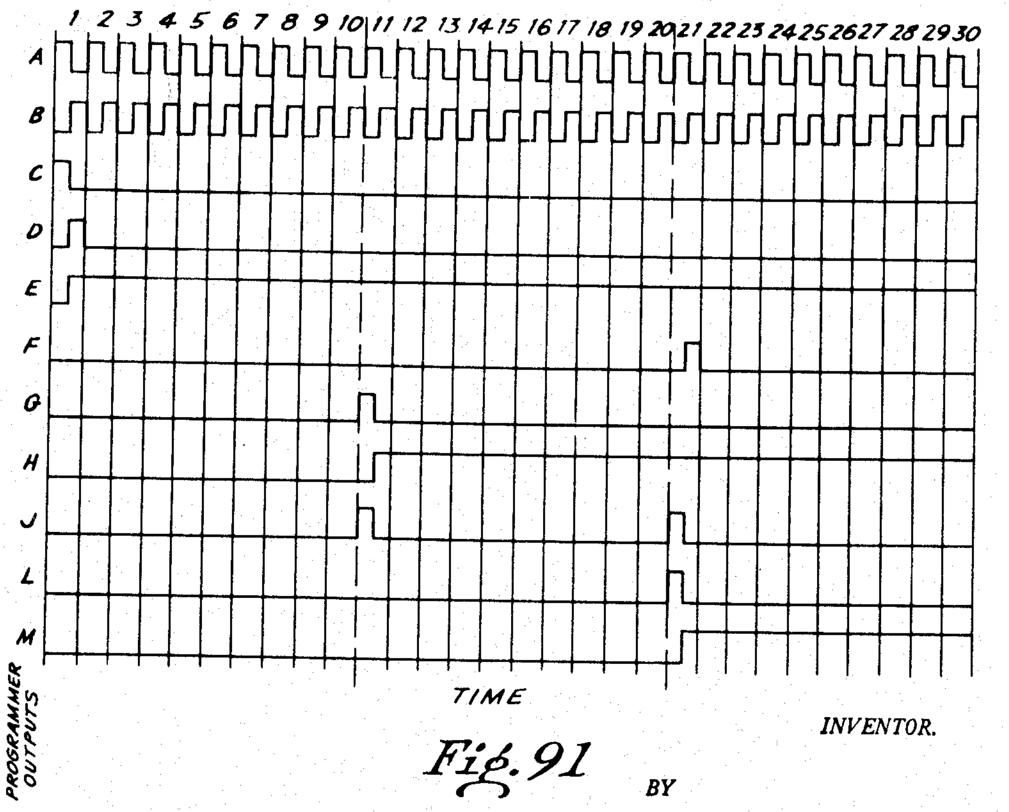
Figure 92:
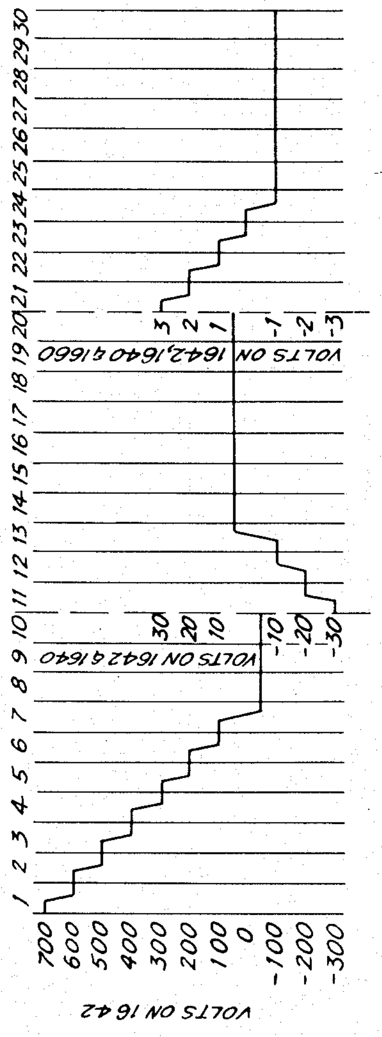
Figure 93:
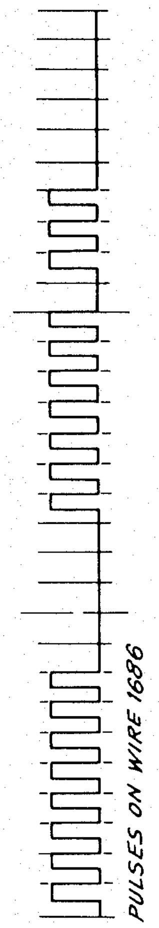
Figure 94:
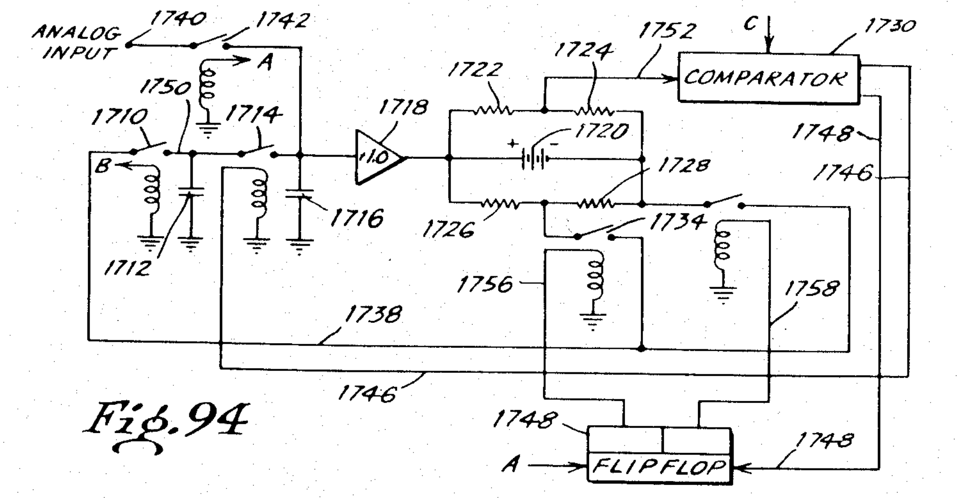
Figure 95:
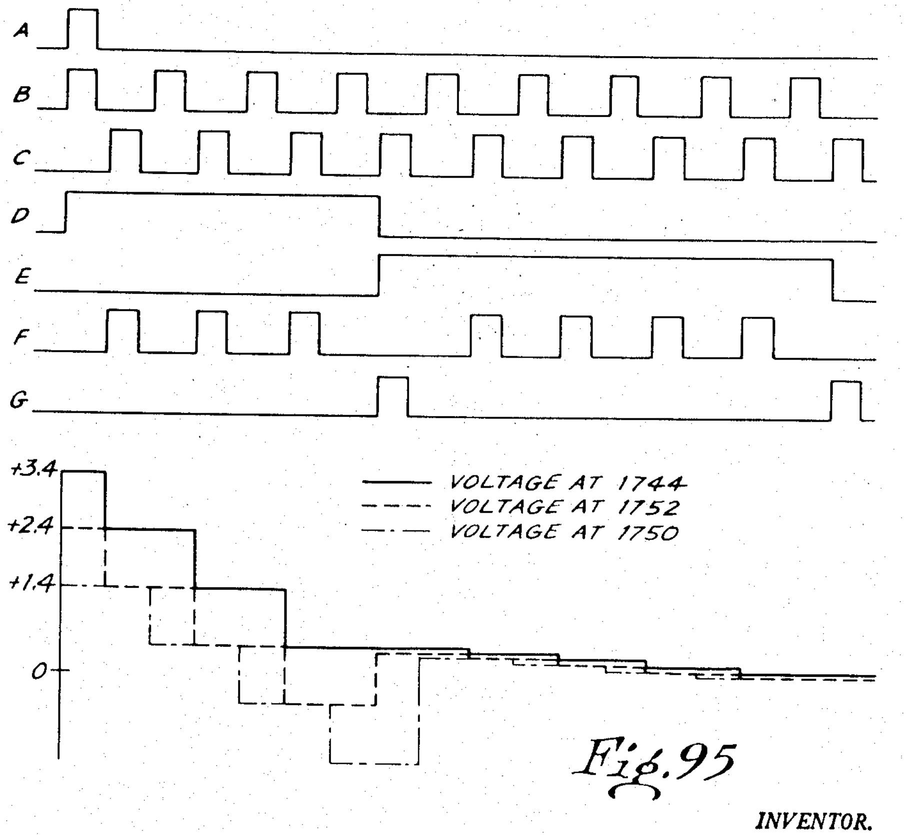

FIGURE 21 is a diagram which shows the relations of the quantized intervals, into which the analog input is divided, at the digital output;

FIGURE 22 shows a programmer suitable for use in the systems of FIGURES 15, 16 and 17 with 2 part bit periods;

FIGURE 23 is a comparator which may be used in all of the analog to digital converters described;

FIGURE 24 shows a summing node for which the output voltage is the negative of the sum of the two input voltages;

FIGURE 25 shows a summing node for which the output voltage is the difference between the two input voltages;

FIGURES 26*a* and 26*b* show a circuit for the pulse processing network together with input and output pulse trains;

FIGURE 27 shows a digital output device for the converter of FIGURE 15;

FIGURE 28 shows typical digital input pulses;

FIGURES 28*a* and 28*b* show the basic block diagrams for complementary tandem arrangements of similar converters used for opposite conversions;

FIGURE 28*c* shows typical digit and synchronizing pulses for the circuits in FIGURES 28*a* and 28*b*;

FIGURE 29 is a circuit diagram of a reversible binary analog to digital converter employing 6 capacitors, one standard voltage source, and final charge storage by the means shown in FIGURE 3;

FIGURE 30 is the analog to digital converter used in the device of FIGURE 29;

FIGURE 31 is the digital to analog converter used in the device of FIGURE 29;

FIGURE 32 shows the timing and voltage relationships for the devices shown in FIGURES 29, 30 and 31;

FIGURE 33 shows a typical flip-flop used in the circuits of the present invention;

FIGURE 34 shows a binary converter system with one source of standard voltage, five capacitors and final charge storage by the means shown in connection with FIGURE 5;

FIGURE 35 is the analog to digital converter used in the device of FIGURE 34;

FIGURE 36 is the digital to analog converter used in the device of FIGURE 34;

FIGURE 37 shows the timing and voltage relaitonships for the devices shown in FIGURES 34, 35 and 36;

FIGURE 38 shows a programmer suitable for use in the systems of FIGURES 34, 35 and 36;

FIGURE 39 shows a binary converter system employing two sources of standard voltage, six capacitors, with provision for placing a sample of the analog voltage on one of the storage capacitors;

FIGURE 40 is the analog to digital converter used in the device of FIGURE 39;

FIGURE 41 is the digital to analog converter used in the device of FIGURE 39;

FIGURE 42 shows the timing and voltage relationships for the devices shown in FIGURES 39, 40 and 41;

FIGURE 43 shows a programmer suitable for use in the systems of FIGURES 39, 40 and 41;

FIGURE 44 shows a reversible binary converter system employing three capacitors plus anticipation;

FIGURE 45 is the analog to digital converter used in the device of FIGURE 44;

FIGURE 46 is the digital to analog converter used in the device of FIGURE 45;

FIGURE 47 shows the timing and voltage relationships for the devices shown in FIGURES 45, 46 and 47;

FIGURE 48 shows a programmer suitable for use in the systems of FIGURES 45, 46 and 47;

FIGURE 49 shows a reversible binary converter system employing a single battery, three capacitors wherein the arithmetic node is combined with the comparison signal generator;

FIGURES 49A, 49B and 49C show various minor modifications of the basic converter circuit of FIGURE 49;

FIGURE 50 is the analog to digital converter used in the device of FIGURE 49;

FIGURE 51 is the digital to analog converter used in the device of FIGURE 49;

FIGURE 52 shows the timing and voltage relationships for the devices of FIGURES 49, 50 and 51;

FIGURE 53 shows an all electronic programmer suitable for use in the systems of FIGURES 49, 50 and 51;

FIGURE 53A shows the timing and voltage relationships for the electronic programmer of FIGURE 53;

FIGURE 54 shows a reversible binary converter system employing three capacitors wherein the arithmetic node is separate from the signal generator and the comparison voltage approaches the analog voltage;

FIGURE 55 is the analog to digital converter used in the device of FIGURE 54;

FIGURE 56 is the digital to analog converter used in the device of FIGURE 54;

FIGURE 57 shows the timing and voltage relationships for the devices of FIGURES 54, 55 and 56;

FIGURE 58 shows a programmer suitable for use in the systems of FIGURES 54, 55 and 56;

FIGURE 59 shows a reversible binary converter system employing a single battery, four capacitors and delayed feedback;

FIGURE 60 is the analog to digital converter used in the device of FIGURE 59;

FIGURE 61 is the digital to analog converter used in the device of FIGURE 59;

FIGURE 62 shows the timing and voltage relationships for the devices of FIGURES 59, 60 and 61;

FIGURE 63 shows a programmer suitable for use in the systems of FIGURES 59, 60 and 61;

FIGURE 64 shows a simplified delayed feedback circuit useable in the converter systems of FIGURES 59, 60 and 61;

FIGURE 65 shows the timing and voltage relationships using the delayed feedback circuit of FIGURE 64;

FIGURE 66 shows a reversible binary converter system employing three capacitors and delayed feedback wherein the reference voltage battery is incorporated in the delayed feedback circuit;

FIGURE 67 is the analog to digital converter used in the device of FIGURE 66;

FIGURE 68 is the digital to analog converter used in the device of FIGURE 66;

FIGURE 69 shows the timing and voltage relationships for the devices of FIGURES 66, 67 and 68;

FIGURE 70 shows a programmer suitable for use in the systems of FIGURES 66, 67 and 68;

FIGURE 71 shows a reversible binary converter system employing delayed feedback and following the plus-minus program of FIGURE 7;

FIGURE 72 is the analog to digital converter used in the device of FIGURE 71;

FIGURE 73 is the digital to analog converter used in the device of FIGURE 71;

FIGURE 74 shows the timing and voltage relationships for the devices of FIGURES 71, 72 and 73;

FIGURE 75 shows a programmer suitable for use in the systems of FIGURES 71, 72 and 73;

FIGURE 76 shows a reversible binary converter system employing delayed feedback wherein the arithmetic node is incorporated in the signal generator;

FIGURE 77 is the analog to digital converter used in the device of FIGURE 76;

FIGURE 78 is the digital to analog converter used in the device of FIGURE 76;

FIGURE 79 shows the timing and voltage relationships for the devices of FIGURES 76, 77 and 78;

FIGURE 80 shows a programmer suitable for use in the systems of FIGURES 76, 77 and 78;

FIGURE 81 shows a reversible binary coded non-binary converter system;

FIGURE 82 shows the voltage waveforms at various points in the circuit of FIGURE 81;

FIGURE 83 shows the output waveforms for the programmer 1380 of FIGURE 81;

FIGURE 84 shows the details of a stepper switch programmer for the converter of FIGURE 81;

FIGURE 85 shows a binary coded non-binary converter system employing delayed feedback;

FIGURE 86 shows programmer outputs suitable for use with the converter of FIGURE 85;

FIGURE 87 shows a modified binary coded non-binary converter system employing delayed feedback similar to the converter of FIGURE 85;

FIGURE 88 shows the programmer output waveforms for the converter of FIGURE 87;

FIGURE 89 shows a reversible uncoded non-binary converter system;

FIGURE 90 shows a pulse train representation of digits suitable for use with the converter of FIGURE 89;

FIGURE 91 shows the programmer output waveforms suitable for use with the converter of FIGURE 89;

FIGURES 92 and 93 show the waveforms of voltages at various points in the circuit of FIGURE 89;

FIGURE 94 shows an uncoded non-binary converter system employing delayed feedback; and FIGURE 95 shows the programmer waveforms and voltages at various circuit locations for the converter of FIGURE 94.

Figure 1:
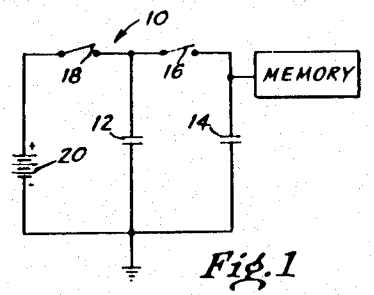
FIGURE 1 shows a basic circuit forming a part of the present invention.

Referring to the drawings, FIGURE 1 shows one of the basic features of the novel converter of the present invention in a simplified form. The drawing shows the basic comparison signal generator indicated at 10 comprising a first capacitor 12 and a second capacitor 14 connected to ground and to each other through a switch 16. A second switch 18 connects a battery 20 constituting a source of standard potential E for the capacitors. The output is taken from capacitor 14 to a memory device 22 which stores information as a function of the electrical signal impressed upon capacitor 14.

Figure 1A:
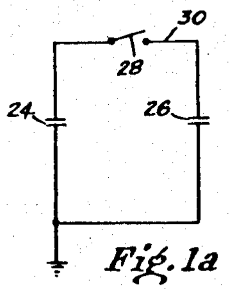
FIGURE 1A illustrates the manner in which capacitors are used to divide voltage in the invention.

Before describing the circuits for a complete converter system it is desirable first to discuss the operation of several subsidiary circuits. FIGURE 1A shows two capacitors 24 and 26 which have their lower plates connected together and to ground in the manner of capacitors 12 and 14 of FIGURE 1. The top plates of capacitors 24 and 26 are connected to a switch 28 which connects the top plates of the capacitors to each other when the switch is closed. The capacity of capacitor 24 is designated as $C_1$ and the capacity of capacitor 26 is designated as $C_2$.

For the following description it is assumed that capacitors 24 and 26 are charged to voltages $E_1$ and $E_2$ respectively and that switch 28 is open. The means for charging the capacitors is not shown in FIGURE 1A. It is apparent, however, that a battery or other suitable source may be simply placed across the capacitors to charge them as desired. Various other charging means are well known and wherever in the following description an assumption is made that initial charge exists on a capacitor it is the result unless otherwise stated of a conventional capacitor charging arrangement.

If after capacitors 24 and 26 are charged the switch 28 is closed, the top plate of capacitors 24 and 26 and the wire 30 connecting them will come to a voltage $e$ which is given by Equation 1 below.

$$e=\frac{C_1}{C_1+C_2}e_1+\frac{C_2}{C_1+C_2}e_2 \quad (1)$$

The derivation of Equation 1 is straightforward from the fundamentals of electrostatics. Therefore the details of the derivation will not be given. Certain special cases may be important, however. For $C_2$ very much larger than $C_1$, Equation 1 becomes approximately $$e=\frac{C_1}{C_2}e_1+e_2 \quad (2)$$

In order to bring out more clearly some of the relations which are required, Equation 1 may be written in the following form.

$$e=\left(e_1\frac{C_1}{C_2}+e_2\right)-\left[\frac{C_1^2}{C_2(C_1+C_2)}e_1+\frac{C_1}{C_1+C_2}e_2\right] \quad (3)$$

In Equation 3 the expression in parentheses is simply the righthand side of Equation 2, and the terms in square brackets may be considered to represent the error which results from using Equation 2 instead of Equation 1. It will be noted that the expression in square brackets, that is, the error, becomes smaller as $C_2$ becomes larger with respect to $C_1$: Furthermore, if $C_2$ is large in camparison with $C_1$, and if $$\frac{C_1^2}{C_2^2}e_1$$

is small in comparison with $e_2$, the the change in voltage of wire 30 upon the closing of switch 28 is $$\frac{C_1}{C_2}e_1$$

regardless of the magnitude of $e_2$.

An extension of this property will next be considered. Assume that switch 28 is open, that capacitor 24 is charged to a potential $e_1$, and that the charge on capacitor 26 is zero. Assume further that capacitor 24 ($C_1$) is much smaller than capacitor 26 ($C_2$). After switch 28 is closed, the voltage on wire 30 is approximately $$\frac{C_1}{C_2}e_1$$

volts. Since $C_1$ is much smaller than $C_2$, this voltage is small in comparison with $e_1$, and capacitor 24 may be considered to have been almost completely discharged. Moreover, it remains true that capacitor 24 is essentially discharged by the switching operation as long as $$e_1\frac{C_1}{C_2}+e_2$$

is small in comparison with $e_1$. In the following explanation it will be assumed that this condition is met in addition to the conditions discussed above.

Now, let switch 28 be opened and let capacitor 24 be charged to the voltage $e_1'$. Upon closing switch 28 a second time, the voltage on wire 30 will become $$(e_1+e_1')\frac{C_1}{C_2}$$

The sequence of charging capacitor 24 to a specified voltage and then closing switch 28 may be repeated a number of times with the result that the voltage on capacitor 26 will be the sum of the separate voltages to which capacitor 24 was charged multiplied by the factor $C_1/C_2$, that is, $$e=\frac{C_1}{C_2}\sum_{1}^{n} e_1^{i} \qquad (3A)$$

where $e_1^i$ represents any of the voltages to which capacitor 24 is charged. In particular, if all $e_1^i$ are equal to the same voltage, $e_1$ say, then $$e=ne_1\frac{C_1}{C_2} \qquad (3B)$$

As noted above, Equations 3A and 3B are approximations. For the approximations to be within reasonable limits the relations noted previously involving capacitors 24, 26 and $e_2$ must obtain.

Still in reference to FIGURE 1A, another important special case is where capacitors 24 and 26 are equal in size, and where capacitor 26 is initially uncharged. Further, let it be assumed that capacitor 24 is charged to a potential $e_1$. Then from Equation 1, when switch 30 is closed, the voltage on wire 30 will become $$e=\tfrac{1}{2}e_1 \qquad (4)$$

Figure 1B:
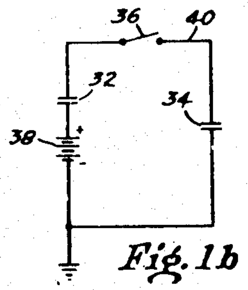
FIGURE 1B illustrates a charge transfer circuit in accordance with one embodiment of the invention.

FIGURE 1B is similar to FIGURE 1A in that it contains two capacitors 32 and 34 and a switch 36; however, FIGURE 1B also contains a battery or other source of constant potential 38. Let the voltage of the battery be E. As before, let capacitors 32 and 34 be designated $C_1$ and $C_2$ respectively, and let them initially be charged to voltages $e_1$ and $e_2$ before switch 36 is closed. After switch 36 is closed, the top plates of the capacitors and wire 40 connecting them will come to a voltage given by Equation 5 as follows:

$$e=\frac{C_1}{C_1+C_2}(E+e_1)+\frac{C_2}{C_1+C_2}e_2 \qquad (5)$$

In particular, if the capacitors are equal in size $$e=\tfrac{1}{2}(E+e_1)+\tfrac{1}{2}e_2 \qquad (6)$$

Equation 6 holds true for switch 36 located at any position in the loop of FIGURE 1B.

Turning to the circuit of FIGURE 2, this circuit shows a second type of charge distributing circuit used in the present invention and will be discussed in relation to the decimal number system. However, with appropriate modifications which will be described later, the discussion also applies to other number bases. The circuit consists of capacitors 42, 44, 46 and 48; switches 50, 52 and 54 and reference will be made to wire 56. The size of capacitors 42, 44, 46 and 48 will be designated by $C_1$, $C_2$, $C_3$, and $C_4$, respectively. Furthermore, the sizes of capacitors 46 and 48 are selected so that $$\frac{1}{C_3}+\frac{1}{C_4}=\frac{10}{C_4} \qquad (7)$$

In other words, the capacity of capacitors 46 and 48 in series is one-tenth the capacity of 48 alone. It follows from Equation 7 that $$C_3=\frac{1}{9}C_4 \qquad (8)$$

Moreover, the sizes of capacitors 44, 46 and 48 are selected so that $$\frac{1}{C_2}+\frac{1}{C_3}+\frac{1}{C_4}=\frac{100}{C_4} \qquad (9)$$

Therefore, the capacity of capacitors 44, 46 and 48 in series is one-hundredth the capacity of capacitor 48 alone. It follows from Equations 7 and 9 that $$C_2=\frac{1}{90}C_4 \qquad (10)$$

Figure 2:
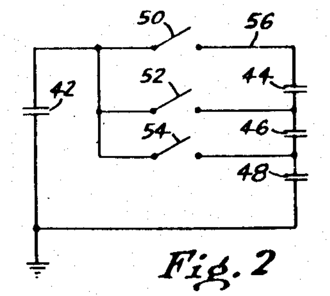
FIGURE 2 shows a capacity voltage divider suitable for use in non-binary converters.

With respect to FIGURE 2, it will be assumed that the capacity of capacitor 42 is small in comparison with $C_4/100$; therefore the capacity of capacitor 42 is also small in comparison with $C_4$ and with $C_4/10$. Now, if capacitors 44, 46 and 48 are discharged, and if capacitor 42 is charged to a voltage $e_1$ after which switch 54 is closed, the wire 56 will assume a voltage $e$ which is given by the following approximate equation.

$$e=e_1\frac{C_1}{C_4} \qquad (11)$$

The proof of Equation 11 involves two steps. First, consideration of Equation 2 will show that the top plate of capacitor 48 is at the approximate potential $$e_1\frac{C_1}{C_4}$$

since the initial charge on capacitor 48 was zero. Moreover, since capacitors 44 and 46 were uncharged before switch 54 was closed and since the closing of switch 54 does not place any charge on either of these capacitors, they remain uncharged after switch 54 is closed. Therefore the voltages across them are zero and the potential of wire 56 is the same as the potential of the top plate of capacitor 48.

In a similar manner, if the capacitors of FIGURE 2 are initially discharged, if the switches are initially open, if capacitor 42 is charged to a voltage $e_1$ after which switch 52 is closed, then the potential of the top plate of capacitor 46 and of wire 56 will be approximately $$e=e_1\frac{1}{10}\frac{C_1}{C_4} \qquad (12)$$

This result follows from the facts that capacitors 46 and 48 in series have one-tenth the capacity of capacitor 48 alone and that no charge is placed on capacitor 44 by the switching operation.

With reference further to FIGURE 2 if the capacitors are initially discharged, if the switches are initially open, and if capacitor 42 is charged to a voltage $e_1$ after which switch 50 is closed, then the potential of the top plate of capacitor 44 and of wire 56 will be approximately $$e=e_1\frac{1}{100}\frac{C_1}{C_4} \qquad (13)$$

Equation 13 follows directly from Equations 2 and 9.

It is noted that the potential of wire 56 in Equation 11 is ten times as large as the potential of wire 56 in Equation 12, which in turn is ten times as large as the potential of the wire 56 in Equation 13. Systems will be described later herein for converting analog quantities into decimal numbers and for converting decimal numbers into analog quantities which systems will depend for their operation on the circuit configuration shown in FIGURE 2. By a different choice of the sizes of capacitors 44, 46 and 48, the ratios of the potentials of the wire 56 upon closing switches 50, 52 or 54 could be made to equal any number which might be desired. Therefore, the circuit in FIGURE 2 is useful not only for converting to and from decimal numbers, but also for converting to and from numbers having any other base. A non-integral number base could be used if desired. As will be explained, the three capacitors 44, 46 and 48 are associated with the individual digits of a 3-digit number. In case a different number of digits is required, the number of capacitors in series must be increased or decreased so that the number of capacitors in series is the same as the number of digits. Circuits for other number bases and numbers of digits than have been discussed above are obvious, and further details are deemed unnecessary.

The circuit shown in FIGURE 3 is novel and illustrates a first type of charge transfer circuit useable in the converters of this invention. A capacitor 60 is connected to the arms of a double-pole double-throw switch 62. One pair of stationary terminals of switch 62 is connected to a battery 64 which has a voltage $e_1$. The other pair of stationary terminals is connected to a second capacitor 66 and to the output of an amplifier 68 as shown. The gain of the amplifier is +1.0, which means that the output is equal to the input in both magnitude and polarity. More particularly, the gain is unity when no current is being drawn from the amplifier.

The circuit in FIGURE 3 has the special property that, if the arms of switch 62 are moved to the lefthand contacts so that capacitor 60 is charged to the voltage $e_1$ of the battery and then if the arms of the switch are moved to the righthand contacts, all of the charge on capacitor 60 is transferred to capacitor 66. Consequently, if the capacity of capacitor 60 is $C_1$ and the capacity of capacitor 66 is $C_2$, the voltage across capacitor 66 changes by an amount $$\frac{C_1}{C_2}e_1$$

and this result occurs regardless of the initial charge on capacitor 66.

The operation of some of the converter systems which will be described depends upon the transfer of charge between capacitors in a configuration represented by FIGURE 1A. For ideal operation, the voltages after the transfer would be as given by Equation 2. However, as has been explained, not all of the charge on capacitor 24 is transferred to capacitor 26, and therefore the voltage on capacitor 26 is not as high as it should be for ideal operation. Moreover, the charge which remains on capacitor 24 may have undesirable effect in later parts of the conversion operation. The application of the circuit in FIGURE 3 removes both of these difficulties since all of the charge on capacitor 60 is transferred to capacitor 66 and hence no charge remains on capacitor 60.

Figure 4:
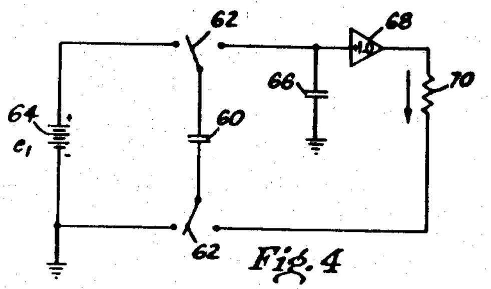
FIGURE 4 illustrates the effect of the output impedance of the amplifier shown in FIGURE 3.

In order to demonstrate the accuracy of the statements in the preceding paragraph, consideration will be given to FIGURE 4. This figure is the same as FIGURE 3 except that the output impedance of the amplifier is shown explicitly. That is, the output impedance of the amplifier is shown as a resistor 70 in which a current $i$ flows in the direction shown by the arrow. In FIGURE 4 the convention will be adopted that capacitors 60 and 66 are charged positively when there is a net positive charge on their upper plates. The capacities of capacitors 60 and 66 will be designated by $C_1$ and $C_2$ respectively; also the initial voltage on capacitor 60 will be designated by $e_1$ and that on capacitor 66 will be designated by $e_2$. When the arms of switch 62 are moved to the righthand contacts, current will generally flow in resistor 70. The integro-differential equation for this current is $$e_2+\frac{1}{C_2}\int idt-Ri+e_1-\frac{1}{C_1}\int idt-e_2-\frac{1}{C_2}\int idt=0 \quad (14)$$

Equation 14 may be differentiated and written as follows:

$$R\frac{di}{dt}+\frac{i}{C_1}=0 \quad (15)$$

Equation 15 is a standard type of differential equation for which the solution is given in textbooks on differential equations. The solution is $$i=A\epsilon^{\frac{-t}{RC_1}} \quad (16)$$

where A is an arbitrary constant and $\epsilon$ is the base for natural logarithms. The arbitrary constant may be evaluated from the initial conditions in the circuit at the instant that switch 62 is moved to the right hand position. At this instant the voltage acting around the circuit is determined by the initial charges on capacitors 60 and 66. The initial charge on capacitor 60 is the battery voltage $e_1$, and the initial voltage on capacitor 66 has been designated $e_2$. Therefore the voltage across resistor 70 is $e_2-(e_2-e_1)$ which is equal to $e_1$, and the current through the resistor is $$i=\frac{e_1}{R}(t=0) \quad (17)$$

From Equation 16 with $t=0$ and from Equation 17, the constant A is $$A=\frac{e_1}{R} \quad (18($$

If this value is substituted in Equation 16, the complete solution of the differential equation is found to be $$i=\frac{e_1}{R}\epsilon^{\frac{-t}{RC_1}} \quad (19)$$

Equation 19 shows that the current decreases as time increases, and eventually the current becomes zero. The total charge which passes through the circuit is given by $$Q=\int_0^{\infty} idt$$

$$\therefore Q=\frac{e_1}{R}\int_0^{\infty}\epsilon^{\frac{-t}{RC_1}} \quad (20)$$

Upon carrying out the integration, the result is $$Q=C_1e_1 \quad (21)$$

This is just the charge that was on capacitor 60 at the instant the arms of switch 62 were moved to the righthand contacts, that is, at $t=0$. Therefore, after the current $i$ has decreased to zero, the charge on capacitor 60 is zero since the direction of current $i$ is such as to place negative charge on capacitor 60 in accordance with the convention for the signs of charges on the capacitors which was stated above. Reference to FIGURE 4 shows that charge which flows out of capacitor 60 must flow into capacitor 66. Therefore, the charge which was initially on capacitor 66 has been changed by the amount Q regardless of the magnitude of the initial charge. Hence, the final voltage on capacitor 66 is $$e=e_2+\frac{C_1}{C_2}e_1 \quad (22)$$

Another circuit by means of which substantially all of the charge on one capacitor may be transferred to another capacitor is shown in FIGURE 5. The theory of operation is described in an article entitled "Long Term Analog Memory" by Torn, Katz and Close, page 566, Proceedings of the National Electronics Conference, vol. 10, 1954. In FIGURE 5 battery 72 is connected to capacitor 74 through switch 76, and the capacitor is connected to amplifier 78 through a second switch 80. Amplifier 78 has a high gain, and the polarity of its output voltage is opposite to the polarity of its input voltage. Capacitor 82 is connected between the input and the output of the amplifier. In operation, switch 76 is closed and opened, and capacitor 74 is thereby charged to the battery voltage $e_1$. Next, switch 80 is closed. As explained in the article referred to above, nearly all of the charge on capacitor 74 is transferred to capacitor 82. The result is that the voltage on wire 84 is nearly zero, and the voltage $e$ on wire 86 is $$e=-e_1\frac{C_1}{C_2}-e_2 \quad (22a)$$

where $C_1$ is the capacity of capacitor 74, $C_2$ is the capacity of capacitor 82, and $-e_2$ is the voltage on wire 86 due to charge on capacitor 82 before switch 80 is closed. The approximation error in Equation 22*a* may be made small by making the gain of amplifier 78 as high as possible.

The transfer circuit of FIGURE 4 has the important advantage over the transfer circuit of FIGURE 5 in that theoretically all the charge may be transferred with a voltage gain of +1. In the circuit of FIGURE 5 perfect charge transfer between capacitors can only be obtained with infinite gain in the amplifier.

Figure 6:
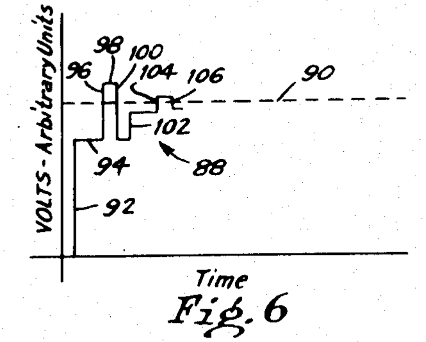
FIGURE 6 shows one program for the synthesis of comparison or analog output voltages for binary conversion.

It was stated previously that the operation of the converters depends upon the generation or synthesis of a comparison voltage. There are two programs by which the comparison voltage of the present invention may be built up. FIGURE 6 illustrates one program for a digital output which is a binary number. In particular, the binary number 1010 is illustrated. In FIGURE 6 the lengths along the horizontal axis represent time and lengths along the vertical axis represent voltage. The comparison voltage generally indicated at 88 is shown as a series of vertical and horizontal line segments. In an actual converter the vertical segments are not exactly vertical or straight; that is, the vertical segments slant a little to the right and are slightly curved. However, straight lines are shown for simplicity and are sufficiently accurate to fully illustrate the action of the converter.

The magnitude of the analog voltage is represented by the horizontal dashed line 90. The first increment 92 in the comparison voltage is approximately half of the largest analog voltage to be encoded. During the time represented by the horizontal line segment 94 a determination is made in the converter that the increment 92 is less than the analog voltage. A second increment 96 is then added to the first increment to form a new comparison voltage, the magnitude of the second increment is exactly half that of the first increment. During the time 98 a determination is made that the comparison voltage is greater than the analog voltage and thereupon, the increment 96 is subtracted from the comparison voltage as shown by line 100. A third increment which is one half the second increment is next added to the comparison voltage, line 102. The comparison voltage is observed to remain less than the analog voltage. A fourth increment, which is one half the third increment, is then added to the comparison voltage, line 104. The fourth increment again makes the comparison voltage greater than the analog voltage, and therefore it is subtracted out as shown by line 106.

The important features of this program are that the comparison voltage is built up by increments or steps each of which is one half of the previous step. When a particular step makes the comparison voltage greater than the analog voltage, the step is subtracted out, and the next step is added. This process is repeated until the desired number of digits has been determined.

The second program for converting an analog quantity into a binary number is illustrated in FIGURE 7. As in FIGURE 6 voltage and time axes are shown, and also the comparison voltage 108 and the analog voltage 110. Moreover, each increment in the comparison voltage is one half of the preceding increment. As before, the first increment 112 is less than the analog voltage, and therefore the second increment 114 is added to the comparison voltage. The first two increments together produce a comparison voltage which is greater than the analog voltage, but the second increment is not subtracted out as it was in the first program. However, the third increment 116 is subtracted from the comparison voltage, which makes the comparison voltage smaller than the analog voltage. The fourth increment 118 is then added to the comparison voltage. In the FIGURE 7 program the comparison voltage is also built up by increments or steps, the magnitude of each step being one half the magnitude of the previous step. However, the steps may be positive or negative in sense. A positive step is added to the comparison voltage whenever the comparison voltage is less than the analog voltage, and a negative step is added to the comparison voltage whenever the comparison voltage is greater than the analog voltage.

Figure 8:
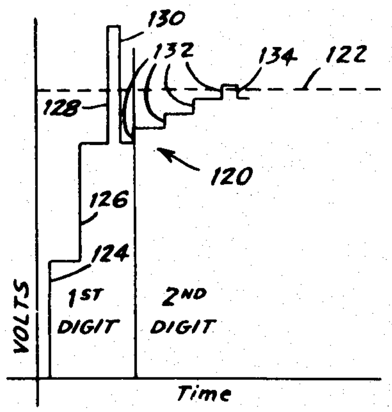
FIGURE 8 shows one program for synthesis of a comparison or analog output voltage for non-binary conversions.
Figure 9:
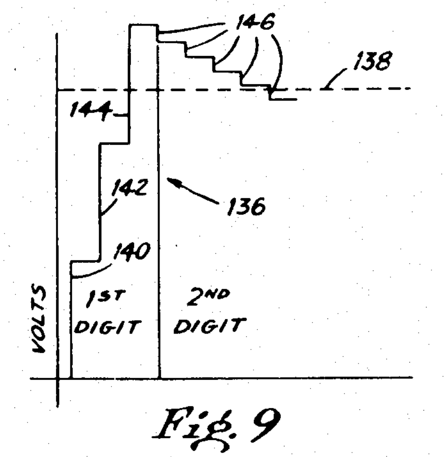
FIGURE 9 is a second program for synthesis of a comparison or analog output voltage for non-binary conversion.

Corresponding programs for number bases other than two are illustrated in FIGURES 8 and 9. The number base 10 has been selected as an example, and the extension to other number bases will be described later. In FIGURE 8 voltage and time axes are similarly again shown together with the comparison voltage 120 and the analog voltage 122. As for binary numbers, the comparison voltage is synthesized from increments of various sizes, but several consecutive increments may have the same size. It will be noted in FIGURE 8 that the comparison voltage is increased by equal increments 124, 126 and 128 until the total exceeds the analog voltage 122. The last increment is then subtracted out from the comparison voltage as shown by line 130. Thereafter the comparison voltage is again built up by increments which are one tenth the magnitude of the previous increments; the smaller increments are shown by lines 132. When the comparison voltage again exceeds the analog voltage, the last increment is subtracted out, line 134. In general, the program illustrated in FIGURE 8 involves building up the comparison voltage in equal steps until the comparison voltage exceeds the analog voltage, whereupon the last increment is subtracted out. Next, increments which are one tenth the size of the previous increments are added to the comparison voltage until the total of all increments again exceeds the analog voltage.

An alternative procedure is illustrated in FIGURE 9, wherein are shown voltage and time axes, the comparison voltage 136, and the analog voltage 138. As in FIGURE 8, the comparison voltage is built up in equal 140, 142, 144 increments, until the comparison voltage is greater than the analog voltage, in particular, it will be noted in FIGURE 9 that the increment represented by line 144 causes the comparison voltage to exceed the analog voltage. Thereafter, the comparison voltage is decreased by increments represented by lines 146 until the comparison voltage is less than the analog voltage. The increments 146 are each one tenth the magnitude of each of the increments 140, 142 or 144. Next, the comparison voltage is increased by equal increments until it again is greater than the analog voltage, the increments being one tenth of the previous increments represented by lines 146 and one hundredth of the increments represented by lines 140, 142 and 144. This procedure is repeated until the desired accuracy has been obtained. In general, the program illustrated in FIGURE 9 involves building up the comparison voltage in equal steps until the comparison voltage exceeds the analog voltage. The comparison voltage is then decreased by equal increments until the comparison voltage is less than the analog voltage, the latter increments being one tenth the previous increments. Next, the comparison voltage is increased by equal increments until the comparison voltage is greater than the analog voltage; the increments in this group are one tenth the size of those in the second group and one hundredth the size of those in the first group. This procedure is repeated as many times as is required.

In the descriptions of FIGURES 8 and 9, decimal numbers have been used for illustration. However, as stated previously, any number base may be used. For example, if the number base eight were desired, the procedure in FIGURE 8 would be as shown except that the increments 132 would be one eighth the size of increments 124, 126 and 128. Similarly in FIGURE 9 the increments 146 would be one eighth the size of increments 140, 142 and 144. In each instance the size of each group of increments is equal to the size of the previous group of increments divided by the number base. The procedures illustrated in FIGURES 8 and 9 are essentially the same as those in FIGURES 6 and 7 respectively.

Figure 10:
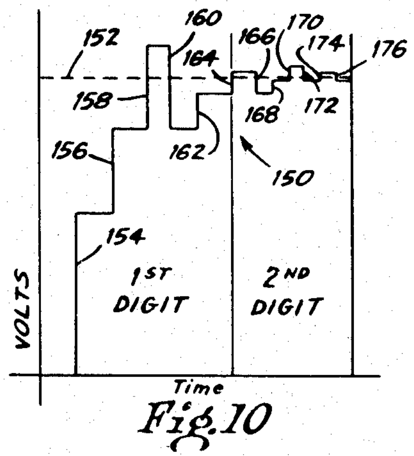
FIGURE 10 shows one program for the synthesis of a comparison or analog output voltage for binary coded non-binary conversions (4–2–2–1 binary decimal code shown)

FIGURE 10 illustrates the manner in which the comparison voltage of the present invention may be synthesized for one form of binary coded non-binary converter. In FIGURE 10 the system shown is for a 4, 2, 2, 1 binary coded decimal conversion.

As in the previous FIGURES 6–9, the axes represent voltage and time with the comparison voltage indicated generally at 150 and the analog voltage by the dashed line 152. The first increment 154 is four units high and the second and third increments 156 and 158 respectively are each two units high. Since increment 158 makes the comparison voltage greater than the analog voltage it is subtracted out as indicated by the line 160. The fourth increment 162 is then added to the comparison voltage and is one unit high. The first, second, third and fourth increments having a relative magnitude of 4, 2, 2, 1 respectively constitute the first binary coded decimal digit.

The second digit is similarly obtained by four increments related to each other in magnitude by the quantities 4, 2, 2, 1 respectively. Since at the end of the first digit the magnitude of the comparison voltage 150 is still less than the analog voltage 152 the first increment of the second digit indicated at 164 is added to the comparison voltage. Since FIGURE 10 relates to a decimal conversion system, the magnitude of the increment 164 is $\frac{1}{10}$ of the corresponding increment 154 for the first digit. Since the increment 164 brings the comparison voltage above the analog voltage it is subtracted out as indicated by the line 166. A second increment 168 is added which is $\frac{1}{10}$ the magnitude of the corresponding increment 156 of the first digit. Similarly, a third increment 170 being $\frac{1}{10}$ the magnitude of increment 158 is added. Since it exceeds the analog voltage the increment 170 is subtracted out at 172. The fourth and last increment of the second digit is added at 174 and is $\frac{1}{10}$ the magnitude of the corresponding increment 162. This increment too, produces a comparison voltage in excess of the analog voltage and is subtracted out at 176.

Succeeding steps can be taken at $\frac{1}{100}$ and $\frac{1}{1000}$ and so on of the original amplitude thereby generating a comparison voltage of the required precision. It is apparent that it is possible to generate binary coded non-binary comparison voltages in a similar manner with 4, 4, 2, 1, with 8, 4, 2, 1, or with any other binary related groups of increments or steps.

Figure 11:
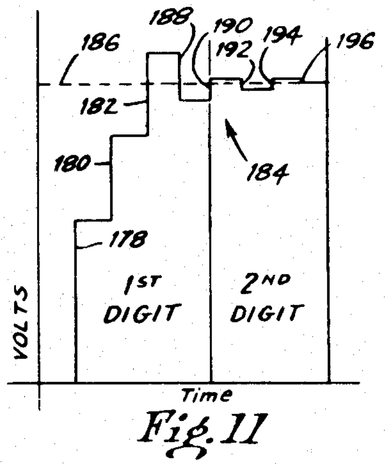
FIGURE 11 shows a second program for the synthesis of a comparison or analog output voltage for binary coded-non-binary conversions (4–2–2–1 binary decimal code shown)

FIGURE 11 illustrates the manner in which the comparison voltage is synthesized in another form of binary coded non-binary analog to digital and digital to analog converter. In FIGURE 11 the system shown is also for a 4, 2, 2, 1 binary coded decimal conversion. The first increment 178 is again four units high while the second and third increments 180 and 182 are again two units high in magnitude. The third increment again brings the comparison voltage generally indicated at 184 above the analog voltage 186 represented in conjunction with the voltage and time axis in the manner of the previous figure. However, the increment 182 is not subtracted out as in FIGURE 10 but rather the fourth increment of magnitude 1 is subtracted from the comparison signal to bring it below the analog voltage 186. The resulting comparison signal represents the first digit.

The second digit is comprised of four successive increments of relative magnitude 4, 2, 2, 1. Each of these increments is $\frac{1}{10}$ the size of the corresponding increment of the first digit. As seen in FIGURE 11, increment 190 of a magnitude of $\frac{4}{10}$ unit is added to the comparison voltage and causes it to exceed the analog voltage 186. For this reason, the second increment 192 of magnitude 0.2 is subtracted from the comparison signal bringing it below the analog voltage. The third increment of 194 of magnitude 0.2 is added and the fourth increment 196 of magnitude 0.1 is subtracted. As before, increment 190 is $\frac{1}{10}$ the size of increment 178, increment 192 is $\frac{1}{10}$ the size of increment 180, increment 194 is $\frac{1}{10}$ the size of increment 182 and increment 196 is $\frac{1}{10}$ the size of increment 188.

Succeeding groups of four steps each can be then taken at $\frac{1}{100}$ and $\frac{1}{1000}$ and so on of the original amplitudes thereby generating a comparison voltage of the required accuracy. This process, too, can be used with other binarily related amplitudes such as 4, 4, 2, 1 and 8, 4, 2, 1 as well as for other related amplitudes and for number bases other than 10. It is apparent that the programs of FIGURES 10, 11 are similar to the programs of FIGURES 6 and 7, respectively.

The meanings of certain terms and expressions as used in this application will be defined as follows:

*Reversible analog to digital converter.*—An apparatus which may be used to convert analog quantities into digital quantities or to convert digital quantities into analog quantities. The unqualified word "converter" will also be used to designate a reversible analog to digital converter.

*Encoding period.*—The time required to convert from an analog quantity into the equivalent digital quantity or to convert a digital quantity into the equivalent analog quantity.

*Bit period.*—The time required to determine one binary digit in the digital output of an analog to digital converter from which the output is a digital quantity having a binary number base.

*Arithmetic node.*—A point in a circuit at which two or more quantities such as voltages, come together and at which additions and/or subtractions among the quantities take place.

*Gating.*—The enabling of a device to operate upon receipt of an enabling or gating signal. Except for the duration of the gating signal, the device is inoperative.

*Digit period.*—In analog to digital conversions to numbers having a number base other than 2, the digit period is the time required to determine one of the digits in the output number.

*Comparator.*—A device having one input terminal, two output terminals, and provision for gating. Upon receipt of the gate pulse, the comparator produces a pulse on one of its outputs if the input voltage is positive, and a pulse on the other output if the input voltage is negative. Furthermore, the comparator embodies means whereby the occurrence of a pulse at one output prevents the occurrence of a pulse at the other output during a single gate pulse. In the converter systems to be described the output pulses from the comparator control certain switching operations. Under some circumstances, a switching operation may cause the voltage at the input to the comparator to change polarity, and if the change in polarity occurred before the end of the gate pulse, pulses would appear at both outputs of the comparator. The appearance of pulses at both outputs of the comparator would cause improper operation of the converter, and therefore the lockout means is provided in order to avoid such improper operation.

*Unity-gain amplifier.*—An amplifier for which the output voltage is the same as the input voltage in both magnitude and polarity. More strictly, the output voltage is the same as the input voltage when no current is being drawn from the output of the amplifier. Other desirable characteristics of the amplifier are that it has high input impedance, and high current gain from input to output. Also the output impedance should be low.

*Polarity-reversing amplifier.*—An amplifier for which the output voltage is the same as the input voltage in magnitude but opposite in polarity. In cases where the impedance of the load on the output of the amplifier is not large in comparison with the internal impedance of the amplifier, the effect of the load must be taken into account in the design of the amplifier. Usually it is desirable that the input impedance of the amplifier be high.

GENERAL BLOCK DIAGRAM OF REVERSIBLE ANALOG TO DIGITAL CONVERTER

Figure 12:
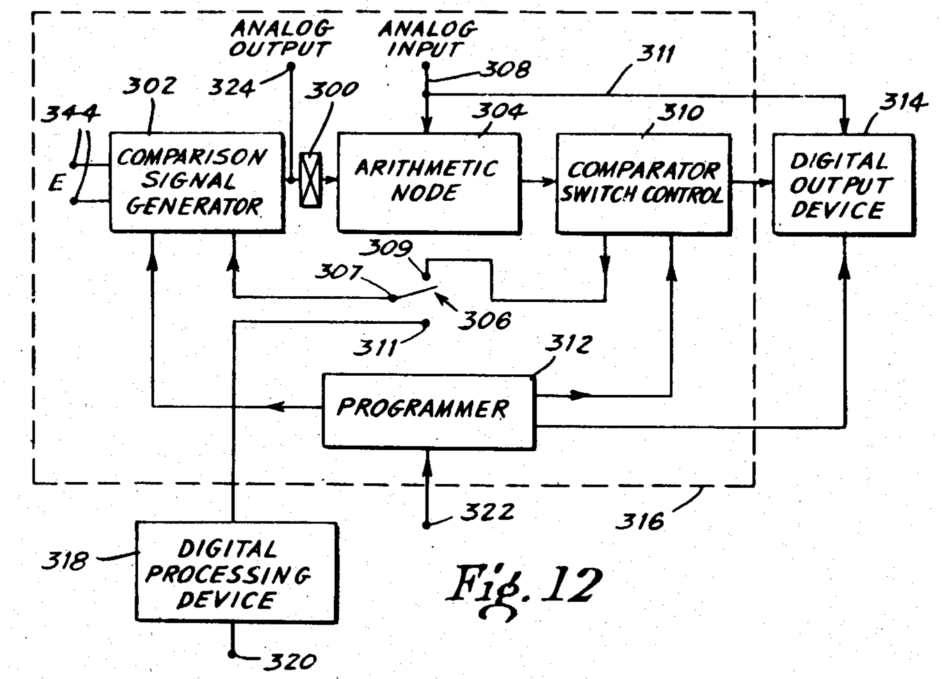
FIGURE 12 shows a block diagram for a reversible analog to digital converter which is generic to the invention.

The general block diagram of a reversible analog to digital converter according to the present invention is shown in FIGURE 12. The operation of the block diagram for analog to digital conversion will be described first, and the operation for digital to analog conversion will be described thereafter.

For analog to digital conversion, the disconnect device 300 is adjusted so that the output of comparison signal generator 302 is connected to the arithmetic node 304. Also the transfer device or switch 306 is set in the upper position as it is viewed in FIGURE 12 with movable contact 307 engaging stationary contact 309. The comparison signal generator synthesizes a quantity which is of the same nature as the analog input. However, as is well known, the output quantity of the comparison signal generator has only certain discrete values. Both the output of the comparison signal generator and the analog input supplied over lead 308 are connected to the arithmetic node 304. The difference between the magnitude of the analog input and the magnitude of the output of the comparison signal generator is formed at the arithmetic node, and this difference is transmitted to the comparator switch control 310 hereafter simplfy referred to as comparator. The comparator may also receive control signals from the programmer 312. The comparator supplies signals to the comparison signal generator 302 which modify the magnitude of the output of the comparison signal generator. The output signal from the comparator is of one type if the analog input is greater than the output from the comparison signal generator and is of a second type if the analog input is less than the output of the comparison signal generator. The programmer supplies control signals to the comparison signal generator, and may supply control signals to the comparator and to the digital output device 314. The basic circuits of the converter are enclosed by the dashed line box 316. The digital output device 314 and the digital processing device 318 are outside the box since in some instances they may be incorporated in auxiliary equipment.

During an analog to digital conversion period, the signals from the programmer and from the comparator cooperate together to cause the output quantity from the comparison signal generator to approach more and more closely to the magnitude of the analog input. In general, the output quantity of the comparison signal generator is increased by increments which have certain definite magnitudes. If a particular increment causes the output of the comparison signal generator to exceed the analog input, the following increment has the opposite sense, and vice versa. The digital number which is the equivalent of the analog input is built up in the digital output device 314 in such form as may be required for utilization. For example, the digital output device may display the number in a counter or other means for visual observation, or the digital output may be mechanical motions or electrical quantities suitable for inputs to computers or control devices. Lead 311 couples the analog input to the digital output for the purposes of calibration and display if desired. This connection is optional. Many types of suitable digital outputs are readily apparent.

For digital to analog conversion, disconnect device 300 is adjusted so that the comparison signal generator 302 is not connected to the arithmetic node 304. Also the transfer 306 is set in the lower position with contact 307 engaging contact 311. The source which supplies digital input signals to terminal 320 must also supply synchronizing signals to terminal 322. The digital processing device 318 converts the digital input signals into a form suitable for controlling the comparison signal generator. The digital control signals cooperate with signals from the programmer to cause the comparison signal generator to synthesize an output which is the equivalent of the digital input. The output of the comparison signal generator thus becomes the analog output and appears at terminal 324. The process by which the comparison signal generator synthesizes the analog output is similar to the process which takes place in an analog to digital conversion. That is, the various digits in the digital input number cause the output quantity of the comparison signal generator to increase or decrease by definite amounts in accordance with the characteristics of each particular digit as illustrated in FIGURES 6–11.

It is to be understood of course that a digital input must not be impressed on the converter when it is being used for analog to digital conversion, and that an analog input must not be impressed on the converter when it is being used for digital to analog conversion.

Figures 13, 14:
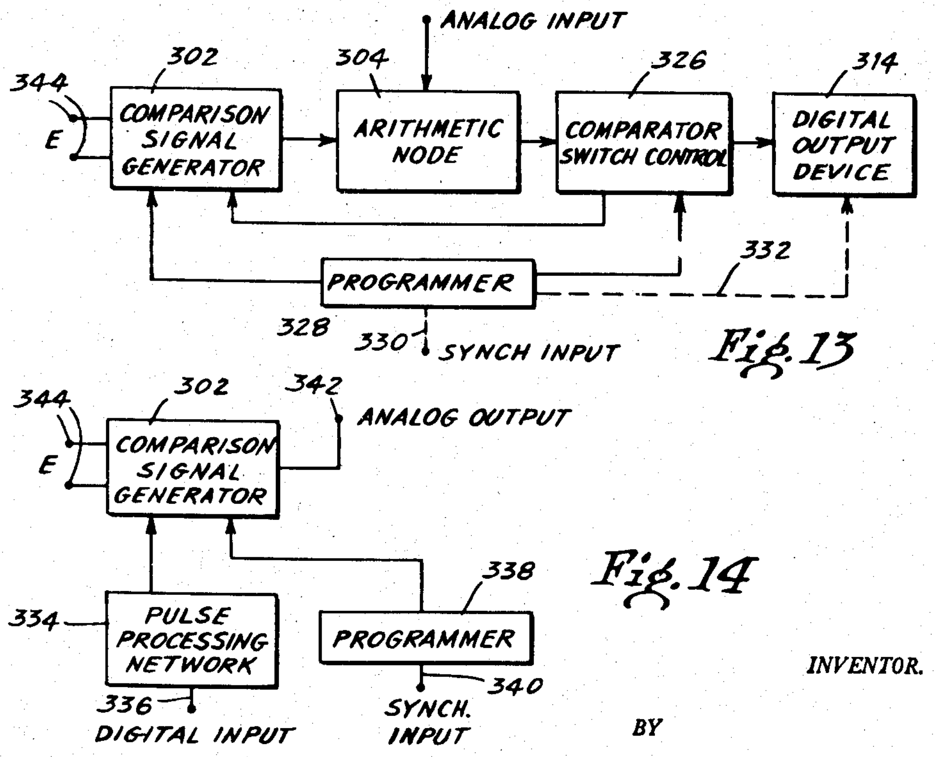
FIGURE 13 shows a block diagram of the analog to digital portion of FIGURE 12 which is generic to the invention.
FIGURE 14 shows a block diagram of the digital to analog portion of FIGURE 12 which is generic to the invention.

FIGURE 13 shows a general block diagram, similar to that of FIGURE 12, of a non-reversible circuit suitable for analog to digital conversion only. In FIGURE 13 the comparison signal generator 302 supplies a signal to the arithmetic node 304 as previously described. The disconnect device 300 shown in FIGURE 12 is omitted from the circuit of FIGURE 13. Connection between the comparator and the comparison signal generator is direct with no transfer device such as device 306 of FIGURE 12 required. In addition, the non-reversible circuit of FIGURE 13 involves no connection between the analog input and the digital output device 314 since this connection in any event is optional and ordinarily is only used for calibration or comparison. A synch input terminal to the programmer 328 is indicated by dashed lines at 330. This synch input may be omitted in all the converters if the programmer comprises a free running multivibrator. Similarly the synch connection from the programmer to the digital output device as indicated by the dashed lead 332 is only necessary in instances when the programmer is not free running.

FIGURE 14 shows a general or basic block diagram for a non-reversible converter constructed along the lines of FIGURE 12 and suitable for digital to analog conversion only. As can be seen the circuit of FIGURE 14 also incorporates the comparison signal generator 302 which forms a basic element of the present invention. A pulse processing network 334 is preferably interposed in the digital input lead 336 which pulse processing network constitutes a simpler form of the digital processing device 318 of FIGURE 12. Programmer 338 with a synch input terminal 340 is also provided. The outputs from the pulse processing network 334 and the programmer 338 are supplied to the comparision signal generator. As in FIUGRE 12 the analog output appears at the output of the comparison signal generator and is taken from terminal 342. Also as in the previous figures the comparison signal generator 302 is connected to a reference source of potential E by way of terminals 344 which if in the form of a battery may comprise a portion of the generator.

It is well known that certain accessories are required for some applications of converters. When the analog input quantity is changing rapidly during an encoding period, a filter and a sample and hold device must be interposed in the analog input lead 308. Moreover, it is sometimes necessary to filter the analog output before it can be used in other equipment. A digital processing device 318 has been shown which converts the digital input into a form which is suitable for controlling the comparision signal generator 302; it is apparent that processing devices may be also required at the other input and output terminals. However, such processing devices are not shown because they are straightforward in design. The digital processing device 318 is shown merely as an indication that many types of digital codes may be converted to equivalent analog quantities by the basic converter. The considerations which are involved in the requirements for filter and for sample and hold devices are explained in the book entitled "Notes on Analog to Digital Techniques" edited by Alfred K. Susskind and published by the Technology Press of Massachusetts Institute of Technology and John Wiley & Sons, Inc. Sample and hold devices will be embodied by way of example in some of the converters to be described hereinafter, but the incorporation of filters where desirable is considered obvious and will not be discussed further.

COMPLETE CONVERTER SYSTEMS OF BN1 TYPE

The circuit of a complete converter system is shown in FIGURE 15. This converter system converts electrical analog voltages to binary numbers and binary numbers to analog voltages. The operation of the system as an analog to digital converter will be described first, and operation as a digital to analog converter will be described thereafter. The identifying number system BN1 defines the comparison signal generator of the system as (B) binary base (N) with no delayed feedback and (1) of the first type most easily distinguished by the fact that it involves either 5 or 6 capacitors.

Two batteries are shown at 350 and 352 with polarities as indicated. The batteries have the same voltage E. The batteries are connected to capacitors 354, 356, 358, 360, 362, 364 through switches 366, 368, 370, 372, 374, 376. Also, switches 378, 380, 382 are connected across capacitors 362, 358, 364, respectively. For convenience of explanation, these switches will be assumed to be magnetically operated relays with normally open contacts; that is, the contacts of a relay are open when no current is flowing through its coil. However, other types of switches, including electronic switches, may be used, and this subject will be discussed later. Capacitors 358 and 364 are connected to a summing amplifier 384 which is so designed that its output voltage $e_0$ is equal to the sum of the two voltages at its input terminals. Thus, the voltage $e_0$ appears on wire 386. Wire 386 is connected to a manually operated triple pole double throw switch 388, the three moving arms of the switch are joined by a dashed line to show the mechanical connection between them. For analog to digital conversion, the arms of switch 388 must all be in the up position as the switch appears in FIGURE 15, and the output of amplifier 384 is thereby impressed on one of the input terminals of the arithmetic node 390.

The analog input voltage enters the converter through terminal 392, and proceeds through a second arm of switch 388 to wire 394. From wire 394 the analog input voltage is impressed on the second input terminal of arithmetic node 390 either directly through switch 396 or through polarity-reversing amplifier 398 and switch 400. The polarity-reversing amplifier, as previously defined herein, has the characteristic that the voltage at its output is the same in magnitude as but opposite in polarity to the voltage at its input. Such amplifiers are well known, and will not be described further. The coils of switches 396 and 400 are energized by flip-flop 402. The flip-flop is triggered by pulses from lead E of the programmer 404 and also by pulses from comparator output wire 406 through switch 408 which is closed in the first bit period by programmer output F. The general function of polarity-reversing amplifier 398, switches 396 and 400 and flip-flop 402 is to accommodate analog input voltages of either positive or negative polarity, and to supply analog output voltages of either positive or negative polarity.

The output of arithmetic node 390 is applied to the input of comparator 410 through the third arm of ganged switch 388. Suitable circuits for the comparator and for the arithmetic node are shown in FIGURES 23 and 24, respectively, and will be described later. The functions of the arithmetic node and of the comparator have been defined previously. The two outputs of the comparator energize the coils of switches 376 and 378, and also these outputs are supplied to the digital output device 412. The digital output device may take a variety of forms depending upon the use which is to be made of the digital output. One of these forms is illustrated in FIGURE 27, and will be described below.

The programmer 404 operates switches 366, 368, 370, 372, 374, 380, 382, as shown by the connections labelled A, B, C, D in FIGURE 15. The programmer also supplies a gate signal to comparator 410 through connection G, and operating signals to the digital output device 412 through connection H. Connection H may consist of one or more wires, depending upon the construction of the digital output device The programmer contains provision for synchronizing input signals through terminal 414. It is well known that converters frequently must be synchronized with other equipment for analog to digital conversion, and for digital to analog conversion it is essential that the switching operations of the converter be synchronized with the digital input signal.

For digital to analog conversion the arms of switch 388 are moved to the down position as illustrated in FIGURE 15 and the digital input voltage enters the converter through terminal 416. Digital inputs may occur in various forms, and a pulse processing network 418 generally will be required to convert the digital input into a train of pulses suitable for operation of the circuit in FIGURE 15. The analog output voltage appears at terminal 420. The polarity of the analog output voltage is determined by switches 396 and 400 which in turn are controlled by flip-flop 402 as for analog to digital conversion. A pulse processing network and the operation of switches 396 and 400 for a typical digital input pulse train will be described later.

For analog to digital conversion, the comparison voltage $e_0$ is generated by capacitors 354, 356, 358, 360, 362, 364, the switches associated with these capacitors, and amplifier 384 which constitutes the comparison voltage generator. This comparison voltage is compared with the analog input voltage in arithmetic node 390. Several modes of operation are possible as will be described hereinafter, but in order to improve the clarity of the present description it is assumed that the polarities of batteries 350 and 352 are as shown. It will be clear presently that the output of amplifier 384 is positive, and it is further assumed that the arithmetic node subtracts the comparison voltage from the voltage on wire 422. In other words, if the voltage on wire 422 is $e_{in}$, the voltage at the output 424 of the arithmetic node is $e_{in}-e_0$. For reasons which will become clear later, switches 396 and 400 are operated so that the voltage on wire 422 is always positive. Thus, if the analog input voltage is positive, switch 396 is closed and switch 400 is open. On the other hand, if the analog input voltage is negative, switch 400 is closed and switch 396 is open. In the latter event, the analog input voltage passes through the polarity-reversing amplifier 398 before it reaches wire 422.

For binary operation of the converter it is necessary that capacitors 354 and 356 be equal, and that capacitor 358 be large in comparison with capacitors 354 or 356. Likewise, capacitors 360 and 362 must be equal, and capacitor 364 must be large in comparison with capacitors 360 or 362. The capacities of capacitors 354, 356, 358, 360, 362, 364 will be designated by $C_1$, $C_2$, $C_3$, $C_4$, $C_5$, $C_6$, respectively. Therefore $$C_1=C_2 \quad (23)$$

$$C_4=C_5 \quad (24)$$

Also it is necessary that $$\frac{C_2}{C_3}=\frac{C_5}{C_6} \quad (25)$$

At the start of an encoding period of analog to digital conversion, the first bit is devoted to switching operations related to the polarity of the analog input voltage. Switches 380 and 382 are closed and opened, thereby discharging capacitors 358 and 364. At the same time, the flip-flop 402 is reset by a pulse from programmer lead E so that switch 396 is closed and switch 400 is open; this state of the flip-flop will be referred to as state 1. Upon completion of this first portion of the first bit period, the output voltage of amplifier 384 is zero, and the voltage on wire 422 has the same polarity as that of the analog input voltage. Therefore, the voltage at the output of the arithmeic node 390 also has the same polarity as the analog input voltage. During the second portion of the first bit period, no switching operations take place in order that output pulses from the comparator may be uniformly spaced in time relationship. In the third portion of the first bit period, the comparator 410 receives a gate pulse from lead G of the programmer 404. In accordance with the definition of a comparator which was stated previously, a pulse will then appear on lead 426 if the input to the comparator is positive, and a pulse will appear on lead 406 if the input to the comparator is negative. In the event that a pulse occurs on lead 406, the pulse is transmitted to the flip-flop through switch 408, and the flip-flop is thereby triggered to its other stable state, that is, to state 2. This action closes switch 400 and opens switch 396 and therefore polarity-reversing amplifier 398 is connected into the circuit. Switch 408 is closed only during the third portion of the first bit period; hence pulses occurring at any other time on lead 406 will have no effect on the flip-flop, and the flip-flop remains in the same state during the remainder of the conversion period. It will be clear from the foregoing description that the voltage on wire 422 at the end of the first bit period will be positive for either polarity of the analog input voltage.

In the preceding paragraph it was stated that a pulse will occur either on wire 426 or on wire 406 in the first bit period. This pulse will operate switch 378 or switch 376 in addition to triggering the flip-flop when it occurs on wire 406. Although operation of switch 376 or switch 378 in the first bit period produces no useful result, nevertheless such operation is not harmful. If switch 378 is closed, there can be no effect on capacitor 364 since switch 376 remains open. It will be explained below that capacitor 362 is in a discharged condition at the end of each bit period. Therefore, if switch 376 is closed, capacitor 362 is placed in parallel with capacitor 364 which has just been discharged, and the voltage on the capacitors remains zero. Switches 376 and 378 could, of course, be deactivated during the first bit period by electromagnets or other obvious means.

At the start of the second bit period, switches 366, 368, 372, 374 are closed and opened. These operations charge capacitors 354 and 356 to the voltage E with respect to ground; and capacitors 360 and 362 are charged to the voltage —E with respect to ground. In the second portion of the second bit cycle, switch 370 is closed and opened, after which the voltage on capacitor 358 is $$E\frac{C_2}{C_3}$$

in accordance with Equation 2. As noted in the discussion of Equation 2 hereinabove, this value of the voltage is not exact but is approximate, and other approximate values of voltages will be used hereafter. However, in the interests of simplification and clarity the word "approximate" will not be repeated each time an approximate value is used, but only in cases where obscurity would result from omission of the word. Since no charge has yet been placed on capacitor 364, the voltage across it is zero, and the voltage at the output of amplifier 384 is therefore $$E\frac{C_2}{C_3}$$

If this voltage is less than the magnitude of the analog input voltage the output voltage of the arithmetic node 390 will be positive. For this case a pulse will occur on lead 426 when the comparator receives a gate pulse in the third portion of the bit period. The pulse on wire 426 will close switch 378, and capacitor 362 thereby will be discharged, after which switch 378 will open.

On the other hand, if $$E\frac{C_2}{C_3}$$

is greater than the magnitude of the analog input voltage, the output of the arithmetic node will be negative. Therefore, when the comparator receives the gate pulse, a pulse will occur on wire 406. This pulse will close switch 376 and the voltage on capacitor 364 will become $$-E\frac{C_5}{C_6}$$

switch 376 then opens. By virtue of Equation 25 the two voltages at the inputs of amplifier 384 will be equal in magnitude, and since they are opposite in polarity the output of the amplifier will be zero.

The operations which were described in the two preceding paragraphs determine the most significant digit of the binary number which is the equivalent of the magnitude of the analog input voltage. The first case, for which $$E\frac{C_2}{C_3}$$

is less than the magnitude of the analog input voltage, corersponds to a binary 1 for the most significant digit. The second case, for which $$E\frac{C_2}{C_3}$$

is greater than the magnitude of the analog input voltage, corresponds to a binary 0 for the most significant digit.

The program for determining the remaining digits of the binary number differs from the program for determining the most significant digit and will now be described. First, it is necessary to consider the charges which remain on capacitor 356 after switch 370 is closed and opened and on capacitor 362 after switch 376 or 378 is closed and opened. From the discussion of Equation 3 it will be understood that nearly all of the charge on capacitor 356 is transferred to capacitor 358 when switch 370 is closed inasmuch as capacitor 358 is much larger than capacitor 356. Therefore, to a good approximation capacitor 356 may be considered to be uncharged when switch 370 is opened. A similar statement applies to the charge on capacitor 362 after switch 376 is closed and opened. It is obvious that when switch 378 is closed and opened, capacitor 362 is completely discharged.

The determination of the second most significant digit of the binary number begins with the closing and opening of switches 368 and 374. Since capacitors 356 and 362 are essentially uncharged, and since capacitors 354 and 356 are equal in capacity, and since capacitors 360 and 362 are equal in capacity, the voltage on capacitors 354 and 356 after switch 368 has been closed and opened is $E/2$; similarly the voltage on capacitors 360 and 362 after switch 374 has been closed and opened is $-E/2$. In the next portion of the second bit period, switch 370 is closed and opened. After this operation the voltage on capacitor 358 is $$\frac{3}{2}E\frac{C_2}{C_3}$$

which can be understood from the discussions of Equations 2 and 3. This voltage produces a new comparison voltage at the output of amplifier 384 which is compared with the magnitude of the analog input voltage in the arithmetic node 390. That is, an increment $$\frac{1}{2}E\frac{C_2}{C_3}$$

is added to the comparison voltage which existed at the completion of the second bit period. As in the determination of the most significant digit, if the output of the arithmetic node is positive, a pulse occurs on wire 426 when the comparator receives a gate pulse. The pulse on wire 426 closes and opens switch 378. On the other hand, if the output of the arithmetic node is negative, a pulse occurs on wire 406 when the comparator receives a gate pulse. The pulse on wire 406 closes and opens switch 376. If a pulse occurs on wire 426 the second most significant digit is 1, and if a pulse occurs on wire 406 the second most significant digit is 0.

The determinations of the remaining digits of the binary number follow the pattern which was described for the second most significant digit. In general, switches 368 and 374 are closed and opened. The charges which remained on capacitors 354 and 360 from the previous bit period are thereby divided in half, and the voltages which appear on capacitors 356 and 362 are one half the voltages which appeared on these capacitors at the corresponding point in the previous bit period. Switch 370 is next closed and opened, which establishes a new comparison voltage by adding an increment to the previous comparison voltage. Moreover, each increment is one-half the magnitude of the increment in the previous bit period. If the new comparison voltage is less than the magnitude of the analog input voltage, switch 378 is closed and opened, discharging capacitor 362. In this event the binary digit is 1. On the other hand, if the comparison voltage is greater than the magnitude of the analog input voltage, switch 376 is closed and opened, and the charge on capacitor 362 is transferred to capacitor 364. In the latter event, the comparison voltage is reduced to the value it had at the end of the previous bit period, and the binary digit is 0. These operations are repeated until the desired number of digits have been determined.

To summarize the foregoing description, in each bit period, a new comparison voltage is formed by adding an increment to the comparison voltage which existed at the end of the previous bit period. For conversion to binary numbers the magnitude of the increment in any bit period is one half the magnitude of the increment in the preceding bit period. If the addition of the increment causes the comparison voltage to exceed the magnitude of the analog input voltage, the increment is subtracted out from the comparison voltage. On the other hand, if the addition of the increment does not cause the comparison voltage to exceed the magnitude of the analog input voltage, the increment remains in the comparison voltage. This program for synthesizing the comparison voltage is the same as that illustrated in FIGURE 6.

FIGURES 16 and 17 are block diagrams for non-reversible circuits based upon the converter of FIGURE 15 with the circuit of FIGURE 16 showing an analog to digital converter only and the circuit of FIGURE 17 a digital to analog converter only. The circuits of FIGURES 16 and 17 may be used individually or may be used in end-to-end combination with a transmission medium of some type in between. For example, the analog to digital converter of FIGURE 16 might be used to convert analog information into digital information which would be telemetered from an aircraft vehicle or the like in digital form and received at a ground station incorporating the circuit of FIGURE 17. Hence, the digital output of the circuit of FIGURE 16 might constitute the digital input of the circuit of FIGURE 17 which at the ground station would then reconvert the digital information back to analog form for the purposes of visual display or for recording or the like.

For analog to digital conversion the gang switch of FIGURE 15 is omitted and direct connections employed. The corresponding parts in FIGURE 16 bear like reference numerals and serve the same functions as that described in conjunction with FIGURE 15. The analog to digital converter of FIGURE 16 incorporates the same programmer having outputs A, B, C, and D. The analog input is supplied to reversing amplifier 398 over lead 432. The digital output as in FIGURE 15 is taken from lead 426 which experiences a pulse whenever the output from the comparator is positive. The presence of a pulse on lead 426 indicates that the comparison voltage is less than the analog voltage and that the particular binary digit is 1. The presence of an alternative pulse on lead 406 and therefore the absence of a pulse on lead 426 so that no pulse appears on the digital output lead indicates that the binary value for that digit is 0.

In FIGURE 17 the programmer 430 is again employed having the four output leads A, B, C and D in addition to the comparator lead G. The digital input is by way of lead 436 to pulse processing network 418. The analog output is taken from lead 438 at the output of amplifier 384.

Figure 18:
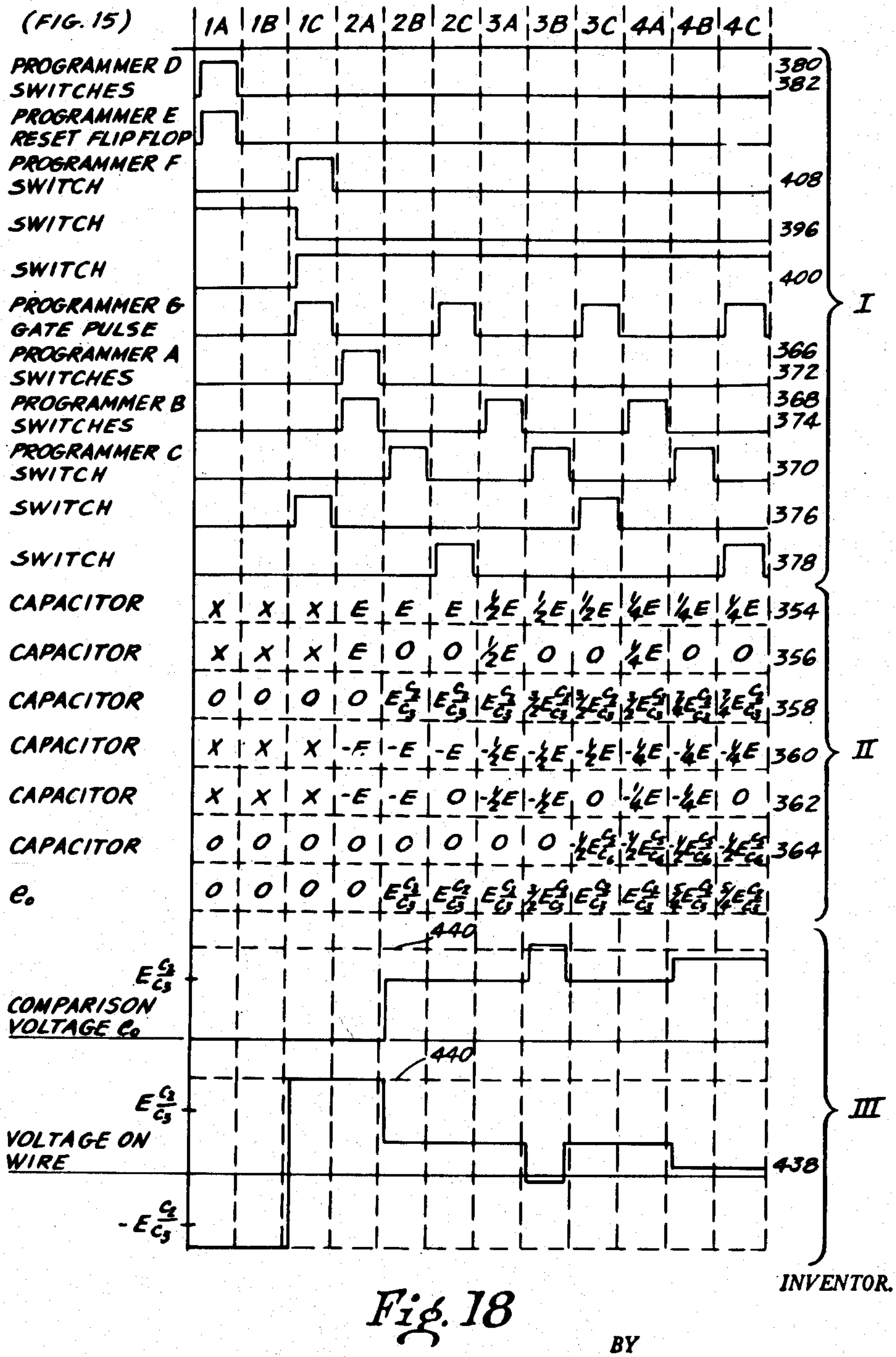
FIGURE 18 shows the timing and voltage relationships for the devices shown in FIGURES 15, 16 and 17 for 3 part bit periods.

In order to illustrate more clearly the operation of the converter systems which are shown in FIGURES 15–17, the switching operations are shown in FIGURE 18 for an analog input voltage for which the algebraic sign and three most significant digits of the equivalent digital number are −101. In accordance with the explanation in the preceding paragraphs, each bit period is divided into three portions. As will be explained later, the switching operations may be programmed so that the bit periods consist of only two portions, which results in a substantial reduction in the duration of a complete encoding period. However, the three-part bit period is easier to explain and therefore it is described first. The operations of the switches are illustrated in FIGURE 18 wherein the three portions of each bit cycle are separated by dashed vertical lines and are labelled A, B, and C. The horizontal axes all represent time, and the vertical axes of the graphs labelled I represent current. The graphs for the switches represent currents in the coils of the switches as functions of time. The voltages on the capacitors and the comparison voltage $e_0$ are shown in tabular form in FIGURE 18 in the group labelled II. The comparison voltage and the voltage at the input to the comparator wire 438 are shown graphically in the group labelled III. In group III, the horizontal axes represent time and the vertical axes represent voltage, and the magnitude of the analog input voltage is shown by dashed horizontal line 440. In group II the mark X represents voltage from the previous encoding period.

With reference to group I, switches 380 and 382 are closed and opened in the first portion of the first bit period. Also, the flip-flop 402 is reset to state 1 for which switch 396 is closed and switch 400 is open. Since the analog input voltage has been assumed to have a negative polarity and since the comparison voltage is zero, as was described above, the voltage at the input to the comparator 410 is negative. Therefore, when the gate pulse is impressed on the comparator in the third portion of the bit period, a pulse occurs on wire 406. Also in the third portion of the bit period, switch 408 is closed, and hence the pulse on wire 406 is conducted to the flip-flop. The pulse reverses the state of the flip-flop, that is, the flip-flop is triggered to state 2. This action opens switch 396 and closes switch 400. In accordance with previous description, these operations connect polarity-reversing amplifier 398 into the circuit, and the voltage on wire 422 becomes positive. The pulse on wire 406 also closes switch 376 but this is not harmful as was explained above.

In the first portion of the second bit period, switches 366, 368, 372, 374 are closed and opened, capacitors 354, 356 thereby being charged to the voltage E, and capacitors 360, 362 to −E. In the second portion of this bit period, switch 370 is closed and opened, which charges capacitor 358 to the voltage $$E\frac{C_2}{C_3}$$

Since it has been assumed that the most significant digit in the binary number which is the equivalent of the magnitude of the analog input voltage is 1, the voltage $$E\frac{C_2}{C_3}$$

is less than the voltage on wire 422. Therefore, when the gate pulse is applied to the comparator in the third portion of the bit period, a pulse occurs on wire 426 which pulse closes and opens switch 378. Thus, capacitor 362 is discharged, and the charge on capacitor 364 remains zero. The second bit period is now complete.

Swtiches 368 and 374 are closed and opened in the first portion of the third bit period, the voltages on capacitors 354 and 356 thereupon being E/2. Similarly, the voltages on capacitors 360 and 362 are E/2. In the second portion of this bit period, switch 370 is closed and opened, whereupon the voltage on capacitor 358 becomes $$\frac{3}{2}E\frac{C_2}{C_3}$$

In accordance with the assumption that the second most significant digit of the binary number is 0, this voltage is greater than the voltage on wire 422, and therefore the input voltage to the comparator is negative. It follows from previous description that a pulse occurs on wire 406 when the comparator receives the gate pulse in the third portion of the bit period. The pulse on wire 406 closes and opens switch 376, and capacitor 364 becomes charged to a voltage $$-\tfrac{1}{2}E\frac{C_5}{C_6}$$

By virtue of Equation 25, the voltage at the output of amplifier 384 is reduced to $$E\frac{C_2}{C_3}$$

which is just the value it had at the end of the second bit period.

In the fourth bit period, switches 368 and 374 are closed and opened, after which switch 370 is closed and opened. The comparison voltage then becomes $$\frac{5}{4}E\frac{C_2}{C_3}$$

Since the third most significant digit of the binary number is assumed to be 1, this voltage is less than the magnitude of the analog input voltage. Therefore, switch 378 is closed and opened in the third portion of this bit period.

If more than three significant digits are required in the binary number, digits of lower significance are determined by programs which are similar to those described above for the third and fourth bit period.

In FIGURE 18 as in FIGURES 6–11 the transitions from one voltage to another are shown as if they occurred instantaneously but this is not the case in actual apparatus. It is well known that the charging of a capacitor requires a definite time interval which is greater than zero, and that in practice the vertical lines representing changes in voltage would be curved and would slope to the right. However, the straight vertical lines in FIGURE 18, group III, illustrate the operation of the circuit satisfactorily, and, as noted previously, present a much clearer picture. Furthermore, the bit periods in FIGURE 18 have been shown divided into three equal portions, but in practice this is not necessary and the portions may be greater or less in number and may be equal or unequal.

FIGURE 19 shows a programmer circuit suitable for use in the systems of FIGURES 15, 16 and 17 which operate with three part bit periods. In FIGURE 19, a battery 442 of sufficient size to provide a switch closing current through the coils of the switches of the circuits of FIGURES 15 through 17 is connected to the movable wiper contacts 444, 446, 448, 450, 452, 454, 456, and 458 of a series of stepper switches A, B, C, D, E, F, G, and 460, the latter providing a gate-off pulse to flip-flop 464. When the wiper arms of the stepper switches are in the home position against the leftmost stationary contact of each switch as illustrated in FIGURE 19, stepper switch 460 connects the battery 442 through lead 458 and stationary contact 462 so as to apply a gate-off signal to the flip-flop 464 by way of lead 466. The stepper switches are actuated by a stepping mechanism 474 driven by clock 472 while the flip-flop is controlled by gate-on pulses from a synch source through lead 468.

The stationary contacts of the stepper switches are shown in rows but it is to be understood that these contacts are actually arranged in circles so that the righthand contact in each row as illustrated in the drawing is actually adjacent to the lefthand contact in the physical circle as acually constructed. In other words, when the moving arm steps from the righthand contact it arrives on the lefthand contact. The steppng mechanism 474 contains an electromagnet, a ratchet, and mechanical linkages which move the stepper arms through one step each time the electromagnet is energized. Suitable stepping switches of this type are commercially available.

The clock 472 may be of various types and for example may include a multivibrator which is designed for good frequency stability. The requirement for frequency stability is because the clock in the analog to digital converter and the clock in the digital to analog converter must remain substantially in synchronism during a coding period. If the digital to analog converter receives the signals from some source other than a corresponding analog to digital converter, that is, for example, from a computer, the clock rate must be adjusted to the rate of the other source. Similarly if the analog to digital converter supplies a signal to apparatus which requires a particular pulse rate, the clock rate must be correspondingly adjusted. For very precise synchronization in either analog to digital or digital to analog conversions a synchronizing pulse may be supplied for each bit period instead of once for each encoding period. However, synchronizing the clocks in each bit period leads to no special problems and is readily apparent.

The clock 472 in the programmer of FIGURE 19 emits three pulses per bit period which corresponds to the number of portions in each bit period as previously described. The clock must also have means whereby it may be started and stopped and the flip-flop gate circuit is provided for this reason. The flip-flops are standard gating circuits which provide voltages which operate the multivibrator clock circuits and thereby turn the clocks on and off. When the flip-flop is in one state, the clock is gated off and vice-versa.

When power is supplied to a converter system including the programmer it is possible that the arms of the stepping switch may be on other than the lefthand contact and that the clock may be gated off by the flip-flop. In order to assure proper operation of the converter system in the first encoding period after the power is turned on, it is necessary prior to the first synchronizing pulse to set the stepping switch arm on the lefthand contact and to set the flip-flop so that the clock is gated off. These operations may be acomplished by various means such as a push button switch or the like which means are straightforward.

At the beginning of an encoding period before the arrival of the first synchronizing pulse the movable wiper arms of the stepping switch are resting on the lefthand contacts and the clock is turned off. The synchronizing pulse triggers the flip-flop to its other state for which action it is necessary that the pulse over-ride the voltage being received from the bottom bank or row of contacts on the stepping switch. This action is simply accomplished. When the flip-flop arrives in its other state, the clock starts running and each pulse from the clock actuates the stepping mechanism to step the moving arms one step to the right. The moving wiper arms apply the battery voltage to the stationary contacts and thus to the output leads which are connected to them. As noted above, when the moving arms step from the extreme righthand contact, they arrive back at the lefthand contact whereupon the voltage is applied to the flip-flop which reverses its state and thereby turns off the clock and stops the stepping operation. The programmer then remains quiescent until the next synchronizing pulse arrives. It is possible of course that the next synchronizing pulse would arrive simultaneously with the step to the lefthand contact and in this case a new encoding period is initiated immediately upon completion of the preceding period. It is possible to completely eliminate the lefthand colume of contacts in which case the quiescent position of the wiper arms is the contacts which are in the second column from the lefthand side in FIGURE 19. Certain of the switches in the converter system would then be energized in the quiescent state but this is not harmful. The stepping switches of the programmers disclosed in this application are all quite similar except that the number of stationary contacts vary in particular cases.

The switching operations for a two-part bit period will now be described with reference to FIGURE 15. The switching program is shown in FIGURE 20, group IV, and is also for an analog input voltage for which the algebraic sign and three most significant digits of the digital equivalent are −101. The voltages on the capacitors and the comparison voltage are shown in FIGURE 20, group V, and the comparison voltage and the voltage on wire 438 are shown in group VI. In the first half of the first bit period, switches 380 and 382 are closed and opened, and the flip-flop 402 is reset to state 1 for which switch 396 is closed and switch 400 is open. At the end of this interval, in accordance with previous description, the voltage on wire 438 has the same polarity as the analog input voltage. Since the polarity of the analog input voltage is assumed to be negative, a pulse occurs on wire 406 when comparator 410 receives a gate pulse in the second half of the first bit period. This pulse on wire 406 triggers the flip-flop to state 2, thereby opening switch 396 and closing switch 400. Switch 408 is closed during this interval in order that the pulse may reach the flip-flop. The pulse on wire 406 also closes and opens switch 376. However, as will be clear from a later description, the charge on capacitor 362 is zero, and therefore this switch operation is not harmful. Moreover, if a pulse occurs on wire 426 instead of wire 406 switch 378 is closed and opened, but this operation also is not harmful as was previously described. Furthermore, in the second half of the first bit period, switches 366 and 368 are closed and opened, which charges capacitors 354 and 356 to the voltage E.

In the first half of the second bit period, switch 370 is closed and opened and capacitor 358 is thereby charged to the voltage $$E\frac{C_2}{C_3}$$

which is also the value of the comparison voltage since capacitor 364 is uncharged. Simultaneously, switches 372 and 374 are closed and opened, charging capacitors 360 and 362 to the voltage E. In accordance with the assumption that the most significant digit of the binary number is 1, the voltage $$E\frac{C_2}{C_3}$$

is less than the magnitude of the analog input voltage, and therefore the voltage on wire 438 is positive. Accordingly, a pulse occurs on wire 426 when the comparator receives a gate pulse in the second half of this bit period. The pulse on wire 426 closes and opens switch 378 and capacitor 362 is discharged. Therefore the comparison voltage remains $$E\frac{C_2}{C_3}$$

Also in the second half of this bit period, switch 368 is closed and opened, after which the voltage on capacitors 354 and 356 is ½E.

In the first half of the third bit period, switch 370 is closed and opened, whereupon the voltage on capacitor 358 and the comparison voltage become $$\frac{3}{2}E\frac{C_2}{C_3}$$

Also switch 374 is closed and opened, and capacitors 360 and 362 both assume the voltage ½E. Since the second most significant digit of the binary number has been assumed to be 0, the voltage $$\frac{3}{2}E\frac{C_2}{C_3}$$

is greater than the magnitude of the analog input voltage. Therefore a pulse occurs on wire 406 in the second half of this bit period, and switch 376 is closed and opened. Capacitor 364 is thereby charged to the voltage $$-\tfrac{1}{2}E\frac{C_2}{C_3}$$

and the comparison voltage is reduced to $$E\frac{C_2}{C_3}$$

Switch 368 is also closed and opened in the second half of this bit period, after which the voltage on capacitors 354 and 356 is ¼E.

Digits of lower significance may be determined by programs similar to those for the second and third most significant digits described above.

FIGURE 22 shows a programmer for a two portion bit period system as is illustrated in FIGURE 20 rather than the three portion bit period illustrated in FIGURE 18. As can be seen in FIGURE 22, the number of stationary contacts in excess of the home contact in each bank is eight corresponding to the number of portions in the four bit periods of FIGURE 20. This number is less than the twelve illustrated in FIGURE 19, which corresponds to the number of portions in the four bit periods illustrated in FIGURE 18. In FIGURE 22 the stepping mechanism, flip-flop, and gate pulses operate in a manner similar to that described with respect to FIGURE 19. However, the quiescent state of the stepper switches is not on the lefthand contact as in FIGURE 19 but rather is on the second-to-left contact. The gate-off pulse passes from the battery through the uppermost of the wiper arms, the stationary contact 475 and lead 473 connected to the upper stepper switch. It is apparent that the entire programmer in FIGURE 22 is somewhat simpler and employs a reduced number of stationary contacts.

It was stated hereinabove that switch 376 or switch 378 is operated in each bit period depending upon the polarity of the output of arithmetic node 390, in other words depending upon whether $e_{in}-e_0$ is greater or less than zero. However, the performance of the converter can be improved by a slightly different rule for operation of these switches for the reason illustrated in FIGURE 21. It is well known that conversion of an analog quantity into an equivalent digital number necessarily involves quantization. For example, in FIGURE 21 the marks 1, 10, 11, 100, 101, etc. on the vertical axis represent the magnitudes which a digital number may have. On the other hand, an analog quantity may correspond to any point on the vertical axis. A conversion in accordance with the descriptions previously given herein would assign the binary number 0 to all analog quantities between the horizontal axis and the mark on the vertical axis which is labelled 1; similarly, all analog quantities between marks 1 and 10 would be assigned the binary number 1. However, a preferred mode of operation would assign the number 0 to analog quantities between the horizontal axis and the dashed horizontal line 480 which is located midway between the horizontal axis and mark 1. The binary number 1 would be assigned to analog quantities between dashed lines 480 and 482 and so on. In order to attain this mode of operation, switches 376 and 378 must be operated in accordance with the following inequalities:

$e_{in}-e_0 > \delta$ Switch 378 operates to $e_{in}-e_0 \geqslant \delta$ Switch 378 operates In the above inequalities, $\delta$ is a quantity which represents one half of the magnitude of the least significant digit, in other words, one half of the distance between the marks, 1, 10, etc. This mode of operation may be obtained by a number of methods, several of which will be described by way of example. A bias can be inserted into the arithmetic node 390 so that its output voltage is $-\delta$ when the comparison voltage equals the input voltage. Similarly, a bias can be put into amplifier 384 or into comparator 410. Since the explanation of this mode of operation in connection with each of the converter systems described herein would add substantially to the complexity of the explanations, further reference will be made to this mode of operation only where means for obtaining it are not readily apparent.

The circuit of FIGURE 15 is a typical embodiment of one of the novel converter systems described herein, but numerous alternative arrangements may also be formed. For example, if the polarities of the batteries in FIGURE 15 are reversed, and if the arithmetic node is designed to add the comparison voltage, which will then be negative, to the voltage on wire 422, the operation of the circuit will not be affected. In FIGURE 15 the conversion of both positive and negative analog input voltages was accomplished by means of polarity-reversing amplifier 398 which was switched in or out of the circuit depending upon the polarity of the analog input voltage. The polarity-reversing amplifier may be eliminated if three reversing switches are added to the circuit. Two of the reversing switches are used to connect batteries 350 and 352 into the circuit with polarities as shown or with reversed polarities. The third reversing switch, in one position, connects comparator output 426 to switch 378 and comparator output 406 to switch 376, as shown in FIGURE 15. In the other position, this reversing switch connects output 426 to switch 376 and output 406 to switch 378. In the first bit period of analog to digital conversion, the polarity of the analog input voltage is determined in accordance with previous description. For this purpose, it is necessary that the reversing switches be placed in a standard position at the beginning of the first bit period. This action may be accomplished by means of a reset signal from the programmer in a manner similar to that described above for switches 396 and 400. In the last portion of the first bit cycle, for positive analog input voltages, the reversing switches are moved to the positions which causes the polarities of the batteries and the connections between the comparator and switches 376 and 378 to be as shown in FIGURE 15. Of course, if this position of the switches is the standard position, they remain in that position. On the other hand, for negative analog input voltages, the reversing switches are moved to the other position.

The function of the arithmetic node 390 may be accomplished in many ways, a few of which will be described as examples. The differential polarized relay is a simple means for obtaining the combined function of the arithmetic node and the comparator 410. However, a relay requires a substantial amount of power and electronic means are preferred for most applications. A preferred means for performing either addition or subtraction of voltages is the feedback amplifier. Suitable circuits are described in the book entitled "Vacuum Tube Amplifiers" edited by Valley and Wallman, and published by the McGraw-Hill Book Company, Inc.

A circuit for adding two voltages is shown in FIGURE 24. The input voltages $e_1$ and $e_2$ are impressed on wires 484 and 486 and pass through resistors 488 and 490 to the input of amplifier 492. This amplifier has a high gain, and the polarity of its output voltage is opposite to the polarity of its input voltage. Resistor 494 is connected between the input and the output of amplifier 492. In accordance with the explanation given by Valley and Wallman, the output voltage on wire 496 is the negative of the sum of the input voltages, that is, the output voltage is $-(e_1+e_2)$.

A circuit for subtracting one voltage from another is shown in FIGURE 25. The two input voltages are impressed on wires 498 and 500. The voltage on wire 498 passes through resistor 502 to the input of amplifier 504, but the voltage on wire 500 goes to the input of amplifier 506. This amplifier is polarity-reversing as defined previously, and generally is a feedback amplifier in accordance with the teaching of Valley and Wallman. The output of amplifier 506 passes through resistor 508 to the input of amplifier 504. Amplifier 504 may be similar to amplifier 492, that is, it has high negative gain with resistor 510 connected between input and output. The output voltage on wire 512 is the voltage on wire 500 minus the voltage on wire 498, in other words, $e_2-e_1$.

Comparators also are well known, and several circuits are described in the book entitled "Pulse and Digital Circuits" by Millman and Taub and published by the McGraw-Hill Book Company, Inc. A suitable comparator for the present invention with two outputs and provision for gating is shown in FIGURE 23. This circuit is a modification of FIGURES 15–22 in Millman and Taub to which reference is made for the details of operation of the basic circuit. Briefly, double triode 514 acts as a differential amplifier. The input to the comparator is impressed on grid 516, and grid 518 is grounded. From FIGURE 23 and from the explanation in Millman and Taub, it is clear that a positive voltage on grid 516 results in a relatively low voltage on anode 520 and a relatively high voltage on anode 522. The circuit elements and power supply voltages are designed so that a small positive voltage on grid 516 cuts off the anode current in triode 524. Similarly, a small negative voltage on grid 516 cuts off the anode current in triode 526. The gate circuit for triode 524 includes resistors 528 and 530 and diodes 532, 534, 536 and 540 and capacitor 542. Likewise, the gate circuit for triode 526 includes resistors 544 and 546, and diodes 548, 550, 552 and 554 and capacitor 556. The gate pulses are applied to wire 558 from which they actuate the gate circuits through blocking capacitors 542 and 556. An output pulse is obtained from wire 560 when the voltage on grid 516 is positive and from wire 562 when the voltage on grid 516 is negative, as will be explained in the following paragraph. A further requirement for the construction of the circuit elements and power supply voltages is that the anodes of triodes 524 and 526 must be at ground potential when grid 516 is at ground potential. Moreover, wires 564 and 566 preferably should be at ground potential when grid 516 is at ground potential. The monostable multivibrators employing dual triodes 568 and 570 are coupled to the pulses on wires 560 or 562 by capacitors 572 and 574. These monostable multivibrators convert the pulses on wires 560 or 562 into waves having square or other suitable shapes to operate the switches to which they are connected. Monostable multivibrators are of course well known.

Prior to the occurrence of a gating pulse at wire 558 both monostable multivibrators are in their stable states and the lefthand sections of dual triodes 568 and 570 are cut off and their righthand sections are conducting. Thus, the potentials at wires 576 and 578 and at the cathodes of diodes 540 and 554 are equal to the positive supply voltage.

It will now be assumed that a positive voltage is applied to grid 516. In accordance with the previous explanation, the anode current of triode 524 is cut off, and furthermore the anode current of triode 526 is high. Therefore, the potential on wire 580 is the same as the positive power supply voltage, that is to say, highly positive with respect to ground. Moreover, the high current in triode 526 causes the potential on wire 582 to be substantially negative with respect to ground. Under these conditions, diodes 534 and 540 are cut off and diodes 532 and 536 are conducting. On the other hand, diodes 550, 548 and 552 are conducting, and diode 554 is cut off. If a positive pulse of suitable magnitude is applied to wire 558, a positive pulse will appear on wire 562 since diode 532 will remain conducting until the potential of wire 564 is higher than the positive power supply voltage. However, diode 548 will become non-conducting because its cathode goes positive and therefore no pulse will appear on wire 560.

The pulse on wire 562 will be coupled to the lefthand section of dual triode 568 causing the upper monostable multivibrator to trigger to its unstable state and produce a positive output pulse at terminal 584. Simultaneously the potential at point 576 which is connected to the cathode of diode 554 will drop to a low value and prevent a pulse from occurring at wire 560 in the event that the potential at grid 516 changes to a negative polarity during the gating impulse at wire 558. The monostable multivibrators are designed so that the duration of their unstable states are at least equal to the durations of the gating impulses at wire 558 and not greater than the period between successive gating pulses.

From a similar line of reasoning, it is clear that a pulse will occur on wire 560 when grid 516 is negative with respect to ground and the monostable multivibrator consisting of dual triode 570 will prevent a signal from appearing at wire 562 during this same gating impulse. The output then appears on terminal 586. Diodes 536 and 552 serve as clamps which prevent wires 560 and 562 from going negative with respect to ground.

Several variations of the circuit in FIGURE 23 will be obvious. For example, with due regard for polarities, the comparison voltage could be impressed on grid 516 and the analog input voltage on grid 518. However, feedback amplifiers provide better accuracy in addition and subtraction of voltages over wide ranges, and therefore are preferred for applications which require the best accuracy obtainable. Nevertheless, in cases where simplicity of apparatus is important and where moderate accuracy is acceptable, the circuit of FIGURE 23 can serve as both arithmetic node and comparator. Also, it is obvious that a bias to provide for the quantity $\delta$ which was described previously may be obtained by connecting grid 518 to a small constant voltage rather than to ground.

It was noted previously herein that the design of the digital output device depends on the use which is to be made of the converter system. In one broad class of applications, a visual display of the digital number is required usually in binary or decimal form. Another broad class of applications includes the recording, processing and transmission of information in digital form, usually as a train of pulses. Circuits and apparatus for accomlishing the desired forms of output are well known and further discussion is deemed unwarranted.

It was noted above that switches of types different from relays can be used in the converter systems described. It will be clear from previous descriptions that the relays which are operated by pulses from the programmer may be replaced by stepping switches or even by cam-operated contactors. Moreover, the circuits can be rearranged to make use of polarized relays and of relays having both normally open and normally closed contacts. Although some of the alternative arrangements might be simpler than the circuits which have been shown in the figures, the alternative arrangements will not be described further because they are considered straightforward. In general, mechanical switches have advantages where high accuracy is required and where high operating speed is not essential.

In applications for which the switches must operate at rates of more than a few hundred times per second, mechanical devices cannot be used. In such applications, electronic switches and switch driver circuits are necessary. Eletronic switches which are suitable for the present requirements are available. In general, four diodes perform the switching operation under the control of a driver circuit which in turn is triggered or driven by pulses from the programmer, comparator, or other souce. An example of a suitable switch is described in U.S. Patent No. 2,729,812 and in U.S. Patent No. 2,250,284.

The operation of the circuit in FIGURE 15 for digital to analog conversion will now be described. As noted previously, switch 388 is set in the down position, and the digital input is impressed on terminal 416 of the pulse processing network 418. The digital input may be presented in a variety of forms, and of course the configuration of the pulse processing network depends upon the characteristics of the particular digital input which is to be converted. For example, in a common form of digital input, the binary 1's are represented by pulses and the binary 0's are represented by the absence of pulses. Moreover, the first few pulses in such a train may be for synchronizing and control purposes, and the next pulse position may signify the algebraic sign of the number. For example, if a pulse exists in this pulse position, the digital number is negative, and if a pulse is absent from this pulse position, the digital number is positive. In order to improve the clarity of the explanations to follow it will be assumed that the pulse train which represents the digital number to be converted into an analog quantity consists only of one synchronizing pulse and of the sign and digit pulses.

One circuit which is suitable for the pulse processing network 418 is shown in FIGURE 26A. The input pulse train is represented in FIGURE 26B at 588, where it is to be understood that pulses may or may not occur at each pulse position except the first position. That is, a pulse always occurs in the first pulse position, and this pulse serves as the synchronizing pulse. The output pulse train is shown in FIGURE 26B at 590. In FIGURE 26A, the input pulse train is connected to terminal 592 which in turn is connected to capacitor 594. The other terminal of the capacitor is connected to diode 596, resistor 598, and output terminal 600. The resistor and diode are connected to battery 602 of which the positive terminal is connected to ground. This circuit is well known and produces an output pulse train as shown in FIGURE 26B. Briefly, if no pulses are impressed on the input terminal, the output remains at a negative voltage equal to that of the battery 602. However, if a positive pulse is impressed on the input terminal, the diode is cutoff because its cathode becomes positive, and, with a suitably high value for resistor 598, the output terminal becomes positive by an amount equal to the input pulse. During the intervals between pulses, the capacitor discharges through the diode, and the output terminal returns to the negative potential of the battery. Therefore the output pulse train appears as shown in FIGURE 26B at 590, where the output is positive during the pulse and negative during the intervals between pulses.

In accordance with the foregoing, the pulse train will be assumed to be shown in FIGURE 28 at 604 where in each graph the horizontal axis represents time and the vertical axis represents voltage. The first pulse 606 is the synchronizing pulse, and thereafter pulses may or may not occur in the consecutive pulse positions. If a pulse occurs in the second position 608, the algebraic sign of the number is positive; if a pulse does not occur in this position the algebraic sign is negative. If a pulse occurs in the third pulse position 610, it signifies that the most significant digit of the digital number is 1; if a pulse does not occur in this position the most significant digit is 0. And so on for the following pulse positions.

With reference to FIGURE 15, it will be noted that the output of the pulse processing network is impressed on the input to the comparator 410. One of the features of the pulse processing network is that its output is similar to its input except that a bias is inserted so that the output appears as in FIGURE 28 at 612. The essential feature of output 612 is that the input to the comparator is negative except when a pulse occurs. Therefore, when the comparator receives a gate pulse, as will be described presently, a pulse occurs on wire 426 if there is a pulse at the input to the comparator; otherwise a pulse occurs on wire 406.

As an example, the conversion of the number −101 will be described. The pulse train for this number is shown in FIGURE 28 at 614 where the synchronizing pulse is shown at 616, the algebraic sign pulse at 618, the most significant digit pulse at 620, the second most significant digit represented by no pulse at 622, and the third most significant digit pulse 624. Upon receipt by the converter of the pulse train which represents the number to be converted, the synchronizing pulse initiates the actions of programmer 404, and, as described previously, resets flip-flop 402 to state 1. The absence of a pulse in the algebraic sign pulse position causes the flip-flop to be triggered to state 2, thereby opening switch 396 and closing switch 400. Immediately thereafter, signals from the programmer close and open switches 366, 368, 372, 374, 380 and 382 after which switch 370 is closed and opened also by a signal from the programmer. Next, pulse 620 occurs simultaneously with the gate pulse to the comparator, and therefore, as described above, a pulse appears on wire 426. This pulse closes and opens switch 378, thereby discharging capacitor 362. The voltage at the analog output terminal 420 now is $$-E\frac{C_2}{C_3}$$

as will be clear from the description of the analog to digital conversion process. Switches 368 and 374 are next closed and opened, after which switch 370 is closed and opened, and the voltage at the analog output terminal becomes $$-\frac{3}{2}E\frac{C_2}{C_3}$$

During the pulse position represented by 622 in FIGURE 28, the input voltage 612 to the comparator is negative, and therefore when the comparator receives a gate pulse an output pulse occurs on wire 406. The output pulse closes and opens switch 376, thereby transferring the charge which was on capacitor 362 to capacitor 364. This transfer of charge changes the voltage at analog output terminal back to $$-E\frac{C_2}{C_3}$$

Switches 368 and 374 are again closed and opened after which switch 370 is closed and opened and the analog output voltage becomes $$-\frac{5}{4}E\frac{C_2}{C_3}$$

The simultaneous occurrence of pulse 624 and the gate pulse causes an output pulse to occur on wire 426 which operates switch 378 to discharge capacitor 362. Therefore, the voltage at the analog output terminal remains $$-\frac{5}{4}E\frac{C_2}{C_3}$$

and this is the final value of the analog voltage which is the equivalent of the digital input −101.

The switching operations which were described in the previous paragraph correspond to the three-portion bit cycle which was described in relation to FIGURE 18. However, the digital to analog conversion process can be accomplished by switching operations corresponding to the two-portion bit cycle illustrated in FIGURE 20. The details of these operations will not be described since they are straightforward and are clear from the descriptions already given.

From the foregoing it should be apparent how one unit connected for analog to digital conversion can work into another unit connected for digital to analog conversion and vice-versa. Also it should be clear how the analog digital configuration alone can be made to operate with a separate source of signals and likewise for the digital to analog conversion configuration.

FIGURES 28A, 28B and 28C illustrate the interchangeability of the units as heretofore set forth.

In FIGURE 28A, the input signals include an analog voltage on one wire and synchronizing pulses on another wire. The synchronizing pulses are applied to both the A/D and the D/A converters and serve to initiate the encoding period. The synchronizing pulses may occur at regular or irregular intervals except that two consecutive pulses must be at least one encoding period apart. During an encoding period the two converters are kept in step by the clocks in the programmers, and therefore the clocks must run at the same rates. This topic is more fully discussed in connection with the details of the programmer. In FIGURE 28B the input signals also come in over two wires, one wire carrying the digital input pulses and the other the synchronizing pulses. Specifically, the digital input pulses include the algebraic sign and the digit pulses but not the synchronizing pulses. In each encoding period the synchronizing pulse occurs one full bit period in advance of the pulse position corresponding to the algebraic sign. The relationship between these two series of pulses is shown in FIGURE 28C where the sign and digit pulse positions are shown by dotted lines to indicate that a pulse may or may not occur at each of these pulse positions. The synch pulse on the other hand does occur prior to each encoding period.

The converters in FIGURES 28A and 28B are preferably complete units and contain a digital output device pulse processing network, and provision for handling either positive or negative inputs or outputs. The purposes of FIGURES 28A and 28B are to illustrate the relationship between the signal inputs and the synchronizing inputs and to show how two reversible or non-reversible converters may be simply connected together. It is apparent however, that other relationships are also feasible. For example, in FIGURE 28B the synchronizing and signal pulses can be transmitted over the same wire in which case the converters need means for distinguishing the synchronizing pulses from the signal pulse. Suitable means for this purpose are well known and are in common use. They have been omitted from the drawings however for the sake of clarity.

FIGURE 27 shows a circuit diagram for a typical digital output device 412. The output from terminal 617 with switch 619 in the lefthand position is a train of pulses which may be related to the analog input voltage through eight different combinations. The first pulse position in each encoding period is defined to represent the polarity of the analog input voltage. Thus a pulse in the first pulse position may be defined to signify a positive analog input voltage. In this case a negative analog input voltage would be identified by a no-pulse in the first pulse position. Alternatively, a pulse in the first pulse position may be defined to signify a negative analog input voltage and a no-pulse to signify a positive analog input voltage. The system may be operated either way. The second and following pulse positions in each encoding period present the digits in the binary output number and for these pulse positions a pulse at terminal 617 is defined to represent a binary one and a no-pulse represents a binary zero. Conversely, a pulse may be defined to represent a binary zero and a no-pulse to represent a binary one. However, a circuit for this definition is not shown since it will be obvious from the explanations which follow. As defined earlier in the converter description, a pulse occurs in one of the two output wires 406 and 426 of the comparator in each bit period. Therefore if the train of pulses on one wire represents the true binary number which is the equivalent of the analog input voltage, the train of pulses on the other wire represents the ones complement of the binary number. It is well known that the ones complement of a binary number is obtained by replacing ones with zeros and zeros with ones. This interchange is provided automatically by the instant comparator since a pulse on one output wire of the comparator means a no-pulse on the other output wire. In digital computers, subtraction is frequently accomplished by means of the ones complement of the subtrahend. Therefore it is very handy for a computer programmer to be able to specify either true or complementary representations for either positive or negative analog inputs. This adds up to eight different combinations which are illustrated in Table I.

*Table I*

| No. | Algebraic Sign | | Digital Output Number | |
|---|---|---|---|---|
| | Positive analog input | Negative analog input | Positive analog input | Negative analog input |
| 1 | P | NP | True | True |
| 2 | P | NP | True | Comp |
| 3 | P | NP | Comp | True |
| 4 | P | NP | Comp | Comp |
| 5 | NP | P | True | True |
| 6 | NP | P | True | Comp |
| 7 | NP | P | Comp | True |
| 8 | NP | P | Comp | Comp |

P=pulse; NP=no-pulse; True=true binary number; Comp=1's complement.
Each of the above combinations may be represented by return-to-zero or by non-return-to-zero waves.

In addition the non-return-to-zero type of representation may be obtained from the circuit of FIGURE 27 by setting switch 619 in the righthand position.

The digital output device in FIGURE 27 is an example of a versatile circuit. However, other types of digital output devices are possible. For example, another common type of pulse presentation is the parallel mode for which each digit in the binary number has its own wire, and pulses and no-pulses appear on all wires simultaneously. This type of output can be incorporated in the converter of the present invention, by the substitution of a storage register for the circuit of FIGURE 27. A particularly significant digital output device for decimal outputs is the visual display and suitable means can be incorporated for this purpose although digital displays for binary numbers are not very often required. The significant point is that the two comparator outputs from the comparator of the circuit of FIGURE 15 contain all the information which is required for any possible form of digital output.

In FIGURE 27 switches 621, 623, 619 and 625 are manually operated and through them the various combinations in Table I may be selected. The positions of the switches are shown in Table II by single digit numbers, as will be explained below in more detail.

In accordance with the previous description it is assumed that a pulse occurs on wire 426 when the input to the comparator is positive and on wire 406 when the input to the comparator is negative. It is further assumed that the polarity of input to the comparator at the start of the last portion of the first bit period is the same as the polarity of the analog input voltage. This is true in the converter systems described but the reverse could be arranged equally as well. With the above assumptions a pulse occurs on wire 426 in the first bit period if the analog voltage is positive and on wire 406 if the analog input voltage is negative. With respect to the pulses which represent the digits of the binary output number the converters fall into two classes. In one class the pulses on wire 426 represent the true binary number which is the equivalent of the magnitude of the analog input voltage for both positive and negative analog input voltages, and consequently the pulses on wire 406 represent the ones complement of the true binary number for both polarities of input. In the other class of converters, the pulses on wire 426 represent the true number for positive analog input voltages and the ones complement for negative analog input voltages. Similarly for the latter class of converters, pulses on wire 406 represent the ones complement for positive analog inputs and the true number for negative analog inputs. The positions of the switches in FIGURE 27 for each class of converters are shown in Table II for the combinations in Table I.

*Table II*

| Combination Number | Class A Converters | | | Class B Converters | | |
|---|---|---|---|---|---|---|
| | Switch 623 | Switch 625 | Switch 621 | Switch 623 | Switch 625 | Switch 621 |
| 1 | 3 | N/A | 7 | 3 | 1 | 6 |
| 2 | 3 | 1 | 6 | 3 | N/A | 7 |
| 3 | 3 | 2 | 6 | 3 | N/A | 5 |
| 4 | 3 | N/A | 5 | 3 | 2 | 6 |
| 5 | 4 | N/A | 5 | 4 | 2 | 6 |
| 6 | 4 | 2 | 6 | 4 | N/A | 5 |
| 7 | 4 | 1 | 6 | 4 | N/A | 7 |
| 8 | 4 | N/A | 7 | 4 | 1 | 6 |

N/A=not applicable.
Return-to-zero: Switch 619 in lefthand position.
Non-return-to-zero: Switch 619 in righthand position.
Class A Converters: Digital output on wire 426 is true number for both positive and negative analog inputs.
Class B Converters: Digital output on wire 426 is true binary number for positive analog inputs; digital output on wire 426 is 1's complement for negative analog input.

In effect with switch 619 in the left hand position, the circuit of FIGURE 27 connects the output terminal 617 to wire 426 or to wire 406 to produce the particular code in Table I which may be desired. With switch 619 in the righthand position the operation is the same except that the pulse train which comes out of OR circuit 627 is converted to the non-return-to-zero mode.

As an example of the operation of FIGURE 27, combination No. 6 in Table I will be traced through for the first class of converters, that is for converters which produce a true binary number on wire 426 for both polarities of analog input. The synchronizing pulse is applied to terminal 629 and it resets flip-flop 631 so that its terminal 1 is at a high voltage and terminal 2 at a low voltage. Switch 623 is set to the four position and the voltages applied to the AND circuits 633 and 635 by the flip-flop open 635 and close 633. An open AND circuit means a condition for which a pulse applied to the other input wire will appear at the output of the AND circuit. Conversely, in a closed AND circuit a pulse on the other input will not appear at the output. Moreover, it should be noted that AND 633 is open while AND 635 is closed or vice-versa but both AND circuits cannot be opened or closed at the same time. The synchronizing pulse also triggers the one shot multivibrator 637 to its quasi-stable state and thereby applies a high voltage to AND circuit 639 to open it. The duration of the quasi-stable portion of the period of the one shot multivibrator is somewhat greater than a bit period and therefore AND circuit 639 remains open during the first bit period but is closed in the second bit period when the one shot multivibrator returns to its stable state. If the analog input voltage is positive a pulse occurs at terminal 426 in the first bit period and a no-pulse occurs at terminal 406. Since AND 633 is closed no-pulse reaches the output terminal 617. On the other hand if the analog input voltage is negative a pulse occurs at terminal 406 and passes through the open AND 635 to the output terminal.

For the following pulse positions which represent the digits in the binary number it is necessary to open AND 633 and to close AND 635 if the analog input voltage is positive but leave AND 635 open or AND 633 closed if the analog input voltage is negative. In other words the flip-flop 631 must be reversed if a pulse occurs on terminal 426 in the first bit period but not if a pulse occurs on terminal 406. Therefore switch 625 is set in the two position and switch 621 is set in the six position so that in the first bit position, a pulse on terminal 426 will pass through the open AND 639 through the delay 641 and trigger the flip-flop to its other state. The delay is desirable so that the flip-flop will not change state until pulses on terminals 426 or 406 have returned to zero. If a pulse does not occur on terminal 426, the state of the flip-flop will remain unchanged. Therefore the requirements of combination No. 6 have been met. Other combinations can be traced through in a similar manner.

The OR circuit 627 combines the output of AND 633 and AND 635 to a single output and this output is the digital output of the converter for return-to-zero operation. For non-return-to-zero operation the output of OR 627 is converted by flip-flop 643 and INHIBIT circuit 645 to the desired wave form as follows:

The comparator gate pulses are impressed on one of the inputs of the INHIBIT circuits through terminal 647. It will be recalled that a comparator gate pulse occurs in the last portion of each bit. The pulse train from the OR circuit 627 is connected to the INHIBIT input through switch 619 which must be set in the righthand position, and through NOT 626. A NOT circuit converts positive pulses into negative pulses, or vice versa.

The INHIBIT circuit 645 is such that if pulses occur at both of its inputs, no pulse occurs on wire 649. However, if a pulse does not occur on the INHIBIT (identified by a small circle) input then a pulse does occur on wire 649 during the comparator gate pulse.

The flip-flop 643 is reset by the synchronizing pulse so that side 1 is at a high voltage and side 2 at a low voltage. If a pulse occurs in the first pulse position the state of the flip-flop 643 is reversed so that side 2 is at a high voltage. It will be noted that no pulse occurs on wire 649 because pulses occur at both inputs of INHIBIT 645. On the other hand if a no-pulse occurs in the first pulse position the comparator gate pulses pass through the INHIBITOR circuit 645 to side 1 of the flip-flop but has no effect since side 1 is already at a high voltage. In general, the voltage of side 1 is high after a no-pulse and the voltage of side 2 is high after a pulse. Therefore, during a series of no pulses side 2 of the flip-flop will remain at a low voltage and will shift to a high voltage after a pulse. Conversely, during a series of pulses side 2 will remain at a high voltage and will shift to a low voltage after a no-pulse. It wil lbe recognized that this operation produces the non-return-to-zero type of wave.

FIGURE 33 is a schematic diagram of one of the flip-flops utilized in the various circuits of the present invention. The flip-flops unless otherwise stated are all alike and essentially have two outputs, one of which is at high potential and the other of which is at low potential. Moreover, the output at high potential is associated with a zero current in the output lead and the output at low potential is associated with a flowing current in the output lead. The state of the flip-flop may be reversed by a trigger pulse, that is, the trigger pulse causes the output which was at high potential to change to a low potential and the output which was at low potential to change to a high potential. The trigger pulse may be applied in two different ways. A symmetrically applied trigger pulse reverses the state of the flip-flop regardless of which state the flip-flop is in before the pulse is applied. An unsymmetrically applied trigger pulse makes the voltage on a particular output high unless the voltage is already high in which case no change results from the pulse.

Unsymmetrically applied trigger pulses may be applied to either side of the flip-flop. The unsymmetrical trigger applied to side 1 of the flip-flop causes the voltage on the corresponding output to become high unless of course it is already high. Moreover, the current in the output lead becomes zero unless it is already zero. The same situation exists with respect to an unsymmetrical pulse to side 2 of the flip-flop.

In the description of FIGURE 15, it was pointed out that an approximation is involved in the conversion process because not all of the charge on capacitor 356 is transferred to capacitor 358 when switch 370 is closed, and not all of the charge on capacitor 362 is transferred to capacitor 364 when switch 376 is closed. These approximations may be eliminated by application of the circuit shown in FIGURE 3. Also, in respect to FIGURE 15 reversing switches were mentioned as an alternative means whereby analog input voltages of both polarities may be converted. However, it is possible to accomplish such conversions with fewer switches and without a polarity-reversing amplifier. Further, it is possible to eliminate a battery from the circuit shown in FIGURE 15 on the condition that summing amplifier 384 is replaced by a differential amplifier. The elimination of a battery is important because it is difficult to maintain the voltages of two batteries equal under variations of life, temperature, and other environmental conditions. FIGURE 29 shows an improved converter system in which the three foregoing improvements have been embodied. The common elements bear like reference numerals.

In FIGURE 29, battery 626 is connected to capacitors 354, 356, 358, 360, 362, 364 through switches 366, 368, 370, 372, 374, 376. Switches 370 and 376 are double-pole switches, the mechanical linkages between the moving arms being shown by dashed lines. The coil of switch 370 is energized through switch 628 or switch 630. The stationary contact of switch 630 is connected to output 426 of comparator 410, and the stationary contact of switch 628 is connected to output C of programmer 632. The coils of switches 628 and 630 are energized from opposite sides of flip-flop 402; that is, when switch 628 is closed, switch 630 is open, and vice-versa. In a similar manner, the stationary contact of switch 636 is connected to output 406 of comparator 410, and the stationary contact of switch 634 is connected to output C of programmer 632. The coils of switches 634 and 636 are energized by flip-flop 402 by connections as shown. Switches 378 and 380 are connected across capacitors 356 and 362, respectively, and serve to discharge the capacitors when required by the conversion process. The coils of switches 378 and 380 are energized through switches 638 and 640 respectively, the coils of the latter switches being energized by flip-flop 402. Switch 382 is connected between the lower plate of capacitor 356 and ground, and switch 642 is connected between the upper plate of capacitor 362 and ground. Switches 644 and 646 are connected across the capacitors 358 and 364, respectively. Capacitors 358 and 364 also are connected to the input terminals of unity-gain amplifiers 648 and 650. The output of amplifier 648 is connected to the lower plate of capacitor 356 through one of the sets of contacts of switch 370, and also one of the inputs of differential amplifier 384. Similarly, the output of amplifier 650 is connected to the upper plate of capacitor 362 through one of the sets of contacts of switch 376, and also to the other input of differential amplifier 384. If the voltage on wire 654 is $e_1$ and the voltage on wire 656 is $e_2$, the output voltage of $e_0$ of amplifier 384 is $$e_0=e_1-e_2 \qquad (26)$$

The voltage $e_0$ appears on wire 386. The output of amplifier 384 is connected to one of the inputs of arithmetic node 390 through manually operated switch 652. As will be explained later herein, the output of arithmetic node 390 may be either the sum or the difference of its inputs. However, in order to simplify the present description the output of the arithmetic node will be defined to be $e_{in}-e_0$ where in this case $e_{in}$ is the analog input voltage. The voltage $e_{in}$ appears on wire 658. The arithmetic node is connected to comparator 410 through manually operated switch 660, and the outputs of the comparator are connected to digital output device 412; also one of the outputs is connected to flip-flop 402. The connections between the flip-flop and switches 628, 630, 634, 636 have already been described. Switch 662 is interposed in the connection between one of the comparator outputs and flip-flop 402.

The function of switch 370 and amplifier 648 is to transfer all of the charge which may be on capacitor 356 at a particular time to capacitor 358 regardless of any prior charge on capacitors 358. As will be explained in more detail later, capacitor 356 is charged through switches 368 and 382. After these switches have been closed and opened, switch 370 is closed, and all of the charge which was on capacitor 356 flows into capacitor 358 as was described in relation to FIGURE 15. By reference to FIGURE 3 it will be clear that capacitor 356 corresponds to capacitor 60, switch 370 corresponds to switch 62, capacitor 358 corresponds to capacitor 66 and amplifier 648 corresponds to amplifier 68. Therefore, the flow of charge from capacitor 356 into capacitor 358 will be clear from the description which was given for FIGURE 3, similar statements apply to capacitors 362 and 364, switch 376 and amplifier 650.

The capacities of capacitors 354, 356, 358, 360, 362, 364 in FIGURE 29 are designated by $C_7$, $C_8$, $C_9$, $C_{10}$, $C_{11}$, $C_{12}$, respectively. For binary operation it is necessary that $$C_7=C_8 \tag{27}$$

$$C_{10}=C_{11} \tag{28}$$

$$\frac{C_8}{C_9}=\frac{C_{11}}{C_{12}} \tag{29}$$

However, it is not necessary that $C_9$ be large in comparison with $C_7$ or $C_8$, or that $C_{12}$ be large in comparison with $C_{11}$. In practice, the capacities of capacitors 358 and 364 may be selected over a wide latitude with no harmful effect on the accuracy of operation of the converter system.

The process for synthesizing the comparison voltage in the circuit of FIGURE 29 is similar in some respects to that in FIGURE 15. That is, the comparison voltage, which appears on wire 386 is the algebraic difference between the voltages on capacitors 358 and 364. During the first bit period in an analog to digital conversion, switching operations are accomplished which depend upon the polarity of the analog input voltage. For positive analog input voltages, the coil of switch 370 is connected to programmer 632, and the coils of switches 376 and 380 are connected to comparator 410; switch 378 is not used. In succeeding bit period, increments are added to the comparison by transferring charge from capacitor 356 to capacitor 358. When it is necessary to subtract out an increment of voltage from the comparison voltage, charge is transferred from capacitor 362 to 364. It will be clear that the comparison voltage with the above switch positions is always positive. On the other hand, for negative analog input voltages, the coil of switch 376 is connected to the programmer, and the coils of switches 370 and 378 are connected to the comparator. In bit periods, after the first one, negative increments are added to the comparison voltage by transfer of charge from capacitor 362 to 364. When it is necessary to subtract out an increment of voltage from the comparison voltage, charge is transferred from capacitor 356 to 358. In this case the comparison voltage is always negative.

FIGURES 30 and 31 show variations of the circuit of FIGURE 29 with that in FIGURE 30 representing a variation of an analog to digital only converter while FIGURE 31 shows a digital to analog only converter. The comparison signal generator in each of FIGURES 30 and 31 is identical to the generator in FIGURE 29 and is enclosed by dashed lines 401. As in FIGURES 16 and 17, the analog digital converter of FIGURE 30 incorporates a direct connection between amplifier 384 and arithmetic node 390. The pulse processing network and digital input are of course omitted. In FIGURE 31 on the other hand, the pulse processing network and digital input are included while the analog output is taken from the output of amplifier 384. It is believed that the operation of the circuits of FIGURES 30 and 31 is clear from the previous description of the operation of the circuit in FIGURE 29.

The program for analog to digital conversion by means of a three-part bit period will now be described for an analog input voltage for which the sign and three most significant digits of the digital equivalent are −101. For this conversion, the switching operations are illustrated in FIGURE 32, the voltages on the capacitors and the comparsion voltage are shown in FIGURE 32, and the comparison voltage and the voltage at the input to comparator 410 are shown graphically in FIGURE 32. The coordinate axes of this figure have the same significance as the coresponding axes in FIGURES 18 and 20.

In the first portion of the first bit period, switches 644 and 646 are closed and opened, thereby discharging capacitors 358 and 364. Simultaneously, flip-flop 402 is reset to state 1 by a pulse from programmer 632. Upon completion of these operations, the polarity of the voltage on wire 424 will be the same as that of the analog input voltage, as will be clear from the description for FIGURE 15. Therefore, when the comparator receives a gate pulse in the third portion of the first bit period, a pulse will appear on wire 406 since the analog input voltage is assumed to be negative. The pulse on wire 406 triggers flip-flop 402 to state 2 through switch 662. Switch 662 is closed only in the third portion of the first bit period in each encoding period by a pulse from programmer 632. Hence pulses on wire 406 in following bit periods will not affect the flip-flop. With the flip-flop in state 2, switches 630, 638 and 634 are closed, and switches 628, 640 and 636 are open. For positive analog input voltages, the flip-flop remains in state 1, and in that case switches 630, 638 and 634 are open, and switches 628, 640 and 636 are closed. After the state of the flip-flop has been established in the first bit period, it retains the same state for the remainder of the encoding period. For reasons which were described in relation to FIGURE 15, the closing of switches in the first bit period by pulses on wires 426 or 406 will have no harmful effect.

In the first portion of the second bit period, switches 366, 372, 368, 374, 382, 642 are closed and opened; capacitors 354, 356, 360, 362 are thereby charged to the voltage E. In the second portion of this bit period, lead C of programmer 632 emits a pulse which actuates switch 376 through switch 634. Switch 634 is closed and switch 628 is open because the flip-flop is in state 2. The closing of switch 376 transfers all of the charge on capacitor 362 to capacitor 364 in accordance with previous explanation. Therefore the voltage on capacitor 364 becomes $$E\frac{C_{11}}{C_{12}}$$

and the comparison voltage is $$-E\frac{C_{11}}{C_{12}}$$

This voltage must be less in absolute value than the analog input voltage since the most significant digit of the digital number has been assumed to be 1. Therefore the voltage at the input to the comparator is negative, and a pulse appears on wire 406 when the comparator receives the gate pulse in the third portion of the bit period. The pulse on wire 406 closes and opens switch 378, and capacitor 356 is discharged.

In the first portion of the third bit period, switches 368, 382, 374, and 642 are closed and opened, after which the voltages on capacitors 354, 356, 360 and 362 are ½E. In the second portion of this bit period, switch 376 is closed and opened, the voltage on capacitor 364 thereupon becoming $$\frac{3}{2}E\frac{C_{11}}{C_{12}}$$

Since the second most significant digit of the digital number is 0, this voltage is greater in absolute magnitude than the analog input voltage, and the polarity of the voltage on wire 424 changes to positive. Therefore, a pulse occurs on wire 426 when the comparator receives a gate pulse in the third portion of the bit period; this pulse closes and opens switch 370 and thereby the charge on capacitor 356 is transferred to capacitor 358. Hence, the comparison voltage returns to the value $$-E\frac{C_{11}}{C_{12}}$$

At the beginning of the fourth bit period, switches 368, 382, 374, 642 are closed and opened, whereupon the voltages on capacitors 354, 356, 360, 362 are ½E. In the second portion of the bit period, switch 376 is closed and opened, and the comparison voltage becomes $$-\frac{5}{4}E\frac{C_{11}}{C_{12}}$$

In line with the assumption that the third most significant digit is 1, the absolute magnitude of this voltage is less than the absolute magnitude of the analog input voltage, and the input voltage to the comparator remains negative. Therefore, a pulse appears on wire 406 when the comparator receives a gate pulse in the third portion of the bit period which closes and opens switch 378 thereby discharging capacitor 356.

The switches in FIGURE 29 may also be operated in a two-portion bit period analogous to the program illustrated in FIGURE 20. In the first portion of the two-portion bit period for FIGURE 29, the switching operations are exactly the same as shown in the column labelled 1A in FIGURE 32. In the second portion of the bit period, the gate pulse occurs and the flip-flop 402 is triggered to state 2 if the analog input voltage is positive. The final state of the flip-flop determines the program for subsequent switching operations as was described above for the three-portion bit period. Also in the second portion of the first bit period, switches 366, 368, 382 are closed and opened for negative analog input voltages, but switches 372, 374, 642 are closed and opened for positive analog input voltages. For proper operation of switches 366, 368, 382, 372, 374, 642, it is necessary that each of them be connected to two selector switches in the manner shown for switches 370 and 376. The selector switches are connected to the programmer, and the operations of the selector switches are controlled by the flip-flop in the same way as switches 628, 630, 634, 636. As was explained in relation to FIGURE 20, the programmer may have less stationary output contacts for the two-portion bit period. The descriptions previously given for FIGURES 15 and 20 will make clear the switching operations for the two-portion bit period, and further details will not be given herein.

It will be recalled that the circuit in which the comparison voltage is synthesized in FIGURE 15 includes six capacitors and two batteries, and that the corresponding circuit in FIGURE 29 includes six capacitors and one battery. A further elimination of one capacitor may be made as shown in FIGURE 34, in which the sum of the capacities of capacitors 356 and 362 must equal the capacity of capacitor 354 for binary operation. It is preferred that the capacities of capacitors 356 and 362 be the same, but this is not necessary provided the capacities of capacitors 364 and 358 are properly chosen, that is $$\frac{C_2}{C_3}=\frac{C_4}{C_5}$$

where 354, 356, 358, 362, 364 are represented by $C_1$, $C_2$, $C_3$, $C_4$, and $C_5$ respectively. Furthermore, in FIGURES 15 and 29, the comparison voltage was synthesized in accordance with the program illustrated in FIGURE 6. By a modification of the switching arrangements, the program illustrated in FIGURE 7 can be provided for, and provisions for this program have also been embodied in FIGURE 34. An additional feature included in FIGURE 34 is the alternative method for transferring charge from one capacitor to another which was illustrated in FIGURE 5.

In FIGURE 34 battery 626 is reversed (the upper terminal is negative in this figure) and is connected to capactiors 354, 356 and 358 through switches 366, 368 and 370. Switches 378 and 380 are connected across capacitors 356 and 362 respectively. The upper plate of capacitor 356 is connected through switch 370 to amplifier 670 and also to one terminal of capacitor 358, the other terminal of which is connected to the output of amplifier 670. Amplifier 670 has a high gain and the polarity of its output voltage is opposite to the polarity of its input. The purpose of the connections between capacitors 356 and 358 and amplifier 670 is to transfer all of the charge which may be on capacitor 356 at a particular time to capacitor 358. It will be observed that capacitor 356 in FIGURE 34 corresponds to capacitor 74 in FIGURE 5; likewise, capacitor 358 corresponds to capacitor 82 and amplifier 670 corresponds to amplifier 78. Therefore, in accordance with the description for FIGURE 5, when switch 370 is closed, all of the charge on capacitor 356 is transferred to capacitor 358. Switch 644 is connected between the input to amplifier 670 and ground, and serves to discharge capacitor 358 at the beginning of an encoding period. Capacitor 362 is connected in a similar manner through switch 376 to capacitor 364, amplifier 672 and switch 646. These circuit elements together with switch 646 have functions corresponding to those of the elements connected to capacitor 356.

The outputs of amplifiers 670 and 672 are connected to the inputs of differential amplifier 384. In the interest of clarity, it will be assumed that the output $e_0$ of amplifier 384 is equal to the voltage on the upper input terminal minus the voltage on the lower input terminal; however, the opposite polarity works just as well, provided suitable changes are made in the arithmetic node. The output of amplifier 384 is connected through manually operated switch 652 to arithmetic node 390. In FIGURE 34, the output voltage of the arithmetic node is equal to the voltage on the lower input terminal minus the voltage on the upper input terminal. The output of the arithmetic node is connected through manually operated switch 660 to comparator 410. If the voltage on wire 424 is positive, a pulse appears on wire 426 when the comparator receives a gate pulse; if the voltage on wire 424 is negative, a pulse appears on wire 406 when the comparator receives a gate pulse. The outputs of the comparator are connected to digital output device 412 and also to switches 370, 376, 378, 380.

For analog to digital conversion, switches 652 and 660 are set to the up positions, and the analog input voltage is impressed on terminal 658. Each bit period has two portions; a third portion would serve no useful purpose. In the first portion of the first bit period, switches 366, 368, 374, 644, 646 are closed and opened. Capacitors 354, 356, 362 are thereby charged to the battery votlage −E, and capacitors 358 and 364 are discharged. Since the output of amplifier 384 will then be zero, the polarity of the voltage on wire 424 will be the same as the polarity of the analog input voltage. In the second portion of the first bit period, the comparator receives a gate pulse, and a pulse occurs on wire 426 if the analog input voltage is positive. In this case, switches 370 and 380 are closed and opened; these operations transfer the charge on capacitor 356 to capacitor 358 and discharge capacitor 362. On the other hand, if the analog input voltage is negative, a pulse occurs on wire 406 in the second portion of the bit period and in this event switches 376 and 378 are closed and opened. For positive analog input voltages, the voltage on wire 386 at the end of the first bit period is $$+E\frac{C_2}{C_3}$$

while for negative analog input voltages the voltage on wire 386 is $$-E\frac{C_4}{C_5}$$

by virtue of the negative gain of amplifiers 670 and 672 and the equal capacitor ratios given the magnitudes of these two voltages are the same.

In the first portion of the second bit period, switches 368 and 374 are closed, thereby charging capacitors 356 and 362 to the voltage —½E. The comparator receives a gate pulse in the second portion of the second bit period. A pulse will occur on wire 426 if the analog input voltage is positive and if $$E\frac{C_2}{C_3}$$

is less than the analog input voltage because the input to the comparator will be positive. However, if $$E\frac{C_2}{C_3}$$

is greater than the analog input voltage, the input to the comparator will be negative and a pulse will occur on wire 406. On the other hand, for a negative analog input voltage a pulse will occur on wire 406 if $$\left|E\frac{C_4}{C_5}\right|$$

is less than the magnitude of the analog input voltage, and on wire 426 if $$\left|E\frac{C_4}{C_5}\right|$$

is greater than the magnitude of the analog input voltage. Switching operations in succeeding bit periods follow the pattern described for the second bit period.

In the first bit period, a pulse on wire 426 signifies that the polarity of the analog input voltage is positive, and a pulse on wire 406 signifies that the analog input voltage is negative. In bit periods, after the first, when the analog input voltage is positive, a pulse on wire 426 signifies that the corresponding digit is a binary 1, and a pulse on wire 406 signifies a binary 0. On the other hand, in bit periods after the first when the analog input voltage is negative, a pulse on wire 426 signifies that the corresponding binary digit is 0, and a pulse on wire 406 signifies a binary 1. Thus, for positive analog input voltages, a pulse on wire 426 in a bit period after the first signifies a binary 1, and the absence of a pulse designates a binary 0. In other words, the pulses and no-pulses on wire 426 represent the true binary number, and the pulses and no-pulses on wire 406 represent the 1's complement of the binary number. However, for negative analog input voltages, pulses and no-pulses on wire 406 (after the first bit period) represent the true binary number, and pulses and no-pulses on wire 426 represent the 1's complement. In the event that the algebraic sign and the true binary number are required for both positive and negative analog input voltages, the digital output device 412 may be designed to produce the desired result as has been explained previously.

FIGURES 35 and 36 show variations for analog to digital conversion only and for digital to analog conversion only respectively. As with earlier embodiments the comparison signal generator of FIGURES 35 and 36 are identical to the comparison signal generator shown in FIGURE 34 and are enclosed by the dashed lines 403. The operation of the circuits of FIGURES 35 and 36 should be clear from the foregoing description of the circuit 34.

In order to clarify further the operation of the circuit of FIGURE 34 for analog to digital conversions, the switching operations are shown in FIGURE 37 for conversion of an analog voltage for which the algebraic sign and first three significant digits of the digital equivalent are —101. The voltages on the capacitors, the comparison voltage on wire 386 and the voltage at the input to the comparator on wire 424 are shown graphically in FIGURE 37, where the analog voltage is represented by a dashed horizontal line. The polarities of the voltages on capacitors 358 and 364 are shown as positive because the inputs to amplifiers 670 and 672 are essentially at ground potential because of feedback and because the outputs of the amplifiers are positive. As explained previously, switches 366, 368, 644, 646, 374 are closed and opened in the first portion of the first bit period. Capacitors 354, 356, 362 are charged to the battery voltage —E, and capacitors 358 and 364 are discharged. The comparison voltage at the output of amplifier 384 is zero, and the voltage at the input to the comparator on wire 424 is the same as the analog input voltage, that is, the polarity is negative. Therefore, a pulse appears on wire 406 when the comparator receives a gate pulse in the second portion of the bit period. The pulse on wire 406 closes and opens switches 376 and 378 which transfers the charge on capacitor 362 to capacitor 364 and discharges capacitor 356. The comparison voltage on wire 386 thus becomes $$-E\frac{C_4}{C_5}$$

the magnitude of which must be less than the magnitude of the analog input voltage since the most significant digit of the digital equivalent of the analog input has been assumed to be 1. Therefore, the input voltage to the comparator is negative.

In the first portion of the second bit period, switches 368 and 374 are closed and opened, after which the voltages on capacitors 354, 356, 362 are —½E. Since the input voltage to the comparator is negative, a pulse occurs on wire 406 when the comparator receives a gate pulse in the second portion of this bit period. Again, the charge on capacitor 362 is transferred to capacitor 364 and capacitor 356 is discharged. The comparison voltage on wire 386 thus becomes $$-\frac{3}{2}E\frac{C_4}{C_5}$$

which must be greater in magnitude than the analog input voltage in accordance with the assumption that the second most significant digit is 0; therefore the input to the comparator becomes positive.

In the first portion of the third bit period, switches 368 and 374 are closed and opened, after which the voltages on capacitors 354, 356, 362 are —¼E. When the comparator receives a gate pulse in the second portion of the bit period, a pulse appears on wire 426 since the input to the comparator is positive. Therefore, switches 370 and 380 are closed and opened, and the charge on capacitor 356 is transferred to capacitor 358 while capacitor 362 is discharged. The comparison voltage is thus changed to $$-\frac{5}{4}E\frac{C_4}{C_5}$$

and the voltage at the input to the comparator returns to a negative polarity since it has been assumed that the third most significant digit of the digital number is 1. In the first portion of the fourth bit period, switches 368, 374 are closed and opened, and the voltages on capacitors 354, 356 and 362 become $-\frac{1}{8}E$. In the second portion of this bit period, a pulse occurs on wire 406 since the input to the comparator is negative, and the comparison voltage is changed to $$-\frac{11}{8}E\frac{C_4}{C_5}$$

Additional binary digits may be obtained when required by a continuation of the procedures described in the foregoing paragraphs.

FIGURE 38 shows a programmer suitable for use in the systems of FIGURES 34, 35 and 36. As will be noticed, the stepping mechanism moves past eight stationary contacts corresponding to the two part bit period operation of the circuit of FIGURE 34.

The operation of the circuit of FIGURE 34 as a digital to analog converter will now be described. Manually operated switches 652 and 660 are set in the down positions and the digit input signal is connected to the input terminal of pulse processing network 418. The analog output voltage appears at terminal 676. The digital conversion process in accordance with the program illustrated in FIGURE 7 involves some significant differences in comparison with the program illustrated in FIGURE 6, and these differences will be pointed out in the explanation immediately following. The pulse processing network 418 is designed so that for positive digital numbers the pulse train at its output is generally, as shown in FIGURE 28, at 612. A pulse occurs in the first pulse position corresponding to the algebraic sign of the digital number, and also pulses occur at all pulse positions which correspond to binary 1's. Pulses are absent from pulse positions which correspond to binary 0's, and the potential of the output of the pulse processing network in the intervals between pulses is negative, as shown at 612.

Upon receipt of the synchronizing pulse in the pulse train representing the digital input number, the programmer closes and opens switches 366, 368, 374, 644, 646. The charges on the several capacitors will be clear from the previous explanation for analog to digital conversion. The first pulse at the output of the pulse processing network representing the algebraic sign of the digital input number occurs simultaneously with the gate pulse, and since the input to the comparator is therefore positive a pulse appears on wire 426. This pulse closes and opens switches 370 and 380 with results as described for analog to digital conversion. That is, the charge on capacitor 356 is transferred to capacitor 358, and capacitor 362 is discharged. The voltage which then appears on wire 386 is $$+E\frac{C_2}{C_3}$$

At the completion of the digital to analog conversion period, the voltage on wire 386 should of course be proportional to the digital input number, and for many applications the preferred factor of proportionality is unity. This value will be used as an example in the following description, but the extension to other values will be clear. In order to describe the topic of scale factors, it is recalled that the greatest magnitude which can be represented by a binary number having $n$ significant digits is $2^n-1$. For example, the largest 3-digit binary number is 111, or 7, assuming that the binary point is at the right of the least significant digit. If the binary input number is expressed as an algebraic sign and $n$ significant digits with the binary point at the right of the least significant digit, then for the proportionality factor between the digital input number and the analog output to be unity, it is necessary that $$E\frac{C_2}{C_3}=2^{n-1} \qquad (30)$$

For example, for a voltage expressed in three significant binary digits, $$E\frac{C_2}{C_3}=4 \text{ volts}$$

After the first pulse, the following pulses and no-pulses transfer charge to capacitor 358 or to capacitor 364, respectively, and the analog equivalent of the digital input is synthesized at the output of amplifier 384 in a manner analogous to the synthesis of the comparison voltage in an analog to digital conversion.

It is to be noted that the increment of voltage due to the pulse or no-pulse which represents the least significant binary digit has a magnitude which is one half of the magnitude represented by the least significant digit; this will be clear from the following example. In the preceding paragraph, the voltage on capacitor 358 after completion of the switching operations due to the pulse representing the algebraic sign of the digital input number was 4 volts. Thereafter, the three pulse positions which represent the significant digits of the digital input number produce voltage increments each of which is one half of the previous increment. Therefore, the final increment is one eighth of the first increment, or ½ volt, whereas the binary number 001. represents 1 volt. This result may obviously be generalized for binary numbers having any number of significant digits and having the binary point at any position. In all cases, as stated above, the final increment is one half the magnitude represented by the least significant digit. This result is different from the outcome of the program illustrated in FIGURE 6 wherein, as noted previously, the final increment is equal to the magnitude represented by the least significant digit.

Another difference between the results of digital to analog conversions in accordance with the programs illustrated in FIGURES 6 and 7 is that the program of FIGURE 6 produces an analog output which is the exact equivalent of the digital input number, but the program of FIGURE 7 produces an analog output which is too high by an amount equivalent to the magnitude represented by ½ the least significant digit of the digital input number. The truth of the foregoing statement may be verified readily by following through the steps in the conversions of typical digital numbers and by reference to elementary concepts in the theory of binary numbers. Since the analog output voltage produced by the program of FIGURE 7 is always too high by the same amount, a correction may be made by several means, for example by a suitable bias in amplifier 384. However, for some applications the error is not important and for these no corrective means are necessary.

For negative digital input numbers, the output of the pulse processing network must be different from the output for positive digital input numbers. In particular, a negative pulse must appear in the pulse position which represents the algebraic sign, and thereafter negative pulses must appear in pulse positions which represent binary 1's, and no-pulses must appear in pulse positions which represent binary 0's. Moreover, the potential of the output of the pulse processing network in the intervals between the negative pulses must be positive. Thus, the output of the pulse processing network for a negative digital input number appears as if the output for the same number with a positive sign were rotated about the horizontal axis through 180°. The other considerations which were described for positive digital input numbers with regard to scale factor and bias apply also to negative digital input numbers provided obvious modifications are made to recognize the negative algebraic sign.

In FIGURES 15, 29 and 34 the analog input voltage was introduced into the converter system through one of the input terminals of the arithmetic node. However, it is possible to impress the analog input voltage on one of the capacitors, and thus there may be a further elimination of the arithmetic node. Such a circuit is shown in FIGURE 39 wherein the switching operations have been designed for a two-portion bit period in the program of FIGURE 6. For simplicity the circuit which synthesizes the comparison voltage includes six capacitors and two batteries, and charge is transferred directly from capacitor 356 to capacitor 358 and from capacitor 362 to 364 as was shown in FIGURE 15.

In FIGURE 39, batteries 350 and 352 are connected to capacitors 354, 356, 358, 360, 362, 364 through switches 366, 368, 370, 372, 374, 376. Switches 378 and 380 are connected across capacitors 356 and 362, respectively, and switches 673 and 674 are connected across capacitors 358 and 364 respectively. Switch 366 is actuated by programmer output B through switch 678 and by programmer output C through switch 676. Similarly, switch 372 is connected to programmer output B or C through switch 682 and 680, switch 368 is connected to programmer output D or E through switch 686 or 684, switch 374 is connected to programmer output D or E through switch 690 or 688. Also, switch 370 is connected to programmer output E or to comparator output 406 through switch 692 or 694, and switch 376 is connected to programmer output E or to comparator output 426 through switch 696 or 698. The coil of switch 378 is connected to comparator output 426 through switch 382, and the coil of switch 380 is connected to comparator output 406 through switch 700. In each of the switch pairs 678, and 676, 686 and 684, 692 and 694, 682 and 680, 690 and 688, 696 and 698, 382 and 700, the coils are energized by opposite sides of flip-flop 402 and only one switch of each pair is closed at any time.

Capacitors 358 and 364 are connected to the two inputs of summing amplifier 384, the output of which is connected through manually operated switch 702 to comparator 410. Pulse processing network 418 is also connected to one of the terminals of switch 702. The outputs 426 and 406 of comparator 410 are connected to digital output device 412 and also, as noted above, to switches 694, 700, 382, 698. Furthermore, wire 406 is connected to flip-flop 402 through switch 408. Programmer 704 generates control voltages for various functions which will be described presently.

For analog to digital conversion, switch 702 is set in the upper position and the analog input voltage is connected to terminal 420. In the first portion of the first bit period, switches 706 and 674 are closed and opened. Also, flip-flop 402 is reset to state 1. Capacitor 358 is thereby charged to the analog input voltage, and capacitor 364 is discharged. It will be clear from previous descriptions that the voltage at the input to the comparator 410 will have the same polarity as the analog input voltage. Therefore, when the comparator receives a gate pulse in the second portion of the first bit period, a pulse will occur on wire 426 if the analog input voltage is positive and on wire 406 if the analog input voltage is negative. If a pulse occurs on wire 406 it will trigger the flip-flop to state 2 through switch 408 which is closed only during the second portion of the first bit period; if a pulse occurs on wire 426, the flip-flop will remain in state 1. When the flip-flop is in state 1, switches 676, 684. 694, 382, 682, 690, 696 are closed and when the flip-flop is in state 2, switches 678, 686, 692, 700, 680, 688, 698 are closed. Also in the second portion of the first bit period, switches 366 and 368 are closed and opened if the analog input voltage is negative, whereas switches 372 and 374 are closed and opened if the analog input voltage is positive. Switching operations in the second and following bit periods are generally as described for the two-portion bit cycle in relation to FIGURE 15.

As an example, switching operations are shown in FIGURE 42 for an analog input voltage for which the algebraic sign and first three significant digits are −101. The voltages on the capacitors and the comparison voltage on wire 386 are shown in FIGURE 42, and the comparison voltage and the voltage on capacitor 358 are shown graphically in FIGURE 42. FIGURE 42 will be readily understood from previous figures and explanations, and will not be described further.

For digital to analog conversion, switches 708 and 702 are moved from the up to the down positions, after which the switching operations will be clear from the description for FIGURE 15.

FIGURES 40 and 41 show variaitons of the converter of FIGURE 39. In FIGURE 40 there appears a circuit suitable for analog to digital conversion only. In FIGURE 41 the circuit is suitable for digital to analog conversion only. As in previous embodiments, it is believed that the operation of the circuits of FIGURES 40 and 41 is clear from the description of the operation of the circuit of FIGURE 39 wherein like elements bear like reference numerals. The comparison signal generators are identical in all circuits and are enclosed by the dashed lines 405 in FIGURES 40 and 41.

FIGURE 43 illustrates a programmer for the circuits of FIGURES 39, 40 and 41. The programmer is illustrated for a three part bit period covering four bit periods so that the stepper switches necessarily sweep over twelve stationary contacts.

The converter systems in FIGURES 15, 29, 34, and 39 have embodied a number of different elements in various combinations. Many other combinations of the elements are possible. Since all of the combinations will be understood from the descriptions already given herein, figures will not be presented for any others. Instead, one classification of the elements is given in the following table, and it is to be understood that this invention includes all possible combinations thereof.

COMPONENTS IN CIRCUIT FOR SYNTHESIS OF COMPARISON VOLTAGE AND ANALOG OUTPUT VOLTAGE 6 capacitors, 2 batteries
6 capacitors, 1 battery
5 capacitors, 1 battery

BIT PERIOD

Two portions
Three portions

PROGRAM FOR SYNTHESIS OF COMPARISON VOLTAGE AND ANALOG OUTPUT VOLTAGE

FIGURE 6
FIGURE 7

ANALOG INPUT

To arithmetic node
To capacitor

CHARGE TRANSFER

From small capacitor to large capacitor (approximation)
Unity gain amplifier (exact)
High-gain polarity-reversing amplifier (exact)

PROVISION FOR BOTH POSITIVE AND NEGATIVE ANALOG INPUTS AND OUTPUTS

Polarity reversing amplifier
Switching operations

BN2 TYPE CONVERTER

The converters of this type are identified by comparison signal generator circuits for binary numbers having no delayed feedback, and utilizing three capacitors plus anticipation. They follow the 1, 0 program of FIGURE 6.

The reversible analog to digital converter shown in FIGURE 44 generates the comparison voltage in a manner different from that described previously. The comparison voltage has two components, one of which is equal to the final value of the comparison voltage in the previous bit interval, and the other which is equal to the increment which will be added in the event that the next binary digit is 1. In addition this system provides for the conversion of both positive and negative quantities by reversing the polarity of the source of standard voltage. Charge transfer to the final storage condenser in the comparison voltage generator is by the means described in connection with FIGURE 5.

The positive terminal of battery 716, the source of standard potential, is connected to the left hand terminals of switches 717 and 719. The negative terminal of battery 716 is connected to the left hand terminals of switches 718 and 720. The right hand terminals of switches 717 and 720 are connected together and to the upper terminal of capacitor 721. The right hand terminals of switches 718 and 719 are connected to ground. The lower terminal of capacitor 721 is connected to ground. The actuating coil for switches 717 and 718 is connected to the right hand terminal of switch 745. The actuating coil for switches 719 and 720 is connected to the right hand terminal of switch 746. The upper terminal of capacitor 721 is connected by wire 712 to left hand terminal of switch 722. The right hand terminal of switch 722 is connected to the upper terminal of capacitor 724, to the right hand terminal of switch 725, to the left hand terminal of switch 726, and by wire 713 to the right hand terminal of switch 723 and to the middle input terminal of the arithmetic node 738. The actuating coil for switch 722 is connected to wire 710 from programmer 742. The actuating coil for switch 725 is connected to the right hand terminal of switch 732 and to the right hand terminal of switch 734. The left hand terminal of switch 723 is connected to ground, and the actuating coil for switch 723 is connected to wire 701 from programmer 742. The lower terminal of capacitor 724 and the left hand terminal of switch 725 are connected to ground. The actuating coil for switch 726 is connected to the right hand terminals of switches 733 and 735. The right hand terminal of switch 726 is connected to the input of amplifier 730 and to the left hand terminal of capacitor 729 and to the right hand terminal of switch 728 by wire 727. The left hand terminal of switch 728 is connected to ground. The actuating coil for switch 728 is connected by wire 701 to programmer 742. The right hand terminal of capacitor 729 is connected to the output of amplifier 730 and to the analog output terminal 731. The analog output terminal, wire 714 is connected to the lower input terminal of the arithmetic node 738. The left hand terminals of switches 733 and 734 are connected to wire 708 from comparator 739. The left hand terminals of switches 732 and 735 are connected by wire 709 to comparator 739. The actuating coil for switches 732 and 733 is connected by wire 704 to flip-flop 743. The actuating coil for switches 734 and 735 is connected by wire 705 to flip-flop 743.

The analog input terminal 747 is connected to manual switch 748. The arm of switch 748 is connected by wire 711 to the input of arithmetic node 738. The output of arithmetic node 738 is connected to manual switch 737. The arm of manual switch 737 is connected by wire 715 to the input of comparator 739. The programmer 742 is connected to comparator 739 by wire 706. Wire 708 at output of comparator 739 is connected to digital output device 740 and to the right hand terminal of switch 744. Wire 709 at the output of comparator 739 is connected to digital output device 740. The left hand terminal of switch 745 is connected to wire 705 at the output of flip-flop 743. The left hand terminal of switch 746 is connected to wire 704 at the output of flip-flop 743. Programmer 742 is connected to flip-flop 743 by wire 701. The left hand terminal of switch 744 is connected to flip-flop 743. The actuating coil for switches 744, 745, and 746 is connected by wire 703 to programmer 742. Programmer 742 is connected to pulse processing network 741 by wires 752 and 753. Pulse processing network 741 is connected to manual switch 737 by wire 751. Digital input terminal 749 is connected to manual switch 750. The arm of switch 750 is connected to pulse processing network 741. Synchronizing input terminal 754 is connected to programmer 742.

The operation of the system shown in FIGURE 44 as an analog to digital converter will be described first, and the operation as a digital to analog converter will be described thereafter. In accordance with previous descriptions, all relays and other mechanical devices may be replaced by electronic devices.

For operation as an analog to digital converter manual switches 748, 750 and 737 are operated to the analog to digital positions. FIGURE 47 shows the voltages that exist at various points within the converter shown on FIGURE 44 for the case when the analog input voltage is +.65E.

During the first portion of the first bit period switches 723, and 728 are closed and a pulse on wire 701 resets flip-flop 743 so as to open switches 732 and 733 and to close switches 734 and 735. All other electrically operated switches are open. The closure of switch 723 causes the voltage on wire 713 and the voltage across capacitor 724 to be zero. The closure of switch 728 connects the input of amplifier 730 to ground and causes the output terminal of amplifier 730 and wire 714 to be at ground potential. Thus at this time the three input signals to the arithmetic node 738 on wires 711, 713 and 714 are: the analog input voltage, zero, and zero respectively. In this system the arithmetic node is a device which sums the potential on wire 711 with the potential on wire 713 and with the negative of the potential on wide 714. Thus, during the first portion of the first bit interval, the potential at wire 736 at the output of the arithmetic node is the analog input voltage.

The output of the arithmetic node is connected to the input of the comparator during analog to digital conversion by switch 737, and wire 715. Comparator 739 is a device which, when gated by a signal on wire 702 during the last portion of each bit period, produces an output pulse on wire 708 or on wire 709. The pulse occurs on wire 708 if the input to the comparator on wire 715 is positive at the start of the gating signal and occurs on wire 709 if the potential on wire 715 is negative at the start of the gating signal.

At the start of the last portion of the first bit period, swiches 744, 745 and 746 are closed. The comparator gating signal occurs on wire 706 causing, in the instance shown in FIGURE 47, a pulse on wire 708. The pulse on wire 708 causes flip-flop 743 to be triggered so that switches 732 and 733 are closed and switches 734 and 735 are opened for the remainder of the conversion period. Switches 719 and 720 are closed for the last portion of the first bit period, thereby charging capacitor 721 to −E. The occurrence of a pulse on wire 708 at the output of the comparator and the charging of capacitor 721 to −E signified that the sign of the analog input voltage was positive.

At the start of the second bit period, switch 722 is closed charging capacitors 721 and 724 to −E/2 as was explained previously in connection with FIGURE 1A. At this time the voltage at the output of arithmetic node 738 is equal to the analog input voltage, $$-\frac{E}{2}+0$$

or in this case +.15E. Thus, the input signal to the comparator is positive at the start of the last portion of the second bit period and a pulse occurs on wire 708 during the last portion of the second bit period signifying that the binary digit is 1. The pulse on wire 708 is connected through switch 733 to the actuating coil for switch 726. Switch 726 is closed thereby transferring all the charge on capacitor 724, to capacitor 729 by the means described previously in the connection with FIGURE 5. In the case illustrated, capacitors 729, 724 and 721 are equal, therefore the voltage at the output of amplifier 730 on wire 714 changes from zero to +.5E. The pulse on wire 708 during the last part of the second bit period signifies that the most significant binary digit is one.

During the first part of the third bit period switch 722 closes causing capacitors 721 and 724 to be charged to −¼E. At this time the voltage out of the arithmetic node and at the input of the comparator is −.10E. As a result, during the last portion of the third bit period a pulse will occur on wire 709 at the output of the comparator which will cause switch 725 to close discharging capacitor 724 to ground and leaving the potential at the output of amplifier 730 on wire 714 unchanged at +.5E. The pulse on wire 709 signified that the second binary digit was 0.

At the start of the fourth bit interval switch 722 closes charging capacitors 721 and 724 to −E8. At this time the voltage at the output of the arithmetic node is +.025E. As a result during the second half of the fourth bit period, a pulse will occur on wire 708 at the output of the comparator causing switch 726 to close thereby transferring all the charge from capacitor 724 to capacitor 729 and causing the potential on wire 714 at the output of amplifier 30 to increase from +.5E to +.625E. This process signified that the third binary digit was 1.

This process continues until as many binary digits are converted as are required by the particular application. It should be noted that exactly the same results would have occurred if wire 713 had been connected to the upper terminal of capacitor 721 rather than to the upper terminal of capacitor 724.

For digital to analog conversion manual switches 737, 748 and 750 are operated to the digital to analog positions. The digital input signal on terminal 749 is connected to the pulse-processing network 741. The pulse-processing network produces a serial train of pulses such that the potential of wire 751, at the start of the second part of all bit periods, is positive for positive digital input signals or when the digit is one; and is negative for negative digital input signals or when the digit is 0. This signal is applied to the input of comparator 739 through switch 737. When the comparator is gated by the signal on wire 702 during the second part of each bit period, the pulses on wire 708 or wire 709 cause switches to operate in the manner described previously in connection with analog to digital conversion. As a result the potential at the output of amplifier 730, which is connected to analog output terminal 731, arrives at the analog value representing the digital input signal at the end of the conversion period. FIGURE 47 shows the switching and voltage relationships that will exist for a digital input signal of +101.

The system shown in FIGURE 44 can be modified to employ the means described in connection with FIGURE 4 for transferring the charge from capacitor 724 to capacitor 729 when the binary digit is 1. The system shown in FIGURE 44 can also be modified to employ the means described in connection with FIGURE 3, for transferring the charge from capacitor 724 to a very large capacitor when the binary digit is 1.

Anticipation voltage (suitable for a connection to wire 713) which is equal to 0 during the first bit period, +.5E during the second bit period, +.25E during the third bit period etc. can be obtained at a lower impedance level from a stepped resistance voltage divider connected across batteries 716 and controlled by the programmer.

FIGURES 45 and 46 illustrate variations of the circuit of FIGURE 44 for one-way conversion only. FIGURE 45 illustrates a circuit suitable for analog to digital conversion. The circuit of FIGURE 46 is for digital to analog conversion. In each of FIGURES 45 and 46 the comparison signal generator is identical to that shown in FIGURE 44 and is enclosed in dashed lines labelled 756. It is believed that the operations of FIGURES 45 and 46 is clear from the previous description of the operation of FIGURE 44.

FIGURE 48 illustrates a programmer for the circuits of FIGURES 44, 45 and 46. As in previous programmer circuits the stationary contacts correspond to the total number of portions for four bit periods. For the four bit periods shown in FIGURE 47 with each bit period having two portions, it is necesary that the stationary contacts of the stepper switch shown in FIGURE 48 have the eight stationary contacts illustrated.

BN3 TYPE CONVERTERS

This class of converter involves operation of the comparison signal generator circuit with no delayed feedback and uses three capacitors. The systems of this class follow the ± program of FIGURE 7.

A preferred general type of reversible analog to digital converter is that which follows the program illustrated in FIGURE 7 to create the associated code. This type has the advantage of fewer discrete operations on the part of the switches and permits a more rapid encoding to be accomplished. Variations of this basic type are possible in which the arithmetic node is combined with or separated from the means for obtaining the analog sample.

One reversible binary analog to digital converter employs a storage capacitor which is common to the analog sample storage system and to the comparison voltage system and performs the functions of the arithmetic node. FIGURE 49 shows a converter of this type. Briefly, the analog sample is placed upon the storage capacitor and this voltage is then caused to reduce toward zero by the addition or subtraction of successive comparison voltage steps. The operation of the switches is programmed in such a way that the voltage on the storage capacitor follows the program illustrated in FIGURE 7. An important feature is that this converter requires only one amplifier unit and with the aid of additional switching can use this one amplifier both for analog input coupling at the time of sampling and for the converter operation. The operation of the system shown in FIGURE 49 will be explained in detail in the following paragraphs. Reference is made to the timing diagrams shown in FIGURE 52.

For purposes of explanation FIGURE 49 shows electrically operated switches or relays for the basic operations. These switches may take many other forms as will be apparent. The use of relays for the figures is not considered to limit the switching operations to this one type of switch. In order to simplify the discussion to follow, the use of the word switch implies any form of electrically operated or electronically operated arrangement. When a manually operated switch is being referred to it will be so described. The figure also shows simplified blocks for various elements of the converter such as the programmer, comparator, digital output device and pulse-processing network. These elements may take on many different forms of which several have been described previously.

Amplifier 815 is a unity gain amplifier. As described previously in connection with FIGURE 1A, capacitors 807 and 809 have equal capacitance for a binary converter. Battery 806, having a potential E, is connected between ground and the arm of switch 804 which is part of a multi-pole switch operated by coil 805. The fixed contact of switch 804 is connected to the upper plate of capacitor 807 as well as to the upper arm of switch 808, another multi-pole switch, by wire 831. The fixed contact of this switch section is connected to the upper plate of capacitor 809 and to the upper arm of switch 810 as well as to the upper arm of switch 813 by wire 832. Both switches 810 and 813 are multi-pole switches. The movable arm of the lower section of switch 808 is connected to ground. The fixed contacts of the lower section of switch 808 is connected to the lower plate of capacitor 809 and to the movable arm of the lower sections of switches 810 and 813 by wire 836. The fixed contact of the upper section of switch 813 connects to the arithmetic node 814. This node is also connected to the input terminal of amplifier 815 and to the fixed contact of switches 802 (a part of the multi-contact switch operated by coil 805), switch 816, and the lower section of switch 810. The fixed contacts of the upper section of switch 810 and the lower section of switch 813 connect to the amplifier output terminal by wire 819. The amplifier output 819 also connects to the fixed contact of switch 818 (a part of the multi-pole switch operated by coil 805) and to one of the fixed contacts on manually operated switch 820 corresponding to the analog to digital operating position of that switch. Wire 819 also connects to the converter output terminal 838 labeled "Analog Output." The arm of switch 818 connects to the arm of switch 816 and to the upper plate of capacitor 817. The lower plate of capacitor 817 is connected to ground. The arm of switch 802 is connected to the converter input terminal labeled "Analog Input," identified as 801, as well as to the fixed contact of manually operated switch 803 which corresponds to the digital to analog operating position for the converter. Switch 803 is a part of switch 820 and its arm is connected to ground. The fixed contact of switch 803 corresponding to analog to digital operating position is not connected anywhere. The fixed contact of manually operated switch 820 corresponding to the digital to analog operating position is connected by lead 834 to the pulse processing network 833 which in turn is connected to the converter input terminal 827 labeled "Digital Input." Pulse processing network 833 is connected to wires A and B from programmer 828. The arm of manually operated switch 820 is connected by lead 835 to the comparator 821. One output of the comparator is connected by lead 823 to the coil of switch 810 and to the digital output device 825. The other comparator output connects by lead 824 to the coil of switch 813 and to the digital output device 825. The comparator is connected by wire 822 to output D of the programmer. The digital output device is connected by wire 826 to output E of the programmer 828. Wire 829 connects between the converter input terminal labeled "Synchronizing Input" and the programmer 828. Wires A, B, C, connect between the programmer 828 and switch coils 805, 808, and 816 respectively. The other ends of all electrically operated switch coils are connected together by lead 830 and in turn connect to the switch operating power source battery 837. The other terminal of this battery connects to ground.

Analog to digital converter operation will be described first, therefore manually operated switch 803 is placed in the A/D or right hand position. Initially switches 802, 804, 808 and 818 are closed. This causes the potential on wires 831 and 832 to be the same as that of the battery 806. Thus, since the lower contact of switch 808 connects the lower plate of capacitor 809 to ground both the capacitors 807 and 809 will be charged to E, the potential of battery 806. While this action is taking place switches 810 and 813 remain open. The timing of the operation of these switches is further illustrated by the timing waveforms shown in FIGURE 52. In these waveforms when the line is up the switch is considered to be closed and when the line is down the switch is open. In order to simplify the drawing, these waveforms have been shown with vertical edges although it is recognized that in practice such waveforms will have finite rise and fall time characteristics. However, the finite rise and fall characteristics will not prevent the converter from operating as described.

With switch 802 closed the analog input voltage is connected by wire 814 to the input of the unity gain amplifier 815. The output of the amplifier, wire 819, therefore rises to the potential of the analog voltage and since switch 818 is closed capacitor 817 is charged to this analog potential. The comparator is controlled by the programmer, wire 822 during this interval so that it takes no action to activate either wire 823 or 824.

At the end of the first section of bit 1, the following switch action takes place. Switches 802, 804, 808 and 818 open while 816 closes. Switches 802, 804, 816 and 818 then remain in this state for the duration of the conversion period. The comparator is gated through wire 822 from the programmer and will operate to close either switch 810 or switch 813 respectively depending on whether the analog sample voltage, which continues to be stored on capacitor 817 is positive or negative. The action of the comparator is described previously in connection with FIGURE 23. Operation for the binary code pattern +01 is illustrated in the center portion of FIGURE 52. The first digit indicates the polarity with closure of switch 810 corresponding to a positive quantity or closure of switch 813 corresponding to a negative quantity. This connects capacitor 809 between the input and output terminals of the amplifier 815 and transfers all the charge originally on capacitor 809 to capacitor 817 as previously described in connection with FIGURE 3. As further described in conjunction with FIGURE 3, the net potential on capacitor 817 after the transfer of charge is completed will be the sum of the original analog sample potential $e_{in}$, and the first comparison voltage, $\pm C_1E/C_2$ where $C_1$ and $C_2$ are the capacitance of capacitors 809 and 817 respectively.

At the start of the second bit, switches 810 and 813 are open and switch 808 closes. Capacitor 807 is charged to potential E while capacitor 809 is completely discharged just prior to this switch operation. As described previously in conjunction with FIGURE 1A the charges will redistribute between the two equal capacitors 807 and 809 with the result that the potential across each capacitor will be $E/2$. Again, at the end of the first section of the bit, switch 808 opens and the comparator is gated through wire 822. If the potential on capacitor 817 is negative, switch 813 will operate corresponding to a binary digit of 0 for the second bit. This connects capacitor 809 between the input and output terminals of the amplifier 815 and transfers all the charge originally on capacitor 809 to the capacitor 817. This adds a potential of $\pm C_1E/2C_2$ to the potential previously across capacitor 817. The sign of the change in potential across capacitor 817 will be in the direction to reduce the voltage across its terminals.

At the start of the third bit, switches 810 and 813 are again open due to the fact that the comparator gating signal on lead 822 has ceased and switch 808 closes. The capacitor 807 was charged to a potential $E/2$ while capacitor 809 was completely discharged just prior to this switch operation. When switch 808 closes the charges redistribute themselves between capacitors 807 and 809 resulting in a potential across each capacitor of $E/4$. Again at the end of the first section of the bit switch 808 opens and the comparator is gated. If the remaining potential on capacitor 817 is now positive, switch 810 will operate corresponding to a binary digit of 1 for the third bit. This connects capacitor 809 between the input and output terminals of the amplifier and transfers all the charge on capacitor 809 to the capacitor 817. This adds a potential $$\pm\frac{C_1}{C_2}\times\frac{E}{4}$$

to the potential previously on capacitor 817.

This process of repeatedly adding or subtracting binarily related comparison voltages to the original potential on the analog storage capacitor continues for as many bits as may be required by the particular application. By this program the voltage remaining on the analog storage capacitor approaches zero with a waveform similar to that shown previously in FIGURE 7. As shown in FIGURE 52, the operation of switch 810 corresponds to a binary code pattern of +01. This code indicates that the analog input, $e_{in}$, bears the following relationship to E:

$$+E>e_{in}>+\frac{E}{2}$$

Another example for the relationship that $$-E<e_{in}<-\frac{E}{2}$$

is given in the same figure.

The same unit may be operated as a digital to analog converter. With manually operated switch 803 placed in the D/A position the analog input terminal is grounded and the input to the comparator is transferred to the digital input terminal via the pulse processing network 833. The output of this network is a positive or negative voltage on lead 834 which changes its state during the time between successive bits. This is known as a non return-to-zero waveform. A pulse on wire 827 will cause the comparator to operate switch 813 while the lack of a pulse will cause the comparator to operate switch 810 at the time of the programmer pulse. The switch timing and voltage sequences for a typical digital code pattern of +00 are shown in FIGURE 52.

During the first part of the first bit, switches 802, 804, 808 and 818 are closed while switches 810, 813 and 816 are open. This causes the potential on capacitors 807 and 809 to rise to the same potential E as the battery 806 since these capacitors are connected to the battery through leads 831 and 832 by the action of switches 804 and 808. The closing of 802 and 818 causes any charge to be removed from capacitor 817 since manual switch 803 is in the D/A position which grounds the input to amplifier 815. The comparator is not gated since no-pulse exists on lead 822 from the programmer and therefore it takes no action at this time.

At the end of the first section of the first bit, switches 802, 804, 808 and 818 open and switch 816 closes. Switches 802, 804 and 818 then remain open for the duration of the conversion period while switch 816 remains closed for the same period. The comparator is gated by the programmer through a pulse on lead 822. Since in the example, FIGURE 52, the input to the comparator on lead 835 is negative at this time the comparator causes switch 813 to close. Through the action described previously in connection with FIGURE 4, when capacitor 809 is connected to the amplifier through switch 813, all its charge is transferred to capacitor 817. The net potential on capacitor 817 will rise to $$\frac{C_1}{C_2}E$$

as previously described. Since the gating pulse to the comparator ceases at the end of the bit switch 813 opens. At this time switch 808 closes. As described previously in connection with FIGURE 1A, the charges will redistrirbute between the two equal capacitors 807 and 809 with the result that the potential across each capacitor will be $E/2$. Again, at the end of the first portion of the bit, the comparator is gated through wire 822 and switch 808 opens. Since the digital input 0, now applies a positive potential to the comparator, input switch 810 will operate. Ths connects capacitor 809 between the amplifier terminals and transfers all the charge from capacitor 809 to the storage capacitor 817. This adds a potential $$-\frac{C_1}{C_2}\times\frac{E}{2}$$

to the potential $$\frac{C_1}{C_2}E$$

previously held by capacitor 817. Since the gating pulse to the comparator ceases at the end of the bit period, switch 810 opens. Again switch 808 closes and the charge remaining on capacitor 807 redistributes between capacitors 807 and 809 resulting in a potential of $E/4$ across capacitor 809. At the end of the first portion or section of the bit, switch 808 opens and the comparator is activated as before. Since the digital input is another 0, a positive potential is present at the comparator input causing switch 810 to operate. This connects capacitor 809 across the amplifier terminals and transfers all its charge to storage capacitor 817. This adds a potential $$-\frac{C_1}{C_2}\frac{E}{4}$$

to the potential $$\frac{C_1 E}{C_2 2}$$

stored on capacitor 817 at the end of the previous bit cycle. The resulting potential on capacitor 817 is thus reduced to $$\frac{C_1 E}{C_2 4}$$

by the end of the bit. This potential is then the analog voltage which is generated by the device operating as a digital to analog converter with the input code shown. The above action may be repeated for an many cycles as is required for a particular application.

FIGURES 50 and 51 show the corresponding circuits for one-way conversion. The circuit of FIGURE 50 is for analog to digital conversion only with the comparison signal generator the same as that shown in FIGURE 49. The comparison signal generator in FIGURE 50 is enclosed in dashed lines 839. In FIGURE 51 for digital to analog conversion the comparison generator is again the same as that shown in FIGURE 49 and is enclosed by the dashed lines 840. Since the circuit of FIGURE 51 involves no analog input there is no necessity for incorporating the means in the comparator for switching the amplifier 815 between the analog input circuit and the charge transfer circuit. For this reason several of the switches shown in the comparator of FIGURE 49 are not required in the comparator of FIGURE 51. Otherwise the operation is the same, that is, the comparator of FIGURE 51 is the same as the comparator for FIGURE 49 when the latter is set for digital to analog conversion.

Several of the earlier embodiments have been described with respect to the utilization of stepping switches for the programmer. FIGURE 53 shows a variation wherein the programmer is completely electronic. This programmer is for the converter system of FIGURES 49, 50 and 51 and is constructed to operate for three bit periods as illustrated in FIGURE 52. Each bit period consists of two portions. The programmer is built up from standard circuits which are described in the literature. The clock 845 includes a gated multivibrator which operates at twice the bit rate. Moreover, a differentiating circuit is included in the clock so that its output is a train of pulses rather than a square wave. The flip-flops 841, 842, 843, and 844 are standard Eccles-Jordan circuits and each flip-flop is provided with two trigger inputs. One trigger input is symmetrical so that a pulse reverses the state of the flip-flop regardless of its state prior to the pulse. The other trigger input is unsymmetrical, and a pulse on this input causes the corresponding side of the flip-flop to flip to high voltage and zero current unless that is already the case. In the event that the side is already at a high voltage and is non-conducting, a pulse on the unsymmetrical trigger input has no effect. The voltages at various points in the circuit of FIGURE 53 are shown in FIGURE 53A.

In FIGURES 53 and 53A all flip-flops are reset (for example by a push-button) so that side one is at a high voltage prior to the first synchronizing pulse. Therefore, the wires from side two are at a relatively low voltage. The synchronizing pulse reverses the state of flip-flop 844 which places a high voltage on the clock 845 and starts it running. Immediately thereafter, the first clock pulse reverses flip-flop 841 to make side one conducting and therefore the voltage from side one passes through a negative step. This step reverses flip-flop 842 which in turn reverses flip-flop 843. Hence, in all the flip-flops side one is now conducting and the wires from side two are at a high potential. The three potentials at the input of the AND circuit 848 produce a positive voltage at its output which reverses the Schmitt circuit 849 so that the voltage on wire 816 falls from a high to a low level. Upon the occurrence of the second clock pulse side two of flip-flop 841 becomes conducting and falls to a low voltage but flip-flop 842 and 843 are not affected since the symmetrical trigger connections are such that the next flip-flop reverses its state only when the voltage of the output of the previous flip-flop changes from a high to a low value. The decrease in voltage on the wire from side two of flip-flop 841 cuts off the AND circuit 848 whereupon the voltage at its output falls to a low value. This decrease in voltage reverses the Schmitt circuit so that the voltage on wire 816 rises to a high value. It will be evident from FIGURE 53A that the three inputs to the AND circuit 848 do not again become positive at the same time in the same encoding period and therefore the voltage at the output of the AND circuit 848 is high only in the first portion of the first bit period.

It will be noted from FIGURE 53A that the voltage waves in the three bit periods are the waves required in FIGURE 52. Just after the seventh clock pulse it will be observed from FIGURE 53A that the three inputs to the AND circuit 847 are positive. Therefore, the output of this AND circuit is positive and flip-flop 844 is reversed so that side two is conducting which makes the voltage on the output wire low; thus stopping the clock. Furthermore, the positive output from the AND circuit 847 fires the blocking oscillator 846 and its output pulse resets flip-flops 841, 842 and 843 to the initial condition in which sides two are conducting and their voltages are low. The programmer is then ready to receive another synchronizing pulse.

FIGURES 49A, 49B and 49C show modifications of the basic converter system of FIGURE 49 and like elements bear like reference numerals. In all instances the programmers and programming sequence is the same as for the circuit of FIGURE 49.

In FIGURE 49A switching of capacitor 817 between the input and output of amplifier 815 is omitted. The analog input is always to the input side of amplifier 815. A second amplifier 801A is inserted in the input lead in place of the switching in FIGURE 49.

In FIGURE 49B the circuit is quite similar with the analog to the top plate of capacitor 817 but in this case both amplifiers 815 and 801A are omitted. However in the circuit of FIGURE 49B the capacity of capacitor 817 must be very much larger than that of 807 or 809. In this circuit the charge transfer is only approximately complete as explained previously in conjunction with FIGURE 1A.

In FIGURE 49C the minus infinity gain type charge transfer circuit of FIGURE 5 is substituted for the unity gain type charge transfer circuit of FIGURE 3 in the converter of FIGURE 49. In this case capacitor 817 is connected between the input and output of minus infinity gain amplifier 815A.

Another reversible binary analog to digital converter of this type is shown in FIGURE 54. This converter also adds or subtracts successive voltage steps following the program illustrated in FIGURE 7 but the comparison voltage is generated separately and stored for comparison with the analog input voltage. Therefore, the final voltage on the storage condenser is equal to the analog voltage instead of approaching zero as it does in the analog to digital converter system shown in FIGURE 49 and a separate arithmetic node is involved in making the comparisons.

In FIGURE 54 the battery 850 having a potential E, is connected between one arm of switch 851 and ground. The fixed contact of this section of switch 851 connects to the arm of switch 853 and to the upper plate of capacitor 852 by wire 878. The lower plate of capacitor

852 is connected to ground. The lower arm of switch 853 is connected to ground. The upper fixed contact of switch 853 is connected to the upper arms of switches 857 and 856 and to the upper plate of capacitor 855 by wire 879. The lower fixed contact of switch 853 is connected to the lower arms of switches 857 and 856 and to the lower plate of capacitor 855 by wire 880. The upper fixed contact of switch 856 connects to the amplifier 860 output via wire 863 while the lower fixed contact connects to the amplifier input via wire 858. The amplifier input 858 connects to the arm on one section of switch 851 and switch 857 and also to the upper plate of capacitor 859. The lower plate of capacitor 859 connects to ground as does the fixed contact arm of the associated section of switch 851. The output of the unity gain amplifier 860 is connected to the arm of manually operated switch 874 via lead 863. The fixed contact of this section of switch 874 connects to one input of the arithmetic node 862. The other fixed contact of this section of switch 874 connects to the analog output terminal 873. The other input to the arithmetic node 862 is the analog input voltage connected to terminal 861. The output of the arithmetic node is connected to one fixed contact of the manually operated double pole double throw switch 874. The arm of this switch section is connected to the comparator 866. The other fixed contact of this switch 874 is connected to the pulse processing network 870. This network also connects to the digital input terminal 871. The output of the comparator is connected via leads 867 and 868 to the digital output device 869 and to the operating coils of switches 857 and 856. The comparator is connected to the programmer 881 by lead 876. The digital output device is connected to the programmer 881 by lead 875. The programmer also had leads connected to the operating coils of switches 851 and 853. The programmer is connected to the synchronizing input terminal 872.

The operation of the device as an analog to digital converter and as a digital to analog converter is quite similar to the operation of the device shown in FIGURE 49. The switch timing and voltage relationships are shown in FIGURE 57. In these waveforms as in those of FIGURE 52 when the line is up the switch is considered to be closed and when the line is down the switch is open. The same comments concerning simplification of the waveforms depicted apply to both FIGURES 52 and 57.

It is considered that the analog input voltage is connected to terminal 861 and remains essentially constant throughout an encoding period. Manual switch 874 is thrown to the A/D position. Initially switches 851 and 853 close thereby causing capacitors 852 and 855 to charge to a potential E, appearing on wire 878, and discharging capacitor 859 to ground potential. Since the amplifier 860 has unity gain, its output on lead 863 will be at ground potential at this time. The comparator as described previously in connection with FIGURE 23 takes no action until it is gated by a programmer pulse on line 876. This pulse occurs during the second part of each bit period. The potential on wire 863 is zero and the analog input potential is $e_{in}$ and is assumed to be within the full scale encoding range of $$\pm 2\frac{C_1}{C_3}E$$

Specifically, $e_{in}$ is greater than $E/2$ but less than E. (In this case $C_1=C_2=C_3$.) At the beginning of the second portion of the bit period, the comparator is gated by a pulse on wire 876 and thereby produces a pulse on wire 867. This action closes switch 857 corresponding to a binary 1 while at the same time switch 853 opens. Through the charge transfer action described in conjunction with FIGURE 3, all the charge which was on capacitor 855 is transferred to capacitor 859. Since capacitors 859 and 855 as well as 852 are all of equal capacitance, the transfer action results in a potential E appearing on wire 863 during the last portion of the bit period. Next the comparator gating pulse ceases causing switches 857 and 856 both to be open while a pulse is applied to switch 853 causing it to close. This corresponds to the first part of the second bit period at which time the charge which remained on capacitor 852 is redistributed equally between the capacitor 852 and capacitor 855. Capacitor 855 thereby charges to a potential $E/2$. At the beginning of the second part of the bit period another gating pulse is applied to the comparator whose input potential is now $e_{in}-E$ which is negative for the example being considered. This action causes a pulse to appear on wire 868 corresponding to a binary 0 and closes switch 856. Again the charge on capacitor 855 is transferred to capacitor 859, this time with a polarity such that it subtracts from the original charge on capacitor 859 thereby resulting in a potential of $E-E/2$ on wire 863. Again the pulse on wire 876 to the comparator ceases, opening switch 856 while a pulse occurs closing switch 853. The charge remaining on capacitor 852 redistributes itself between capacitor 852 and capacitor 855 resulting in a potential $E/4$ on both capacitors. When the comparator gating pulse on wire 876 occurs in the second part of the third bit period, the net input potential to the comparator is negative therefore causing the comparator to produce a pulse on wire 867. This pulse closes switch 857. The charge on capacitor 855 is transferred to capacitor 859 with a polarity such that its adds to the original charge resulting in a net potential of $e_{in}-3E/4$ at the comparator. Thus, the encoding is completed with a resulting code pattern of 101 for the case when $e_{in}$ is greater than $E/2$ but less than E.

For digital to analog conversion the manually operated switch 874 is placed in the D/A position. This action breaks the feedback connection between the comparison voltage generator and the comparator and connects the digital input pulses to the comparator directly so that its action is controlled by these pulses. The pulse processing network 870 produces a positive or negative voltage on wire 882 which changes its state only at the time between successive bits. This is known as a non-return-to-zero waveform. A pulse on wire 871 causes the comparator to operate switch 857 while the absence of a pulse causes the comparator to operate switch 856 at the time of the comparator gating pulse from the programmer.

For the typical digital code pattern 010, the relationships are as shown in the lower section of FIGURE 57. Initially switches 856 and 857 are open while switches 851 and 853 are closed. Capacitors 852 and 855 thus charge to a potential E. At the beginning of the second part of the bit period, switches 851 and 853 open while the comparator gate causes switch 856 to close. This connects capacitor 855 between the input and output terminals of amplifier 860 and causes all its charge to be transferred to capacitor 859 changing its potential to $-E$. Next switches 856 and 857 open or remain open while switch 853 closes. The charge on capacitor 852 redistributes itself between 852 and 855 resulting in a potential of $E/2$ on both. As the second part of the second bit period starts, switch 853 opens and the input to the comparator causes switch 857 to close. The charge on capacitor 855 is transferred to capacitor 859 with such a polarity as to decrease its potential to $-E/2$. Switches 857 and 856 open or remain open at the start of the third bit period while switch 853 again closes. The potential on capacitor 855 rises to $E/4$ while that of capacitor 852 drops to $E/4$. As the second part of the bit period starts, switch 853 opens and because of the input to the comparator, switch 856 closes. This again results in a transfer of the charge on capacitor 855 to capacitor 859 changing its potential to $-3E/4$ and concludes the digital to analog conversion. This final value of the potential on capacitor 859 is the value represented by the code pattern 010. The above operations can obviously be carried on for additional digits depending upon the needs of a particular application.

Another modification of the system described in conjunction with FIGURE 54 results in further simplification for some applications where extreme accuracy may not be necessary. This simplification consists of removal of the unity gain amplifier 860 after which wire 858 is connected to wire 863. The connection between wire 863 and the fixed contacts of switches 856 and 857 is removed and these switch points are then returned to ground. Capacitor 859 or $C_3$ is now made very large compared to capacitor 855 or $C_2$. The system now operates employing the principles discussed previously in conjunction with FIGURE 1A and Equation 2.

FIGURES 55 and 56 show the corresponding circuits for one-way converters having comparison signal generators identical to that illustrated in FIGURE 54. The comparison signal generators in FIGURES 55 and 56 are enclosed by the dashed lines 890 and operate in the same manner as in FIGURE 54. FIGURE 55 shows the corresponding circuit for analog to digital conversion. While the digital output could be taken from either lead 868 and lead 867, it is illustrated from 867. FIGURE 56 shows the corresponding circuit for digital to analog conversion with the analog output taken from the output of amplifier 860. In each case, only the output A from programmer 881 is required because of the reduced number of switching operations involved.

FIGURE 58 shows a stepper switch type programmer for the circuits of FIGURES 54, 55 and 56, similar to programmers earlier described. As can be seen, the programmer is set up as a three output programmer in addition to the gating off output to the flip-flop. While the total of four outputs are required for the operation of FIGURE 54, the additional switching operation output is not required in the circuits of FIGURES 55 and 56 so that this output of the programmer need not be used for these two figures. As is apparent from FIGURE 58, the programmer incorporates six stationary contacts in each bank of the stepper switch in addition to the home contact corresponding to the total number of bit portions or sections covering three bit periods and having two portions each.

In FIGURES 1–58, the transfer of charge may be accomplished by three different means, only one of which is shown in each figure. These means are the positive unity gain circuit of FIGURE 3, the minus infinity gain circuit of FIGURE 5 and the large capacity approximation of FIGURE 1A. Moreover, in these figures, the analog input voltage may be impressed on one terminal of the comparator or on the final capacitor. In converter systems in which the analog input voltage is impressed on the capacitor, the analog input may be connected directly to the capacitor or through an amplifier. Moreover, by suitable changes in the programmer outputs, the operating modes of these circuits may be 0, 1 or +1, −1 as shown in FIGURES 6 and 7 respectively. All possible combinations of these factors in a converter system are within the scope of the invention.

BF1 CONVERTERS

Another class of reversible binary digital to analog converters employs a delayed feedback network and produces a comparison voltage according to the pattern shown in FIGURE 6. These converters employ comparison signal generators which produce binary type signals, include delayed feedback and operate according to the first program identifiable as the 1, 0 or FIGURE 6 program. FIGURE 59 shows an analog to digital converter which is representative of this class of converter. Briefly, the comparison voltage in each bit period is obtained in part from a division of charge between two equal capacitors and in part from the output of a delayed feedback circuit. The delayed feedback circuit produces a voltage at its output which is constant during any bit period and is (after the first bit period) equal to the final value of the voltage at the input to the delayed feedback circuit in the previous bit period. The operation of the system shown in FIGURE 59 is explained in detail in the following paragraphs.

Source 901 of standard voltage is connected to ground and to one terminal of switch 902. The actuating coil for switch 902 is connected to wire A from the programmer 903. The other terminal of switch 902 is connected to wire 904 and to the upper terminals of capacitors 905, and 906 to switch 907 and to amplifier 908. The lower terminal of capacitor 905 is connected to switch 909. The lower terminal of switch 909 is connected to wire 910, the output of the delayed feedback circuit 911 enclosed in dashed lines. The actuating coil for switch 909 is connected to wire B from programmer 903. The lower terminal of switch 907 is connected to wire 910. The actuating coil for switch 907 is connected to wire F from the arm of switch 912. The output of amplifier 908 is connected to the input (wire 914) of the delayed feedback network 911 and to switch 913.

Wire 914 is connected to switches 915 and 916. The actuating coil for switch 915 is connected to wire C from the programmer 903 and the actuating coil for switch 916 is connected to wire D from the programmer 903. The other terminal of switch 915 is connected by wire 917 to capacitor 918, switch 919 and amplifier 920. The lower terminal of capacitor 918 is connected to ground and the lower terminal of switch 919 is connected to ground. The actuating coil for switch 919 is connected to wire A from the programmer 903. The output of amplifier 920 is connected to switch 921. The other terminal of switch 921 is connected to wire 910, the output of the delayed feedback circuit 911. The actuating coil for switch 921 is connected to wire D from the programmer 903. Switch 916 is connected to capacitor 922 and to the input of amplifier 923 by wire 924. The other terminal of capacitor 922 is connected to ground. The output of amplifier 923 is connected to switch 925. The actuating coil for switch 925 is connected by wire C to programmer 903. The right hand terminal of switch 925 is connected to wire 910, the output of delayed feedback circuit 911.

Switch 913 is connected to the output of amplifier 908 and to the arm of switch 927. The actuating coil for switch 913 is connected to wire G from the programmer 903. Switch 926 is connected to ground and to the arm of switch 927. The actuating coil for switch 926 is connected to wire G from the programmer 903. The stationary contacts of switch 927 are connected to the arithmetic node 933 and to the input of amplifier 944. The analog input terminal 928 is connected to the input of amplifier 944 and to switch 932. The analog output terminal 929 is connected to switches 931 and 932 and to the input of the arithmetic node 933. The actuating coils for switches 931 and 932 are connected to flip-flop 945. The output of amplifier 944 is connected by wire 930 to switch 931. The output of the arithmetic node 933 is connected by wire 934 to the input of comparator 935.

Programmer 903 is connected to comparator 935 by wire 936. Comparator 935 is connected to the digital output device 940 by wires 939 and 946. Comparator 935 is connected to switch 912 by wire 938. Flip-flop 945 is connected to wire G from programmer 903. Flip-flop 945 is connected to switch 947. Switch 947 is connected to switch 912 by wire F. The actuating coil for switch 947 is connected to wire G from programmer 903.

Digital input terminal 948 is connected to switch 937. Switch 937 is connected to the input of the pulse-processing network 949. Pulse processing network 949 is connected to wires A and B from programmer 903. The output of pulse-processing network 949 is connected to switch 912. Synchronizing input 943 is connected to programmer 903. Programmer 903 is connected to the digital output device 940 by wire 941 and by wire A. The lower terminal of capacitor 906 is connected to ground.

The operation of the system shown in FIGURE 59 as an analog to digital converter will be described first, and operation as a digital to analog converter will be described thereafter. In accordance with previous descriptions, all relays and other mechanical devices may be replaced by electronic devices.

For operation as an analog to digital converter, manual switches 912, 927 and 937 are operated to the analog to digital converter positions. At the start of the conversion switch 926 is closed and switch 913 is opened. Also flip-flop 945 causes switch 931 to be closed and 932 to be open. Thus the two signals at the input to the arithmetic node are the negative of the analog input voltage and zero. For the purpose of this description it will be assumed that the arithmetic node is a summing device as was described previously. At this time the output of the arithmetic node on wire 934 is positive if the analog input voltage is negative and vice-versa.

Next the comparator 935 is enabled by the programmer 903 through a pulse on wire 936. If the polarity of the voltage on wire 934 at the input to the comparator is positive a pulse will occur at the comparator output on wire 946. If the polarity of the voltage at wire 934 is negtative a pulse will occur at wire 939. A pulse on wire 946 at this time means that the polarity of the analog input signal is negative and will cause flip-flop 945 to be triggered to the opposite state through switch 947 which is closed only during the polarity interval shown in FIGURE 62.

A pulse on wire 939 during the polarity interval signifies that the analog input voltage is positive and flip-flop 945 is not triggered. If the analog input signal is positive switch 931 remains closed and switch 932 remains open. If the analog input signal is negative switch 931 is open and switch 932 is closed for the remainder of the conversion period after the first part of the polarity interval. The output signals from the comparator on wires 946 and 939 are applied to the digital output device 940 which has been described previously. This completes all operations during the polarity interval shown in FIGURE 62.

At the start of bit number 1 as shown on FIGURE 62 switches 902, 909, 916, 921 and 919 are closed causing the potential on wire 910 to be zero and causing equal capacitors 905 and 906 to be charged to E, the potential of battery 901. Amplifiers 920 and 923 must have equal voltage gains such that when either of these gains is multiplied by that of amplifier 908 the product is +1.0. In order to simplify the following description the voltage gains of each of the amplifiers 908, 920 and 923 will be taken as +1.0. The operation of this converter with these voltage gains other than +1.0 is obvious and will not be described in detail. Thus the potential at the output of amplifier 908 which is connected through switches 913 and 927 to the input of the arithmetic node is +E. The potential at the other input to the arithmetic node is negative and has a magnitude equal to that of the analog input voltage. During the latter portion of the interval for bit number one switches 909 and 919 are opened and comparator 935 causes an output pulse to appear on wire 946 if the voltage at the output of amplifier 908 is greater in magnitude than the analog input voltage indicating that the most significant digit is 0. If not a pulse appears on wire 939 indicating that the digit is 1. If the digit is 0 the pulse on wire 946 is connected through switch 912 to the actuating coil of switch 907. Thus if the digit is 0 switch 907 closes, discharging capacitor 906 to the potential of wire 910 in the latter portion of the bit period. At the end of the period for bit number one, the final value of the potential at the output of amplifier 908 is stored on capacitor 922 through switch 916. If the most significant digit is 1, the potential on capacitor 922 is E. If the most significant digit is 0, the potential on capacitor 922 is 0. At this time all operations for bit number one are completed. In terms of earlier described systems capacitors 905 and 906 serve to distribute the charge in the manner discussed in FIGURE 1A. The storage capacitor in the feedback system is one of capacitors 918 and 922.

At the start of the period for bit number two switches 921 and 916 are opened and switches 909, 915 and 925 are closed. Thus the potential on wire 910 assumes the final value of the potential at the output of amplifier 908 in the first bit period and the potential on capacitor 906 increases by ½E as was explained previously in connection with FIGURE 16. This may be described as follows:

At the end of the first bit, with switch 916 closed, the voltage at the output of amplifier 908 induces a charge across the capacitor 922 of equal voltage. At the start of bit period No. 2 switch 916 is open so that this voltage is preserved by the charge across the capacitor 922. However, at the same time, switch 925 is closed so that the voltage of wire 924 passes through the unity gain amplifier and the amplifier causes the same voltage to appear on wire 910.

Prior to the closing of switch 909 at the beginning of the second bit period, the voltage on wire 910 is exactly the same as the voltage at the upper plates of capacitors 905 and 906. Hence when switch 909 is closed, one-half of the charge on capacitor 905 is transferred to capacitor 906 since the capacitors are equal. The operation of this circuit is the same as the circuit of FIGURE 1B where the feedback voltage on line 910 is substituted for battery 38. As in FIGURE 1B switch 909 may be located anywhere in the loop and may be positioned between capacitors 905 and 906 if desired. The result is that the potential of the upper plate of each capacitor and hence the potential of wire 904 is raised by one-half E. Switch 909 is opened and the potential at the output of amplifier 908 (which is the same as that of capacitor 906 and wire 904) and the negative of the analog input voltage are added in the arithmetic node and applied to comparator 935. As during bit number one an enabling pulse from the programmer on wire 936 causes the comparator to produce an output pulse on wire 946 if the digit is 0 or on wire 939 if the digit is 1. If the digit is 0 capacitor 906 is discharged to the potential of wire 910 by switch 907. If the digit is 1 switch 907 does not close and capacitor 906 remains charged. Wire 910 has sufficiently low impedance that capacitor 906 can be adequately discharged in the time available. Amplifiers 920 and 923 may take the form of cathode followers, with the input to the grid and with output from the cathode or preferably are feedback amplifiers having low output impedance. Therefore wire 910 is at this time connected through switch 921 or switch 925 to ground through the cathode resistor of one of the amplifiers 920 and 923. Feedback amplifiers, of course, have a low output impedance so that for all practical purposes the connections through 921 and 925 place the wire 910 also at low impedance. The time constant of the discharge circuits can be chosen so as to in no way affect the operation of the delayed feedback circuit as described.

At the end of bit number two the final value of the voltage on capacitor 906 is stored on capacitor 918 by amplifier 908 and switch 915.

The process explained for bit number one and bit number two continues for succeeding bit periods with the storage alternating between capacitors 918 and 922 until the analog to digital conversion is complete. Switch 909 is closed during the first portion of all periods and switch 907 is closed during the last portions of the bit period when the corresponding digit is 0. Switches 915 and 925 are closed during even numbered bit periods and open during odd numbered bit periods. The opposite is true for switches 916 and 921. FIGURE 62 shows the switching and voltage relations that exist in the system shown in FIGURE 59 when the analog input voltage equals −101.

For digital to analog conversion manual switches 912, 927 and 937 are operated to the digital to analog position. A source of synchronizing pulses is connected to terminal 943 of programmer 903 and the digital signal to be converted is connected to the digital input terminal 948.

Pulse processing network 949 produces a serial train of pulses at its output (wire 942) such that no pulse is present in the first portion of all bit intervals. A pulse is present in the latter part of the first (or polarity) interval when the quantity is positive. During succeeding bit intervals, which are associated with the magnitude of the quantity, the pulse processing network produces pulses at wire 942 only when the corresponding digit is 0.

Thus for positive quantities the output of amplifier 908 is connected by switches 913, 927 and 932 to the analog output terminal after the polarity interval. For negative quantities the output of amplifier 908 is connected by switches 913, 927, amplifier 944, and switch 931 to the analog output terminal 929. The voltage existing on the analog output terminal represents the digital input signal at the completion of the decoding interval. Programming of all switches is the same as that described previously for analog to digital conversion. FIGURE 62 shows the voltage and switching sequence which occurs when the digital input is +101. The first column in FIGURE 62 labelled POL. INT. represents the sign bit or polarity interval.

FIGURES 60 and 61 illustrate the one-way converters. The converter of FIGURE 60 is an analog to digital converter having a comparison signal generator identical to that shown in FIGURE 59. The comparison signal generator is indicated by the dashed box 949 in FIGURE 60. Similarly, FIGURE 61 shows a one-way converter for digital to analog conversion only. Here again, the comparison signal generator is identical to that of FIGURE 59 and is indicated by the dashed box 949. A programmer suitable for use with the converters of FIGURES 59, 60 and 61 is shown in FIGURE 63.

The programmer is for a two-portion bit period, and covers a total of four bit periods so that in addition to the home stationary contact, eight additional stationary contacts are required for each bank of the switches. The operation of the programmer of FIGURE 63 is in all respects the same as the earlier stepper switch programmers discussed and further description is deemed unwarranted.

The delayed feedback circuit shown in FIGURE 64 can be used to replace the delayed feedback circuit of the reversible analog to digital converter shown in FIGURE 59. Wire 961 is connected to the output of amplifier 908 and wire 977 is connected to wire 910. Wire 936 from the actuating coil for switch 962 is connected to wire 936 from the programmer 903. The actuating coil for switch 965 is connected to wire A from programmer 903 and the actuating coil for switch 970 is connected to wire B from programmer 903.

In the delayed feedback circuit shown in FIGURE 64 wire 961 is connected to switch 962. Switch 962 is connected by wire 964 to the upper terminal of capacitor 963, the upper terminal of switch 965 and the input of amplifier 968. The bottom terminals of capacitor 963 and switch 965 are connected to ground. The output of amplifier 968 is connected by wire 969 to switch 970. Switch 970 is connected by wire 972 to the upper terminal of capacitor 971 and to the input of amplifier 976. The lower terminal of capacitor 971 is connected to ground. The output of amplifier 976 is connected to wire 977.

FIGURE 65 shows the switching and voltage relationships that exist within the delayed feedback circuit shown in FIGURE 64 when the conversion of the analog input voltage results in −101. After the polarity interval shown in FIGURE 62 switch 970 is closed during the first portion of each bit period. Switch 965 is closed during the first portion of bit number one and switch 962 is closed during the last portion of each bit period.

Thus, the circuit of FIGURE 64 causes the final value of the voltage on its input in any bit period to appear on its output in the next succeeding bit period. Consequently this delayed feedback circuit can be used to replace that shown in FIGURE 59.

When the delayed feedback circuit of FIGURE 64 is employed in the system of FIGURE 59 the product of the gains of amplifiers 908, 968, and 976 must be +1.0 although the individual amplifier gains can be otherwise. For clarity the above discussion has assumed that each of the three amplifiers has a gain of +1.0. The operation of the system for other gains whose product is +1.0 is obvious. The programmer when utilizing the feedback circuit of FIGURE 64 remains the same and is shown in FIGURE 63.

FIGURE 66 shows a reversible analog to digital converter employing delayed feedback and using a three part bit period. It is to be noted that battery 1013, the source of standard potential is connected within the delayed feedback circuit 1016 and the left hand terminal of switch 1002 is grounded. Whereas for previous circuits, the switch corresponding to 1002 was connected to a battery and the switch corresponding to 1036 was grounded. The location of the battery in the delayed feedback circuit results in a system which is able to generate both positive and negative comparison voltages of value E centered about zero. If the battery is located between switch 1002 and ground as in previous converters the variation is between 0 and 2E. Moreover the output code has a feature which is useful in many applications, that is, positive analog input voltages are converted into true binary numbers whereas negative analog input voltages are converted into the ones complements. Further, for positive analog input quantities, the pulse on wire 1026 represent binary ones and the pulses on wire 1027 indicate binary zeros, whereas for negative inputs the pulses on wire 1026 indicate binary zeros and the pulses on wire 1027 indicate binary ones.

Switch 1002 is connected to ground and to the top terminal of capacitor 1003 and to the left hand terminal of switch 1005 through wire 1004. The bottom terminal of capacitor 1003 is connected to wire 1015. The right hand terminal of switch 1005 is connected to the upper terminal of capacitor 1007, the upper terminal of switch 1008 and the input terminal of amplifier 1009 by wire 1006. The lower terminal of capacitor 1007 is connected to ground. The lower terminal of switch 1008 is connected to wire 1015. The actuating coil for switch 1002 is connected to a wire A from programmer 1001. The actuating coil for switch 1005 is connected to wire B from programmer 1001. The actuating coil for switch 1008 is connected by wire 1017 to switch 1035. The output of amplifier 1009 is connected by wire 1010 to switch 1011 and to the analog output terminal 1018. The right hand terminal of switch 1011 is connected to the upper terminal of capacitor 1012, to the upper terminal of switch 1036 and to the input of amplifier 1014. The lower terminal of capacitor 1012 is connected to ground. The lower terminal of switch 1036 is connected to the negative terminal of battery 1013. The positive terminal of battery 1013 is connected to ground. The actuating coil for switch 1036 is connected to wire A from programmer 1001. The output terminal of amplifier 1014 is connected to wire 1015. The actuating coil for switch 1011 is connected to wire C from programmer 1001. The analog output terminal 1018 is connected to one of the stationary contacts of switch 1019. The other stationary contact of switch 1019 is connected to ground. The arm of switch 1019 is connected by wire 1020 to the input of the arithmetic node 1022. The analog input terminal 1021 is connected to the input of the arithmetic node. Wire 1023 (the output of the arithmetic node) is connected to the input of comparator 1024. Programmer 1001 is connected to comparator 1024 by wire 1025. Outputs from comparator 1024 are connected to the digital output device 1029 by wires 1026 and 1027. Programmer 1001 is connected to digital output device 1029 by wire 1030 and 1031. The output of comparator 1024 at wire 1027 is connected to switch 1035 by wire 1028. Digital input terminal 1032 is connected to switch 1033. The arm of switch 1033 is connected to the input of pulse processing network 1034. The output of the pulse processing network 1034 is connected to switch 1035. Pulse processing network 1034 is connected to wires 1025 and A from programmer 1001. Synchronizing input terminal 1037 is connected to programmer 1001.

For operation as an analog to digital converter manual switches 1019, 1033 and 1035 are operated to the analog to digital position. Switches 1002, 1005 and 1036 are closed causing the potential at wire 1020 and the lower input signal to the arithmetic node 1022 to be zero. Both terminals of capacitor 1007 are grounded discharging this capacitor. Amplifiers 1009 and 1014 are each assumed to have voltage gains equal to +1.0 for this description. However, the voltage gains of the two amplifiers can be other than +1.0 provided the product of the two gains is +1.0. Operation of the converter for amplifier voltage gains other than +1.0 is readily apparent.

Capacitor 1012 is charged to −E, the potential of battery 1013 causing wire 1015 (through amplifier 1014) to assume this same potential. Thus capacitor 1003 is charged to E.

Arithmetic node 1022 is arranged so that the potential on its output wire 1023 is equal to the voltage at the analog input terminal 1021 minus the voltage on wire 1020. Thus if the voltage at the output of amplifier 1009 is more positive than the analog input voltage, the voltage at the output of the arithmetic node on wire 1023 will be negative. Likewise if the voltage at the output of amplifier 1009 is less than the analog input voltage the voltage on wire 1023 at the input to the comparator 1024 is positive.

Switches 1002, 1005 and 1036 are opened and a pulse from programmer 1001 is applied to comparator 1024 by wire 1025. If the polarity of the signal on wire 1023 is negative a pulse occurs on wire 1027 indicating that the polarity of the analog input signal is negative. If the polarity of the signal on wire 1023 is positive a pulse occurs on wire 1026 indicating that the polarity of the analog input signal is positive. The signal on wire 1026 or wire 1027 is applied to the digital output device 1029 which was described previously.

The output signal from comparator 1024 on wire 1027 is connected through wire 1028, switch 1035 and wire 1017 to the actuating coil of switch 1008. Thus when the polarity of the analog input signal is negative, switch 1008 is closed during the second portion of the first bit period charging capacitor 1007 to −E, the potential of battery 1013. If the polarity of the analog input signal is positive switch 1008 is not closed during the first bit period and capacitor 1007 remains uncharged.

During the last portion of the first bit period switch 1011 is closed charging capacitor 1012 to the final potential of capacitor 1007 in the second portion of the first bit period. Switch 1011 is then opened and the first bit period is complete. During the first bit period a pulse on wire 1026 into the digital output device 1029 indicates that the polarity of the analog input signal is positive. Similarly a pulse during the first bit period on wire 1027 indicates that the analog input voltage is negative.

During succeeding bit periods switch 1005 is closed during the first portion of each bit period. Just prior to the closing of switch 1005 the voltage on wire 1015 is equal to the voltage across capacitor 1007. Since capacitors 1003 and 1007 are equal, the voltage across capacitor 1003 decreases to one half its previous value each time switch 1005 is closed and at the same time the voltage across capacitor 1007 increases by the same amount. Switch 1005 is opened and comparator 1024 determines whether or not the potential across capacitor 1007 is more positive than the analog input voltage. If the potential on capacitor 1007 is more positive than the analog input voltage a pulse on wire 1027 at the comparator output causes switch 1008 to discharge capacitor 1007 to its last previous value and the digit is zero. If the potential of capacitor 1007 is not more positive than the analog input voltage a pulse on wire 1026 at the comparator output signifies that the digit is 1 and capacitor 1007 remains charged. During the last portion of each bit period switch 1011 is closed and opened after charging capacitor 1012 to the same potential as capacitor 1007. Thus the voltage at the output of amplifier 1009 approaches the same value as the analog input voltage according to the pattern explained in connection with FIGURE 6. Signals on wires 1026 and 1027 at the comparator output signify to the digital output device 1029 the polarity and magnitude of the analog input voltage in digital form.

FIGURE 69 shows the switching and voltage relationships whicht exist in the analog to digital converter of FIGURE 66 for an analog input voltage equal to −101.

For digital to analog conversion manual switches 1019, 1033 and 1035 are operated to the digital to analog position. A source of synchronizing pulses is connected to terminal 1037 of programmer 1001 and the digital signal to be converted is connected to the digital input terminal 1032.

Pulse processing network 1034 produces a serial train of pulses at its output (wire 1036) such that no pulse is present in the first and last portions of all bit intervals. A pulse is present in the middle part of the first (or polarity) interval when the quantity is negative. During succeeding bit intervals when the quantity is positive the pulse processing network produces pulses at wire 1036 during the middle portion of bit intervals when the corresponding binary digit is 0. When the quantity is negative the pulse processing network produces pulses at wire 1036 during the middle portions of bit intervals following the polarity digit when the binary digit is 1. FIGURE 69 also shows the switching and voltage relationships which exist for a digital input code of −101. The generation of the voltage at the output of amplifier 1009 is exactly the same as in analog to digital conversion except that switch 1008 is under the control of the pulse processing network rather than the comparator. The voltage existing across capacitor 1007 and at the output of amplifier 1009 (which is connected to the analog output terminal 1018) has a polarity and magnitude representative of the digital input signal at the completion of the decoding period.

The three-part bit period employed in the reversible analog to digital converter of FIGURE 66 is a result of the relatively simple delayed feedback circuit 1016. The analog to digital converter shown in FIGURE 59 can be modified to a three-part bit period by replacing delayed feedback circuit 911 or 978 with the delayed feedback circuit 1016 and modifying programmer 903 appropriately. In this case it is necessary to connect the bottom terminal of switch 1036 in the delayed feedback circuit 1016 to ground.

Conversely, delayed feedback circuits 911 and 978 shown in FIGURES 59 and 64 respectively can be employed in the reversible analog to digital converter of FIGURE 66 by modifying programmer 1001 appropriately and by connecting the bottom terminal of switch 919 (or 965) to the negative terminal of the source of standard potential. The positive terminal of this source of standard potential is then connected to ground.

FIGURES 67 and 68 show the equivalent circuits for the one-way converters. The comparison single generators which are the same as that shown in FIGURE 66 are indicated by the dashed boxes 1040 in FIGURES 67 and 68. FIGURE 67 shows a circuit for analog to digital conversion only while the circuit of FIGURE 68 is for digital to analog conversion only. In FIGURE 68, the digital input is connected directly to the coil of dumper switch 1008 and the arithmetic node and comparator switch control are not required in this circuit.

FIGURE 70 shows a stepper switch type of programmer for the circuits of FIGURES 66, 67 and 68. The programmer of FIGURE 70 is for four bit periods, each bit period made up of three portions or sections. The operation of this programmer is similar to those previously described.

Another binary analog to digital converter employing delayed feedback is shown in FIGURE 71. This system generates the comparison voltage in the manner shown in FIGURE 7. Briefly the comparison voltage in each bit period is obtained in part from a division of charge between two capacitors (which are not necessarily equal) and in part from the output of a delayed feedback circuit. The delayed feedback circuit produces a voltage at its output which is constant during any bit period and is (after the first bit period) equal to a constant times the final value of the voltage at its input in the previous bit period. The system shown in FIGURE 71 can be used as an analog to digital converter or as a digital to analog converter. This system will be explained in detail in the following paragraphs.

In the other converter circuits the capacity of the first two capacitors must be equal for proper operation, that is $C_1=C_2$ and the product of the amplifier gains whether individually positive or negative must equal +1. However in the circuit of FIGURE 71 the amplifier gains product must only satisfy the equation $$\text{Product}=\frac{1}{2}\left(1+\frac{C_2}{C_1}\right)$$

Therefore capacitors $C_1$ and $C_2$, that is 1054 and 1057, need not be equal. Variation in the amplifier gains thus offers a way of compensating for capacitor inequality in the circuit of FIGURE 71.

The left hand terminal of switch 1051 is connected to ground. The right hand terminal of switch 1051 is connected to the left hand terminal of switch 1052 and to the upper terminal of capacitor 1054 and to the right hand terminal of switch 1056. The right hand terminal of switch 1052 is connected by wire 1058 to the right hand terminal of switch 1055, to the upper terminal of capacitor 1057, and to the input of amplifier 1059. The right hand terminal of switch 1053 is connected to the left hand terminal of switch 1055 and to the lower terminal of capacitor 1054. The left hand terminal of switch 1053 is connected to the left hand terminal of switch 1056 and to wire 1066. The actuating coil for switch 1051 is connected to wire A from programmer 1083. Switches 1052 and 1053 have a common actuating coil which is connected to wire 1075 at the output of comparator 1074. Switches 1055 and 1056 have a common actuating coil which is connected to wire 1076 at the output of comparator 1074. The lower terminal of capacitor 1057 is connected to ground. The output terminal of amplifier 1059 is connected to the left hand terminal of switch 1061. The right hand terminal of switch 1061 is connected by wire 1064 to the upper terminal of capacitor 1062, to the upper terminal of switch 1063 and to the input of amplifier 1065. The actuating coil for switch 1061 is connected to wire B from programmer 1083. The lower terminal of capacitor 1062 is connected to ground. The lower terminal of switch 1063 is connected to the positive terminal of a source of standard potential 1085. The negative terminal of battery 1085 is connected to ground. The actuating coil of switch 1063 is connected to wire A from programmer 1083. The output of amplifier 1065 is connected to wire 1066 and through wire 1060 to the analog output terminal 1067.

The upper terminal of switch 1068 is connected by wire 1060 to the output of amplifier 1065. The lower terminal of switch 1068 is connected to ground. The arm of switch 1068 is connected to the input of arithmetic node 1072. The analog input terminal 1070 is connected to the lower terminal of switch 1071. The arm of switch 1071 is connected to the input to arithmetic node 1072. The upper terminal of switch 1071 is connected by wire 1080 to the output of pulse processing network 1078. The output of arithmetic node 1072 is connected to the input of comparator 1074 by wire 1073. Programmer 1083 is connected to comparator 1074 by wire 1081. The two comparator output signals on wire 1075 and 1076 are connected to the input of digital output device 1077. Programmer 1083 is connected to digital output device 1077 by wire 1082. Digital input terminal 1079 is connected to the input of pulse processing network 1078. Pulse processing network 1078 is connected to wires A and 1081 from programmer 1083. A synchronizing input terminal 1084 is connected to programmer 1083.

Operation of the system shown in FIGURE 71 as an analog to digital converter will be described first, and operation as a digital to analog converter will be described thereafter. In accordance with previous descriptions, all relays and other mechanical devices may be replaced by electronic devices.

For operation as an analog to digital converter manual switches 1068 and 1071 are operated to the analog to digital converter position. Switches 1051 and 1063 are closed and switch 1061 is opened. At this time switches 1052, 1053, 1055 and 1056 are open. Thus the two signals at the input to the arithmetic node are the analog input voltage and +E times the voltage gain of amplifier 1065.

The converter shown in FIGURE 71 is different from those described previously in that the product of the voltage gains of amplifiers 1059 and 1065 does not have to be +1.0. For binary conversion the product of the voltage gains of amplifiers 1059 and 1065 must be equal to $\frac{1}{2}(1+C_2/C_1)$ where $C_2$ is capacitor 1057 and $C_1$ is capacitor 1054. However, for ease in illustration the following description will assume that the voltage gains of amplifiers 1059 and 1065 are each equal to —1.0 and capacitors 1054 and 1057 are equal. Also the comparison signal in FIGURE 71 need not be taken from the output of the delayed feedback circuit as shown but may if desired be taken from the output of amplifier 1059 instead.

The arithmetic node consists of circuits which add the negative of the voltage on the upper input terminal to the voltage on the lower input terminal. Thus if the voltage on wire 1069 is more positive than the analog input voltage the voltage at the output of the arithmetic node on wire 1073 is positive.

Thus, at the start of the conversion period when switch 1063 is closed and the analog input voltage is greater than —E, the polarity of the voltage at the output of the arithmetic node on wire 1073 is negative. During this time comparator 1074 is enabled by programmer 1083 through wire 1081 causing a pulse to appear on wire 1075 at the output of comparator 1074. The actuating coil for switches 1052 and 1053 is connected to wire 1075. Thus switches 1052 and 1053 are closed charging capacitor 1054 to E.

Next switches 1051, 1052, 1053 and 1063 are opened and switch 1061 is closed discharging capacitor 1062. Switch 1061 is next opened and the potential on wire 1060 is zero. If the analog input voltage on terminal 1070 is positive, wire 1073 is negative. If the analog input voltage is negative, wire 1073 is positive. When the enabling pulse occurs on wire 1081 comparator 1074 causes a pulse on wire 1075 if the analog input voltage is positive or a pulse on wire 1076 if the analog input voltage is negative. Thus switches 1052 and 1053 are operated if the analog input voltage is positive or switches 1055 and 1056 are operated if the analog input voltage is negative. If switches 1052 and 1053 are operated the voltage on capacitor 1057 increases by $E/2$. If on the other hand switches 1055 and 1056 are operated the voltage on capacitor 1057 decreases by $E/2$. Next the pair of switches which has just been operated are opened and switch 1061 is closed, causing the output voltage from amplifier 1065 to equal the voltage across capacitor 1057. Switch 1061 is then opened and another comparison takes place. If the voltage on wire 1060 is less than the analog input voltage switches 1052 and 1053 are closed causing the voltage on capacitor 1057 to increase by $E/4$. If the voltage on wire 1060 is greater than the analog input voltage switches 1055 and 1056 operate causing the voltage on capacitor 1057 to decrease by $E/4$. Each succeeding change in voltage on capacitor 1057 is ½ the value of the preceding change. This process is continued until the conversion is complete. The signals on wires 1075 and 1076 at the output of comparator 1074 are connected to the input of the digital output device 1077. These signals signify the polarity and magnitude of the analog input voltage.

FIGURE 74 shows the switching and voltage relations that exist within the converter shown in FIGURE 71, when the analog input voltage is equal to —010.

For digital to analog conversion manual switches 1071 and 1068 are operated to the digital to analog positions. The digital signal to be converted is connected to the digital input terminal 1079.

Pulse processing network 1078 produces a serial train of pulses at its output (wire 1080) such that the pulse train is positive during the initial part of the decoding interval and thereafter the polarity of the pulse train at the time of the initiation of the comparator gate pulse signifies the digital quantity to be decoded as shown in FIGURE 74. The voltage existing on the analog output terminal represents the digital input signal at the completion of the decoding interval. Programming of all switches is the same as that described previously for analog to digital conversion.

FIGURES 72 and 73 show the one-way converters having the same comparison signal generators as the circuit of FIGURE 71. The comparison signal generators are enclosed by the dashed lines 1090 in FIGURES 72 and 73. The operation of the circuits of FIGURES 72 and 73 is believed clear from the previous description of the operation of FIGURE 71 for both digital to analog and analog to digital conversion.

FIGURE 75 shows a stepper switch type programmer for the circuits of FIGURES 71, 72 and 73. As can be seen, the programmer of FIGURE 75 is for a two portion bit period and shows a total of four bit periods corresponding to the similar showing in FIGURE 74. The operation of the programmer of FIGURE 75 is similar to that of the earlier described stepper switch type programmers.

Other forms of delayed feedback circuits than those shown previously can be employed. In particular in FIGURE 59, if capacitors 918 and 922 are made sufficiently large, amplifiers 920 and 923 can be eliminated. In this case the gain of amplifier 908 must be +1.0.

The elimination of the amplifier introduces an approximation into the operation of the circuit. The nature of the approximation can be understood from a consideration of FIGURE 1B. If battery 38 is replaced by a capacitor which is large in comparison with capacitors 32 and 34 then when switch 36 is closed the potentials on capacitors 32 and 34 will be different from those shown in Equation 5 because the voltage on the capacitor which replaces the battery is not absolutely constant. The amount of approximation involved in a particular case may be determined from FIGURE 1B after modification by substitution of a capacitor for the battery together with an analysis similar to that which was given for FIGURE 1A.

Similarly, in FIGURE 64 if capacitor 971 is made sufficiently large, amplifier 976 can be eliminated. In addition of capacitor 963 is made sufficiently larger than capacitor 971, amplifier 968 can be eliminated. The elimination of amplifier 976 involves the same approximation discussed above. However, the elimination of both amplifiers 976 and 968, involves an additional approximation in that the discharging of capacitor 963 into 971 reduces the charge on capacitor 963. Therefore capacitor 963 must be so large that the change in voltage on capacitor 963 when it is connected to capacitor 971, is small compared to the voltage corresponding to the least significant binary digit.

If only amplifier 976 is eliminated the product of the gains of amplifiers 908 and 968 must be +1.0. If both amplifiers 968 and 976 are eliminated the gain of amplifier 908 must be +1.0.

Similarly, if capacitor 1012 in FIGURE 66 is sufficiently large amplifier 1014 can be eliminated. In this case the gain of amplifier 1009 must be +1.0.

If capacitor 1062 in FIGURE 71 is sufficiently large, amplifier 1065 can be eliminated. In this case the gain of amplifier 1059 must be equal to $\frac{1}{2}(1+C_2/C_1)$ where $C_2$ is capacitor 1057 and $C_1$ is capacitor 1054.

In the system shown in FIGURE 71 it is possible to replace switch 1061 and capacitor 1062 by an electrical delay line. The delay time should be slightly less than the period between pulses on wire 1081 as shown in FIGURE 74 in order to permit delay line charging transients to decay to a permissible value prior to switching. If the surge impedance of the electrical delay line is sufficiently low, it will be possible to eliminate the amplifier 1065 as well as switch 1061 and capacitor 1062. The elimination of amplifier 1065 will involve an approximation similar to that described above.

BF2B CONVERTER SYSTEMS

The reversible analog to digital converter which was shown in FIGURE 71 can be modified so that a sample of the analog input voltage can be applied to one of the storage capacitors at the start of each encoding period. The digital equivalent of this sample of the analog input voltage is determined by reducing the voltage on the capacitor to a minimum value by operating sequences similar to those which have been described previously.

FIGURE 76 is the diagram for a reversible analog to digital converter employing a delayed feedback circuit in which a sample of the analog input voltage is applied to capacitor 1114. Delayed feedback circuit 1117 can be of any of the forms which were described previously in connection with FIGURES 59 , 64 66 or 71.

Battery 1135 which is the source of standard potential is connected to ground and to the left hand terminal of switch 1106. The right hand terminal of switch 1106 is connected to left hand terminal of switch 1107 and to the right hand terminal of switch 1111 and to the upper terminal of capacitor 1109. The left hand terminal of switch 1105 is connected to the arm of manual switch 1120. The lower fixed terminal of switch 1120 is connected to ground. The upper terminal of switch 1120 is connected to analog input terminal 1121. The right hand terminal of switch 1105 is connected to the arithmetic node 1113. The actuating coil for switches 1105 and 1106 is connected to wire 1101 from programmer 1132. The right hand terminal of switch 1107 is connected to the left hand terminal of switch 1112 and to the right hand terminal of switch 1110. The left hand terminal of switch 1108 is connected to wire 1118, the output of delayed feedback circuit 1117. The right hand terminal of switch 1108 is connected to the left hand terminal of switch 1110 and to the lower terminal of capacitor 1109. The actuating coil for switches 1107 and 1108 is connected to wire 1103 from comparator 1123. The left hand terminal of switch 1111 is connected to wire 1118. The actuating coil for switches 1110 and 1111 is connected to wire 1104 from comparator 1123. The right hand terminal of switch 1112 is connected to the arithmetic node 1113. The actuating coil for switch 1112 is connected to wire 1134 from programmer 1132. The upper terminal of capacitor 1114 is connected to the arithmetic node 1113 and the lower terminal of this capacitor is connected to ground. The arithmetic node 1113 is connected to the input of amplifier 1115. The output of amplifier 1115 is connected to the input of the delayed feedback circuit 1117 and to the analog output terminal 1116. Delayed feedback circuit 1117 is connected to programmer 1132 by wires 1101 and 1102. The output of the delayed feedback circuit is connected by wire 1110 to the upper terminal of manual switch 1122. The lower terminal of switch 1122 is connected by wire 1126 to the output of pulse processing network 1125. The arm of switch 1122 is connected to the left hand terminal of switch 1138. The left hand terminal of switch 1137 is connected to the negative terminal of battery 1136. The positive terminal of battery 1136 is connected to ground. The right hand terminal of switches 1137 and 1138 are connected to the input of comparator 1123. The actuating coil for switch 1137 is connected to wire 1101 from programmer 1132. The actuating coil for switch 1138 is connected to wire 1134 from programmer 1132. Programmer 1132 is connected to comparator 1123 by wire 1102. The output of comparator 1123 is connected to digital output device 1124 by wires 1103 and 1104. Programmer 1132 is connected to digital output device 1124 by wires 1127 and 1128. Programmer 1132 is connected to pulse processing network 1125 by wires 1129 and 1130. The digital input terminal 1131 is connected to the pulse processing network 1125. The synchronizing input terminal 1133 is connected to programmer 1132. The operation of the system shown in FIGURE 76 as an analog to digital converter will be described first, and operation as a digital to analog converter will be described thereafter. In accordance with previous descriptions all relays and other devices may be replaced by electronic devices.

For operation as an analog to digital converter manual switches 1120 and 1122 are operated to the analog to digital converter position. At the start of the conversion programmer 1132 closes switches 1105 and 1106 and 1137. At this time wire 1118 is at ground potential due to switching within the delayed feedback circuit 1117 under the control of programmer 1132.

The negative potential of battery 1136 is connected to the input of comparator 1123 by switch 1137. The enabling pulse to comparator 1123 from programmer 1132 by wire 1102 causes a pulse to occur on wire 1103 at the output of comparator 1123 which causes switches 1107 and 1108 to close. As a result of this process capacitor 1109 is charged to the potential of battery 1135 and capacitor 1114 is charged to the analog input voltage. Next switches 1105, 1106, 1107, 1108 and 1137 are opened. Switch 1138 is closed and remains closed for the remainder of the conversion period. Delayed feedback circuit 1117 causes the analog input potential to appear at the output of the delayed feedback circuit throughout the period labeled bit number 1 in FIGURE 79. The bit labeled A is used for obtaining this analog voltage. During bit number 1, the output of the delayed feedback circuit is connected to the comparator through wire 1119, switch 1122 and switch 1138. If the output of the delayed feedback circuit is positive, the enabling pulse from programmer 1132 on wire 1102 to comparator 1123 will cause a pulse to occur on wire 1104. If the output of the delayed feedback circuit is negative a pulse occurs instead on wire 1103. Thus if the output of the delayed feedback circuit is positive switches 1110 and 1111 will operate causing the potential across capacitor 1114 to decrease by E/2. On the other hand if the potential at the output of delayed feedback circuit 1117 during bit number 1 is negative switches 1107 and 1108 will close causing the potential across capacitor 1114 to increase by E/2. Next the pair of switches (1107 and 1108 or 1110 and 1111) which has been operated is opened and delayed feedback circuit 1117 stores the potential at the output of amplifier 1115. The final value of the voltage at the output of amplifier 1115 in bit number 1 occurs at wires 1118 and 1119 during the entire second bit period. At the start of the second bit period, switches 1107 and 1108 are operated if the final value of the voltage at the output of amplifier 1115 was negative in the first bit period. If the final value of the voltage at the output of amplifier 1115 was positive switches 1110 and 1111 are closed. Thus, if the final value of the voltage at the output of amplifier 1115 in the first bit period was positive, the voltage across capacitor 1114 will be decreased by E/4. On the other hand, if the final value of the voltage at the output of amplifier 1115 was negative during the first bit period the voltage across capacitor 1114 will be increased by E/4. This process continues untill the voltage across capacitor 1114 is reduced to a value smaller than that representing the least significant digit. Each succeeding change in voltage on capacitor 1114 is ½ the value of the preceding change.

The signals on wire 1103 and 1104 at the output of comparator 1123 are connected to the input of the digital output device 1124. These signals signify the polarity and magnitude of the analog input voltage.

FIGURE 79 shows the switching and voltage relations that exist within the analog to digital converter shown in FIGURE 76 when the analog input voltage is equal to +010.

For digital to analog conversion manual switches 1120 and 1122 are operated to the digital to analog position. At the start of the decoding period switches 1105, 1106 and 1137 are closed. Switches 1107 and 1108 are closed by the action of comparator 1123 as was described previously for analog to digital conversion. Thus capacitor 1109 is charged to E, the potential of battery 1135 and capacitor 1114 is discharged to ground through switches 1105 and 1120. Next switches 1105, 1106, 1107, 1108 and 1137 are opened and switch 1138 is closed connecting the input of the comparator through switch 1122 to wire 1126, the output of pulse processing network 1125. FIGURE 79 shows the voltage that will exist on wire 1126 at the output of pulse processing network 1125 during digital to analog conversion when the digital quantity is +010. Thus the voltage on wire 1126 at the output of pulse processing network 1125 is connected to the input of the comparator 1123 and controls the actions of switches 1107 and 1108 or switches 1110 and 1111 so that the final voltage at the end of the decoding period which exists on capacitor 1114 represents the digital input signal. Programming of all switches is the same as that previously described for analog to digital conversion.

The delayed voltage gain from the input of amplifier 1115 to the output of the delayed feedback circuit 1117 must be equal to +1.0 and capacitor 1114 must be equal to capacitor 1109.

FIGURES 77 and 78 show the one-way converters corresponding to the two-way converter of FIGURE 76. As in previous embodiments the comparison signal generator of FIGURES 77 and 78 is the same as that shown in FIGURE 76 and is enclosed by the dashed lines 1140. The operation of the circuits of FIGURES 77 and 78 is believed clear from the previous description of the operation of the circuit of FIGURE 76 for both analog to digital and digital to analog conversion.

FIGURE 80 shows a stepper switch type of programmer for the circuits of FIGURES 76, 77 and 78. The programmer is set up for two portion bit periods having a total of five bit periods or ten stationary contacts in addition to the home contacts in each bank of contacts. As is clear from FIGURE 79, bit period A is utilized to place the analog voltage on the output of the delayed feedback circuit. The remaining four bits provide the digital or analog information desired. The programmer 80 is in all respects similar in operation to the earlier programmers described.

NON-BINARY CONVERTERS

The transfer of charges between capacitors may also be used to convert analog voltages to pulse representations which are not based on the binary number system and vice-versa. The binary-coded number system and the decimal numbers system are the best known examples of these non-binary systems. However, binary coding may be used to represent any non-binary system. That is, a binary coded representation may be used for a number in the octal system. Similarly a train of pulses may be used to represent directly the equivalent of an analog input in the octal or any other number system. It is to be emphasized that, although binary numbers have peculiar properties which make them particularly appropriate for pulse representation of the digital equivalents of analog unmbers, numbers with other bases and also binary-coded representations for other number bases may also be represented by pulse trains. Circuits which have outputs and which accommodate inputs for some of these representations are shown in FIGURES 81 to 95. Since the decimal number system is used so generally in everyday life, in comparison with number systems based on other digits, the outputs of the figures referred to above are either direct decimal representations of the analog inputs or are binary-coded decimal representations. However, it is to be understood that the circuits could readily be modified to operate with digital numbers having other number bases.

BINARY CODED

One type of reversible non-binary converter is that known as a binary coded decimal converter. In this type the presence or absence of a pulse in the code signifies the presence or absence of a weighted value which when added to all other weighted values in the code for a particular decade results in a decimal representation of the input magnitude. Since it requires at least four binary digits to represent ten magnitudes there are four digits for each decimal decade plus an additional digit to signify polarity where bipolar quantities are involved. The four binary digits may be assigned many combinations of weighted values but the more common are the 8, 4, 2, 1; 4, 4, 2, 1 and the 4, 2, 2, 1 relationships. Thus in the 8, 4, 2, 1 system, if the first digit is present, it indicates that the magnitude is greater than 8, or, for the second and third systems, greater than 4. Conversely, the absence of a pulse in the first digit indicates the quantity is less than 8 or 4 respectively. The decimal number in each decade is obtained by taking the sum of all the weighted values represented by the presence of a pulse in a given position in the decade. Succeeding weighted values for additional decades have their values related by factors of ten to the values assigned to the initial four digit group. Thus a decimal quantity having 1000 possible values requires a total of three four digit groups or twelve binary digits.

The description of this converter is based upon the use of the 8, 4, 2, 1 weighted values although other weight assignments may be readily employed. Various alternative circuits and techniques for accomplishing conversion of this general type will be covered in later paragraphs.

FIGURE 81 shows the circuit of a binary coded decimal converter while FIGURE 84 shows a suitable programmer. The waveforms generated by the programmer appear in FIGURE 83. Typical waveforms generated in the encoding of an input of +8.43 units is shown in FIGURE 82.

Operation of the converter is initiated by the occurrence of a synchronizing pulse at the synch input terminal 1440 of the programmer shown in FIGURE 84. This pulse triggers flip-flop 1438 causing a gate pules to be applied to the clock 1434. The clock is thereby caused to start and produces regularly spaced pulses to operate the switch stepping mechanism 1432, thus initiating simultaneous movement of the switch arms across the fixed switch contacts to produce the pattern of output pulses shown in FIGURE 83 in the manner of the programmers previously described. Intervals during which the waveforms are up indicate that the associated switches of FIGURE 81 are closed while intervals during which the waveforms are down mean the switches are open. The stepping switch is capable of continuous rotation and is arranged with each bank of contacts in cylindrical form so that the last contact to the right of the figure is physically next to the first contact on the left. Thus the switch returns to its starting position as shown prior to or in the course of each encoding period. The last switch position in the cycle again triggers the flip-flop 1438, resetting it in preparation for another synch input pulse and simultaneously stopping the clock pulses and thus the switch motion.

At the start of an encoding period waveform D closes switches 1342 and 1352 and waveform J closes switches 1330, 1312, 1382 and 1384. Flip-flop 1322 is reset by the leading edge of waveform G so that lead 1326 is positive and switch 1320 is closed while switch 1318 is open. This action causes the analog input to be applied to the input of the unity gain, non-inverting amplifier 1362 while at the same time capacitor 1388 is connected to the amplifier output. Capacitor 1388 thus acquires a charge such that its potential is equal to that of the analog input. This potential is also applied to one input of the arithmetic node 1372 whose other input is zero as a result of the operation of switch 1382 and the connection through the unity gain, non-inverting amplifier 1376. Due to the operation of switches 1382, 1342 and 1352, capacitors 1344 and 1350 are completely discharged. The arithmetic node 1372 is a network upon whose output line 1370 appears the sum of the two input voltages on lines 1364 and 1374. Thus since input 1374 is zero and input 1364 is the analog value, the output 1370 is a positive voltage.

At the beginning of the second half of the unit period switches 1342 and 1352 open. At the same time a pulse is applied to the comparator 1368 through the action of waveform F. The comparator puts out a pulse on either line 1332 or line 1360 depending upon whether its input on line 1370 is respectively (*a*) not negative (0 or plus) or (*b*) negative. In the example being described, line 1370 is positive; therefore, a pulse occurs on line 1332 closing switch 1346 which in later periods discharges capacitor 1350 but more importantly triggers flip-flop 1322 to the opposite state which in turn closes the switch 1318 and opens switch 1320. This action causes the analog input voltage to pass through the inverting unity gain amplifier 1316 instead of through a direct path thereby causing the voltage 1364 to change polarity. Since the digital output device 1378 is connected to the other comparator output 1360, no output pulse appears in the output code during this first unit period. The lack of an output pulse during this unit period therefore signifies a positive analog input quantity. Had the input analog voltage been negative, a pulse would have occurred on wire 1360 instead of wire 1332 and flip-flop 1322 would not have been triggered. Thus, regardless of the polarity of the analog input voltage, the voltage on wire 1364 is negative at the start of the second unit period.

At the start of the second unit period, switches 1312, 1382, 1384, 1330 and 1346 open while switches 1338, 1342, 1352 and 1390 close. The opening of switch 1384 and the closing of switch 1390 transfers capacitor 1388 with its stored sample of the analog input voltage from the output of amplifier 1362 and its input where it remains for the rest of the encoding period. Switch 1338 connects the battery 1334 with a potential, E, of 8 units to capacitor 1344 and through switches 1342, 1352 to capacitor 1350 causing them to charge to that potential. Capacitors 1344 and 1350 have equal capacitance. This causes the voltage at 1374 to rise to a value of 8 units as shown on FIGURE 82. The voltage at 1370 is thereby decreased from a negative value of 8.43 units to a negative value of 0.43 unit. At the end of this first half of the second unit period, switches 1338, 1342 and 1352 open and a pulse, waveform F, is applied to the comparator. Since the voltage at 1370 is negative, a pulse appears on comparator output 1360 which closes switches 1348, 1354 and causes a pulse to appear in the digital output code. When switches 1348, 1354 close, the capacitor 1350 is connected between the input and output terminals of the amplifier 1362 and as described previously in connection with FIGURE 3, all of its charge is transferred to capacitor 1388. Capacitor 1388 (in this case) has a capacitance equal to that of capacitor 1350, therefore the output voltage 1364 changes by 8 units in a direction to reduce the magnitude of the voltage to a negative value of 0.43 unit. It is to be noted that the voltage 1374 assumes a new value one half a unit period in advance of the change which is brought about in voltage 1364 so that the comparator actually anticipates the change which will be introduced by its action. This anticipation permits less time for each unit period. Through the action of reducing the voltage 1364, the voltage 1370 goes positive to a net value of 7.57 units.

At the start of the third unit period, switches 1348, 1354 open and switches 1342, 1352 close. The charge of 8 units remaining on capacitor 1344 from the preceding period redistributes itself equally between capacitors 1344 and 1350 since they are equal and the voltage at 1374 and across capacitor 1344 drops to four units. The voltage at 1370 drops by four units to a value of 3.57 units. At the middle of each unit period, switches 1342, 1352 open and pulse is applied to the comparator. Since the voltage 1370 is still positive, the output pulse appears on line 1332 closing switch 1346 thereby discharging capacitor 1350 and resulting in no pulse in the output code.

At the start of the fourth unit period, switch 1346 opens while switches 1342, 1352 close. Again the charge of four units on capacitor 1344 redistributes itself and the voltage 1374 drops to two units. The voltage at 1370 therefore drops two units to a value of plus 1.57 units. At the middle of the period, switches 1342, 1352 open and pulse is applied to the comparator. Since the voltage 1370 is still positive, the output pulse appears on line 1332 closing switch 1346, thereby discharging capacitor 1350 and resulting in no pulse in the output code.

At the start of the fifth unit period, switch 1346 opens while switches 1342 and 1352 close. The charge of two units on capacitor 1344 redistributes itself and the voltage 1374 drops to one unit. The voltage at 1370 therefore drops one unit to a value of plus 0.57 unit. At the middle of the unit period, switches 1342, 1352 open and a pulse is applied to the comparator. Since the voltage 1370 is still positive, the output pulse appears on line 1332 closing switch 1346, thereby discharging capacitor 1350 and resulting in no pulse in the output code.

At the start of the sixth unit period, switch 1346 opens while switches 1342, 1352, 1400 close. The closing of switch 1400 connects capacitors 1344 and 1350 to the resistance divider tap across resistors 1402, 1392 and 1398 in series where the battery voltage E is reduced by a factor of 10. These capacitors are charged to a potential of 0.8 unit. The anticipation circuit amplifier 1376 causes the potential at wire 1374 to drop from its original potential of plus 1 (one) unit to a new potential of plus 0.8 unit. The voltage on wire 1370 therefore changes by 0.2 unit to a new value of 0.37 unit. At the middle of the unit period, switches 1342, 1352, 1400 open and a pulse is applied to the comparator. Since the voltage at 1370 is still positive, the output pulse appears on line 1332 closing switch 1346 thereby discharging capacitor 1350 and resulting in no pulse in the output code.

At the start of the seventh unit period, switch 1346 opens while switches 1342, 1352 close. The charge of 0.8 unit on capacitor 1344 redistributes itself and the voltage 1374 drops to 0.4 unit. The voltage at 1370 therefore drops 0.4 unit from 0.37 unit to a negative value of .03 unit. At the middle of the period, switches 1342, 1352 open and a pulse is applied to the comparator 1368. Since the voltage 1370 is now negative, the output pulse appears on line 1360 switches 1348, 1354 and causing a transfer of charge from capacitor 1350 to capacitor 1388 with a resulting decrease in voltage 1364 to minus .03 unit. Since the pulse appearing on wire 1360 is also applied to the digital output device 1378, a pulse appears in the output code during this seventh unit period. Since the voltage at 1364 has changed to minus .03 unit, an increase appears in voltage 1370 from minus .03 unit to plus .37 unit.

At the start of the eighth period, switches 1348, 1354 open while switches 1342, 1352 close. The charge of 0.4 unit on capacitor 1344 redistributes itself and the voltage 1374 drops to 0.2 unit. The voltage at 1370 therefore drops 0.2 unit to a value of plus .17 unit. At the middle of the period, switches 1342, 1352 open and a pulse is applied to the comparator. Since the voltage 1370 is still positive, the output pulse appears on line 1332 closing switch 1346, discharging capacitor 1350 and resulting in no pulse in the output code.

At the start of the ninth period, switch 1346 opens while switches 1342 and 1352 close. The charge of 0.2 unit on capacitor 1344 redistributes itself and the voltage 1374 drops to 0.1 unit. The voltage at 1370 therefore drop 0.1 unit to a value of plus .07 unit. At the middle of the period, switches 1342 and 1352 open and a pulse is applied to the comparator. Since the voltage 1370 is still positive, the output pulse appears on line 1332 closing switch 1346, discharging capacitor 1350 and resulting in no pulse in the output code.

At the start of the tenth unit period, switch 1346 opens while switches 1342, 1352 and 1396 close. The closing of switch 1396 connects capacitors 1344 and 1350 to the resistance divider tap where the battery voltage E is reduced by another factor of 10. Thus these capacitors are charged to a potential of 0.08 unit. The anticipation circuit amplifier 1376 causes the potential at wire 1374 to drop from its previous value of 0.1 unit to a new potential of 0.08 unit. The voltage on wire 1370 therefore changes by 0.02 unit to a new value of 0.05 unit. At the middle of the unit period, switches 1342, 1352 and 1396 open and a pulse is applied to the comparator. Since the voltage at 1370 remains positive, the output pulse appears on line 1332 closing switch 1346, thereby discharging capacitor 1350 and resulting in no pulse in the output code.

At the start of the eleventh unit period, switch 1346 opens while switches 1342, 1352 close. The charge of 0.08 unit on capacitor 1344 redistributes itself and the voltage 1374 drops to 0.04 unit. The voltage at 1370 therefore drops 0.04 unit to a value of 0.01 unit. At the middle of the period, switches 1342, 1352 open and a pulse is applied to the comparator. Since the voltage 1370 is still positive the output pulse appears on line 1332 closing switch 1346 discharging capacitor 1350 and resulting in no pulse in the output code.

At the start of the twelfth period, switch 1346 opens while switches 1342, 1352 close. The charge of 0.04 unit on capacitor 1344 redistributes itself and the voltage 1374 drops to 0.02 unit. The voltage 1370 therefore drops 0.02 unit to a negative value of 0.01 unit. At the middle of the unit period, switches 1342, 1352 open and a pulse is applied to the comparator. Since the voltage 1370 is negative, the output pulse appears on line 1360 closing switches 1348, 1354 and causing a transfer of charge from capacitor 1350 to capacitor 1388 with a resulting change in voltage 1364 to minus 0.01 unit. Since the pulse appearing on wire 1360 is also applied to the digital output device 1378, a pulse appears in the output code during this twelfth unit period. Since the voltage 1364 has changed to minus 0.01 unit, an increase appears in the voltage 1370 from minus 0.01 unit to plus 0.01 unit.

At the start of the thirteenth bit period, switches 1348 and 1354 open while switches 1342 and 1352 close. The charge of .02 unit on capacitor 1344 redistributes itself and the voltage 1374 drops to 0.01 unit. The voltage at 1370 changes to zero. At the middle of the unit period, switches 1342 and 1352 open and a pulse is applied to the comparator. Since the voltage at 1370 is not positive, the output pulse appears on line 1360 closing switches 1348 and 1354, discharging capacitor 1350 and making the net charge on capacitor 1388 zero.

Where only positive input quantities are to be encoded, the converter may be simplified by eliminating switches 1318, 1320, 1330 and 1382 as well as amplifier 1316 and flip-flop 1322. The time required for a conversion may be shortened by one unit period since the first period was devoted entirely to polarity determination. This time reduction can best be accomplished by consolidating unit period number 1 and 2 by modifying waveforms G and J and causing them to occur in what is shown as unit 2 on FIGURE 83. The modification of the waveform involves shortening the duration of G so that it occurs only during the first half of the unit period corresponding to the time of waveform A and eliminating J by using waveform A instead to activate switches 1312 and 1384.

Another variation which is effective for either bipolar or unipolar inputs involves the use of a separate unity gain non-inverting amplifier in the analog input line instead of using switches 1384 and 1390 in conjunction with amplifier 1362. This may be accomplished by introducing the unity gain amplifier in the line between terminal 1310, the analog input, and the arm of switch 1312. Switches 1384 and 1390 are eliminated and capacitor 1388 is permanently connected between the input of amplifier 1362 and ground. Other than eliminating the operation of these switches, there is no change in operating sequence.

FIGURE 85 shows a binary-coded decimal analog to digital converter employing delayed feedback and using a three-part bit period. This converter is similar to that described in connection with FIGURE 66 except for the capacitor 1518, switch 1520 and programming signal F. The battery 1540 is shown in the capacitor circuit rather than in the feedback circuit as in FIGURE 66 but may be in either position. 1548 is the analog input terminal. Output terminal 1550 provides a pulse train in synchronism with waveform C which is the 8, 4, 2, 1 binary-coded decimal equivalent of positive analog input voltages.

The left hand terminal of switch 1510 is connected to the positive terminal of battery 1540. The negative terminal of battery 1540 is connected to the ground. The right hand terminal of switch 1510 is connected by wire 1512 to the upper terminals of capacitors 1516 and 1518 and to the left hand terminal of switch 1514. The lower terminal of capacitor 1516 is connected to the left hand terminal of switch 1520. The right hand terminal of switch 1514 is connected to the upper terminal of capacitor 1522, to the upper terminal of switch 1524, and to the input of unity-gain amplifier 1528 by wire 1526. The lower terminal of capacitor 1522 is connected to ground. The output of unity-gain amplifier 1528 is connected to the input of comparator 1546 and to the left hand terminal of switch 1532. The right hand terminal of switch 1532 is connected to the upper terminals of capacitor 1536 and switch 1538 and to the input of unity-gain amplifier 1542. The lower terminal of capacitor 1536 is connected to ground. The lower terminal of switch 1538 is connected to ground. The output terminal of unity-gain amplifier 1542 is connected by wire 1544 to the lower terminal of switch 1524, the lower terminal of capacitor 1518, and the right hand terminal of switch 1520. The analog input terminal 1548 is connected to the input of comparator 1546. Output lead 1552 from comparator 1546 is connected to the actuating coil for switch 1524.

Waveforms suitable for actuating the switches and the comparator are shown in FIGURE 86. These waveforms are generated by a stepper switch type programmer similar to those described previously. The letters on these waveforms correspond to those shown on FIGURE 85.

The switching sequences are exactly the same as described in connection with FIGURE 66 except for switch 1520. At the start of the conversion (in the first portion of the first bit period) switch 1520 is closed, thereby charging capacitor 1516 ($C_1$) to the potential of battery 1540 with the top terminal of capacitor 1516 positive. Switch 1520 then opens and does not close again until after the first portion of the fourth bit period. (In the case illustrated, switch 1520 closes during the last portion of the fourth bit period.) In case there are more than two decimal digits in the conversion process, switch 1520 closes after the first portion of the fourth bit period in the conversion of each decimal digit except that it is not necessary (but is not harmful) to close switch 1520 during the final decimal digit.

Capacitors 1518 and 1522 are equal in size and capacitor 1516 is $\frac{3}{32}$ as large as either capacitor 1518 or capacitor 1522. Thus, when switch 1520 is closed at the start of conversion, capacitor 1516 is charged to E, the potential of battery 1540. During succeeding closures of switch 1520, the charge on capacitor 1518 is increased from $\frac{1}{8}$ its value at the start of the decimal digit conversion to $\frac{1}{5}$ of that value. Therefore, the increase in voltage on capacitor 1522 during the next closure of switch 1514 will be $\frac{1}{10}$ as large as at the start of the conversion of the decimal digit just previous.

By adjusting capacitor 1516 to the proper size and by making suitable changes in the timing signals shown in FIGURE 86, it is possible to make binary coded analog to digital conversions to other number bases.

The binary-coded decimal analog to digital converter shown in FIGURE 87 is capable of encoding both positive and negative analog input voltages. This converter is exactly the same as that shown in FIGURE 85 with the following changes.

(1) The left hand terminal of switch 1510 is connected to ground instead of to the positive terminal of battery 1540.

(2) The lower terminal of switch 1538 is connected to the negative terminal of battery 1540 instead of to ground and the positive terminal of battery 1540 is connected to ground.

(3) Capacitor 1562 ($C_1$), switch 1564 and switch 1560 have been added. The upper terminal of capacitor 1562 is connected to the upper terminal of switch 1560 and to the upper terminal of capacitor 1516. The lower terminal of capacitor 1562 is connected to the left-hand terminal of switch 1564 and to the lower terminal of switch 1560. The right-hand terminal of switch 1564 is connected to the lower terminal of capacitor 1516 and to the left-hand terminal of switch 1520.

(4) Programmer signal F of FIGURE 86 has been replaced by signal G shown on FIGURE 88.

(5) New programmer signal H to operate switch 1564 is required.

At the start of the conversion period, capacitors 1562 and 1522 are discharged and capacitors 1516, 1518 and 1536 are charged to the potential of battery 1540. The upper terminal of capacitor 1536 acquires a negative charge. Next, timing signal C gates comparator 1546. If the analog input signal is positive, a pulse occurs at terminal 1550. If the analog input signal is negative, a pulse occurs at terminal 1552 and switch 1524 closes, charging capacitor 1522 ($C_3$) to the negative potential of battery 1540.

During succeeding bit intervals, the pulses on terminal 1550 represent the 8, 4, 2, 1 binary-coded decimal equivalent of the analog input signal for positive quantities and the ones complement of the binary-coded decimal equivalent for negative input quantities. Conversely, the pulses at terminal 1552 (after the first or polarity interval) represent the binary-coded decimal equivalent of the analog input signal for negative quantities and the ones complement of the binary-coded decimal equivalent for positive input quantities.

Capacitors 1562 and 1516 are of equal capacitance. Switch 1564 is closed connecting capacitors 1562 and 1516 in parallel and discharging capacitor 1516 to one-half the battery potential prior to the end of the operation of switch 1520 at the end of the first decimal digit period. Switch 1520 closes after the first portion of the fifth bit period. (In the case illustrated, switch 1520 closes during the last portion of the fifth bit period.) The encoding of the most significant decimal digit is complete at the end of the fifth bit period since the first bit period was used to determine polarity. For the encoding of succeeding decimal digits, switch 1564 does not close and switch 1520 closes after the first portion of the fourth bit period in the conversion of each decimal digit except that it is not necessary (but is not harmful) to close switch 1520 during the final decimal digit.

NON-BINARY CONVERTER

Another circuit for a reversible analog to digital converter for operation with non-binary numbers is shown in FIGURE 89. This circuit can operate also with binary numbers, but one of its primary advantages lies in its capability for operation with non-binary numbers.

The pulse trains which are utilized in FIGURE 89 for representation of the digital equivalents of analog voltages in analog to digital conversions are composed of a time sequence of pulse positions. As shown in FIGURE 90, at each pulse position, the voltage may rise to a standard value or the voltage may remain at zero, depending upon factors which will be explained later. In other words, at each pulse position, there may be a pulse or a no-pulse, as part of the representation of a digit. Other types of number representation for non-binary numbers are sometimes used. For example, the voltages at each pulse position may assume one of several standard values, and also the voltage at a particular pulse position may endure for a longer or shorter time. The outputs of the circuits described herein may be converted to these alternative representations by suitable modification of the digital output device 1687; however, unless otherwise stated, the digital output of the converter will consist of pulse trains as shown in FIGURE 90. The pulse train in FIGURE 90 is also used for digital to analog conversions. With respect to other types of pulse representations of numbers, statements similar to those for analog to digital conversion may be made for digital to analog conversion.

Although the circuit of FIGURE 89 may be designed to operate with numbers having any number base, the following explanations will utilize decimal numbers since 10 is such a commonly used number base.

FIGURE 89 shows a reversible decimal analog to digital converter. The analog input terminal 1610 is connected to the left-hand fixed terminal of switch 1612 and to the left-hand terminal of switch 1614. The rotor of manual switch 1612 is connected to ground. The right-hand terminal of switch 1614 is connected to the left-hand terminal of switch 1656, to the left-hand terminal of switch 1616, to the left-hand terminal of switch 1618, to the right-hand terminal of the lower section of switch 1630 and to the input of unity-gain amplifier 1638. Also to switch 1628 the right-hand terminal of switch 1656 is connected to the upper terminal of capacitor 1660 and to the left-hand terminal of switch 1658. The lower terminal of capacitor 1660 is connected to ground. The right-hand terminal of switch 1658 is connected to the right-hand terminal of switch 1620, to the right-hand terminal of switch 1622 and to the output of unity-gain amplifier 1638. The right-hand terminal of switch 1616 is connected to the upper terminal of capacitor 1640 and to the left-hand terminal of switch 1620. The lower terminal of capacitor 1640 is connected to ground. The right-hand terminal of switch 1618 is connected to the upper terminal of capacitor 1642 and to the left-hand terminal of switch 1622. The lower terminal of capacitor 1642 is connected to ground. The positive terminal of the source of standard potential 1632 is connected to the left-hand terminal of the upper section of switch 1626. The negative terminal of source 1632 is connected to the left-hand terminal of the lower section of switch 1626. The right-hand terminal of the upper section of switch 1626 is connected to the upper terminal of capacitor 1634, to the left-hand terminal of the upper section of switch 1628, and to the left-hand terminal of the upper section of switch 1630. The right-hand terminal of the lower section of switch 1626 is connected to the lower terminal of capacitor 1634, to the left-hand terminal of the lower section of switch 1628 and to the left-hand terminal of the lower section of switch 1630. The right-hand terminal of the upper section of switch 1628 is connected by wire 1636 to the input of unity-gain amplifier 1638. The right-hand terminal of the upper section of switch 1630 is connected to the right-hand terminal of the lower section of switch 1628 and to the output of unity-gain amplifier 1638 on wire 1644. The output of unity-gain amplifier 1638 is connected to the analog output terminal 1646 and to the upper fixed terminal of switch 1624. The lower fixed terminal of manual switch 1624 is connected to the pulse processing network 1688. The digital input terminal 1686 is connected to the pulse processing network 1688. The rotor of manual switch 1624 is connected to the input of comparator 1650.

The upper output terminal of comparator 1650 is connected by wire 1652 to the lower input terminal of AND circuit 1664, to the upper fixed terminal of manual switch 1662 and to the delay circuit 1670. Terminal 1654, the lower output terminal of comparator 1650, is connected to the lower fixed terminal of switch 1162. The rotor of manual switch 1662 is connected to delay 1668. The output of delay 1668 is connected to the input of AND circuit 1672 and to the input of AND circuit 1680. The output of AND circuit 1664 is connected to the right-hand input terminal of flip-flop 1666. The left-hand output terminal of flip-flop 1666 is connected to the right-hand input of AND circuit 1672. The right-hand output terminal of flip-flop 1666 is connected to the right-hand input terminal of AND circuit 1734. The output of delay 1670 is connected to the left-hand input of AND circuit 1734 and to the left-hand input of AND circuit 1678. The output of AND circuit 1672 is connected by wire 1775 to reversing switch 1774. The output of AND circuit 1682 is connected to the input of NOT circuit 1783. The left-hand output terminal of flip-flop 1676 is connected to the right-hand input terminal of AND circuit 1680. The right-hand output terminal of flip-flop 1676 is connected to the right-hand input terminal of AND circuit 1678. The output terminal of AND circuit 1680 is connected to the left-hand input terminal of OR circuit 1681. The output terminal of AND circuit 1678 is connected to the right-hand input terminal of OR circuit 1681. The output of OR circuit 1681 is connected to the right-hand input terminal of AND circuit 1682 and to delay 1684. The output of NOT circuit 1683 is connected to the inhibiting terminal of INHIBIT circuit 1685. The output of INHIBIT circuit 1685 is connected by wire 1686 to the input of digital output device 1687.

The actuating coils for switch 1628 and 1630 are connected separately to reversing switch 1674. The output of AND circuit 1672 is connected to the upper input terminal of AND circuit 1677. The output of AND circuit 1677 is connected to one shot multivibrator 1692. The output of one shot multivibrator 1692 is connected to the left-hand trigger terminal of flip-flop 1676. The output of delay 1684 is connected to the input of INHIBIT circuit 1685.

The programmer 1696 is similar to the other stepper switch programmers previously described. This programmer provides signals for controlling switches, for controlling the comparator, for inputs to the AND circuits, and for resetting the flip-flops. FIGURE 91 shows the timing waveforms for the various outputs from programmer 1696 for analog to digital conversions. Wire A is connected to the actuating coil for switch 1626. Wire B is connected to comparator 1650. Wire C is connected to the actuating coils for switches 1614 and 1622 and is connected to reset flip-flops 1666 and 1676. Wire D is connected to AND circuit 1664 and to AND circuit 1677. Wire E is connected to the actuating coil for switch 1618. Wire F is connected to one output of AND circuit 1682. Wire G is connected to the actuating coil for switch 1620. Wire H is connected to the actuating coil for switch 1616. Wire L is connected to the actuating coil for switch 1658. Wire J is connected to flip-flop 1666. Wire M is connected to the actuating coil for switch 1656.

For analog to digital operation of the circuit in FIGURE 89, the output train of pulses may be divided into several groups as shown in FIGURE 90. The first group, which consists of pulses that may be concerned with scale factor, and other features, is not part of the present invention. However, a preferred arrangement is to have the last pulse in this group available for synchronizing purposes. Following this group, there is a pulse position, or unit period, in which the presence of a pulse signifies a positive analog input voltage and in which a no-pulse signifies a negative analog input voltage. This convention can readily be reversed, if desired. The presence of pulses and no-pulses in the next nine pulse positions determines the magnitude of the most significant digit of the output number which is the equivalent of the analog input voltage. That is, if the polarity pulse position is followed by six pulses and three no-pulses, the most significant digit is 6. Similarly, the following group of ten pulse positions is related to the magnitude of the second most significant digit. The first pulse position in this group is always a no-pulse, but the remaining pulse positions may contain pulses or no-pulses. Thus, if the first three pulse positions of this group contain no-pulses and if the next seven pulse positions contain pulses, the second most significant digit is 7. Likewise, the next group of ten pulse positions designates the third most significant digit. Here again the first pulse position is always a no-pulse, and the number of pulses in the following pulse position determines the magnitude of the third most significant digit. The pulse positions corresponding to the various digits of the output number are shown in groups separated by vertical dashed lines. In general, except for the polarity pulse, the odd-numbered significant digits have similar pulse patterns, and the even-numbered significant digits have similar pulse patterns; however, it will be noted that the pulse patterns for the odd-numbered digits are different from the patterns for the even-numbered digits. That is, in the groups of pulses positions associated with the odd-numbered significant digits, the pulses occur early in the group, whereas in the groups associated with the even-numbered significant digits, the pulses occur late in the group. The pulse train which represents the digital output number +673 is shown in FIGURE 90 and pulses in the group representing synchronization, scale factor, etc. are not shown. Thus, in FIGURE 90, the first pulse indicates that the polarity of the analog input voltage is positive. The following six pulses represent the most significant digit, which is 6. The numbers of pulses in the following groups will be observed to be equal to the corresponding digits.

The convention with respect to pulses and no-pulses in the representation of significant digits can be reversed. The convention which was stated above has been adopted by way of example only. It is also to be understood that additional digits of lower significance may be represented by additional groups of 10 pulse positions, as indicated on FIGURE 90.

For the analog to digital conversion mode of operation of the circuit in FIGURE 89, manually operated switches 1612, 1624, 1662 and 1674 are placed in the A/D positions. In the first half of the first unit period, switches 1614, 1622 and 1626 are closed and opened by the programmer. The voltages which actuate these and other switches, and also the program voltages applied to AND 1664, AND 1667, AND 1682 and the trigger pulses to flip-flops 1666 and 1676, are shown in FIGURE 91, and reference to this figure will clarify the following explanations. The effects of the operations of switches 1614, 1622 and 1626 are to place a voltage equal to the analog input voltage on capacitor 1642, and to charge capacitor 1634 to the voltage of the standard cell 1632. Moreover, in the first half of the first unit period, flip-flops 1666 and 1676 are reset by unsymmetrical trigger pulses from the programmer so that the voltages of outputs 2 are high. Therefore, AND 1672 and AND 1678 are open, and AND 1634 and AND 1680 are closed. At the start of the second half of the first unit period, switch 1618 is closed and remains closed for the balance of the A/D period. Also during the second half of the first unit period, AND 1664 and AND 1677 are opened by voltages from the programmer. When the gate pulse is applied to the comparator 1650 in the second half of the first unit period, a pulse appears on wire 1652 if the analog input voltage is positive, and on wire 1654 if the analog input voltage is negative. In the latter case, the pulse passes through DELAYs 1668 and 1672, and closes and opens switch 1628 through wire 1673. This operation transfers the charge from capacitor 1634 to capacitor 1642. The mechanism of charge transfer was described previously in relation to FIGURES 3 and 4. The sizes of capacitors 1634, 1642 and the voltage of battery 1632 are selected so that the change in voltage of capacitor 1642 corresponds to one unit in the most significant digit position. That is, the magnitude of the negative voltage on capacitor 1642 is reduced by this amount. The pulse on wire 1673 also passes through AND 1677 and triggers the one shot multivibrator 1692 to its quasi-stable state. The duration of the quasi-stable state is slightly greater than one-half of a unit period, and therefore the one-shot multivibrator returns to its stable state in the first half of the second unit period. The return to the stable stat etriggers flip-flop 1676 so that output 1 is at a high voltage. The transfer opens AND 1680 and closes AND 1678. Thus, AND 1680 remains closed during the entire first unit period, and therefore the pulse on wire 1654 does not appear on wire 1686.

On the other hand, if the analog input voltage is positive, a pulse appears on wire 1652 in the second half of the first unit period. This pulse passes through AND 1664, and reverses flip-flop 1666 so that output 1 is high, and output 2 is low. This action opens AND 1634 and closes AND 1672. The pulse on wire 1652 also passes through DELAY 1670 and reaches AND 1634 after it has been opened by the transfer of flip-flop 1666. Thus, the delay time in DELAY 1670 must be equal to or slightly greater than the transfer time of flip-flop 1666. In order to have pulses occur at the output of the converter at the same time regardless of the polarity of the analog input voltage, the delay time of DELAY 1668 must be the same as the delay of DELAY 1670. Thus the pulse on wire 1652 passes through AND 1634, AND 1678, OR 1681, DELAY 1684, INHIBIT 1685 and appears on wire 1686 to digital output device 1687. The action of INHIBIT 1685 will be explained later, but for the present it is sufficient to note that this pulse passes through it. The pulse on wire 1652 also appears on wire 1675 and closes and opens switch 1630. This switching operation transfers a negative charge from capacitor 1634 to capacitor 1642, and reduces the voltage on the latter capacitor by an amount which corresponds to one unit in the most significant digit position similar to the action which was described for negative analog input voltages. If the most significant digit is 0, the voltage on capacitor 1642 will become negative or zero; otherwise, a positive residue of charge remains on capacitor 1642.

The description of the operation of the circuit of FIGURE 89 for positive analog input voltages will be continued, after which the operation for negative analog voltages will be described. In the first half of the second unit period, switch 1626 is closed and opened, thereby charging capacitor 1634 to the battery voltage. It will be assumed that the remainder of charge on capacitor 1622 after the first unit period is positive. This will be true except when the most significant digit is 0. Therefore a pulse appears on wire 1652 when the comparator gate pulse occurs in the second half of the second unit period. This pulse appears on wires 1675 and 1686 by means previously described, and the voltage on capacitor 1642 is reduced by another increment. This action continues until the voltage on capacitor 1642 becomes negative, after which pulses appear on wire 1654 during the comparator gate pulse. However, since AND 1672 is closed, these pulses cannot go anywhere, and they have no effect on the voltage of capacitor 1642 or any other part of the circuit. It will be apparent from the foregoing explanation that the number of pulses which appear on wire 1686 in the first digit period is equal to the polarity pulse plus the most significant digit.

To return to operation with negative analog input voltages, it will be recalled that AND 1672 was open at the end of the first unit period, and that AND 1680 was closed. Therefore, the pulse on wire 1654 does not appear on wire 1686 although it does appear on wire 1673. The purpose of AND 1677 and one-shot multivibrator 1692 is seen to be to cooperate with flip-flop 1676 to prevent a pulse from appearing on wire 1686 in the first unit period when the analog input voltage is negative. As noted previously, AND 1680 is opened in the first half of the second unit period for negative analog input voltages, and thereafter pulses which appear on wire 1654 also appear on wire 1686. In each unit period, the magnitude of the negative voltage on capacitor 1642 is reduced by an amount corresponding to one unit in the most significant digit position by a process similar to that described for positive analog input voltages. When the number of pulses on wire 1654 is one greater than the most significant digit, the voltage on capacitor 1642 becomes positive. Thereafter, in the first digit period, pulses appear on wire 1652 when the comparator is gated, but these pulses can go nowhere, since AND 1634 is closed.

It is especially important to note that the polarity of the voltage on capicitor 1642 changes sign during the first digit period. That is, if the analog input voltage is positive, the voltage on capacitor 1642 is negative at the end of the first digit period. On the other hand, if the analog input voltage is negative, the voltage on capacitor 1642 is positive at the end of the first digit period.

At the start of the second digit period, that is, in the first half of the eleventh unit period, switch 1620 is closed and opened, thereby charging capacitor 1640 to the same voltage as capacitor 1642. In the second half of this unit period, switch 1616 is closed, and it remains closed during the remainder of the encoding period. The closing of switch 1616, together with the previous closing of switch 1618, connects capacitors 1642 and 1640 in parallel, and the size of capacitor 1640 is selected so that the sum of the capacities is 10 times the capacity of capacitor 1642. Therefore, as will be clear from the explanations for FIGURE 2, the changes in voltage on them when switch 1628 or 1630 is operated will be one tenth that for capacitor 1642 alone. Also in the first half of the eleventh unit period, switch 1626 is closed and opened, and a symmetrical trigger pulse is applied to flip-flop 1666. Thus the state of the flip-flop is reversed, and the AND circuits associated with it are also reversed with respect to being open and closed. It will be clear that, for positive analog input voltages, AND 1672 is opened and AND 1634 is closed. The converse is true for negative analog input voltages.

It will be recalled that for positive analog input voltages, the voltage on capacitors 1642 and 1640 is negative in the first part of the eleventh unit period. Therefore, when the comparator receives a gate pulse in the second part of the eleventh unit period, a pulse occurs on wire 1654. This pulse operates switch 1628 through AND 1672 and wire 1673 but does not appear on wire 1686 because AND 1680 remains closed. The operation of switch 1628 decreases the magnitude of the negative voltage on capacitors 1642 and 1640 by an amount corresponding to one unit in the second most significant digit position, in accordance with previous explanations. In following unit periods, the magnitude of the voltage on capacitors 1642 and 1640 is further reduced until eventually the voltage on the capacitors becomes positive. Thereafter, pulses appear on wire 1652 and travel to wire 1686 through the open AND 1678. However, these pulses on wire 1652 will not operate switches 1628 or 1630 since AND 1634 is closed and since no pulses occur on wire 1654 at these times. It will be noted that pulses do not generally occur on wire 1686 in the second most significant digit until the later unit periods.

For negative analog input voltages, the voltage on capacitors 1642 and 1640 is positive in the first half of the eleventh unit period, and AND 1634 is opened by the transfer of flip-flop 1666. Therefore, the pulse which occurs on wire 1652 in the second half of this period operates switch 1630, but does not appear on wire 1686 since AND 1678 is closed. Each operation of switch 1630 reduces the voltage on capacitors 1642 and 1640 in a manner which has been previously explained, until the voltage finally becomes negative. Thereafter, pulses occur on wires 1654 and 1686, but do not actuate switches 1628 or 1630.

For both positive and negative analog input voltages, the number of pulses which appear on wire 1686 in the second digit period is equal to the second most significant digit.

At the start of the third digit period, that is, in the first half of the twenty first unit period, switch 1658 is closed and opened, thereby charging capacitor 1660 to the same voltage as capacitors 1642 and 1640. In the second half of this unit period, switch 1656 is closed, and it remains closed during the remainder of the encoding period. The closing of switch 1656, together with the previous closings of switches 1616 and 1618, places capacitors 1660 in parallel with capacitors 1640 and 1642. Moreover, the size of capacitor 1660 is selected so that the sum of the three capacitors is 100 times the capacity of capacitor 1642. Therefore, as will be clear from previous explanations, the changes in voltage on them when switch 1628 or switch 1630 is operated will be one-hundredth that for capacitor 1642 alone. Also in the first half of the twenty-first unit period, switch 1626 is closed and opened, and a symmetrical trigger pulse is applied to flip-flop 1666. Thus the state of the flip-flop is reversed, and the AND circuits associated with it are also reversed with respect to being open and closed. It will be clear that, for positive analog input voltages, AND 1634 is opened and AND 1672 is closed. The converse is true for negative analog input voltages.

It will be recalled that the polarity of the voltage on capacitor 1642, and also the polarities of the voltages on capacitors 1620 and 1660 when they are connected in parallel with capacitor 1642, changes sign in each digit period. Therefore, the voltage on capacitors 1642, 1640 and 1660 is positive in the first half of the twenty-first unit period when the analog input voltage is positive, and vice versa. Hence, for positive analog input voltages, a pulse occurs on wire 1652 when the comparator 1650 receives a gate pulse in the second half of the twenty-first unit period. This pulse passes through the open AND 1634, and operates switch 1630. The pulse also passes through open AND 1678 and OR 1681, but does not reach wire 1686 because of the action of INHIBIT 1685, the action of which will now be explained. In the second half of the twenty-first unit period, AND 1682 is opened by a pulse from the programmer. Therefore, the pulse at the output of OR 1681 passes through AND 1682, is inverted by NOT 1683 and is applied to the inhibit input of INHIBIT 1685. In the meantime, the pulse out of OR 1681 also passes through DELAY 1684, and reaches the other input on INHIBIT 1685. However, the inhibit circuit is then closed, and the pulse cannot pass through to wire 1686. It will be clear that the delay in DELAY 1684 must be equal to or slightly greater than the time required for the pulse to pass through AND 1682 and NOT 1683. The general purpose of those circuit elements is to block from wire 1686 the first pulse in the third, fifth, etc. digit periods. If this were not done, the number of pulses on wire 1686 would exceed the corresponding digit by one.

In following unit periods, the charge on capacitors 1642, 1640 and 1660 is reduced by repeated operations of switch 1628 or switch 1630 until the polarity changes sign. The action is similar to that described for the first two digit periods, except that each increment of voltage is one-hundredth of the increments in the first digit period. After the polarity changes sign, the voltage on the capacitors remains unchanged until the next digit period. In FIGURE 91, waveshapes are shown for three digits, but it will be clear from the foregoing explanations how additional digits could be provided for if desired.

In order to illustrate further the operation of the circuit in FIGURE 89 for analog to digital conversion, an analog input of just over +673 volts will be assumed, and the conversion will be followed through in detail. In the first half of the first unit period, switches 1614 and 1622 are closed and opened, and capacitor 1642 is charged to the analog input voltage. Also, switch 1626 is closed and opened, thereby charging capacitor 1634 to the voltage of the standard battery 1632. Furthermore, pulses from output C of the programmer 1696 reset flip-flops 1666 and 1676 so that sides 2 are at high voltages. Hence, AND 1672 and AND 1678 are open, while AND 1634 and AND 1680 are closed. In the second half of the first unit period, a gate pulse is applied to a comparator 1650 from programmer output B, and a pulse appears on wire 1652 since the input to the comparator was positive. Also, AND 1664 and AND 1677 are opened in the second half of the first unit period by a pulse from output D of the programmer. However, no pulse occurs at the output of AND 1677 because no pulse is impressed on its second input. The pulse on wire 1652 passes through the open AND 1664 and reverses flip-flop 1666. This action opens AND 1634 and closes AND 1672. The pulse on wire 1652 also passes through DELAY 1670, AND 1634 and closes and opens switch 1630 through wire 1675. In accordance with previous explanations, the operation of switch 1630 reduces the voltage on capacitor 1642 by 100 volts so that the voltage is just over 573 volts at the end of the second half of the first unit period.

The voltage on capacitor 1642 is shown in FIGURE 92, and it should be observed that the vertical scale factor changes by a multiple of ten at the beginning of each digit period. The pulses which appear on wire 1686 are shown in FIGURE 93. As explained previously, this pulse train can be converted to any desired form by a suitable digital output device 1687. The switching operations in the second through the seventh unit periods are similar. That is, in each of these unit periods, switch 1626 is closed and opened in the first half of the unit period, and switch 1630 is closed and opened in the second half. These operations reduce the voltage on capacitor 1642 by 100 volts in each unit period, as shown in FIGURE 92. Also, pulses occur on wires 1652 and 1686 in each of these unit periods, as shown in FIGURE 93. In the seventh unit period, the voltage on capacitor 1642 becomes negative by just under 27 volts. Therefore, in unit periods 8, 9 and 10, pulses occur on wire 1654 in the second half of each period. However, these pulses can go nowhere since AND 1672 and AND 1680 are closed, and the voltage on capacitor 1642 remains constant.

In the first half of the eleventh unit period, a symmetrical trigger pulse is applied to flip-flop 1666 from output J of the programmer. The flip-flop is thereby reversed and AND 1672 is opened, and AND 1634 is closed. Also in the first half of the eleventh unit period, switch 1626 is closed and opened thereby charging capacitor 1634 to the battery voltage. Furthermore, switch 1620 is closed and opened, and capacitor 1640 is charged to the same voltage as capacitor 1642. Thereupon, switch 1616 is closed, which connects capacitors 1642 and 1640 in parallel.

In the second half of the eleventh unit period, a pulse occurs on wire 1654 when the comparator receives a gate pulse. The pulse on wire 1654 passes through the open AND 1672, and operates switch 1628. However, this pulse does not appear on wire 1686 since AND 1680 remains closed. The operation of switch 1628 places a positive increment of 10 volts on capacitors 1642 and 1640 in accordance with previous explanation. The switching operations in unit periods 12 and 13 are similar to those in unit period 11, and positive increments of 10 volts are added to the voltages on capacitors 1642 and 1640 in each unit period. The increment in unit period 13 causes the voltage on capacitors 1642 and 1640 to become positive by just over three volts. In unit periods 14 through 20, pulses occur on wire 1652 in the second half of each period, and these pulses pass through open AND 1678 to wire 1686. However, the pulses cannot operate switch 1630 since AND 1634 is closed. It will be noted that the number of pulses which appear on wire 1686 is 7, which is equal to the second most significant digit.

In the first half of unit period 21, a symmetrical trigger pulse is applied to flip-flop 1666 with the effect that AND 1672 is closed and AND 1634 is opened. Also switch 1626 is closed and opened, and switch 1658 is closed and opened. The latter operation results in the charging of capacitor 1660 to the same voltage as that of capacitors 1642 and 1640. Thereupon, switch 1656 is closed, which connects capacitor 1660 in parallel with capacitors 1642 and 1640. In the second half of unit period 21, a pulse occurs on wire 1652, and this pulse operates switch 1630. This operation reduces the voltage on capacitors 1642, 1640, and 1660 by one volt. However, the pulse on wire 1652 does not appear on wire 1686 because of the action of INHIBIT 1685, as previously explained. The voltage on capacitors 1642, 1640 and 1660 is further decreased by one volt in unit periods 22, 23 and 24. Moreover, the pulses which occur on wire 1652 in these unit periods also appear on wire 1686. In unit period 24, the voltage on the capacitors 1642, 1640 and 1660 becomes negative, and thereafter in the third digit period pulses occur in wire 1654 in the second half of each unit period. However, these pulses have no effect since all of the AND circuits connected to wire 1654 are closed. It will be noted in FIGURE 93 that, in the third digit period, three pulses appear on wire 1686 corresponding to the value of the digit.

Additional digits of lesser significance can be provided for by more capacitor and switch combinations similar to capacitor 1642 and switches 1618 and 1622, and by suitable programmer outputs. The extension of the circuit of FIGURE 89 to more digits is believed to be clear from the preceding explanations.

The operation of the circuit in FIGURE 89 for digital to analog conversion will now be described. Manual switches 1612, 1624, 1662 and 1674 are placed in the D/A positions. The digital input pulse train is connected to terminal 1686. Prior to the first unit period, a synchronizing pulse sets the programmer into operation, and in the first half of the first unit period, flip-flop 1666 is reset so that side 2 is at a high voltage. Therefore, AND 1672 is open and AND 1634 is closed. Also in the first half of the first unit period, switch 1626 may be closed and opened, although this operation is of no consequence as will become clear from the later explanation. Nevertheless, operation of switch 1626 in the first half of the first unit period may allow the construction of a simpler programmer, since then output A from the programmer may be used for both A/D and D/A conversions.

For positive digital input numbers having the general pattern which was described in connection with FIGURE 90, a pulse will occur in the second half of the first unit period. Simultaneously, the comparator will receive a gate pulse from the programmer. Therefore, a pulse will occur on wire 1652. Also in the second half of the first unit period AND 1664 is opened by a gate pulse from the programmer, and the pulse on wire 1652 therefore triggers flip-flop 1666 so that side 1 is at a high voltage, which action opens AND 1634 and closes AND 1672. The pulse on wire 1652 also passes through DELAY 1670, and the now open AND 1634, and operates switch 1628. However, this operation is of no consequence as will become clear presently. For negative digital input signals, a pulse will occur on wire 1654 and a no-pulse will occur on wire 1652 in the first half of the first unit period. Therefore, side 2 of flip-flop 1666 will remain at a high voltage.

In the first half of the second unit period, switch 1626 is closed and opened, thereby charging capacitor 1634 to the battery voltage. Also switches 1614 and 1618 are closed and opened, discharging capacitor 1642. From this operation it may be seen that any operation of switches 1626, 1628 or 1630 in the first unit period is of no consequence. Unless the most significant digit of the digital input number is zero, a pulse will occur in the second half of the second unit period. Therefore in the second half of the second unit period, for positive input numbers, switch 1628 will be closed and opened. This operation will charge capacitor 1642 to a voltage corresponding to one unit in the most significant digit position. Input pulses in succeeding unit periods will add further increments of voltage to capacitor 1642, and the total voltage on this capacitor at the end of the first digit period will correspond to the most significant digit.

The switching operations for negative digital input voltages are similar to those for positive digital input voltages except that flip-flop 1666 is not reversed in the first unit period, and switch 1630 is operated instead of switch 1628. Therefore, negative increments of voltage are added to capacitor 1642 as a result of pulses in the second and following unit periods, and the total voltage on capacitor 1642 at the end of the first digit period will correspond to the most significant digit in magnitude but will have a negative polarity.

At the start of the second digit period, that is, in the first half of unit period 11, switch 1620 is closed and opened, thereby charging capacitor 1640 to the same voltage as capacitor 1642. Thereupon, switch 1616 is closed, connecting capacitor 1640 in parallel with capacitor 1642. In accordance with previous explanation, the combined capacity of these capacitors is ten times that of capacitor 1642 alone. Hence, in the seond digit period, the operation of swithes 1626 and 1628 or switch 1630 will add increments of voltage to capacitors 1642 and 1640 which are one tenth the magnitude of the increments in the first digit period. Moreover, since no change is made in the state of flip-flop 1666, these increments have the same polarity as those in the first digit period. Therefore, at the end of the second digit period, the voltage on capacitors 1642 and 1640 corresponds to the two most significant digits of the digital input number, and the polarity of the voltage on these capacitors corresponds to the polarity pulse or no-pulse of the digital input number. It should also be noted no pulse occurs on wire 1652 until there is a pulse on digital input terminal 1686. In general, there will be a no-pulse in the digital input pulse train in the first unit period of the second digit period, that is, in unit period 11, and therefore neither switch 1628 nor switch 1630 will operate in this unit period. Therefore, the operation of switch 1626 in the first half of this unit period will be of no consequence but on the other hand will not be harmful. Moreover, several unit periods may pass in the second digit period before there is an input pulse, and in case the second most significant digit is zero there will be no input pulse at all in the second digit period. Here again, the operation of switch 1626 will be of no consequence but will not be harmful.

The third digit period is similar to the second. In the first half of unit period 21, switch 1658 is closed and opened, charging capacitor 1660 to the same voltage as capacitors 1642 and 1640. Thereupon, switch 1656 is closed, and capacitor 1660 is connected in parallel with capacitors 1642 and 1640. In accordance with previous explanations, the combined capacity of the three capacitors is 100 times that of capacitor 1642 alone. Therefore the inrements of voltage due to the operation of switches 1626 and 1628 or 1630 is one hundredth of the increments in the first digit period. In the second half of unit period 21, a no-pulse occurs on wire 1652 and the operation of switch 1626 in this unit period is of no consequence, as was previously explained. However, unless the third most significant digit is 0, a pulse does occur on wire 1652 in the second half of unit period 22, and this pulse operators switch 1628 or switch 1630, depending upon the polarity of the digital input voltage. The number of increments of voltage which are added to capacitors 1642, 1640, and 1660 is equal to the number of input pulses in the third digit period. Therefore, the total voltage on these capacitors at the end of the third period corresponds to the first three significant digits of the digital input pulse train. This voltage appears at Analog Output terminal 1646.

Digits of lesser significance may be provided for in accordance with the explanation for analog to digital operation.

In the mode of operation described above for digital to analog conversion, it will be observed that the increments of voltage which are added to capacitor 1642, and to capacitors 1640 and 1660 when they are in parallel with it, all have the same polarity in a given conversion period. Moreover, additional programmer outputs are required which are not required for analog to digital conversion. For example, switches 1614 and 1618 are closed and opened in the first half of the first unit period in an analog to digital conversion, but in a digital to analog conversion they are closed and opened in the first half of the second unit period. The voltages from the programmer which are required for these and other functions may be obtained from additional programmer outputs which are not shown in FIGURE 89, and may be selected by a multipole double throw switch of suitable construction. The production of the additional outputs required for digital to analog conversion as described is considered straightforward and will not be described in detail.

With respect to the synthesis of the analog output voltage, it is possible to arrange the resetting and later triggering of flip-flop 1666 so that the voltage on capacitor 1642 is, in general, too high at the end of the first digit period, and is reduced to a value that is, in general, too low at the end of the second digit period. Then, in the third digit period, the voltage is built up again, and so on for digits of lesser significance. Both of these methods for synthesis of the analog output voltage are within the scope of the invention.

In FIGURE 89, charge is transferred from capacitor 1634 to capacitor 1642 (including capacitors 1640 and 1660, as the case may be) by means of a gain-of-one amplifier. This transfer may also be accomplished by means of an amplifier having a high negative gain, or by having capacitor 1642 large in comparison with capacitor 1634. All three of these methods of charge transfer are within the scope of the invention. The switching sequences must be modified slightly depending upon which method of charge transfer is used, but these are readily apparent.

FIGURE 94 shows a decimal analog to digital converter employing delayed feedback. The analog input terminal 1740 is connected to the left hand terminal of switch 1742. The right hand terminal of switch 1742 is connected to the upper terminal of capacitor 1716, to the right hand terminal of switch 1714, and to the input of unity gain amplifier 1718. The lower terminal of capacitor 1716 is connected to ground. At the start of each conversion, switch 1742 is closed charging capacitor 1716 to the analog input voltage.

The output of amplifier 1718 is connected to the positive terminal of battery 1720 and to resistors 1722 and 1726. Resistors 1722 and 1724 form a voltage divider between the output of amplifier 1718 and wire 1738 and their junction is connected by wire 1752 to the input of comparator 1730. Resistors 1726 and 1728 form a second voltage divider across battery 1720. The junction of resistors 1726 and 1728 is connected to the left hand terminal of switch 1734. The negative terminal of battery 1720 is connected to the left hand terminal of switch 1736. The right hand terminals of switches 1734 and 1736 are connected by wire 1738 to the left hand terminal of switch 1710. The right hand terminal of switch 1710 is connected to the upper terminal of capacitor 1712 and to the left hand terminal of switch 1714. The lower terminal of capacitor 1712 is connected to ground. Wire 1746 at the output of comparator 1730 is connected to the actuating coil for switch 1714. The other output from comparator 1730, wire 1748, is connected to flip-flop 1754. Output signals from flip-flop 1754 are connected to the actuating coils for switches 1734 and 1736 by wires 1756 and 1758.

FIGURE 95 shows the switch control signals that exist during the conversion of an analog input voltage of +3.4 volts. Also shown on FIGURE 95 are the voltages which occur at the input (or output) of unity-gain amplifier 1718; at the upper terminal of capacitor 1712; and at the input to the comparator on wire 1752.

At the start of the conversion period, switches 1742 and 1710 are closed. Flip-flop 1754 is set by pulse A so that switch 1736 is closed and switch 1734 is open. Thus capacitor 1716 is charged to the analog input voltage and capacitor 1712 is charged to the analog input voltage minus the potential at the junction of resistors 1722 and 1724. Switches 1742 and 1710 are opened now. In the next step, switch 1714 is closed if the potential on wire 1752 is positive and remains open if this potential is negative. If resistors 1722 and 1724 and capacitors 1712 and 1716 are related properly, the voltage at 1752 during the first portion of unit periods is the same as the potential will be at wire 1744 in the second part of unit periods, if switch 1714 is operated by comparator 1730. For this reason $$R1722/(R1722+R1724)=C1712/(C1712+C1716)$$

In the case illustrated in FIGURE 95, R1722=R1724 and C1712=C1716. Thus $$R1722/(R1722+R1724)=C1712/(C1712+C1716)=\frac{1}{2}$$

Comparator 1730 is activated next by wave form C. Since, at this time, the potential on wire 1752 at the input to the comparator is positive, a pulse occurs on wire 1746 closing switch 1714 and causing the potential on capacitor 1716 to decrease by half the potential across battery 1720. In this particular illustration, the potential across battery 1720 is 2.0 volts, therefore the potential across capacitor 1716 changes from +3.4 volts to +2.4 volts.

Next, switch 1714 opens and switch 1710 closes charging capacitor 1712 to +0.4 volt. Switch 1710 opens and since the voltage on wire 1752 is positive, switch 1714 closes causing the voltage on capacitor 1716 to change from +2.4 volts to +1.4 volts. This process is repeated until the voltage on wire 1752 becomes negative at which time switch 1714 is not operated by the comparator and instead the comparator (through wire 1748) causes flip-flop 1754 to open switch 1736 and to close switch 1734. This causes the potential on wire 1738 to be 0.2 volt less positive than that on capacitor 1716 since R1726/(R1726+R1728)=0.1.

The number of closures of switch 1714 while switch 1736 is closed is equal to the most significant decimal digit.

Next, the conversion process continues with changes in potential across capacitor 1716, one-tenth as great as before or 0.1 volt. The number of closures of switch 1714 while switch 1734 is closed is a direct measure of the value of the second decimal digit.

The system described above is for positive analog input voltages only, however, it is straight forward to handle both positive and negative analog input voltages by:

(1) Sensing the polarity of the input voltage with the comparator and reversing battery 1720 for negative analog input signals;

(2) Sensing the polarity of the input voltage with the comparator and reversing capacitor 1716 for negative analog input signals.

In cases where high impedance at the analog input terminal is desired, capacitor 1716 can be transferred, by switches, to the output terminal of amplifier 1718 during the time that switch 1742 is closed and then switched back to the position shown in FIGURE 94 for the remainder of the encoding period.

It is apparent from the foregoing that the present invention provides a plurality of novel converter systems for use with both binary and non-binary number systems. An important feature of the converter systems of the present invention common to each of the converters disclosed is the fact that for both digital to analog operation and analog to digital operation the converter systems of the present invention all operate on the digits of the number to be converted in the order beginning with the most significant digit first. This feature of the systems makes it possible to use the converters in a reversible manner through a simple switching change in the converter circuit.

Various changes, modifications and rearrangements readily suggest themselves. In all of the delayed feedback circuits the source of standard potential may be connected either to the first capacitor or in the delayed feedback circuit as desired. Similarly in all of the converter systems which do not employ delayed feedback any one of the three charge transfer circuits may be used. The simplest charge transfer circuit is where the storage capacitor is much larger than the charge sharing capacitors but this arrangement necessarily involves an approximation. A second charge transfer circuit involves a unity positive gain amplifier circuit as disclosed in FIGURES 3 and 4. FIGURE 5 of the instant application discloses the third transfer circuit involving an amplifier having a high negative gain.

In converter systems not employing delayed feedback the comparison voltage is taken from the output of the charge transfer circuit. In converters employing delayed feedback circuits the comparison voltage may be taken from the input of the delayed feedback circuit. This is of course the first place in such converter systems that a usable comparison signal occurs. It is apparent, however, that the usable comparison signal may be extracted from a later point in the circuit and some of the converter systems have been drawn to show this optional arrangement.

The converter systems of the present invention involve a minimum number of relatively simple components of standard, stable construction. The basic signal generator portions of the converter circuits involve only a few capacitors, some switches and one or two amplifiers. For this reason the converter systems of the present invention are relatively inexpensive to manufacture, are extremely reliable, and take up a minimum of space.

This application is a division of Serial No. 25,343, filed April 28, 1960.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed and desired to be secured by United States Letters Patent is:

1. A signal generator comprising first and second charge sharing capacitors, a third capacitor, fourth and fifth charge sharing capacitors, a sixth capacitor, means for producing a reference charge on said first and fourth capacitors, switch means for coupling said first and fourth capacitors to said second and fifth capacitors respectively in charge sharing relation whereby the charge on said first capacitor is distributed between said first and second capacitor in a predetermined manner and the charge on said fourth capacitor is distributed between said fourth and fifth capacitors in a predetermined manner, means connecting said third and sixth capacitors in series, means for taking an output from across said third and sixth capacitors in series, means for transferring the charge on said second and fifth capacitors to said third and sixth capacitors respectively, and means for selectively discharging said fifth capacitor prior to said transfer.

2. A signal generator according to claim 1 wherein the selective discharge of said fifth capacitor is controlled by the presence or absence of a signal corresponding to the last transferred amount of charge as a discrete factor in the signal to be generated.

3. A signal generator according to claim 1 wherein said sharing capacitors transfer charge in weighted steps representing the successive whole numbers of a number system.

4. A signal generator according to claim 1 wherein said first capacitor equals said second capacitor, said fourth capacitor equals said fifth capacitor.

5. A signal generator according to claim 4 wherein the capacity ratio of said third capacitor to said second capacitor equals the capacity ratio of said sixth capacitor to said fifth capacitor.

6. A signal generator according to claim 5 wherein said third and sixth capacitors are much larger than said other capacitors.

7. A signal generator according to claim 1 wherein the charge transferred to said third and sixth capacitors tends to equalize the voltage at said output means.

8. A signal generator according to claim 7 wherein discharge of said capacitor is controlled by a signal representing a digital number and the resulting voltage on said sixth capacitor is the analog equivalent of said digital number.

9. A signal generator according to claim 1 including means for comparing the voltage on said sixth capacitor with an analog voltage and means responsive to said comparison for controlling the selective discharge of said fifth capacitor.

10. A signal converter system comprising first and second charge sharing capacitors, a third capacitor, fourth and fifth charge sharing capacitors, a sixth capacitor, means for producing a reference charge on said first and fourth capacitors, switch means for coupling said first and fourth capacitors to said second and fifth capacitors respectively in charge sharing relation whereby the charge on said first capacitor is distributed between said first and second capacitors in a predetermined manner and the charge on said fourth capacitor is distributed between said fourth and fifth capacitors in a predetermined manner, means connecting said third and sixth capacitors in series, means for taking an output from across said third and sixth capacitors in series, means for transferring the charge on said second and fifth capacitors to said third and sixth capacitors respectively, means for supplying said output to a signal comparator, means for applying an analog signal to said comparator, and means responsive to the output of said comparator for selectively discharging said fifth capacitor prior to the transfer of its charge to said sixth capacitor.

11. A signal converter system according to claim 10 including switch means for alternatively connecting said selective discharge means to said comparator and to a digital signal input whereby said converter system becomes a reversible analog to digital and digital to analog converter respectively.

12. A reversible converter according to claim 11 including polarity responsive means for applying an analog input signal to said comparator of constant polarity irrespective of the polarity of the analog signal applied to said polarity responsive means.

13. A reversible converter according to claim 12 including a digital output device connected to said comparator and means for indicating at said digital output device the polarity of said analog input.

14. A reversible converter according to claim 13 wherein said output means includes an amplifier and an arithmetic node and said digital input includes a pulse processing network.

15. A converter system according to claim 10 including means permanently connecting said output means to said comparator whereby said system is usable for analog to digital conversion only.

16. A converter system according to claim 10 wherein said digital input is permanently connected to said comparator whereby said system is usable for digital to analog conversion only.

17. A reversible analog to digital and digital to analog converter comprising first and second potential sources in series, first and second charge sharing capacitors, a third capacitor, fourth and fifth charge sharing capacitors, a sixth capacitor, one side of each of said capacitors being coupled to the junction point of said potential sources and to a reference potential switch means for coupling said first potential source to said first capacitor and said second battery to said fourth capacitor to produce a reference charge on said first and fourth capacitors, pulse responsive switch means for periodically connecting the other sides of said first and fourth capacitors to the other sides of said second and fifth capacitors respectively whereby the reference charge on said first capacitor is periodically distributed between said first and second capacitors and the reference charge on said fourth capacitor is periodically distributed between said fourth and fifth capacitors, pulse responsive switch means for successively transferring the shared charge on said second capacitor to said third capacitor and on said fifth capacitor to said sixth capacitor, means connecting the other sides of said fifth and sixth capacitors through a summing amplifier to an arithmetic node whereby the voltage signal across said third and sixth capacitors constitutes one input to said node, means connecting an analog voltage to the other input of said node, means connecting the output of said node to a comparator, means connecting a digital input signal to said comparator, switch means for alternatively connecting said comparator to said arithmetic node for analog to digital operation and to said digital input for digital to analog operation, and means including said comparator sensitive to the polarity of the input signal to said comparator for discharging said fifth capacitor prior to charge transfer when said comparator input is one polarity and transferring the charge on said fifth capacitor to said sixth capacitor when said comparator input is of the other polarity.

18. A converter according to claim 17 wherein said first capacitor equals said second capacitor, said fourth capacitor equals said fifth capacitor, and the capacity ratio of said third capacitor to said second capacitor equals that of said sixth capacitor to said fifth capacitor.

19. A converter according to claim 18 wherein said third and sixth capacitors are much larger than said other capacitors.

20. A converter according to claim 17 including polarity responsive means for applying an analog input signal to said comparator of constant polarity irrespective of the polarity of the analog signal applied to said polarity responsive means.

21. A converter according to claim 20 including a programmer for supplying programming pulses to the switches of said converter.

22. A reversible analog to digital and digital to analog converter comprising a potential source, first and second charge sharing capacitors, a third capacitor, fourth and fifth charge sharing capacitors, a sixth capacitor, means connecting one side of said potential source and one side of each of said capacitors to a reference potential, switch means for coupling the other side of said potential source to the other sides of said first and fourth capacitors to produce a reference charge on said first and fourth capacitors, pulse responsive switch means for periodically connecting the other sides of said first and fourth capacitors to the other sides of said second and fifth capacitors respectively whereby the reference charge on said first capacitor is periodically distributed between said first and second capacitors and the reference charge on said fourth capacitor is periodically distributed between said fourth and fifth capacitors, pulse responsive switch means for successively transferring the shared charge on said second capacitor to said third capacitor and on said fifth capacitor to said sixth capacitor, means connecting the other sides of said third and sixth capacitors through unity gain amplifiers to a differential amplifier, means connecting the output of said differential amplifier to an arithmetic node whereby the voltage signal across said third and sixth capacitors constitutes one input to said node, means connecting an analog voltage to the other input of said node, means connecting the output of said node to a comparator, means connecting a digital input signal to said comparator, switch means for alternatively connecting said comparator to said arithmetic node for analog to digital operation and to said digital input for digital to analog operation, and means including said comparator sensitive to the polarity of the input signal to said comparator for discharging said fifth capacitor prior to charge transfer when said comparator input is one polarity and transferring the charge on said fifth capacitor to said sixth capacitor when said comparator input is of the other polarity.

23. A converter according to claim 22 wherein said first capacitor equals said second capacitor and said fourth capacitor equals said fifth capacitor.

24. A converter according to claim 23 wherein the capacity ratio of said third capacitor to said second capacitor equals the capacity ratio of said sixth capacitor to said fifth capacitor.

25. A converter according to claim 22 including polarity responsive means for applying an analog input signal to said comparator of constant polarity irrespective of the polarity of the analog signal applied to said polarity responsive means.

26. A converter according to claim 22 including a digital output device connected to said comparator and means for indicating at said digital output device the polarity of said analog input.

27. An analog to digital converter comprising a potential source, first and second charge sharing capacitors, a third capacitor, fourth and fifth charge sharing capacitors, a sixth capacitor, means connecting one side of said potential source and one side of each of said capacitors to a reference potential, switch means for coupling the other side of said potential source to the other sides of said first and fourth capacitors to produce a reference charge on said first and fourth capacitors, pulse responsive switch means for periodically connecting the other sides of said first and fourth capacitors to the other sides of said second and fifth capacitors respectively whereby the reference charge on said first capacitor is periodically distributed between said first and second capacitors and the reference charge on said fourth capacitor is periodically distributed between said fourth and fifth capacitor, pulse responsive switch means for successively transferring the shared charge on said second capacitor to said third capacitor and on said fifth capacitor to said sixth capacitor, means connecting the other sides of said third and sixth capacitors through unity gain amplifiers to a differential amplifier, means permanently connecting the output of said differential amplifier to said node whereby the voltage signal across said third and sixth capacitors constitutes one input to said node, means permanently connecting an analog voltage input lead to said node, means connecting the output of said node to a comparator, and means including said comparator sensitive to the polarity of the input signal to said comparator for discharging said fifth capacitor prior to charge transfer when said comparator input is one polarity and transferring the charge on said fifth capacitor to said sixth capacitor when said comparator input is of the other polarity.

28. An analog to digital converter according to claim 27 wherein said first capacitor equals said second capacitor and said fourth capacitor equals said fifth capacitor.

29. An analog to digital converter according to claim 28 wherein the capacity ratio of said third capacitor to said second capacitor equals the capacity ratio of said sixth capacitor to said fifth capacitor.

30. An analog to digital converter according to claim 27 including polarity responsive means for applying an analog input signal to said comparator of constant polarity irrespective of the polarity of the analog signal applied to said polarity responsive means.

31. An analog to digital converter according to claim 27 including a digital output device connected to said comparator and means for indicating at said digital output device the polarity of said analog input.

32. A digital to analog converter comprising a potential source, first and second charge sharing capacitors, a third capacitor, fourth and fifth charge sharing capacitors, a sixth capacitor, means connecting one side of said potential source and one side of each of said capacitors to a reference potential, switch means for coupling the other side of said battery to the other sides of said first and fourth capacitors to produce a reference charge on said first and fourth capacitors, pulse responsive switch means for periodically connecting the other sides of said first and fourth capacitors to the other sides of said second and fifth capacitors respectively whereby the reference charge on said first capacitor is periodically distributed between said first and second capacitors and the reference charge on said fourth capacitor is periodically distributed between said fourth and fifth capacitors, pulse responsive switch means for successively transferring the shared charge on said second capacitor to said third capacitor and on said fifth capacitor to said sixth capacitor, means connecting the other sides of said third and sixth capacitors through unity gain amplifiers to a differential amplifier, means connecting the output of said differential amplifier to an analog output lead, means permanently connecting a digital input lead to said comparator, and means including said comparator sensitive to the pulse present condition and pulse absent condition of the pulse positions in a digital input pulse train for discharging said fifth capacitor prior to charge transfer when one said condition occurs and transferring the charge on said fifth capacitor to said sixth capacitor when the said other condition occurs.

33. A digital to analog converter according to claim 32 wherein said first capacitor equals said second capacitor and said fourth capacitor equals said fifth capacitor.

34. A digital to analog converter according to claim 33 wherein said third capacitor to said second capacitor equals the capacity ratio of said sixth capacitor to said fifth capacitor.

35. A signal generator comprising first, second and third charge sharing capacitors, fourth and fifth storage capacitors, means for producing a reference charge on said first capacitor, switch means for coupling said first capacitor to said second and third capacitors in charge sharing relation whereby the charge on said first capacitor is distributed between said first capacitor on the one hand, and said second and third capacitors on the other hand in a predetermined manner, means for transferring the charge on said second and third capacitors to said fourth and fifth capacitors respectively, and means for selectively discharging one of said second and third capacitors prior to said transfer.

36. A signal generator according to claim 35 wherein the selective discharge of said one of said second and third capacitors is controlled by the presence or absence of a signal corresponding to the last transferred amount of charge as a discrete factor in the signal to be generated.

37. A signal generator according to claim 35 wherein said sharing capacitors transfer charge in weighted steps representing the successive whole numbers of a number system.

38. A signal generator according to claim 35 wherein the sum of the capacitances of said second and third capacitors is equal to the capacitance of said first capacitor.

39. A signal generator according to claim 38 wherein said second and third capacitors are equal.

40. A signal generator according to claim 35 wherein the charge is shared between said first capacitor and said second and third capacitors, the latter two being connected in parallel during said charge sharing.

41. A signal generator according to claim 40 wherein the charge on said second capacitor is transferred to said fourth capacitor at the same time that said third capacitor is discharged.

42. A signal generator according to claim 41 wherein the charges on said second and third capacitors are transferred to said fourth and fifth capacitors through circuits including amplifiers having voltage gains approaching infinity.

43. A signal generator according to claim 42 wherein the signals from said fourth and fifth capacitors are of opposite polarity and are applied to the input of a differential amplifier.

44. A signal generator according to claim 43 wherein the discharge of said capacitor is controlled by a signal representing a digital number and the resulting voltage output from said differential amplifier is the analog equivalent of said digital number.

45. A signal generator according to claim 44 including means for comparing the voltage output from said differential amplifier with an analog voltage, and means responsive to said comparison for controlling the selective discharge of said second and third capacitors.

46. A signal converter system comprising first, second and third charge sharing capacitors, fourth and fifth storage capacitors, means for producing a reference charge on said first capacitor, switch means for coupling said first capacitor to said second and third capacitors in charge sharing relation whereby the charge on said first capacitor is distributed between said first capacitor on the one hand, and said second and third capacitors on the other hand in a predetermined manner, means for transferring the charge on said second and third capacitors to said fourth and fifth capacitors respectively, and means for selectively discharging one of said second and third capacitors at the same time the charge on the other of said second and third capacitors is transferred to one of said fourth and fifth capacitors.

47. A signal converter system according to claim 46 including means for supplying the voltage on said fourth and fifth capacitors through a differential amplifier to a signal comparator, means for applying an analog signal to said comparator, and means responsive to the output of said comparator for selectively discharging one of said second and third capacitors prior to the transfer of its charge to one of said fourth and fifth capacitors.

48. A signal converter system according to claim 47 including switch means for alternatively connecting said selective discharge means to said comparator and to a digital signal input whereby said converter system becomes a reversible analog to digital and digital to analog converter respectively.

49. A reversible converter according to claim 48 including a digital output devices connected to said comparator and means for indicating at said digital output device the polarity of said analog input.

50. A reversible converter according to claim 49 including an arithmetic node between said differential amplifier and said comparator and wherein said digital input includes a pulse processing network.

51. A converter according to claim 47 including means permanently connecting said differential amplifier to said comparator whereby said system is usable for analog to digital conversion only.

52. A converter system according to claim 47 wherein said digital input is permanently connected to said comparator whereby said system is usable for digital to analog conversion only.

53. A reversible analog to digital and digital to analog converter comprising a potential source, switch means connecting said potential source to a first charge sharing capacitor to produce a reference charge on said first capacitor, second and third charge sharing capacitors, fourth and fifth storage capacitors, switch means for connecting said first capacitor across each of said second and third capacitors in parallel whereby the charge on said first capacitor is shared in a predetermined manner between said first capacitor and said second and third capacitors in parallel, switch means and an amplifier having a voltage gain approaching infinity for successively transferring the charge on said second capacitor to said fourth capacitor and on said third capacitor to said fifth capacitor, means connecting the outputs of said charge transfer amplifiers through a differential amplifier to an arithmetic node whereby the voltage on said fourth and fifth capacitors constitutes an input to said node, means connecting an analog voltage to the other input of said node, means connecting the output of said node to a comparator, means connecting a digital input signal to said comparator, switch means for alternatively connecting said comparator to said arithmetic node for analog to digital operation and to said digital input for digital to analog operation, and means including said comparator sensitive to the polarity of the input signal to said comparator for discharging said second capacitor prior to said charge transfer when said comparator input is one polarity and discharging said third capacitor prior to said charge transfer when said comparator input is of the other polarity.

54. A converter according to claim 53 wherein the capacitance of said first capacitor equals the sum of the capacitances of said second and third capacitors.

55. A converter according to claim 54 wherein said second and third capacitors are equal.

56. A converter according to claim 55 including a programmer for supplying programming pulses to the switches of said converter.

57. A signal converter system comprising first and second charge sharing capacitors, a third capacitor, fourth and fifth charge sharing capacitors, a sixth capacitor, means for producing a reference charge on said first and fourth capacitors, switch means for coupling said first and fourth capacitors to said second and fifth capacitors respectively in charge sharing relation whereby the charge on said first capacitor is distributed between said first and second capacitors in a predetermined manner and the charge on said fourth capacitor is distributed between said fourth and fifth capacitors in a predetermined manner, means connecting said third and sixth capacitors in series, means for taking an output from across said third and sixth capacitors in series, means for transferring the charge on said second and fifth capacitors to said third and sixth capacitors respectively, means for supplying said output through a summing amplifier to a signal comparator, means for applying an analog input signal across said third capacitor, and means responsive to the output of said comparator for selectively discharging said fifth capacitor prior to the transfer of its charge to said sixth capacitor.

58. A signal converter system according to claim 57 including switch means for alternatively connecting said selective discharge means to said comparator and to a digital signal input whereby said converter system becomes a reversible analog to digital and digital to analog converter respectively.

59. A reversible converter according to claim 58 including a digital output device connected to said comparator and means for indicating at said digital output device the polarity of said analog input.

60. A reversible converter according to claim 59 wherein said summing amplifier is connected directly to said comparator and said digital input includes a pulse processing network.

61. A converter system according to claim 60 including means permanently connecting said summing amplifier to said comparator whereby said system is usable for analog to digital conversion only.

62. A converter system according to claim 60 whereby said digital input is permanently connected to said comparator whereby said system is usable for digital to analog conversion only.

63. A reversible analog to digital and digital to analog converter comprising first and second potential sources in series, first and second charge sharing capacitors, a third capacitor, fourth and fifth charge sharing capacitors, a sixth capacitor, one side of each of said capacitors being coupled to the junction point of said potential sources and to a reference potential, switch means for coupling said first potential source to said first capacitor and said second potential source to said fourth capacitor to produce a reference charge on said first and fourth capacitors, pulse responsive switch means for periodically connecting the other sides of said first and fourth capacitors to the other sides of said second and fifth capacitors respectively whereby the reference charge on said first capacitor is periodically distributed between said first and second capacitors and the reference charge on said fourth capacitor is periodically distributed between said fourth and fifth capacitor, pulse responsive switch means for successively transferring the shared charge on said second capacitor to said third capacitor and on said fifth capacitor to said sixth capacitor, means connecting the other sides of said third and sixth capacitors through a summing amplifier to a comparator whereby the voltage signal across said third and sixth capacitors constitutes the input to said comparator, means connecting a digital input signal to said comparator, means connecting an analog input voltage across said third capacitor, switch means for alternatively connecting said comparator to said summing amplifier for analog to digital operation and to said digital input for digital to analog operation, and means including said comparator sensitive to the polarity of the input signal to said comparator for discharging said fifth capacitor prior to charge transfer when said comparator input is one polarity and transferring the charge on said fifth capacitor to said sixth capacitor when said comparator input is of the other polarity.

64. A converter according to claim 63 wherein said first capacitor equals said second capacitor, said fourth capacitor equals said fifth capacitor, and the capacity ratio of said third capacitor to said second capacitor equals that of said sixth capacitor to said fifth capacitor.

65. A converter according to claim 64 wherein said third and sixth capacitors are much larger than said other capacitors.

66. A converter according to claim 65 including a programmer for supplying programming pulses to the switches of said converter.

67. A signal generator comprising first and second charge sharing capacitors, a third storage capacitor, means for producing a reference charge on said first capacitor, switch means for coupling said first capacitor to said second capacitor in charge sharing relation whereby the charge on said first capacitor is distributed between said first and second capacitors in a predetermined manner, means for transferring the charge on said second capacitor to said third capacitor, and means responsive to the algebraic sum of the voltages across said second and third capacitors for selectively discharging said second capacitor.

68. A signal generator according to claim 67 wherein the selective discharge of said second capacitor is controlled by the presence or absence of a signal corresponding to the amount of charge on said second capacitor as a discrete factor in the signal to be generated.

69. A signal generator according to claim 68 wherein said sharing capacitors transfer charge in weighted steps representing the successive whole numbers of a number system.

70. A signal generator according to claim 69 wherein said first and second capacitors are equal.

71. A signal generator according to claim 70 wherein the charge on said second capacitor is transferred to said third capacitor through a circuit including an amplifier having a voltage gain approaching infinity.

72. A signal converter system comprising first and second charge sharing capacitors, a third storage capacitor, means for producing a reference charge on said first capacitor, switch means for coupling said first capacitor to said second capacitor in charge sharing relation whereby the charge on said first capacitor is distributed between said first and second capacitors in a predetermined manner, means for transferring the charge on said second capacitor to said third capacitor, means for applying the voltage across said second capacitor as an anticipation voltage to the input of an arithmetic node, means for applying the voltage across said third capacitor to said arithmetic node, means for applying an analog signal to said node, means coupling said node to a comparator and means responsive to the output of said comparator for selectively discharging said second capacitor prior to the transfer of its charge to said third capacitor.

73. A signal converter system according to claim 72 including switch means for alternatively connecting said selective discharge means to said comparator and to a digital signal input whereby said converter system becomes a reversible analog to digital and digital to analog converter respectively.

74. A reversible converter according to claim 73 including polarity responsive means for applying an analog input signal to said comparator of constant polarity irrespective of the polarity of the analog signal applied to said polarity responsive means.

75. A reversible converter according to claim 74 including a digital output device connected to said comparator and means for indicating at said digital output device the polarity of said analog input.

76. A converter according to claim 72 including means permanently connecting said arithmetic node to said comparator whereby said system is usable for analog to digital conversion only.

77. A converter system according to claim 72 wherein said digital input is permanently connected to said comparator whereby said system is usable for digital to analog conversion only.

78. A reversible analog to digital and digital to analog converter comprising a potential source, switch means connecting said potential source to a first charge sharing capacitor to produce a reference charge on said first capacitor, a second charge sharing capacitor, a third storage capacitor, switch means for connecting said first and second capacitors whereby the charge on said first capacitor is shared in a predetermined manner between said first and second capacitors, switch means and an amplifier having a voltage gain approaching infinity for successively transferring the charge on said second capacitor to said third capacitor, means connecting said second and third capacitors to an arithmetic node whereby the voltage across said third capacitor is supplied as a comparison voltage to said node and the voltage across said second capacitor is supplied as an anticipation voltage to said node, means connecting an analog voltage to the third input of said node, means connecting the output of said node to a comparator, means connecting a digital input to said comparator, switch means for alternatively connecting said comparator to said arithmetic node for analog to digital operation and to said digital input for digital to analog operation, and means including said comparator sensitive to the polarity of the input signal to said comparator for discharging said second capacitor prior to said charge transfer when said comparator input is one polarity and transferring the charge from said second capacitor to said third capacitor when said comparator input is of the other polarity.

79. A converter according to claim 78 including switch means responsive to the sign pulse of a digital train for reversing the contacts of said potential source connected to said first capacitor.

80. A converter according to claim 78 wherein said switch means for reversing the potential source contacts comprises a flip flop coupled to the output of said comparator.

81. A converter according to claim 80 wherein said digital input includes a pulse processing network.

82. A converter according to claim 81 including a programmer for supplying programming pulses to the switches of said converter.

83. A signal generator comprising first and second charge sharing capacitors, a third storage capacitor, means for producing a reference charge on said first capacitor, switch means for coupling said first capacitor to said second capacitor in charge sharing relation whereby the charge on said first capacitor is distributed between said first and second capacitors in a predetermined manner, means for transferring the charge on said second capacitor to said third capacitor, said charge transfer means comprising a unity voltage gain amplifier, and means including an arithmetic node connected to the output of said amplifier for selectively reversing the polarity of said second capacitor prior to the transfer of charge from said second capacitor to said third capacitor.

84. A signal generator according to claim 83 wherein the selective reversal of said second capacitor is controlled by the presence or absence of a signal corresponding to the last transferred amount of charge as a discrete factor in the signal to be generated.

85. A signal generator according to claim 84 wherein said sharing capacitors transfer charge in weighted steps representing the successive whole numbers of a number system.

86. A signal generator according to claim 85 wherein said charge polarity reversing means comprises switch means for reversing the connection between said second and third capacitors.

87. A signal generator according to claim 86 wherein said second capacitor is connected between the input and the output of said unity gain amplifier for charge transfer.

88. A signal generator according to claim 87 wherein said reversing means reverses the plates of said second capacitor connected to the input and output respectively of said unity gain amplifier.

89. A signal generator according to claim 88 wherein the reversal of the plates of said second capacitor is controlled by a signal representing a digital number and the resulting voltage output from said unity gain amplifier is the analog equivalent of said digital number.

90. A signal generator according to claim 89 including means for comparing the voltage output from said unity gain amplifier with an analog voltage, and means responsive to said comparison for controlling the selective reversal of said second capacitor.

91. A converter system comprising first and second charge sharing capacitors, a third storage capacitor, means for producing a reference charge on said first capacitor, switch means for coupling said first capacitor to said second capacitor in charge sharing relation whereby the charge on said first capacitor is distributed between said first and second capacitors in a predetermined manner, means for transferring the charge on said second capacitor to said third capacitor, said charge transfer means comprising a unity voltage gain amplifier, and means for selectively reversing the polarity of said second capacitor prior to the transfer of charge from said second capacitor to said third capacitor, means connecting the output of said amplifier through an arithmetic node to a comparator, means for connecting an analog input to the input of said node, means for connecting a digital input to the input of said comparator, and means responsive to the output of said comparator for reversing the plate of said second capacitor connected to the input of said unity gain amplifier.

92. A converter system according to claim 91 wherein said first and second capacitors are equal.

93. A converter system according to claim 92 including means for alternatively connecting said comparator to said node and to said digital input whereby said system becomes a reversible analog to digital and digital to analog converter respectively.

94. A reversible converter according to claim 93 including a digital output device connected to said comparator and means for indicating at said digital output device the polarity of said analog input.

95. A reversible converter according to claim 94 wherein said digital input includes a pulse processing network.

96. A converter according to claim 91 including means permanently connecting said node to said comparator whereby said system is usable for analog to digital conversion only.

97. A converter according to claim 91 including means permanently connecting said digital input to said comparator whereby said system is usable for digital to analog conversion only.

98. A reversible analog to digital and digital to analog converter comprising a potential source, switch means connecting said potential source to a first charge sharing capacitor to produce a reference charge on said first capacitor, a second charge sharing capacitor, a third storage capacitor, switch means for connecting said first and second capacitors whereby the charge of said first capacitor is shared in a predetermined manner between said first and second capacitors, an amplifier having unity voltage gain, switch means for reversibly connecting said second capacitor between the input and output of said amplifier, means for applying an analog voltage to the input of said amplifier, means connecting one plate of said third capacitor to the input of said unity gain amplifier, means connecting the other plate of said third capacitor to a reference potential, an arithmetic node connecting an analog voltage directly to the input of said comparator, means for connecting a digital input to the input of said comparator, switch means for alternatively connecting said comparator to said node for analog to digital operation and to said digital input for digital to analog operation, and means including said comparator sensitive to the polarity of the input signal to said comparator for connecting one plate of said second capacitor to the input and the other plate to the output of said amplifier prior to charge transfer when said comparator input is one polarity and reversing the plates of said second capacitor prior to charge transfer when the input to said comparator is of the other polarity.

99. A converter according to claim 98 wherein said first and second capacitors are equal.

100. A converter according to claim 99 wherein said digital input includes a pulse processing network.

101. A converter according to claim 100 including a programmer for supplying programming pulses to the switches of said converter.

102. A signal generator comprising first and second charge sharing capacitors, means for producing a reference charge on said first capacitor, means periodically connecting said first and second capacitors together in charge sharing relation, a delayed feedback circuit including at least one storage capacitor, a unity gain amplifier coupling said second capacitor to said feedback circuit whereby the signal corresponding to the voltage across said second capacitor is induced on said storage capacitor, means for storing said signal on said storage capacitor, and means for feeding said stored signal back to said first capacitor.

103. A signal generator comprising first and second charge sharing capacitors, means for producing a reference charge on said first capacitor, means periodically connecting said first and second capacitors together in charge sharing relation, a delayed feedback circuit comprising third and fourth storage capacitors connected in parallel signal paths, a first amplifier for applying the voltage across said second capacitor to said delayed feedback circuit, means for alternately coupling the output of said amplifier to first one and then the other of said storage capacitors corresponding to the voltage across said second capacitor, and second and third amplifiers for feeding said induced signals back to said first capacitor.

104. A signal generator according to claim 103 wherein the voltage gains of said second and third amplifiers are equal and each multiplied by the voltage gain of said first amplifier equals one.

105. A signal generator according to claim 104 wherein the voltage gain of each of said amplifiers is unity.

106. A signal generator comprising first and second charge sharing capacitors, a potential source, means for connecting said potential source to said first capacitor for producing a reference charge thereon, means connecting one plate of said first and second capacitors to the input of a first unity gain amplifier, means connecting the other plate of said second capacitor to a reference potential, a delayed feedback circuit including third and fourth storage capacitors in parallel signal paths, means alternately connecting the output of said first unity gain amplifier to said third and fourth capacitors, the opposite sides of said third and fourth capacitors being connected to said reference potential, whereby a voltage signal is alternately induced on said third and fourth capacitors equal to the voltage across said second capacitor, second and third unity gain amplifiers connecting said third and fourth capacitors to a common feedback lead whereby the voltage signal on said third and fourth capacitors appears on said lead, and means for connecting said lead to the other plate of said first capacitor to unbalance the voltage across said first and second capacitors and produce charge sharing therebetween.

107. A signal generator according to claim 106 wherein said second and third amplifiers are low output impedance amplifiers.

108. A signal generator according to claim 107 including means for selectively discharging the said one plate of said second capacitor to the voltage of said feedback lead.

109. A signal generator according to claim 108 wherein the selective discharge of said one plate is controlled by the presence or absence of a signal corresponding to the quantity of charge last transferred between said sharing capacitors as a discrete factor in the signal to be generated.

110. A signal generator according to claim 109 wherein the charge is transferred between said sharing capacitors in discrete weighted quantities representative of the successive whole numbers of a number system.

111. A signal generator according to claim 110 wherein said first and second capacitors are equal.

112. A signal converter comprising first and second charge sharing capacitors, a potential source, means for connecting said potential source to said first capacitor for producing a reference charge thereon, means connecting one plate of said first and second capacitors to the input of a first unity gain amplifier, means connecting the other plate of said second capacitor to a reference potential, a delayed feedback circuit including third and fourth storage capacitors in parallel signal paths, means alternately connecting the output of said first unity gain amplifier to said third and fourth capacitors, the opposite sides of said third and fourth capacitors being connected to said reference potential, whereby a voltage signal is alternately induced on said third and fourth capacitors equal to the voltage across said second capacitor, second and third unity gain amplifiers connecting said third and fourth capacitors to a common feedback lead whereby the voltage signal on said third and fourth capacitors appears on said lead, and means for connecting said lead to the other plate of said first capacitor to unbalance the voltage across said first and second capacitors and produce charge sharing therebetween, means coupling the output of said first unity gain amplifier through an arithmetic node to a comparator, means for applying an analog input to said arithmetic node and means including said comparator responsive to the polarity of the input signal to said comparator for controlling the selective discharge of said one plate of said second capacitor.

113. A converter according to claim 112 including means for applying an analog input voltage of constant polarity to said arithmetic node irrespective of the polarity of said analog voltage.

114. A converter according to claim 113 wherein said constant analog polarity means includes a flip-flop circuit.

115. A converter according to claim 113 including means for applying a digital input signal to said selective discharge means and means for alternatively connecting said comparator to said selective discharge means and said digital input to said selective discharge means whereby said system is a reversible analog to digital and digital to analog converter respectively.

116. A reversible converter according to claim 115 wherein said digital input includes a pulse processing network.

117. A reversible converter according to claim 116 including a programmer for supplying programming pulses to the switches of said converter.

118. A converter according to claim 113 including means permanently connecting said comparator to said selective discharge means whereby said system is usable for analog to digital conversion only.

119. A converter according to claim 113 including means for applying a digital input to said selective discharge means, and means permanently connecting said digital input to said selective discharge means whereby said system is usable for digital to analog conversion only.

120. A signal generator comprising first and second charge sharing capacitors, means for producing a reference charge on said first capacitor, means periodically connecting said first and second capacitors together in charge sharing relation, a first amplifier coupling the voltage across said second capacitor to a delayed feedback circuit, said delayed feedback circuit comprising a third storage capacitor connected between the output of said first amplifier and a reference potential, a second amplifier coupled to the output of said third capacitor, a fourth storage capacitor coupled between output of said second amplifier and said reference potential, a third amplifier coupled to the output of said fourth capacitor, and means for feeding the output from said third amplifier back to said first capacitor.

121. A signal generator according to claim 120 wherein the product of the voltage gains of said first, second and third amplifiers is one.

122. A signal generator according to claim 121 wherein the voltage gain of each of said amplifiers is unity.

123. A signal generator comprising first and second charge sharing capacitors, a potential source, means for connecting said potential source to said first capacitor for producing a reference charge thereon, means connecting one plate of said first and second capacitors to the input of a first unity gain amplifier, means connecting the other plate of said seocnd capacitor to a reference potential, a delayed feedback circuit, said circuit comprising a third storage capacitor connected between the output of said first amplifier and said reference potential, a second amplifier coupled to the output of said third capacitor, a fourth storage capacitor coupled between output of said second amplifier and said reference potential, a third amplifier coupled to the output of said fourth capacitor, a feedback lead connected to the output of said third amplifier, and means for connecting said lead to the other plate of said first capacitor to unbalance the voltage across said first and second capacitors and produce charge sharing therebetween.

124. A signal generator according to claim 123 wherein said second and third amplifiers are cathode followers.

125. A signal generator according to claim 123 including means for selectively discharging said one plate of said second capacitor to the voltage of said feedback lead.

126. A signal generator according to claim 125 wherein the selective discharge of said one plate is controlled by the presence or absence of a signal corresponding to the quantity of charge last transferred between said sharing capacitors as a discrete factor in the signal to be generated.

127. A signal generator according to claim 126 wherein the charge is transferred between said sharing capacitors in discrete weighted quantities representative of the successive whole numbers of a number system.

128. A signal generator according to claim 127 wherein said first and second capacitors are equal.

129. A signal converter comprising first and second charge sharing capacitors, a potential source, means for connecting said potential source to said first capacitor for producing a reference charge thereon, means connecting one plate of said first and second capacitors to the input of a first unity gain amplifier, means connecting the other plate of said second capacitor to a reference potential, a delayed feedback circuit comprising a third storage capacitor connected between the output of said first amplifier and said reference potential, a second amplifier coupled to the output of said third capacitor, a fourth storage capacitor coupled between output of said second amplifier and said reference potential, a third amplifier coupled to the output of said fourth capacitor, a feedback lead connected to the output of said third amplifier, and means for connecting said lead to the other plate of said first capacitor to unbalance the voltage across said first and second capacitors and produce charge sharing therebetween, means coupling the output of said first unity gain amplifier through an arithmetic node to a comparator, means for applying an analog input to said arithmetic node and means including said comparator responsive to the polarity of the input signal to said comparator for controlling the selective discharge of said one plate of said second capacitor.

130. A converter according to claim 129 including means for applying an analog input voltage of constant polarity to said arithmetic node irrespective of the polarity of said analog voltage.

131. A converter according to claim 130 including means for applying a digital input signal to said selective discharge means and means for alternatively connecting said comparator to said selective discharge means and said digital input to said selective discharge means whereby said system is a reversible analog to digital and digital to analog converter respectively.

132. A reversible converter according to claim 131 wherein said digital input includes a pulse processing network.

133. A reversible converter according to claim 132 including a programmer for supplying programming pulses to the switches of said converter.

134. A converter according to claim 130 including means permanently connecting said comparator to said selective discharge means whereby said system is usable for analog to digital conversion only.

135. A converter according to claim 130 including means for applying a digital input to said selective discharge means, and means permanently connecting said digital input to said selective discharge means whereby said system is usable for digital to analog conversion only.

136. A signal generator comprising first and second charge sharing capacitors, means including a potential source for producing a reference charge on said first capacitor, means periodically connecting said first and second capacitors together in charge sharing relation, a first amplifier coupling the voltage across said second capacitor to a delayed feedback circuit, said delayed feedback circuit comprising a third storage capacitor connected between the output of said first amplifier and a reference potential, a second amplifier coupled to the output of said third capacitor, said potential source being connected between the input of said second amplifier and said reference potential, and means for feeding the output from said second amplifier back to said first capaictor.

137. A signal generator according to claim 136 wherein the product of the voltage gains of said first and second amplifiers is one.

138. A signal generator according to claim 137 wherein the voltage gain of each of said amplifiers is unity.

139. A signal generator comprising first and second charge sharing capacitors, means connecting one plate of said first and second capacitors to the input of a first unity gain amplifier, means connecting the other plate of said second capacitor to a reference potential, a delayed feedback circuit comprising a third storage capacitor connected between the output of said first amplifier and said reference potential, a second amplifier coupled to the output of said third capacitor, a potential source for producing a reference charge on said first capacitor connected between the input of said second amplifier and said reference potential, a feedback lead connected to the output of said third amplifier, and means for connecting said lead to the other plate of said first capacitor to unbalance the voltage across said first and second capacitors and produce charge sharing therebetween.

140. A signal generator according to claim 139 wherein said second amplifier is a low output impedance amplifier.

141. A signal generator according to claim 140 including means for selectively discharging the said one plate of said second capacitor to the voltage of said feedback lead.

142. A signal generator according to claim 141 wherein the selective discharge of said one plate of said second capacitor is controlled by the presence or absence of a signal corresponding to the quantity of charge last transferred between said sharing capacitors as a discrete factor in the signal to be generated.

143. A signal generator according to claim 142 wherein the charge is transferred between said sharing capacitors in discrete weighted quantities representative of the successive whole numbers of a number system.

144. A signal generator according to claim 143 wherein said first and second capacitors are equal.

145. A signal converter comprising first and second charge sharing capacitors, a battery, means for connecting said battery to said first capacitor for producing a reference charge thereon, means connecting common plates of said first and second capacitors to the input of a first unity gain amplifier, means connecting the other plate of said second capacitor to ground, a delayed feedback circuit comprising a third storage capacitor connected between the output of said first amplifier and ground, a second amplifier coupled to the output of said third capacitor, a reference voltage battery connected between the input of said second amplifier and ground, a feedback lead connected to the output of said third amplifier, and means for connecting said lead to the other plate of said first capacitor to unbalance the voltage across said first and second capacitors and produce charge sharing therebetween, means coupling the output of said first unity gain amplifier through an arithmetic node to a comparator, means for applying an analog input to said arithmetic node and means including said comparator responsive to the polarity of the input signal to said comparator for controlling the selective discharge of said common plates.

146. A signal converter according to claim 145 including means for applying a digital input signal to said selective discharge means and means for alternatively connecting said comparator to said selective discharge means and said digital input to said selective discharge means whereby said system is a reversible analog to digital and digital to analog converter respectively.

147. A reversible converter according to claim 146 wherein said digital input includes a pulse processing network.

148. A reversible converter according to claim 147 including a programmer for supplying programming pulses to the switches of said converter.

149. A converter according to claim 145 including means permanently connecting said comparator to said selective discharge means whereby said system is usable for analog to digital conversion only.

150. A converter according to claim 145 including means for applying a digital input to said selective discharge means, and means permanently connecting said digital input to said selective discharge means whereby said system is usable for digital to analog conversion only.

151. A signal generator comprising first and second charge sharing capacitors, means including a potential source for producing a reference charge on said first capacitor, means periodically connecting said first and second capacitors together in charge sharing relation, a first amplifier coupling the voltage across said second capacitor to a delayed feedback circuit, said delayed feedback circuit comprising a third storage capacitor connected between the output of said first amplifier and a reference potential, a second amplifier coupled to the output of said third capacitor, said potential source being connected between the input of said second amplifier and a reference potential, means for feeding the output from said second amplifier back to said first capacitor, and means for selectively reversing the plate of said first capacitor to which said feedback output is applied.

152. A signal generator according to claim 151 wherein the product of the voltage gains of said first and second amplifiers is $$\frac{1}{2}\left(1+\frac{C_1}{C_2}\right)$$

where $C_1$ and $C_2$ are the capacitances of said first and second capacitors respectively.

153. A signal generator according to claim 152 including a comparator, and means for coupling the output from said first amplifier to the input of said comparator.

154. A signal generator comprising first and second charge sharing capacitors, means connecting one plate of said first and second capacitors to the input of a first unity gain amplifier, means connecting the other plate of said second capacitor to a reference potential, a delayed feedback circuit comprising a third storage capacitor connected between the output of said first amplifier and said reference potential, a second amplifier coupled to the output of said third capacitor, a potential source for producing a reference charge on said first capacitor connected between the input of said second amplifier and said reference potential, a feedback lead connected to the output of said second amplifier, means for connecting said lead to one of the plates of said first capacitor to unbalance the voltage across said first and second capacitors to produce charge sharing therebetween, and means for selectively and simultaneously reversing the plate of said first capacitor connected to said second capacitor and the plate of said first capacitor to which said feedback lead is connected prior to charge sharing between said first and second capacitors.

155. A signal generator according to claim 154 wherein said second amplifier is a low output impedance amplifier.

156. A signal generator according to claim 155 wherein the reversing of the plates of said first capacitor is controlled by the presence or absence of a signal corresponding to the quantity of charge last transferred between said sharing capacitors as a discrete factor in the signal to be generated.

157. A signal generator according to claim 156 wherein the charge is transferred between said sharing capacitors in discrete weighted quantities representative of the successive whole numbers of a number system.

158. A signal generator according to claim 157 wherein said first and second capacitors are equal.

159. A signal converter comprising first and second charge sharing capacitors, means connecting one plate of said first and second capacitors to the input of a first unity gain amplifier, means connecting the other plate of said second capacitor to a reference potential, a delayed feedback circuit comprising a third storage capacitor connected between the output of said first amplifier and said reference potential, a second amplifier coupled to the output of said third capacitor, a potential source for producing a reference charge on said first capacitor connected between the input of said second amplifier and said reference potential, a feedback lead connected to the output of said second amplifier, means for connecting said lead to one of the plates of said first capacitor to unbalance the voltage across said first and second capacitors to produce charge sharing therebetween, and means for selectively and simultaneously reversing the plate of said first capacitor connected to said second capacitor and the plate of said first capacitor to which said feedback lead is connected prior to charge sharing between said first and second capacitors, means coupling the output of said second unity gain amplifier through an arithmetic node to a comparator, means for applying an analog input to said arithmetic node, and means including said comparator responsive to the polarity of the input signal to said comparator for controlling the selective reversal of the plates of said first capacitor.

160. A converter according to claim 159 including means for applying a digital input signal to said selective discharge means and means for alternatively connecting said comparator to said selective discharge means and said digital input to said selective discharge whereby said system is a reversible analog to digital and digital to analog converter respectively.

161. A reversible converter according to claim 160 wherein said digital input includes a pulse processing network.

162. A reversible converter according to claim 161 including a programmer for supplying programming pulses to the switches of said converter.

163. A converter according to claim 159 including means permanently connecting said comparator to said selective discharge means whereby said system is usable for analog to digital conversion only.

164. A converter according to claim 159 including means for applying a digital input to said selective discharge means, and means permanently connecting said digital input to said selective discharge means whereby said system is usable for digital to analog conversion only.

165. A signal converter comprising first and second charge sharing capacitors, a potential source, means for connecting said potential source to said first capacitor for producing a reference charge thereon, means connecting one plate of said first and second capacitors to the input of a first unity gain amplifier, means connecting the other plate of said second capacitor to a reference potential, a delayed feedback circuit, means connecting the output of said amplifier to the input of said delayed feedback circuit, a feedback lead connected to the output of said delayed feedback circuit, means for connecting said lead to one of the plates of said first capacitor to unbalance the voltage across said first and second capacitors to produce charge sharing therebetween, means for selectively and simultaneously reversing the plate of said first capacitor connected to said second capacitor and the plate of said first capacitor to which said feedback lead is connected prior to charge sharing between said first and second capacitors, and means for coupling an analog input to the said one plate of said second capacitor.

166. A signal converter according to claim 165 wherein the reversing of the plates of said first capacitor is controlled by the presence or absence of a signal corresponding to the quantity of charge last transferred between said sharing capacitors as a discrete factor in the signal to be generated.

167. A signal converter according to claim 166 wherein the charge is transferred between said sharing capacitors in discrete weighted quantities representative of the successive whole numbers of a number system.

168. A signal converter according to claim 167 wherein said first and second capacitors are equal.

169. A converter according to claim 168 including means coupling the output of said delayed feedback circuit to a comparator, and means including said comparator responsive to the polarity of the input signal to said comparator for controlling the selective reversal of the plates of said first capacitor.

170. A converter according to claim 169 including means for applying a digital input signal to said selective reversal means, and means for alternatively connecting said comparator to said selective reversal means and said digital input to said selective reversal means whereby said system is a reversible analog to digital and digital to analog converter respectively.

171. A reversible converter according to claim 170 wherein said digital input includes a pulse processing network.

172. A reversible converter according to claim 171 including a programmer for supplying programming pulses to the switches of said converter.

173. A converter according to claim 169 including means permanently connecting said comparator to said selective discharge means whereby said system is usable for analog to digital conversion only.

174. A converter according to claim 169 including means for applying a digital input to said selective discharge means, and means permanently connecting said digital input to said selective discharge means whereby said system is usable for digital to analog conversion only.

175. A charge transfer circuit comprising a potential source having first and second terminals connected to opposite sides of said potential source, a unity voltage gain amplifier having input and output terminals, a first capacitor connected between said amplifier input terminal and ground, a second capacitor having first and second plates, and means for switching said first plate between said first terminal of said potential source and said amplifier input terminal and at the same time switching said second plate between said second terminal of said potential source and said amplifier output terminal.

176. A signal generator comprising first and second charge sharing capacitors, means for producing a reference charge on said first capacitor, means periodically connecting said first and second capacitors together in charge sharing relation, a delayed feedback circuit comprising third and fourth storage capacitors connected in parallel signal paths, the capacitances of said third and fourth capacitors being much larger than the capacitance of said second capacitor, a unity gain amplifier for applying the voltage across said second capacitor to said delayed feedback circuit means for alternately coupling the output of said amplifier to first one and then the other of said storage capacitors whereby a signal is alternately induced on said storage capacitors corresponding to the voltage across said second capacitor, and a feedback lead for feeding said induced signals back to said first capacitor.

177. A signal generator comprising first and second charge sharing capacitors, means for producing a reference charge on said first capacitor, means periodically connecting said first and second capacitors together in charge sharing relation, a first amplifier coupling the voltage across said second capacitor to a delayed feedback circuit, said delayed feedback circuit comprising a third storage capacitor connected between the output of said first amplifier and a reference potential, a second amplifier coupled to the output of said third capacitor, the product of the gains of said amplifiers being one, a fourth storage capacitor coupled between the output of said second amplifier and said reference potential, the capacitance of said fourth capacitor being much larger than that of said third capacitor, and a feedback lead for feeding the output from said fourth capacitor to said first capacitor.

178. A signal generator comprising first and second charge sharing capacitors, means for producing a reference charge on said first capacitor, means periodically connecting said first and second capacitors together in charge sharing relation, a unity gain amplifier coupling the voltage across said second capacitor to a delayed feedback circuit, said delayed feedback circuit comprising a third storage capacitor connected between the output of said first amplifier and a reference potential, a fourth storage capacitor coupled between the output of said third capacitor and said reference potential, the capacitance of said fourth capacitor being much larger than the capacitance of said first capacitor, the capacitance of said third capacitor being much larger than the capacitance of said fourth capacitor, and a feedback lead for feeding the output from said fourth capacitor back to said first capacitor.

179. A signal generator comprising first and second charge sharing capacitors, means for producing a reference charge on said first capacitor, means periodically connecting said first and second capacitors together in charge sharing relation, a unity gain amplifier coupling the voltage across said second capacitor to a delayed feedback circuit, said delayed feedback circuit comprising a third storage capacitor connected between the output of said amplifier and a reference potential, the capacitance of said third capacitor being much larger than the capacitance of said first capacitor, said charge producing means including a potential source connected between the output of said third capacitor and said reference potential, and a feedback lead for feeding the output from said third capacitor back to said first capacitor.

180. A signal generator comprising first and second charge sharing capacitors, means including a potential source for producing a reference charge on said first capacitor, means periodically connecting said first and second capacitors together in charge sharing relation, an amplifier having a gain equal to $$\frac{1}{2}\left(1+\frac{C_1}{C_2}\right)$$

(where $C_1$ and $C_2$ are the capacitances of said first and second capacitors respectively) coupling the voltage across said second capacitor to a delayed feedback circuit, said delayed feedback circuit comprising a third storage capacitor connected between the output of said amplifier and a reference potential, the capacitance of said third capacitor being much larger than the capacitance of said second capacitor, said potential source being connected between the output of said third capacitor and said reference potential, a feedback lead for feeding the output of said third capacitor back to said first capacitor, and means for selectively reversing the plate of said first capacitor to which said fed back output is applied.

181. A signal converter system comprising first and second charge sharing capacitors, a third storage capacitor, means for producing a reference charge on said first capacitor, switch means for coupling said first capacitor to said second capacitor in charge sharing relation whereby the charge on said first capacitor is distributed between said first and second capacitors in a predetermined manner, means for transferring the charge on said second capacitor to said third capacitor, said charge transfer means comprising a unity voltage gain amplifier, means for selectively reversing the polarity of said second capacitor prior to the transfer of charge from said second capacitor to said third capacitor, a comparator, means connecting the output from said unity gain amplifier to the input of said comparator, and means for connecting an analog input signal to said third capacitor.

182. A signal converter system comprising first and second charge sharing capacitors, a third storage capacitor, means for producing a reference charge on said first capacitor, switch means for coupling said first capacitor to said second capacitor in charge sharing relation whereby the charge on said first capacitor is distributed between said first and second capacitors in a predetermined manner, means for transferring the charge on said second capacitor to said third capacitor, the capacitance of said third capacitor being much larger than the capacitance of said second capacitor, means for selectively reversing the polarity of the charge on said second capacitor prior to its transfer from said second capacitor to said third capacitor, a comparator, means connecting the output from said third capacitor to the input of said comparator, and means for connecting an analog input signal to the input of said comparator.

183. A signal converter system comprising first and second charge sharing capacitors, a third storage capacitor, means for producing a reference charge on said first capacitor, switch means for coupling said first capacitor to said second capacitor in charge sharing relation whereby the charge on said first capacitor is distributed between said first and second capacitors in a predetermined manner, means for transferring the charge on said second capacitor to said third capacitor, said charge transfer means comprising an amplifier having a negative voltage gain approaching infinity, means for selectively reversing the polarity of the charge on said second capacitor prior to its transfer from said second capacitor to said third capacitor, a comparator, means connecting the output from said infinity gain amplifier to the input of said comparator, and means for connecting an analog input signal to the input of said comparator.

184. A signal generator comprising first and second charge sharing capacitors, a potential source, means for connecting said potential source to said first capacitor to produce a reference charge thereon, means for periodically connecting said first and second capacitors together in charge sharing relation, a third storage capacitor, means for transferring the charge on said second capacitor to said third capacitor, and means for periodically reducing the voltage of said potential source coupled to said first capacitor by a factor representative of the successive digits of a non-binary number system.

185. A signal generator according to claim 184 including a potential divider between said potential source and said first capacitor, and means for periodically varying the position of the tap on said divider.

186. A signal generator according to claim 185 wherein said potential divider comprises a potentiometer, and said tap acts to successively divide the output of said potential source by a factor of ten.

187. A signal generator according to claim 186 wherein said charge transferring means comprises a unity gain amplifier.

188. A signal generator according to claim 187 wherein said third capacitor has one side connected to a reference potential, and means for switching the other side of said third capacitor between the input and output of said unity gain amplifier.

189. A signal generator comprising first and second charge sharing capacitors, means including a potential source for producing a reference charge on said first capacitor, means periodically connecting said first and second capacitors together in charge sharing relation, a first amplifier coupling the voltage across said second capacitor to a delayed feedback circuit, means for feeding the output from said delayed feedback circuit back to said first capacitor, and means for periodically modifying the voltage across said first capacitor by a factor representative of the successive digits of a non-binary number system.

190. A signal generator according to claim 189 wherein said modifying means comprises means for connecting a third capacitor across said first capacitor.

191. A signal generator according to claim 190 including means for connecting at least one additional capacitor across said first and third capacitors.

192. A signal generator according to claim 190 wherein the combined capacity of said first and third capacitors in parallel is greater than the capacity of said first capacitor alone by a factor representative of the next digit of a decimal number.

193. A signal generator according to claim 192 wherein said delayed feedback circuit comprises a fourth storage capacitor connected between the output of said first amplifier and a reference potential, a second amplifier coupled to the output of said third capacitor, said potential source being connected between said first capacitor and said reference potential, and means for feeding the output from said second amplifier back to said first capacitor and third capacitors.

194. A signal generator comprising first and second capacitors, a potential source for periodically applying a reference charge to said first capacitor, means for transferring the charge on said first capacitor to said second capacitor, and means for connecting a third capacitor across said second capacitor, the capacitances of said second and third capacitors in parallel being greater than the capacitance of said second capacitor alone by a factor representative of the next successive digit of a non-binary number system.

195. A signal generator according to claim 194 wherein said number system is to the base ten.

196. A signal generator according to claim 195 including means for connecting at least one additional capacitor across said second and third capacitors.

197. A signal generator according to claim 194 including means for reversing the polarity of the charge transferred from said first to said second capacitor at the end of a period representative of a complete digit of said number system.

198. A signal generator according to claim 197 wherein said charge transferring means comprises a unity gain amplifier.

199. A signal generator according to claim 198 including means for switching each of said second and third capacitors between the input and the output of said unity gain amplifier.

200. A signal generator according to claim 199 including means for connecting said third capacitor to the output of said unity gain amplifier and said second capacitor to the input of said unity gain amplifier at the end of said digit period whereby said third capacitor is charged to the voltage of said second capacitor at the end of said period.

201. A signal generator comprising first and second charge sharing capacitors, means for periodically connecting said capacitors together in charge sharing relation, means connecting the output of said second capacitor to a delayed feedback circuit, said delayed feedback circuit comprising a potential source and a voltage divider, and means for feeding back the output from said delayed feedback circuit to said first capacitor.

202. A signal generator according to claim 201 wherein said voltage divider comprises a potentiometer for periodically varying the feedback voltage by a factor representative of the successive digits of a non-binary number system.

203. A signal generator according to claim 202 wherein the base of said number system is ten.

204. A signal generator according to claim 202 wherein said second capacitor is connected to said delayed feedback circuit through a unity gain amplifier.

205. A signal generator according to claim 204 including means for applying an analog voltage to the input of said amplifier.

206. A signal generator according to claim 205 including a comparator, a second voltage divider across said potential source and means for applying an anticipation voltage from said second voltage divider to said comparator.

207. A signal generator according to claim 206 wherein said potential source is poled to oppose the voltage produced by the charge on said second capacitor.

208. A signal converter system comprising first and second charge sharing capacitors, a third storage capacitor, means for producing a reference charge on said first capacitor, switch means for coupling said first capacitor to said second capacitor in charge sharing relation whereby the charge on said first capacitor is distributed between said first and second capacitors in a predetermined manner, means for transferring the charge on said second capacitor to said third capacitor, said charge transfer means comprising an amplifier having a high negative voltage gain, means for selectively reversing the polarity of said second capacitor prior to the transfer of charge from said second capacitor to said third capacitor, a comparator, means connecting the output fed from said amplifier to the input of said comparator, and means for impressing an analog input signal on said comparator.

209. A signal converter system according to claim 208 wherein said analog input signal means includes an input terminal directly connected to said comparator.

210. A signal converter system comprising first and second charge sharing capacitors, a third storage capacitor, means for producing a reference charge on said first capacitor, switch means for coupling said first capacitor to said second capacitor in charge sharing relation whereby the charge on said first capacitor is distributed between said first and second capacitors in a predetermined manner, means for transferring the charge on said second capacitor to said third capacitor, said charge transfer means comprising an amplifier having a high negative voltage gain, means for selectively reversing the polarity of said second capacitor prior to the transfer of charge from said second capacitor to said third capacitor, a comparator, and means connecting the output from said infinity gain amplifier to the input of said comparator.

211. An analog to digital converter comprising first and second charge sharing capacitors, a third capacitor, means for producing a reference signal on one of said sharing capacitors, switch means for coupling said sharing capacitors together in charge sharing relation at spaced intervals of time whereby said reference charge is distributed between said sharing capacitors in diminishing quantities representative of the successive digits of a number system starting with the most significant digit first, and means for transferring all the charge on said second capacitor to said third capacitor after each sharing interval, said transfer means including a reversing switch for reversing the connection between said second and third capacitors, said charge transfer means including an amplifier having a high negative gain.

References Cited in the file of this patent

UNITED STATES PATENTS 2,817,704 Huntley ---------------- Dec. 24, 1957

UNITED STATES PATENT OFFICE

CERTIFICATE OF CORRECTION

Patent No. 3,140,481 July 7, 1964

Philip A. Hoffman

It is hereby certified that error appears in the above numbered patent requiring correction and that the said Letters Patent should read as corrected below.

Column 2, lines 34 and 35, for "delays" read -- delay --; column 15, line 12, for "simplfy" read -- simply --; column 18, line 69, for "arithmeic" read -- arithmetic --; column 20, line 18, for "corersponds" read -- corresponds --; column 24, line 8, for "acually" read -- actually --; column 25, line 4, for "colume" read -- column --; column 35, line 54, for "wil lbe" read -- will be --; column 39, line 25, for "$\frac{1}{2}E$" read -- $\frac{1}{4}E$ --; column 45, line 61, for "684." read -- 684, --; column 48, line 27, for "wide" read -- wire --; column 49, line 15, for "-E8" read -- $-\frac{E}{8}$ --; column 51, line 74, for the bold-faced numeral "1" read -- 1 --, set in light-faced type; column 53, lines 50 and 51, for "redistrirbute" read -- redistribute --; line 57, for "Ths" read -- This --; column 54, line 20, for "an" read -- as --; column 57, line 31, for the bold-faced numeral "101" read -- 101 --, set in light-faced type; column 63, line 37, for "pulse" read -- pulses --; column 65, line 22, for "whicht" read -- which --; column 69, line 2, for "of" read -- if --; line 50, for "64 66" read -- 64, 66 --; column 72, line 74, for "pules" read -- pulse --; column 75, line 28, for "drop" read -- drops --; column 79, line 37, for "1162" read -- 1662 --; column 81, lines 47 and 48, for "stat etriggers" read -- state triggers --; column 86, line 73, for "swithes" read -- switches --; column 87, line 31, for "inrements" read -- increments --; line 38, for "operators" read -- operates --; column 95, line 30, for "devices" read -- device --; column 102, line 35, for "seocnd" read -- second --; column 103, line 55, for "capaictor" read -- capacitor --.

Signed and sealed this 27th day of April 1965.

(SEAL)
Attest:

ERNEST W. SWIDER
Attesting Officer

EDWARD J. BRENNER
Commissioner of Patents